US009508837B2

(12) United States Patent
Arigane et al.

(10) Patent No.: US 9,508,837 B2
(45) Date of Patent: Nov. 29, 2016

(54) SEMICONDUCTOR DEVICE AND METHOD OF MANUFACTURING SAME

(71) Applicant: Renesas Electronics Corporation, Koutou-ku, Tokyo (JP)

(72) Inventors: Tsuyoshi Arigane, Tokyo (JP); Daisuke Okada, Tokyo (JP); Digh Hisamoto, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/004,972

(22) Filed: Jan. 24, 2016

(65) Prior Publication Data

US 2016/0141396 A1 May 19, 2016

Related U.S. Application Data

(62) Division of application No. 14/548,595, filed on Nov. 20, 2014, now Pat. No. 9,257,446.

(30) Foreign Application Priority Data

Nov. 26, 2013 (JP) ................................ 2013-243953

(51) Int. Cl.
*H01L 21/3205* (2006.01)
*H01L 29/66* (2006.01)
*H01L 27/115* (2006.01)
(Continued)

(52) U.S. Cl.
CPC ..... *H01L 29/66833* (2013.01); *H01L 21/2815* (2013.01); *H01L 21/28158* (2013.01); *H01L 21/28282* (2013.01); *H01L 27/11565* (2013.01); *H01L 27/11568* (2013.01); *H01L 27/11573* (2013.01); *H01L 29/42344* (2013.01); *H01L 29/42364* (2013.01); *H01L 29/511* (2013.01); *H01L 29/517* (2013.01); *H01L 29/518* (2013.01); *H01L 29/66545* (2013.01); *H01L 29/792* (2013.01)

(58) Field of Classification Search
CPC .................. H01L 29/66833; H01L 29/42344; H01L 27/115; H01L 29/66954
See application file for complete search history.

(56) References Cited

U.S. PATENT DOCUMENTS 8,305,802 B2 11/2012 Kawashima et al.
8,357,968 B2 1/2013 Chakihara et al.
(Continued)

FOREIGN PATENT DOCUMENTS

JP 2009-059927 A 3/2009
JP 2010-087252 A 4/2010
(Continued)

*Primary Examiner* — Fernando L Toledo
*Assistant Examiner* — Neil Prasad
(74) *Attorney, Agent, or Firm* — Shapiro, Gabor and Rosenberger, PLLC

(57) ABSTRACT

To provide a semiconductor device having a nonvolatile memory improved in characteristics. In the semiconductor device, a nonvolatile memory has a high-k insulating film (high dielectric constant film) between a control gate electrode portion and a memory gate electrode portion and a transistor of a peripheral circuit region has a high-k/metal configuration. The high-k insulating film arranged between the control gate electrode portion and the memory gate electrode portion relaxes an electric field intensity at the end portion (corner portion) of the memory gate electrode portion on the side of the control gate electrode portion. This results in reduction in uneven distribution of charges in a charge accumulation portion (silicon nitride film) and improvement in erase accuracy.

5 Claims, 113 Drawing Sheets

(51) Int. Cl.

| | |
|---|---|
| ***H01L 29/51*** | (2006.01) |
| ***H01L 29/423*** | (2006.01) |
| ***H01L 21/28*** | (2006.01) |
| ***H01L 29/792*** | (2006.01) |

(56) References Cited

U.S. PATENT DOCUMENTS

| | | | | |
|---|---|---|---|---|
| 8,410,543 | B2 * | 4/2013 | Yanagi | G11C 16/0466 257/315 |
| 2011/0272753 | A1 * | 11/2011 | Funayama | H01L 29/42324 257/299 |
| 2012/0299084 | A1 | 11/2012 | Saito et al. | |

FOREIGN PATENT DOCUMENTS

| | | | |
|---|---|---|---|
| JP | 2010-108976 | A | 5/2010 |
| JP | 2011-049282 | A | 3/2011 |
| JP | 2011-103332 | A | 5/2011 |
| JP | 2012-248652 | A | 12/2012 |

* cited by examiner

FIG. 10

| PULSE NUMBER | N=1 | N>1 |
| --- | --- | --- |
| Source | 0V | 0V |
| Drain | 0V | 0V |
| MG | 12V | 14V |
| CG | 0V | 0V |
| Well | 0V | 0V |

FIG. 11

| PULSE NUMBER | N=1 | N>1 |
| --- | --- | --- |
| Source | 0V | 0V |
| Drain | 0V | 0V |
| MG | 11V | 13V |
| CG | 0V | 0V |
| Well | −1V | −1V |

FIG. 12

| PULSE NUMBER | N=1 | N>1 |
|---|---|---|
| Source | 6V | 7V |
| Drain | Open | Open |
| MG | −6V | −7V |
| CG | 0V | 0V |
| Well | 0V | 0V |

FIG. 13

| PULSE NUMBER | N=1 | N>1 |
|---|---|---|
| Source | 0.3V | 0.3V |
| Drain | 4.5V | 4.9V |
| MG | 10V | 11V |
| CG | 0.9V | 0.9V |
| Well | 0V | 0V |

| PULSE NUMBER | N=1 | N>1 |
|---|---|---|
| Source | 0.3V | 0.3V |
| Drain | 4.5V | 4.9V |
| MG | 10V | 11V |
| CG | 1.5V | 1.5V |
| Well | −1V | −1V |

SEMICONDUCTOR DEVICE AND METHOD OF MANUFACTURING SAME

CROSS-REFERENCE TO RELATED APPLICATIONS

The disclosure of Japanese Patent Application No. 2013-243953 filed on Nov. 26, 2013 including the specification, drawings and abstract is incorporated herein by reference in its entirety.

BACKGROUND

The present invention relates to a semiconductor device and a method of manufacturing the semiconductor device and is suited for use in, for example, a semiconductor device having a nonvolatile memory cell and a method of manufacturing the semiconductor device.

Semiconductor devices having a memory cell region having therein, for example, a memory cell of a nonvolatile memory formed on a semiconductor substrate and a peripheral circuit region having therein a peripheral circuit comprised of, for example, a MISFET (metal insulator semiconductor field effect transistor) and formed on the semiconductor substrate have been used widely.

As the nonvolatile memory, a memory cell comprised of a split gate cell using a MONOS (metal-oxide-nitride-oxide semiconductor) film is sometimes used. This memory cell is comprised of two MISFETs, that is, a control transistor having a control gate electrode and a memory transistor having a memory gate electrode. When both a memory cell of such a nonvolatile memory and a MISFET configuring a peripheral circuit are loaded together on a semiconductor substrate, gate electrodes are formed in the respective regions.

For example, Patent Document 1 (Japanese Unexamined Patent Application Publication No. 2011-49282) discloses a method of manufacturing a semiconductor device including forming a MISFET from a high-k film and a metal gate electrode through a damascene process.

Patent Document 2 (Japanese Unexamined Patent Application Publication No. 2011-103332) and Patent Document 3 (Japanese Unexamined Patent Application Publication No. 2010-108976) disclose a semiconductor device having a nonvolatile memory and a MISFET formed in a peripheral circuit region. According to them, a high dielectric constant film is used as a gate insulating film of the MISFET.

Patent Document 4 (Japanese Unexamined Patent Application Publication No. 2010-87252) discloses a split gate transistor having a high dielectric constant film as a gate insulating film below a control gate electrode.

Patent Document 5 (Japanese Unexamined Patent Application Publication No. 2009-59927) discloses a method of manufacturing a nonvolatile semiconductor memory device including forming a memory gate electrode on the sidewall of a dummy gate and then removing the dummy gate to form a control gate electrode.

Patent Document 6 (Japanese Unexamined Patent Application Publication No. 2012-248652) discloses a split gate nonvolatile memory having a memory gate electrode made of a stacked film of a metal film and a silicon film thereon.

PATENT DOCUMENTS

[Patent Document 1] Japanese Unexamined Patent Application Publication No. 2011-49282

[Patent Document 2] Japanese Unexamined Patent Application Publication No. 2011-103332

[Patent Document 3] Japanese Unexamined Patent Application Publication No. 2010-108976

[Patent Document 4] Japanese Unexamined Patent Application Publication No. 2010-87252

[Patent Document 5] Japanese Unexamined Patent Application Publication No. 2009-59927

[Patent Document 6] Japanese Unexamined Patent Application Publication No. 2012-248652

SUMMARY

A memory cell of a nonvolatile memory or the like and an MISFET configuring a peripheral circuit are sometimes loaded on the same semiconductor substrate.

As a gate insulating film of this MISFET, for example, a high dielectric constant film, so-called high-k film, having a specific dielectric constant higher than that of a silicon nitride film is sometimes used and as a gate electrode of the MISFET, a so-called metal gate electrode is sometimes used.

A semiconductor device having both such a MISFET and a memory cell requires various investigations for finding manufacturing steps suited for it. In addition, the memory cell is sometimes desired to have a high-k film or a metal gate electrode from the standpoint of miniaturization or reduction in power consumption. It is therefore necessary to investigate the configuration of them or manufacturing steps of the device based on the characteristics of the memory cell and MISFET to be loaded together.

The other problems and novel features will be apparent from the description herein and accompanying drawings.

The outline of typical embodiments, among the embodiments disclosed herein, will next be described briefly.

A semiconductor device according to one embodiment disclosed herein has a first insulating film formed between a first gate electrode portion and a semiconductor substrate and a second insulating film formed between a second gate electrode portion and the semiconductor substrate and between the first gate electrode portion and the second gate electrode portion and having a charge accumulation portion in the film. The first insulating film is formed between the first gate electrode portion and the semiconductor substrate and between the first gate electrode portion and the second gate electrode portion and has a high dielectric constant film having a dielectric constant higher than that of a silicon nitride film. The first gate electrode portion and the first insulating film have therebetween a metal compound film.

A method of manufacturing a semiconductor device according to one embodiment disclosed herein includes: forming a first conductive film in a first region of a semiconductor substrate via a first insulating film, successively forming a second insulating film and a second conductive film on the upper surface and side surface of the first conductive film and in a second region adjacent to the first region, and etching the second insulating film and the second conductive film to leave the second conductive film in the second region via the second insulating film. The second insulating film has a high dielectric constant film having a dielectric constant higher than that of a silicon nitride film.

The semiconductor device shown in the typical embodiment disclosed herein can have improved characteristics.

The method of manufacturing a semiconductor device shown in the typical embodiment disclosed herein can provide a semiconductor device having good characteristics.

BRIEF DESCRIPTION OF THE DRAWINGS

FIG. 10 shows a first example of an erase pulse;

FIG. 11 shows a second example of an erase pulse;

FIG. 12 shows a third example of an erase pulse;

FIG. 13 shows a first example of a write pulse;

DETAILED DESCRIPTION

Figure 1:
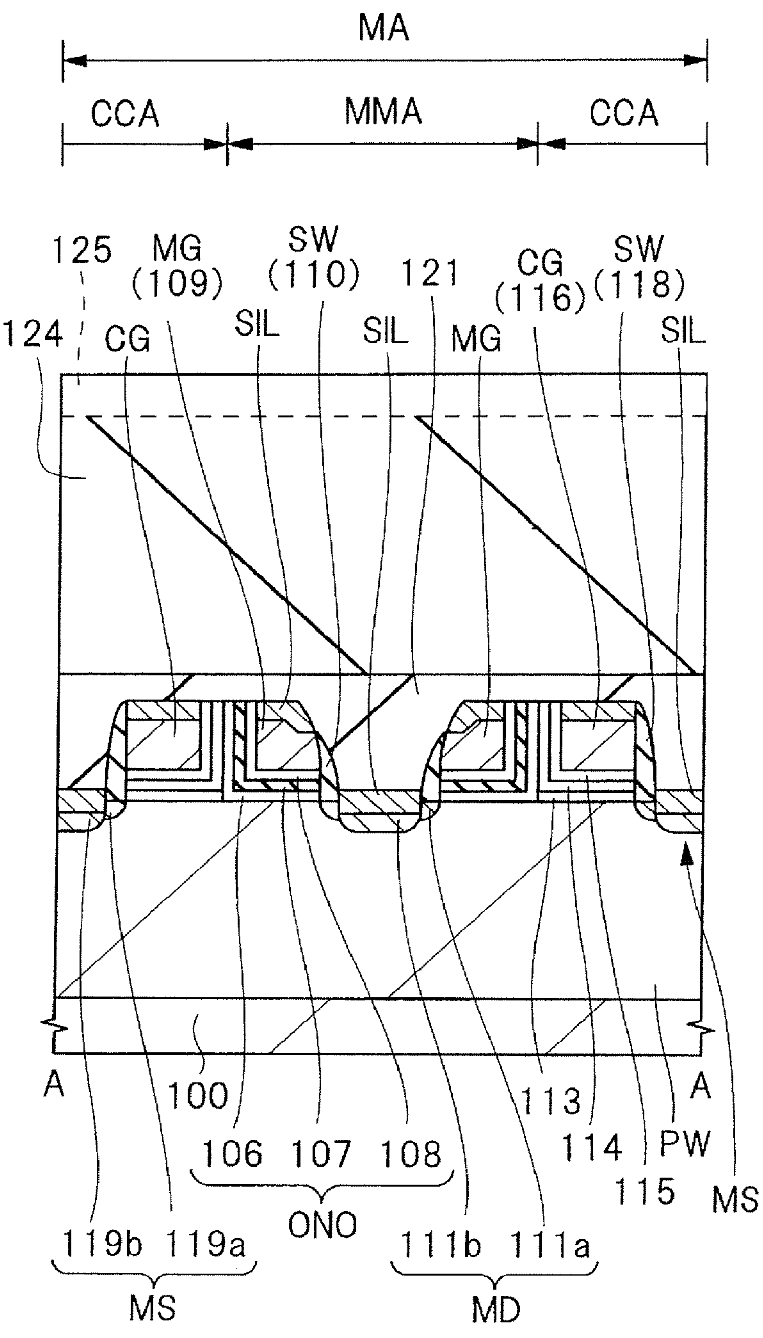
FIG. 1 is a cross-sectional view showing a semiconductor device of First Embodiment.

In the following embodiments, a description may be made after divided in a plurality of sections or embodiments if necessary for the sake of convenience. These sections or embodiments are not independent from each other unless otherwise particularly specified, but one of them may be a modification example, application example, detailed description, complementary description, or the like of a part or whole of the other one. In the following embodiments, when a reference is made to the number of elements (including the number, value, amount, range, or the like), the number is not limited to a specific number but may be more or less than the specific number, unless otherwise particularly specified or principally apparent that the number is limited to the specific number.

Further, in the following embodiments, the constituent component (including component step or the like) is not always essential unless otherwise particularly specified or principally apparent that it is essential. Similarly, in the following embodiments, when a reference is made to the shape, positional relationship, or the like of the constituent component, that substantially approximate or analogous to it is also embraced unless otherwise particularly specified or principally apparent that it is not. This also applies to the above-mentioned number (including the number, value, amount, range, or the like).

Embodiments will hereinafter be described in detail based on drawings. In all the drawings for describing the embodiments, members having the same function will be identified by the same or like reference numerals and overlapping descriptions will be omitted. When there is a plurality of members (sites) similar to each other, a symbol may be added to the reference numeral to show an individual or specific site. In the following embodiments, a description on the same or similar portion is not repeated in principle unless otherwise particularly necessary.

In the drawings to be used in the following embodiments, even a cross-sectional view is sometimes not hatched to facilitate understanding of it or even a plan view may be hatched to facilitate understanding of it.

In the cross-sectional view and plan view, the dimensions of each site do not correspond to those of an actual device. To facilitate understanding of them, the dimensions of a particular site may be enlarged relatively. Even when a cross-sectional view and a plan view correspond to each other, the dimensions of a particular site may be enlarged relatively to facilitate understanding of the drawing.

First Embodiment

The structure of a semiconductor device of the present embodiment will hereinafter be described referring to some drawings.

[Description on Structure]

The semiconductor device of the present embodiment has a memory cell (memory transistor, control transistor) formed in a memory cell region MA and a peripheral transistor formed in a peripheral circuit region PA. The transistor described herein is also called "MISFET" (metal insulator semiconductor field effect transistor).

(Description on the Structure of a Memory Cell)

Figure 2:
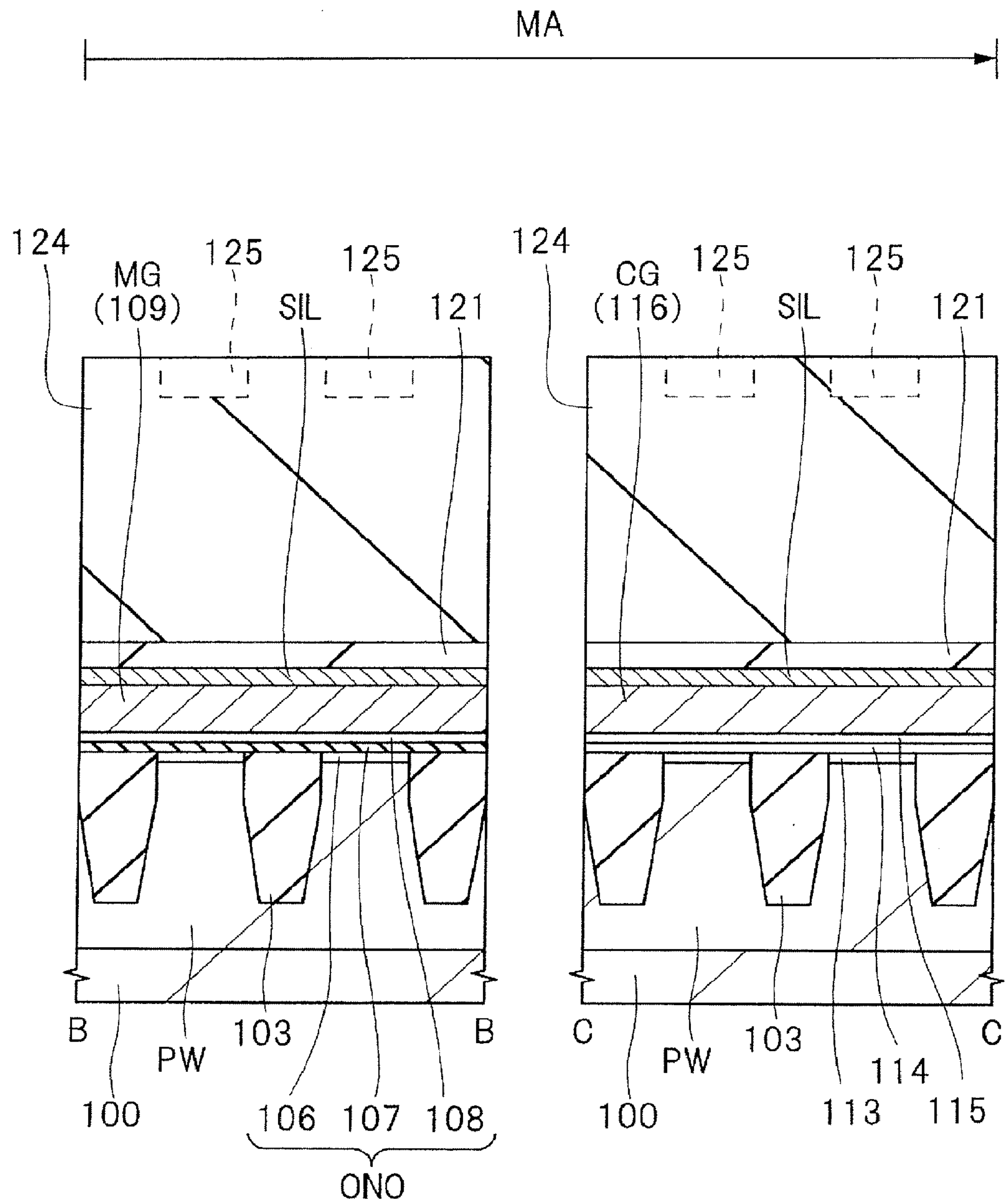
FIG. 2 is a cross-sectional view showing the semiconductor device of First Embodiment.
Figure 3:
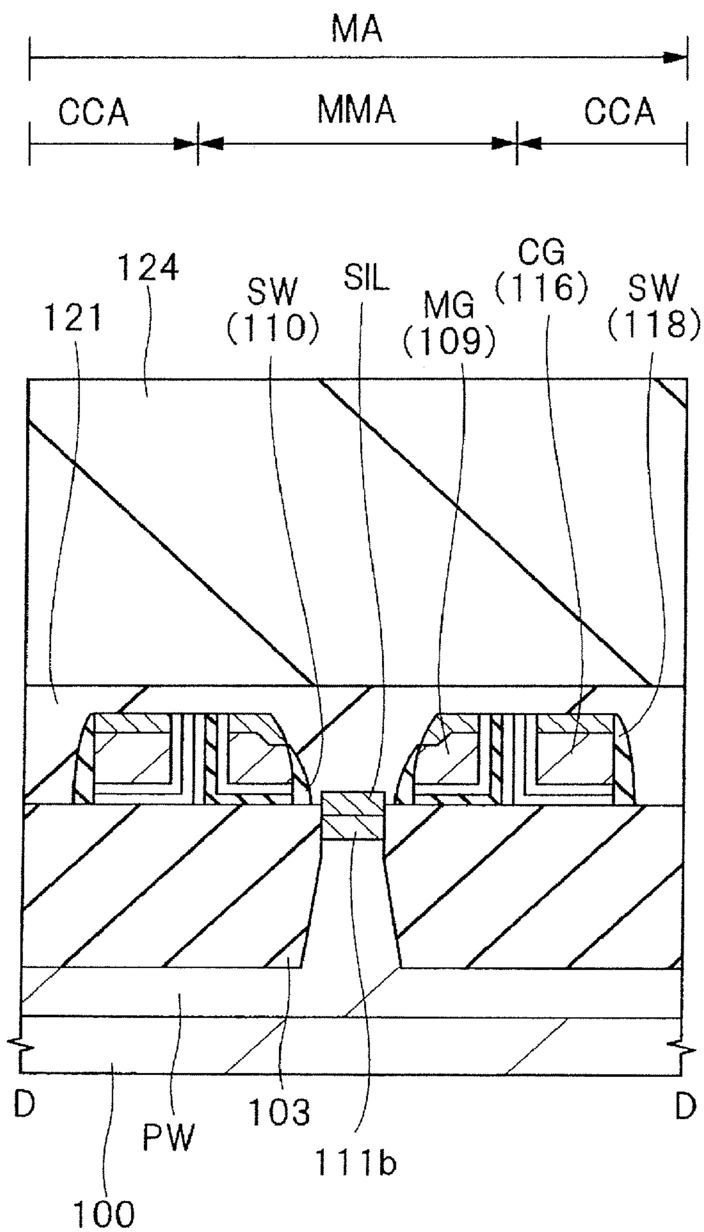
FIG. 3 is a cross-sectional view showing the semiconductor device of First Embodiment.
Figure 4:
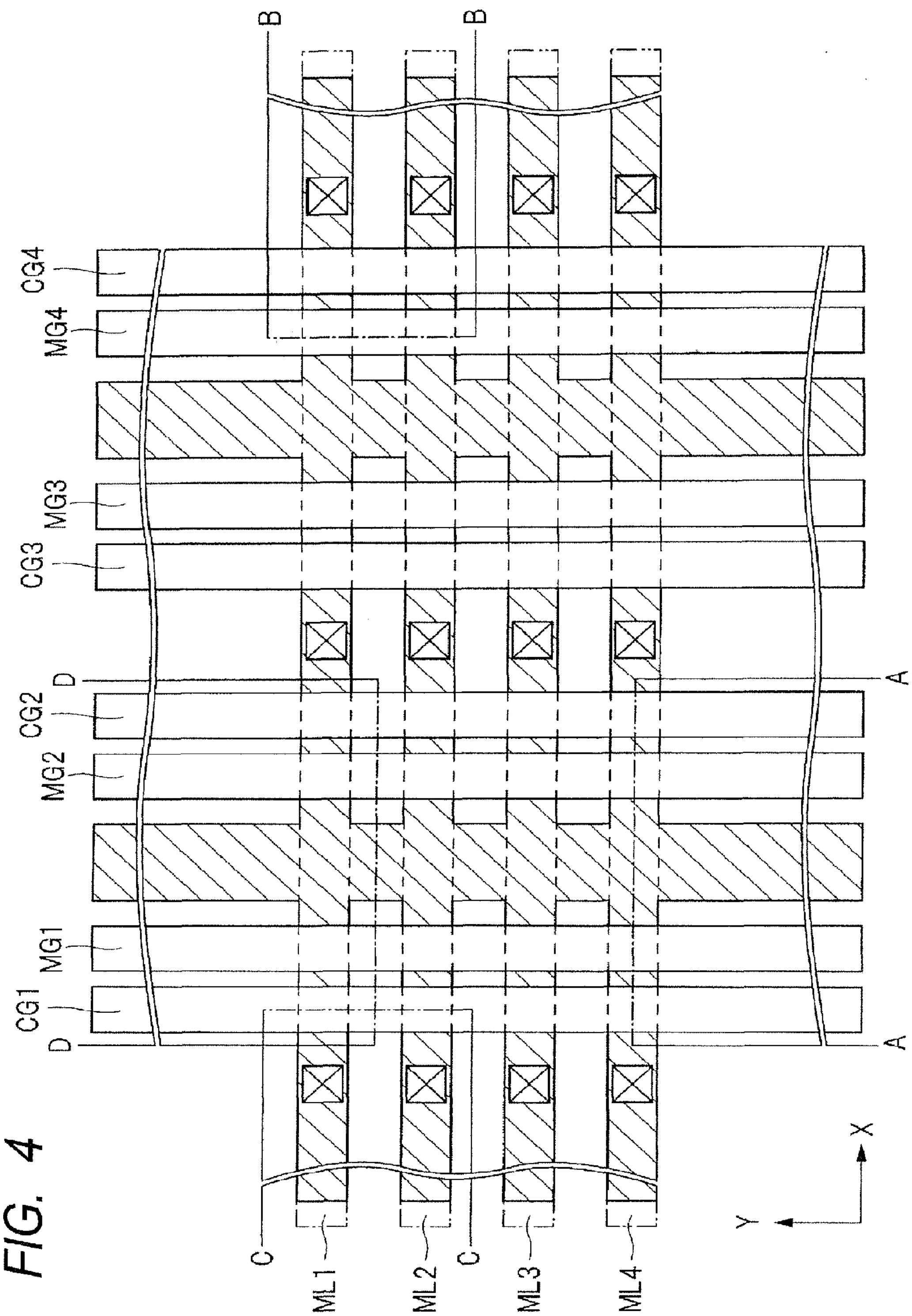
FIG. 4 is a plan view showing a memory array of the semiconductor device of First Embodiment.
Figure 5:
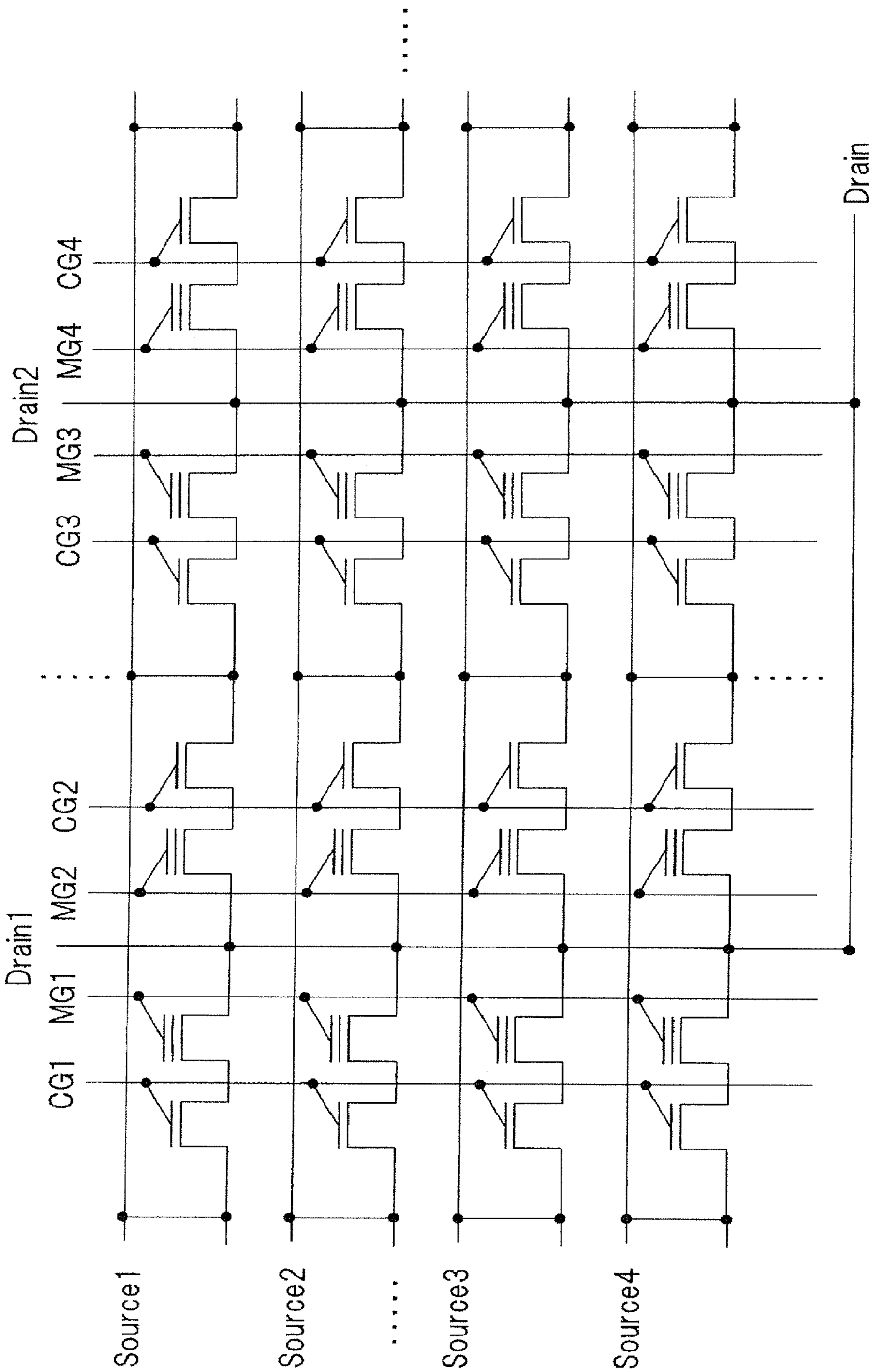
FIG. 5 is a circuit diagram showing the memory array of the semiconductor device of First Embodiment.
Figure 6:
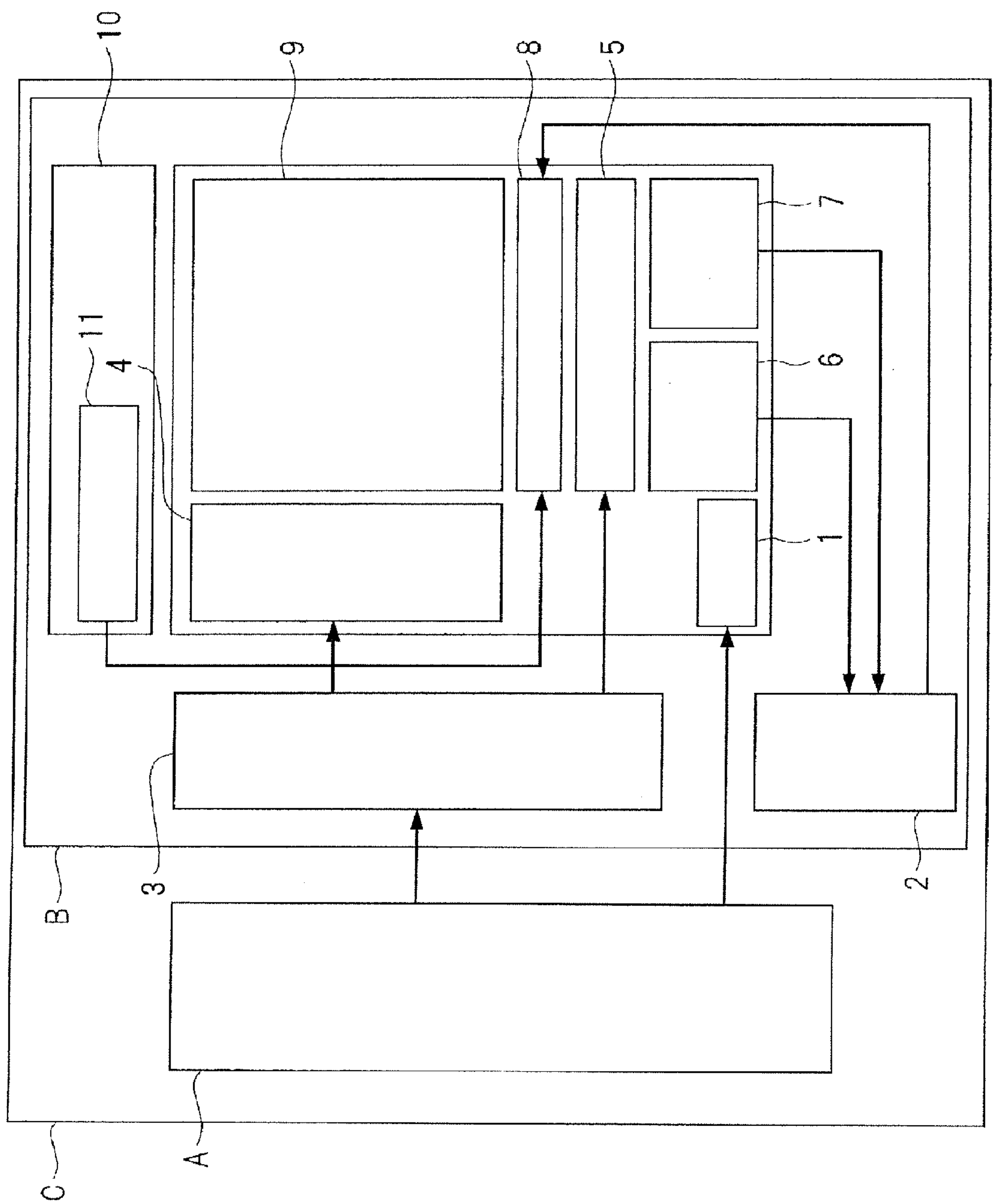
FIG. 6 is a block diagram showing a configuration example of the semiconductor device of First Embodiment.

FIGS. 1 to 3 are cross-sectional views showing the semiconductor device of the present embodiment. FIG. 4 is a plan view showing a memory array of the semiconductor device of the present embodiment. For example, FIG. 1 corresponds to the A-A cross-section of FIG. 4; FIG. 2 corresponds to the B-B cross-section and the C-C cross-section of FIG. 4; and FIG. 3 corresponds to the D-D cross-section of FIG. 4. FIG. 5 is a circuit diagram showing the memory array of the semiconductor device of the present embodiment. FIG. 6 is a block diagram showing a configuration example of the semiconductor device of the present embodiment.

As shown in FIGS. 1 to 3, the memory cell (element) is comprised of a control transistor having a control gate electrode portion CG and a memory transistor having a memory gate electrode portion MG.

More specifically, the memory cell has a control gale electrode portion CG arranged over a semiconductor substrate 100 (p well PW) and a memory gate electrode portion MG arranged over the semiconductor substrate 100 (p well PW) and adjacent to the control gate electrode portion CG.

For example, the control gate electrode portion CG and the memory gate electrode portion MG are each made of a silicon film. The silicon film has thereover a metal silicide film SIL.

The memory cell further has an insulating film and a metal compound film arranged between the control gate electrode portion CG and the semiconductor substrate 100 (p well PW). The insulating film has a high dielectric constant film having a dielectric constant higher than that of a silicon nitride film. As FIG. 1 shows, the memory cell has a silicon oxide film 113 and a high-k insulating film (high dielectric constant film) 114 as the insulating-film. Further, the high-k insulating film 114 and the control gate electrode portion CG have therebetween a titanium nitride film 115 as the metal compound film (barrier film).

The high-k insulating film (high dielectric constant film) 114 lies between the control gate electrode portion CC and the semiconductor substrate 100 (p well PW) and between the control gate electrode portion CG and the memory gate electrode portion MG.

The titanium nitride film 115 (metal compound film) lies between the control gate electrode portion CG and the semiconductor substrate 100 (p well PW) and between the control gate electrode portion CG and the memory gate electrode portion MG.

The memory cell further has an insulating film ONO (106, 107, 108) arranged between the memory gate electrode portion MG and the semiconductor substrate 100 (p well PW). The insulating film ONO is comprised of, for example, a silicon oxide film 106, a silicon nitride film 107 thereon, and a silicon oxynitride film 108 thereon. The silicon nitride film 107 will serve as a charge accumulation portion.

The insulating film ONO (106, 107, 108) are provided between the memory gate electrode portion MG and the semiconductor substrate 100 (p well PW) and between the control gate electrode portion CG and the memory gate electrode portion MG.

This means that the control gate electrode portion CG and the memory gate electrode portion MG have therebetween the insulating film ONO (106, 107, 108), the high-k insulating film (high dielectric constant film) 114, and the metal compound film (titanium nitride film 115) which are arranged in order of mention from the side of the memory gate electrode portion MG.

The memory cell further has a source region MS and a drain region MD formed in the p well PW of the semiconductor substrate 100. The memory gate electrode portion MG and the control gate electrode portion CG has, on the sidewall portion of the synthesis pattern thereof, a sidewall film (sidewall insulating film, sidewall spacer) SW made of an insulating film.

The source region MS is comprised of an $n^+$ type semiconductor region 119*b* and an $n^-$ type semiconductor region 119*a*. The $n^-$ type semiconductor region 119*a* is a region formed in self alignment with the sidewall of the control gate electrode portion CG. The $n^+$ type semiconductor region 119*b* is a region formed in self alignment with the side surface of the sidewall film SW on the side of the control gate electrode portion CG and has a junction depth and an impurity concentration greater than those of the $n^-$ type semiconductor region 119*a*. Such a source electrode (or drain electrode) comprised of a lightly doped semiconductor region and a heavily doped semiconductor region is called a source electrode (or drain electrode) with an LDD (lightly doped drain) structure.

The drain region MD is comprised of an $n^+$ type semiconductor region 111*b* and an $n^-$ type semiconductor region 111*a*. The $n^-$ type semiconductor region 111*a* is a region formed in self alignment with the sidewall of the memory gate electrode portion MG. The $n^+$ type semiconductor region 111*b* is a region formed in self alignment with the side surface of the sidewall film SW on the side of the memory gate electrode portion MG and has a junction depth and an impurity concentration greater than those of the $n^-$ type semiconductor region 111*a*.

In the present specification, the source region MS and the drain region MD are defined based on the magnitude of voltage to be applied thereto. A semiconductor region to which a high voltage is applied upon write operation which will be described later will hereinafter be called "drain region MD" and a semiconductor region to which a low voltage is applied upon write operation will hereinafter be called "source region MS" consistently.

The control gate electrode portion CG, the memory gate electrode portion MG, the source region MS ($n^+$ type semiconductor region 119*b*), and the drain region MD ($n^+$ type semiconductor region 111*b*) have thereover a metal silicide film SIL.

The memory cell has thereon a silicon oxide film 121 as an interlayer insulating film and this silicon oxide film 121 has thereon a silicon oxide film 124 as an interlayer insulating film. This silicon oxide film 124 has thereon a wiring 125 and the like.

Two memory cells shown in FIG. 1 are arranged substantially symmetrically with the drain region MD therebetween. As will be described later, a plurality of memory cells is arranged in the memory cell region MA. For example, a memory cell on the left side in the memory cell region MA shown in FIG. 1 has, on a further left side thereof, another memory cell (not illustrated) having the source region MS in common.

A region between the control gate electrode portions arranged with this source region therebetween will hereinafter be called "region CCA". A region between memory gate electrode portions MG arranged with the drain region MD therebetween will hereinafter be called "region MMA". In FIG. 1, the region MMA has, on both sides thereof, the regions CCA. This region CCA includes the formation regions of the high-k insulating film (high dielectric constant film) 114 and the metal compound film (titanium nitride film 115) arranged along the sidewall of the control gate electrode portion CG. The region MMA, on the other hand, includes the formation region of the insulating film ONO (106, 107, 108) arranged along the sidewall of the memory gate electrode portion MG.

As described above, memory cells are arranged in a horizontal direction (gate length direction) in FIG. 1 so that the drain region MD and the source region, each shared by two adjacent memory cells, are arranged alternately and they configure a memory cell array. In addition, there is a plurality of memory cell arrays arranged in a direction (gate width direction) perpendicular to the paper plane of FIG. 1. A plurality of memory cells therefore lie in array form. The memory cell array will hereinafter be described referring to FIGS. 4 to 6.

(Memory Array)

As shown in FIG. 4, the control gate electrode portions CG (CG1, CG2, CG3, CC4) and the memory gate electrode portions MG (MG1, MG2, MG3, MG4) of the memory cell extend in direction Y (direction crossing with the A-A cross-sectional portion, a longitudinal direction of the paper plane).

A plurality of active regions (hatched portions) is provided in a line shape extending in direction X and lines extending in direction X are coupled to each other by a coupling portion extending in direction Y. These active regions are defined by element isolation regions 103 and are exposed regions of the p well PW.

The control gate electrode portions CG and also the memory gate electrode portions MG are symmetrical about the above-mentioned coupling portion. The active regions on the side of the control gate electrode portions CG (CG1, CG2, CG3, CG4) have thereover contact portions. Wirings (ML1, ML2, ML3, ML4) extend in direction X so as to couple the contact portions arranged in direction X. The coupling portions have therebetween a drain region MD. This region (between the coupling portions) will be a drain line (Drain 1, Drain 2) which will be described later. The contact portions have therebelow source regions MS. The wirings (ML1, ML2, ML3, ML4) will be source lines (Source 1, Source 2, Source 3, Source 4) which will be described later.

As shown in FIG. 5, the memory cells (memory transistors, control transistors) are arranged in array form at intersections between Drain 1 and Drain 2 and Source 1, Source 2, Source 3, and Source 4.

As shown in FIG. 6, the memory cell array 9 is in a memory portion B. For example, this memory portion B and a logic portion A configure a semiconductor device C of the present embodiment.

The memory portion B is comprised of, for example, a control circuit 1, an input/output circuit 2, an address buffer 3, a row decoder 4, a column decoder 5, a verify sense amplifier circuit 6, a high-speed read sense amplifier circuit 7, a write circuit 8, a memory cell array 9, and a power supply circuit 10. The control circuit 1 controls a control signal temporarily stored therein after inputted from the logic portion A. The control circuit 1 also controls the potential of the control gate electrode portion CG and the memory gate electrode portion MG of the memory cell in the memory cell array 9. Various data such as data to be read from the memory array 9 or written to the memory array 9 or program data is inputted/outputted to and from the input/output circuit 2. The address buffer 3 temporarily stores therein an address inputted from the logic portion A. The row decoder 4 and the column decoder 5 are each coupled to the address buffer 3. The row decoder 4 decodes based on a row address outputted from the address buffer 3 and the column decoder 5 decodes based on a column address outputted from the address buffer 3. The verify sense amplifier circuit 6 is a sense amplifier for a read/write verify operation. The high-speed read sense amplifier circuit 7 is a read sense amplifier used upon data reading. The write circuit 8 latches write data inputted via the input/output circuit 2 and controls data writing. The power supply circuit 10 is comprised of a voltage generation circuit for generating various voltages to be used upon data writing, data erasing, data verifying or the like, a current trimming circuit 11 for generating and supplying an arbitrary voltage value to the write circuit, and the like.

The configurations shown in FIGS. 4 to 6 are only examples and the configuration of the semiconductor device of the present embodiment is not limited to them.

(Description on Peripheral Transistor)

Figure 7:
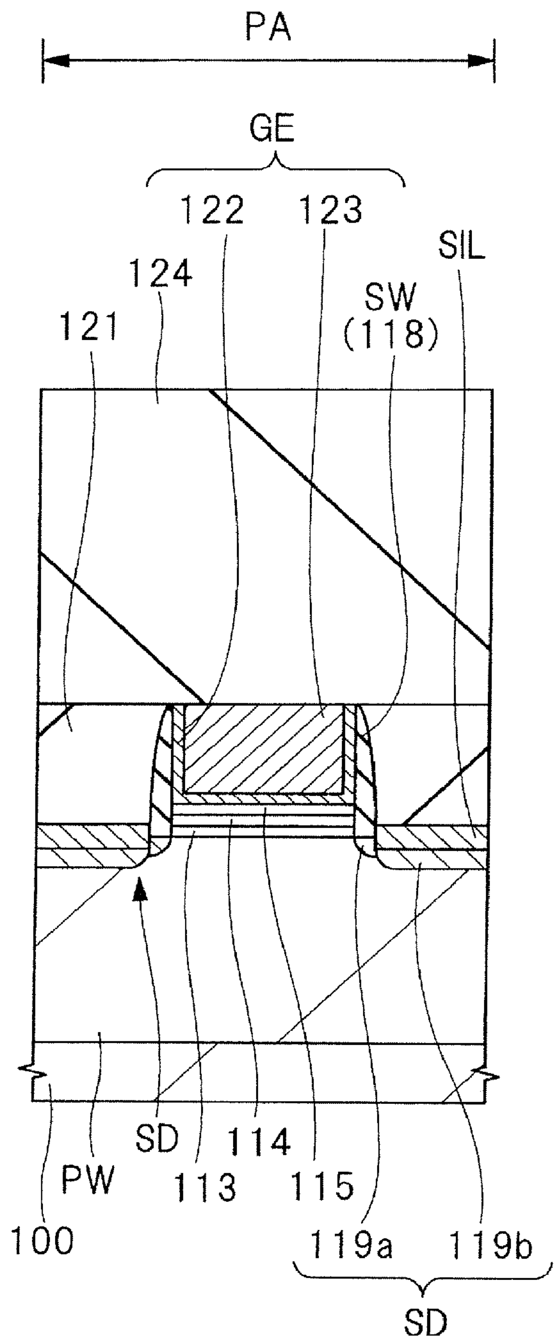
FIG. 7 is a cross-sectional view showing the semiconductor device of First Embodiment.

Various circuits provided around the memory cell array 9 are comprised of an element such as peripheral transistor. FIG. 7 is a cross-sectional view showing the semiconductor device of the present embodiment.

As shown in FIG. 7, the peripheral transistor has a gate electrode portion GE arranged over the semiconductor substrate 100 (p well PW) and a source/drain region SD provided in the p well PW on both sides of the gate electrode portion GE. The gate electrode portion GE is comprised of a metal electrode film 122 and a metal film 123 thereon. The peripheral transistor further has an insulating film and a metal compound film arranged between the gate electrode portion GE and the semiconductor substrate 100 (p well PW). The insulating film has a high dielectric constant film having a dielectric constant higher than that of a silicon nitride film. As shown in FIG. 7, the peripheral transistor has, as the insulating film, a silicon oxide film 113 and a high-k insulating film (high dielectric constant film) 114 and, as the metal compound film, a titanium nitride film 115 provided between the high-k insulating film 114 and the gate electrode portion GE.

The gate electrode portion GE has, on the sidewall portion thereof, a sidewall film SW made of an insulating film. The source/drain region SD is comprised of an $n^+$ type semiconductor region 119*b* and an $n^-$ type semiconductor region 119*a*. The $n^-$ type semiconductor region 119*a* is formed in self alignment with the sidewall of the gate electrode portion GE. The $n^+$ type semiconductor region 119*b* is formed in self alignment with the side surface of the sidewall film SW and has a junction depth and an impurity concentration greater than those of the $n^-$ type semiconductor region 119*a*. This source/drain region SD ($n^+$ type semiconductor region 119*b*) has thereon a metal silicide film SIL.

The gate electrode portion GE of the peripheral transistor has, on both sides thereof, a silicon oxide film 121 as an interlayer insulating film and this silicon oxide film 121 has thereon a silicon oxide film 124 as an interlayer insulating film.

(Operation)

Next, one example of basic operations of the memory cell will be described. Three operations, that is, (1) read operation, (2) erase operation, and (3) write operation will be described as the operations of the memory cell. There are however various definitions of these operations and in particular, the erase operation and the write operation are sometimes defined conversely.

(1) Read Operation

For example, the channel below the control gate electrode portion CG is turned ON by applying a positive potential of about 1.2 V to the source region MS on the side of the control gate electrode portion CG and applying a positive potential of about 1.2 V to the control gate electrode portion CG. By setting the memory gate electrode portion MG at a predetermined potential (meaning a middle potential between a threshold voltage in write state and a threshold voltage in erase state), retained charge data can be read as a current. By setting the middle potential between the threshold voltage in write state and the threshold voltage in erase state at 0 V, boosting of a voltage to be applied to the memory gate electrode portion MG in a power supply circuit becomes unnecessary, making it possible to achieve high-speed reading.

(2) Erase Operation

For example, a voltage of 12 V is applied to the memory gate electrode portion MG, a voltage of 0 V is applied to the control gate electrode portion CG, a voltage of 0 V is applied to the drain region MD on the side of the memory gate electrode portion MG, and a voltage of 0 V is applied to the source region MS on the side of the control gate electrode portion CG. Holes are injected into the silicon nitride film 107 (charge accumulation portion) from the side of the memory gate electrode portion MG through an EN tunneling phenomenon (FN tunneling system) to achieve erasure (FN tunneling system). However, the source region MS on the side of the control gate electrode portion CG may be electrically opened or a potential of about 1 V may be applied to the control gate electrode portion CG.

Figure 8:
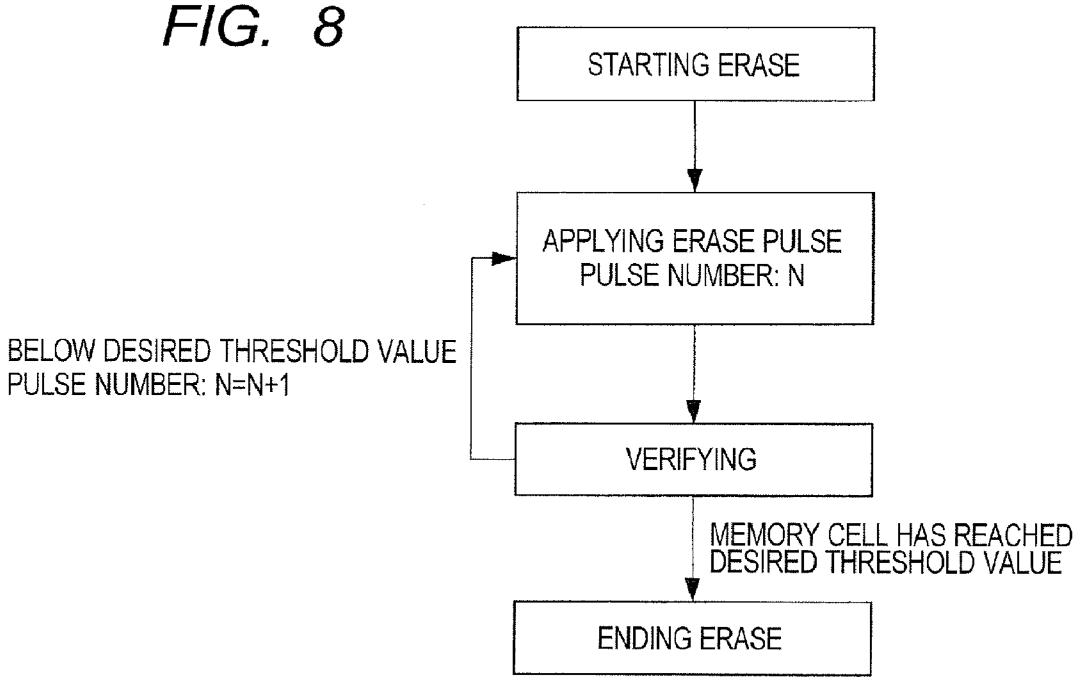
FIG. 8 is a chart showing a flow of an erase operation from the start to the end thereof.

FIG. 8 is a chart showing a flow of an erase operation from the start to the end thereof. As shown in FIG. 8, an erase pulse is applied and holes are injected into the silicon nitride film 107 to achieve erasure. Then, a verify operation is performed to find whether the memory cell has reached a desired threshold voltage or not. When the memory cell does not reach the desired threshold voltage, a sequence of applying an erase pulse is repeated. When it has reached the desired threshold voltage, the erase operation is ended.

When the verify operation is performed after the first erase operation (N=1) and then, the erase operation is performed further (N>1), erase conditions need not necessarily be the same as those for the first erase conditions. FIG. 10 shows an example of the erase pulse. As shown in FIG. 10, the first erase operation (N=1) is performed by setting the memory gate electrode portion MG at 12 V, the control gate electrode portion CG at 0 V, the drain region MD (Drain) at 0 V, the source region MS (Source) at 0 V, and the p well PW (Well) at 0 V. The second or subsequent erase operation (N>1) is then performed by setting the memory gate electrode portion MG at 14 V, the control gate electrode portion CG at 0 V, the drain region MD (Drain) at 0 V, the source region MS (Source) at 0 V, and the p well PW (Well) at 0 V.

A second example of an erase pulse is shown in FIG. 11. As shown in FIG. 11, a negative potential may be applied to the p well PW (Well). As shown in FIG. 11, the first erase operation (N=1) is performed by setting the memory gate electrode portion MG at 11 V, the control gate electrode portion CG at 0 V, the drain region MD (Drain) at 0 V, the source region MS (Source) at 0 V, and the p well PW (Well) at −1 V. The second or subsequent erase operation (N>1) is then performed by setting the memory gate electrode portion MG at 13 V, the control gate electrode portion CG at 0 V, the drain region MD (Drain) at 0 V, the source region MS (Source) at 0 V, and the p well PW (Well) at −1 V. In this case, a potential difference between the memory gate electrode portion MG and the p well PW (Well) becomes greater than a potential difference between the memory gate electrode portion MG and the control gate electrode portion CG. This facilitates injection of holes into the silicon nitride film 107 below the memory gate electrode portion MG. As a result, electrons in the silicon nitride film 107 can be erased efficiently.

The erase operation may be achieved by generating hot holes on the side of the substrate (Well) through band-band tunneling and injecting them into the silicon nitride film 107 (BTBT system). A third example of an erase pulse is shown in FIG. 12. As shown in FIG. 12, the first erase operation (N=1) is performed by setting the memory gate electrode portion MG at −6 V, the control gate electrode portion CG at 0 V, the drain region MD (Drain) in an open state, the source region MS (Source) at 6 V, and the p well PW (Well) at 0 V. The second or subsequent erase operation (N>1) is then performed by setting the memory gate electrode portion MG at −7 V, the control gate electrode portion CO at 0 V, the drain region MD (Drain) in an open state, the source region MS (Source) at 7 V, and the p well PW (Well) at 0 V. In this case, the threshold voltage of the memory cell can be set lower, making it possible to increase a channel current and in addition, speed up the erase operation of the memory cell.

(3) Write Operation

For example, a voltage of 10.5 V is applied to the memory gate electrode portion MG, a voltage of 0.9 V is applied to the control gate electrode portion CG, a voltage of 4.6 V is applied to the drain region MD on the side of the memory gate electrode portion MG, and a potential lower than that applied to the drain region, for example, 0.3 V is applied to the source region MS on the side of the control gate electrode portion CG. As a result, concentrated injection of electrons is performed into an end portion of the memory gate electrode portion MG on the side of the control gate electrode portion CG. This injection system is called an SSI (source side hot electron) injection system.

Figure 9:
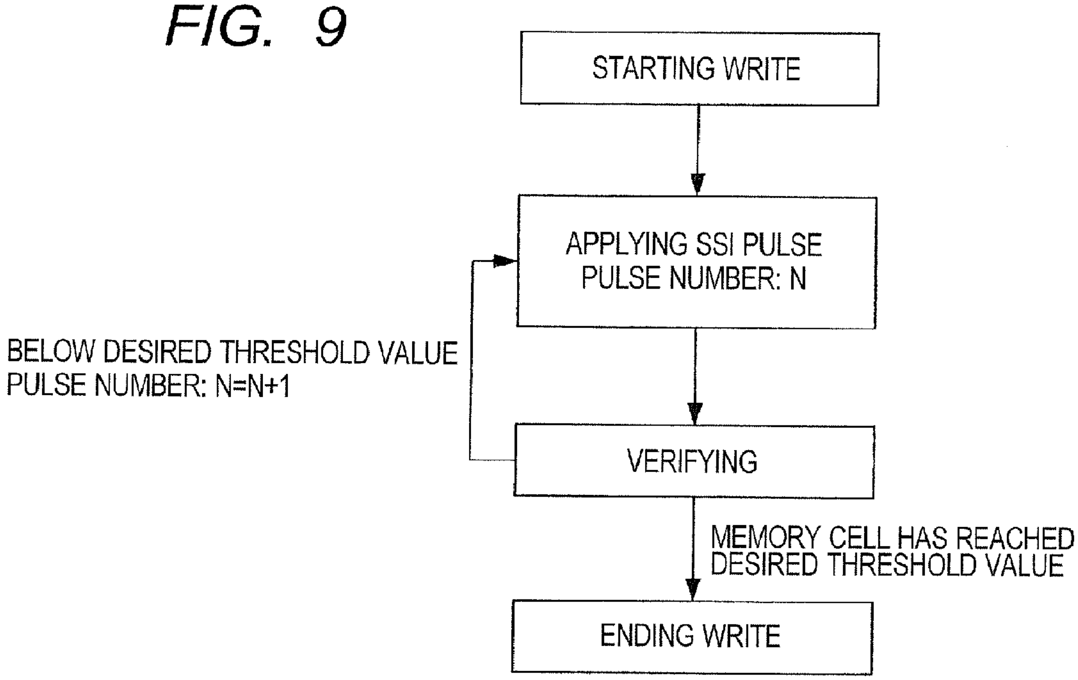
FIG. 9 is a chart showing a flow of a write operation from the start to the end thereof.

FIG. 9 is a chart showing a flow of a write operation from the start to the end thereof. As shown in FIG. 9, a write operation is performed by applying an SSI pulse to inject electrons into the silicon nitride film 107. Then, a verify operation is performed to verify whether the memory cell has reached a desired threshold voltage or not. When the memory cell has not reached the desired threshold voltage, a sequence of applying an SSI pulse is repeated. When the memory cell has reached the desired threshold voltage, the write operation is ended.

When the verify operation is performed after the first write operation (N=1) and then a write operation is performed further (N>1), write conditions need not necessarily be the same as those for the first write conditions. FIG. 13 shows a first example of a write pulse. As shown in FIG. 13, the first write operation (N=1) is performed by setting the memory gate electrode portion MG at 10 V, the control gate electrode portion CG at 0.9 V, the drain region MD (Drain) at 4.5 V, the source region MS (Source) at 0.3 V, and the p well PW (Well) at 0 V. The second or subsequent write operation (N>1) is then performed by setting the memory gate electrode portion MG at 11 V, the control gate electrode portion CG at 0.9 V, the drain region MD (Drain) at 4.9 V, the source region MS (Source) at 0.3 V, and the p well PW (Well) at 0 V.

Figures 14, 15:
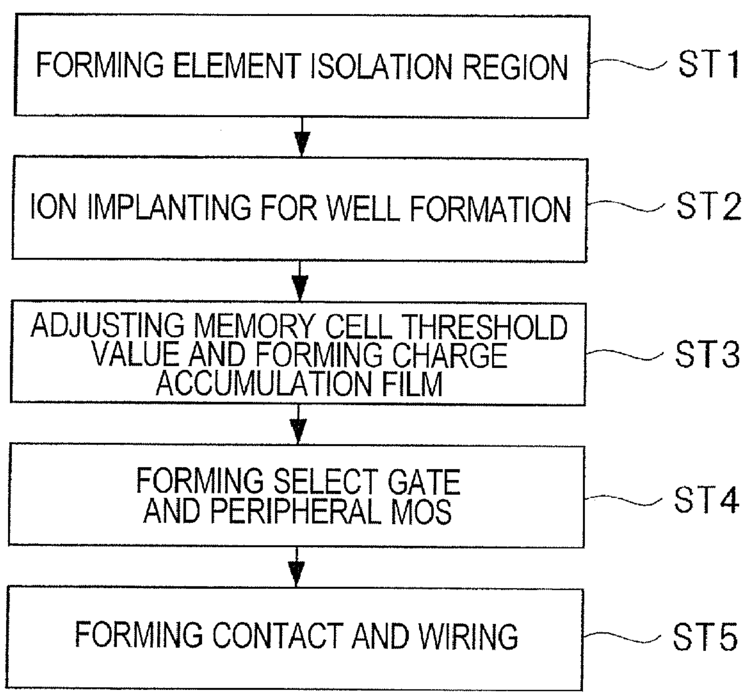
FIG. 14 shows a second example of a write pulse.
FIG. 15 is a flow chart showing a manufacturing step of the semiconductor device of First Embodiment.

A second example of a write pulse is shown in FIG. 14. As shown in FIG. 14, a negative potential may be applied to the p well PW (Well). As shown in FIG. 14, the first erase operation (N=1) is performed by setting the memory gate electrode portion MG at 10 V, the control gate electrode portion CG at 1.5 V, the drain region MD (Drain) at 4.5 V, the source region MS (Source) at 0.3 V, and the p well PW (Well) at −1 V. The second or subsequent write operation is (N>1) then performed by setting the memory gate electrode portion MG at 11 V, the control gate electrode portion CG at 1.5 V, the drain region MD (Drain) at 4.9 V, the source region MS (Source) at 0.3 V, and the p well PW (Well) at −1 V. In this case, a potential difference between the drain region MD and the p well PW (Well) or a potential difference between the memory gate electrode portion MG and the p well PW (Well) can be made greater so that high-speed write operation can be achieved.

In the present embodiment, since the control gate electrode portion CG and the memory gate electrode portion MG have therebetween the high-k insulating film (high dielectric constant film) 114, an electric field intensity at the end portion (corner portion) of the memory gate electrode portion MG on the side of the control gate electrode portion CG is relaxed upon erasing. This makes it possible to reduce uneven distribution of charges in the charge accumulation portion (silicon nitride film 107) and thereby improve the erase accuracy.

In particular, an electric field becomes larger at the end portion (corner portion) of the memory gate electrode portion MG on the side of the control gate electrode portion CG when erasing is performed through the above-mentioned FN tunnel system compared with erasing through the BTBT system. Concentrated injection of many holes occurs at this end portion. As a result, deterioration in erase accuracy may presumably occur due to variation in the distribution of charges (holes, electrons) in the charge accumulation portion (silicon nitride film 107).

In the present embodiment, on the other hand, the control gate electrode portion CG and the memory gate electrode portion MG have therebetween the high-k insulating film (high dielectric constant film) 114 so that an electric field intensity at the end portion (corner portion) of the memory gate electrode portion MG on the side of the control gate electrode portion CG is relaxed upon erase operation, resulting in improvement in erase accuracy.

Further, in the present embodiment, the control gate electrode portion CG and the memory gate electrode portion MG have therebetween the insulating film ONO (106, 107, 108), the high-k insulating film 114, and the metal compound film (titanium nitride film 115) are arranged successively from the side of the memory gate electrode portion MG so that an electric field intensity at the end portion (corner portion) of the memory gate electrode portion MG on the side of the control gate electrode is relaxed upon erasing. This leads to improvement in erase accuracy.

In the present embodiment, an n-MOS type memory cell has been described in detail, but a p-MOS type memory cell, if having the configuration of the present embodiment, can produce an advantage similar to that of the n-MOS type memory cell. Also as the peripheral transistor, an n-MOS type transistor is shown as an example, but a p-MOS type transistor may be used as the peripheral transistor or both an n-MOS type transistor and a p-MOS type transistor may be formed in the peripheral circuit region PA.

[Description on Manufacturing Method]

Next, referring to FIGS. 15 to 49, a method of manufacturing the semiconductor device of the present embodiment will be described. FIG. 15 is a flow chart showing manufacturing steps of the semiconductor device of the present embodiment and FIGS. 16 to 49 are cross-sectional views showing the manufacturing steps of the semiconductor device of the present embodiment.

A step of forming a memory cell in the memory cell region MA and a peripheral transistor in the peripheral circuit region PA will next be described referring to these drawings.

As shown in FIG. 15, the manufacturing flow of the semiconductor device includes a step of forming an element isolation region (ST1), a step of forming a well (ST2), a step of forming a memory gate electrode portion and a charge accumulation film (ST3), a step of forming a control gate electrode portion and a peripheral transistor (ST4), and a step of forming a contact (plug) and a wiring (ST5). These steps will hereinafter be described specifically.

Figure 16:
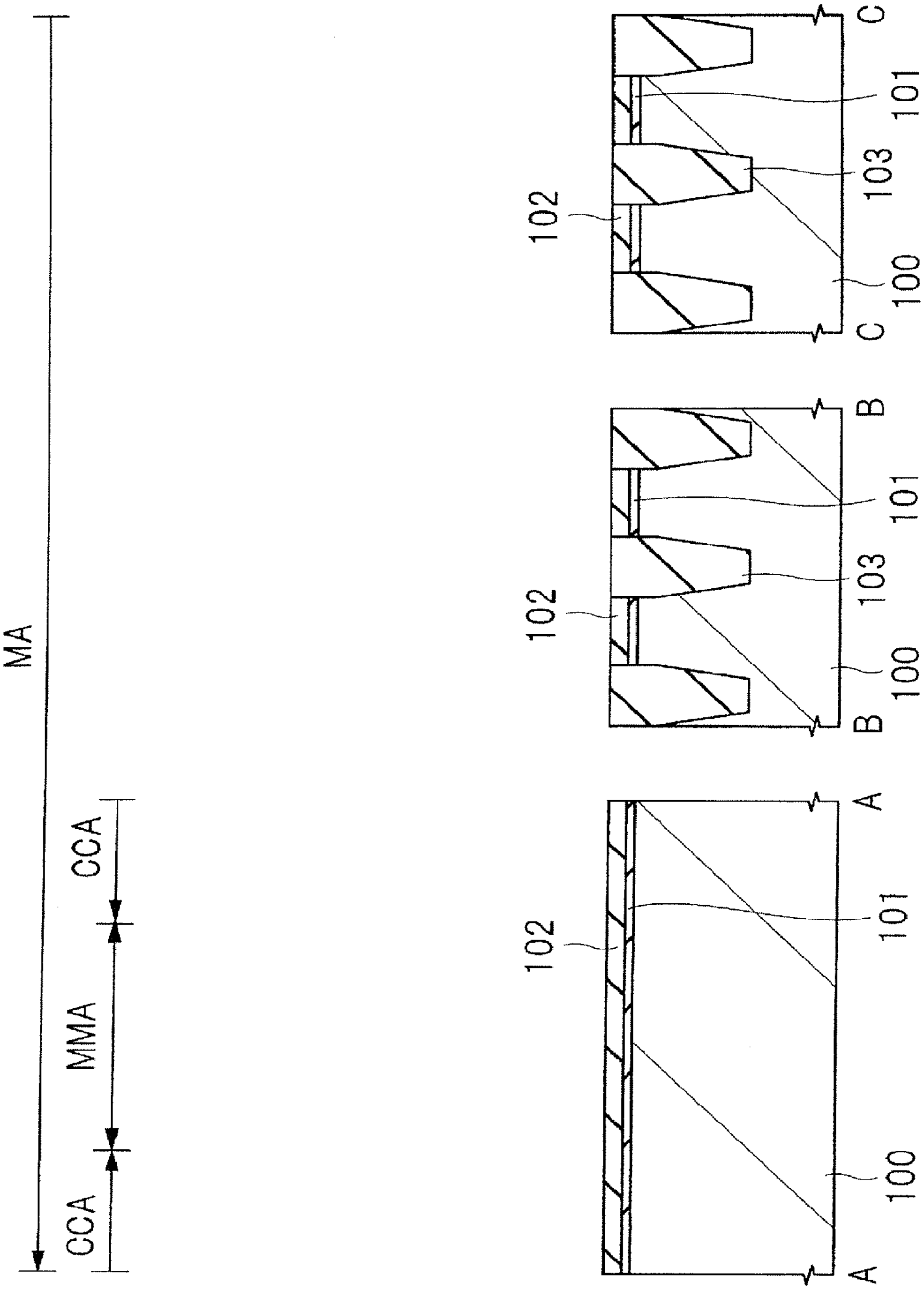
FIG. 16 is a cross-sectional view showing a manufacturing step of the semiconductor device of First Embodiment.
Figure 17:
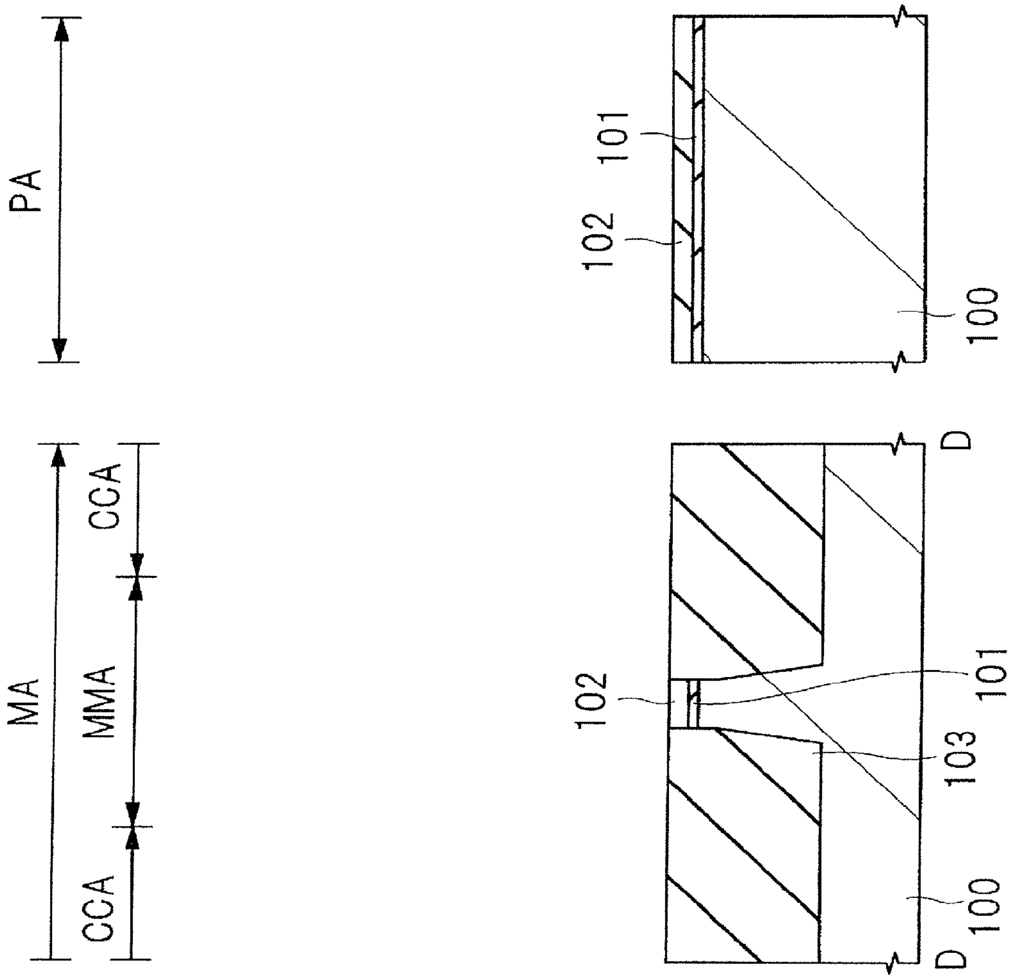
FIG. 17 is a cross-sectional view showing a manufacturing step of the semiconductor device of First Embodiment.

First, as shown in FIGS. 16 and 17, an element isolation region 103 is formed in the main surface of a semiconductor substrate 100. Described specifically, as the semiconductor substrate 100, a semiconductor substrate, for example, having a specific resistance of from about 1 to 10 Gcm and made of p type single crystal silicon is provided first. Next, the semiconductor substrate 100 is thermally oxidized to form a silicon oxide film 101 of about 10 nm thick. Then, a silicon nitride film 102 of about 50 nm thick is deposited on the silicon oxide film 101 by CVD (chemical vapor deposition) or the like. Next, the silicon oxide film 101, the silicon nitride film 102, and the semiconductor substrate 100 are etched using photolithography and dry etching to form an element isolation trench of about 150 nm deep. A silicon oxide film is deposited on the silicon nitride film 102 and also in the element isolation trench by CVD or the like, followed by removal of the silicon oxide film outside the element isolation trench by CMP (chemical mechanical polishing) or the like to fill the element isolation trench with the insulating film such as silicon oxide film. Such an element isolation process is called STI (shallow trench isolation).

Figure 18:
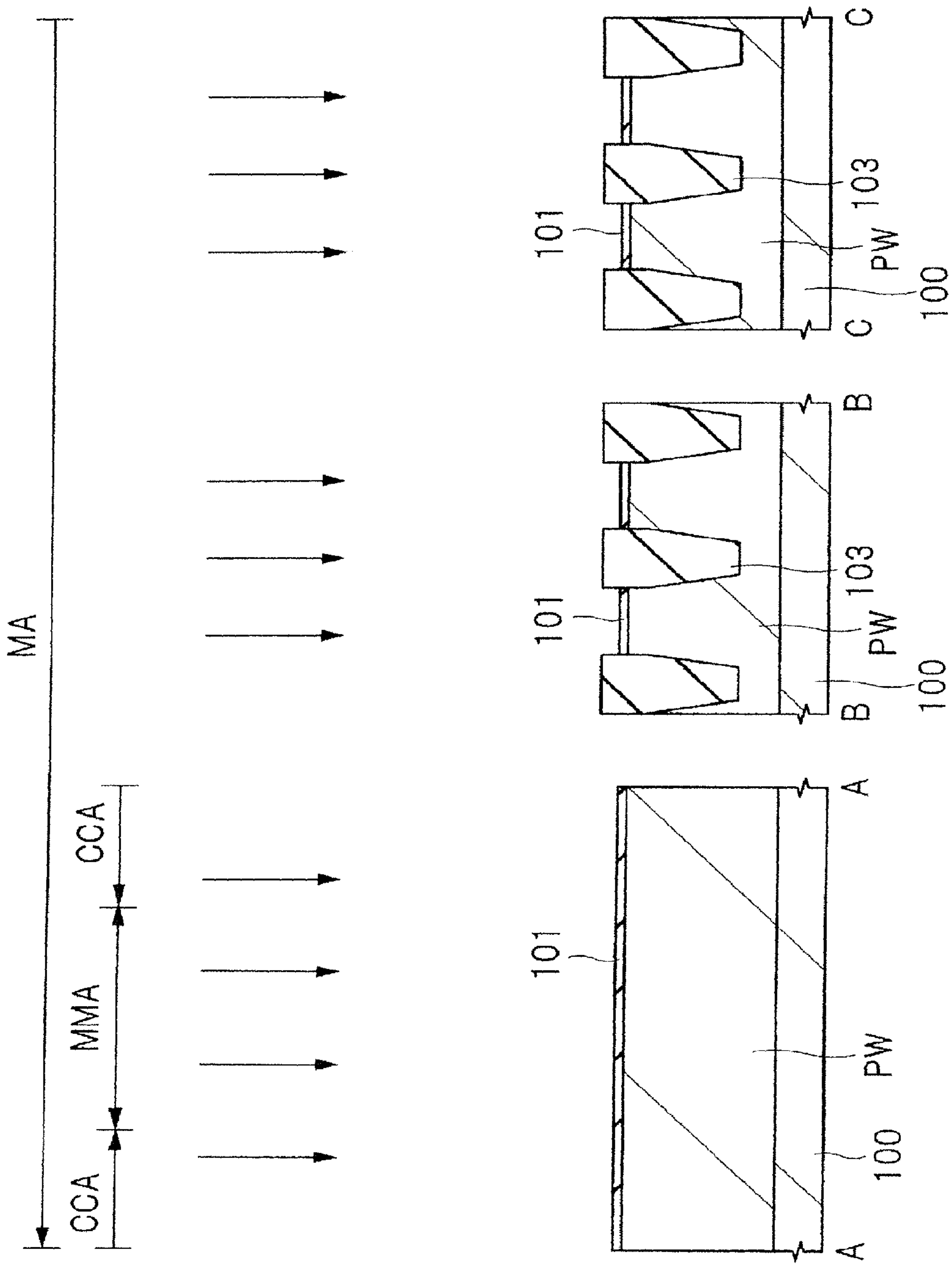
FIG. 18 is a cross-sectional view showing a manufacturing step of the semiconductor device of First Embodiment following that of FIG. 16.
Figure 19:
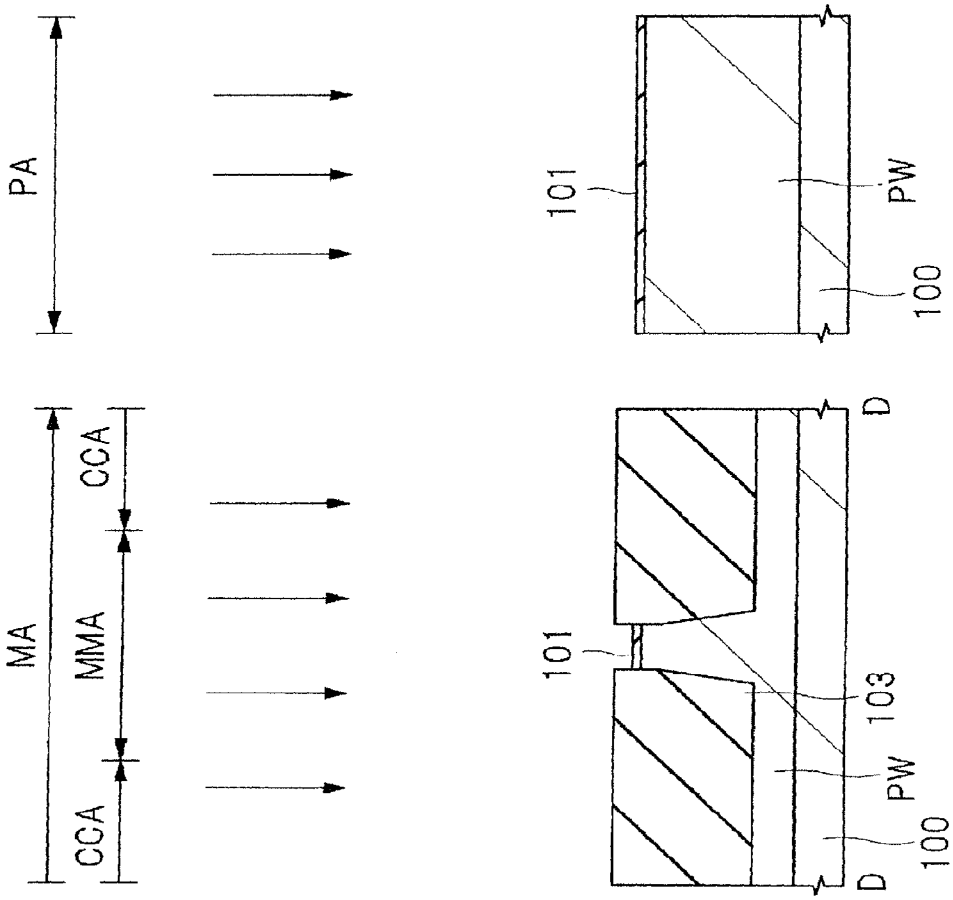
FIG. 19 is a cross-sectional view showing a manufacturing step of the semiconductor device of First Embodiment following that of FIG. 17.

Next, as shown in FIGS. 18 and 19, a p well PW is formed in the semiconductor substrate 100. First, the silicon nitride film 102 is removed. Then, ion implantation of a p type impurity (for example, boron (B)) is performed while using the silicon oxide film 101 as a through film to form a p well PW. Although FIGS. 18 and 19 show only the p well PW formation region, an n well may formed in another region by ion implantation of an n type impurity.

Figure 20:
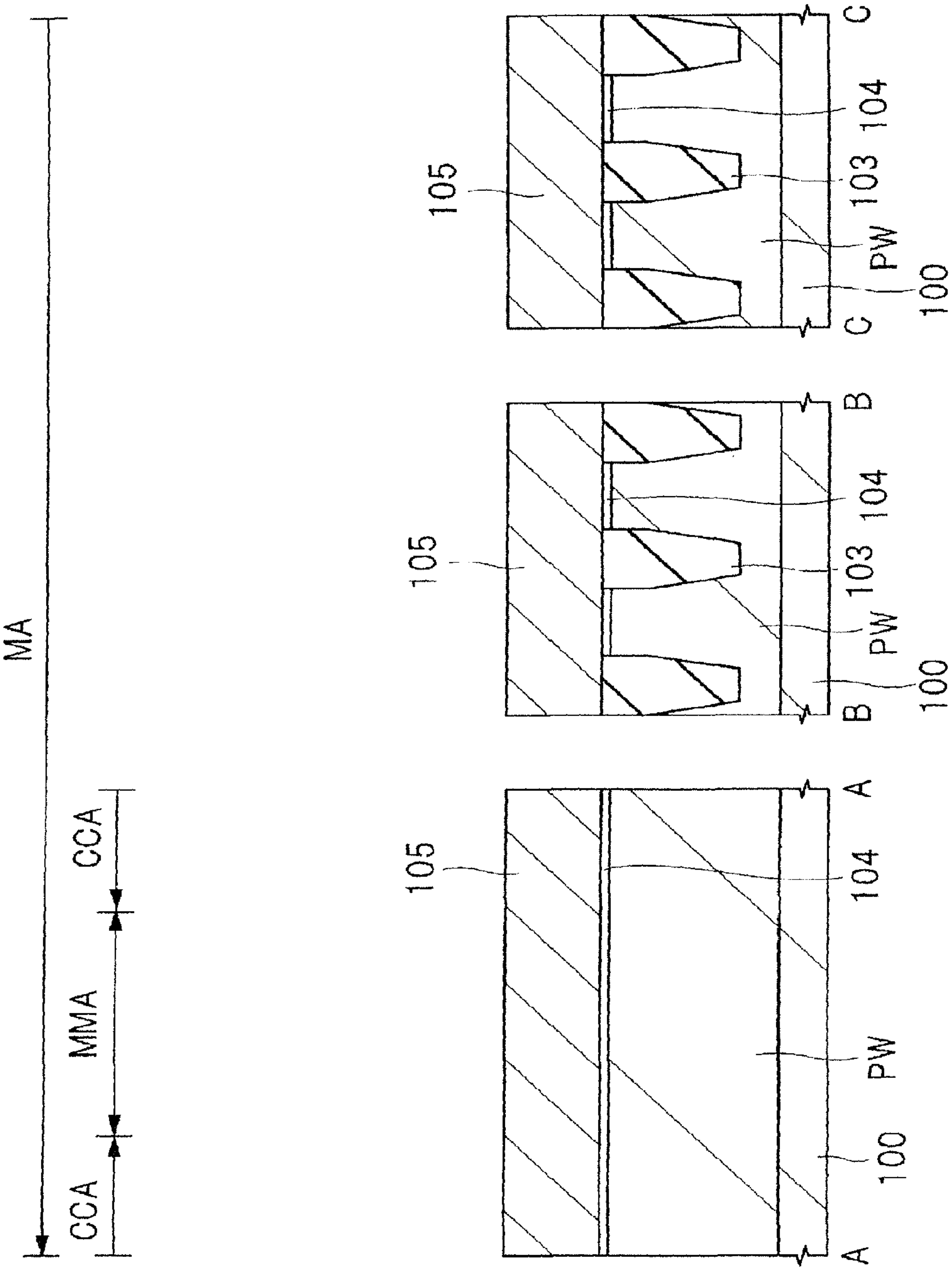
FIG. 20 is a cross-sectional view showing a manufacturing step of the semiconductor device of First Embodiment following that of FIG. 18.
Figure 21:
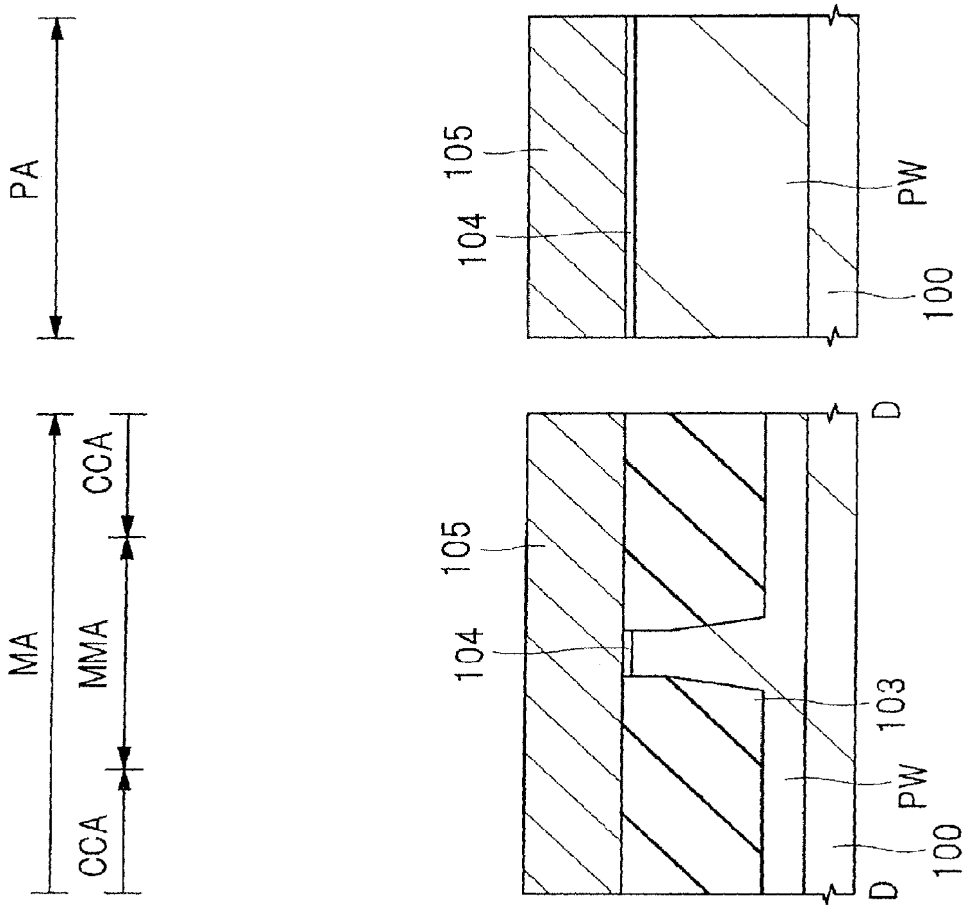
FIG. 21 is a cross-sectional view showing a manufacturing step of the semiconductor device of First Embodiment following that of FIG. 19.

Next, as shown in FIGS. 20 and 21, a polysilicon film 105 is formed on the semiconductor substrate 100. The polysilicon film 105 is a film configuring a sidewall of the memory gate electrode portion MG when it is formed in sidewall shape. The sidewall may be made of another material film.

First, after removal of the silicon oxide film 101 by wet etching or the like, a silicon oxide film 104 of about 2 nm thick is formed on the semiconductor substrate 100 by thermal oxidation. Then, a polysilicon film 105 of about 120 nm thick is formed on the silicon oxide film 104 and the element isolation region 103 by CVD or the like.

Figure 22:
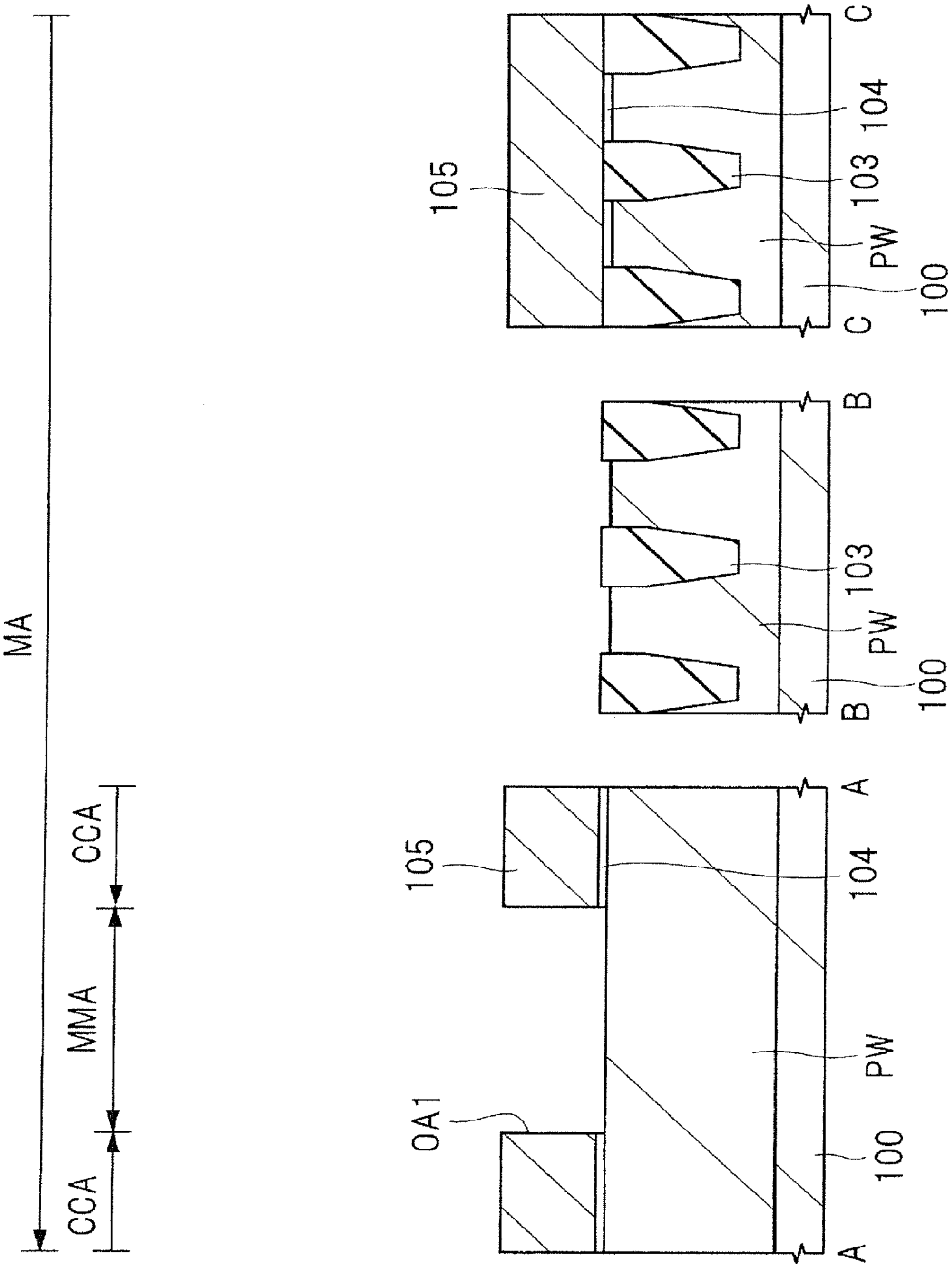
FIG. 22 is a cross-sectional view showing a manufacturing step of the semiconductor device of First Embodiment following that of FIG. 20.
Figure 23:
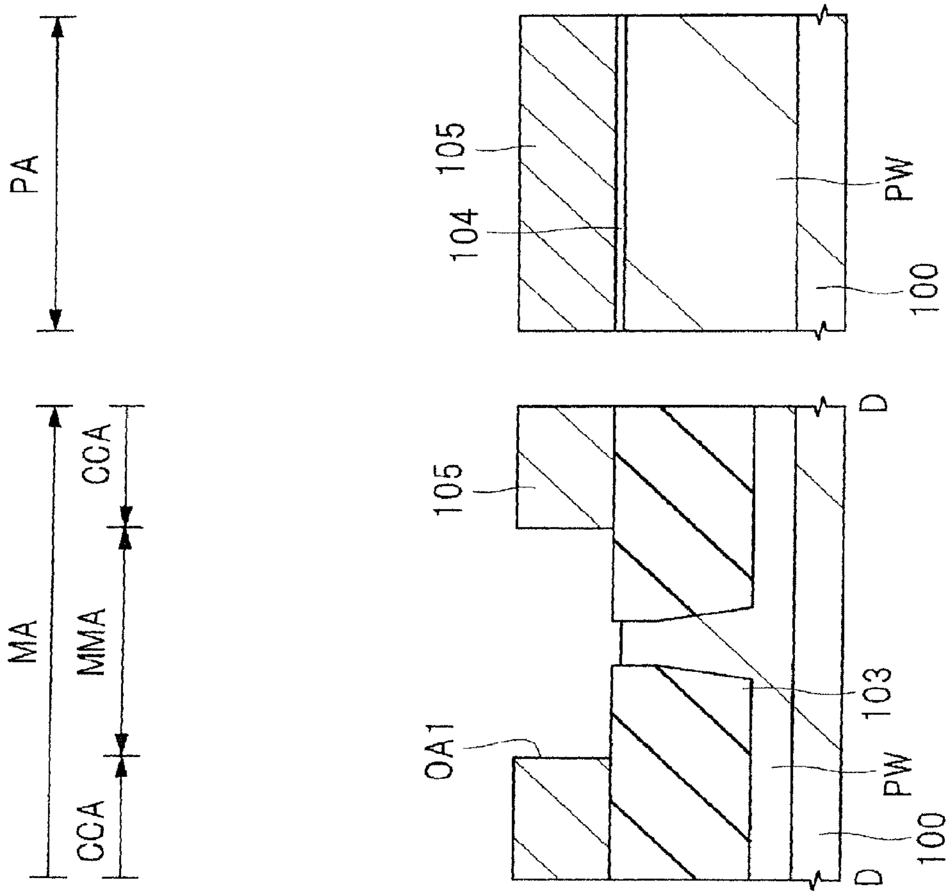
FIG. 23 is a cross-sectional view showing a manufacturing step of the semiconductor device of First Embodiment following that of FIG. 21.

Next, as shown in FIGS. 22 and 23, an opening portion OA1 is formed in the polysilicon film 105. This opening portion OA1 is formed by removing the polysilicon film 105 and the underlying silicon oxide film 104 from the region MMA, for example, by photolithography and dry etching. In other words, a stacked film of the polysilicon film 105 and the silicon oxide film 104 is left in the region CCA. At this time, the stacked film of the polysilicon film 105 and the silicon oxide film 104 is left also in the peripheral circuit region PA. The opening portion OA1 has a width of, for example, about 200 nm.

Figure 24:
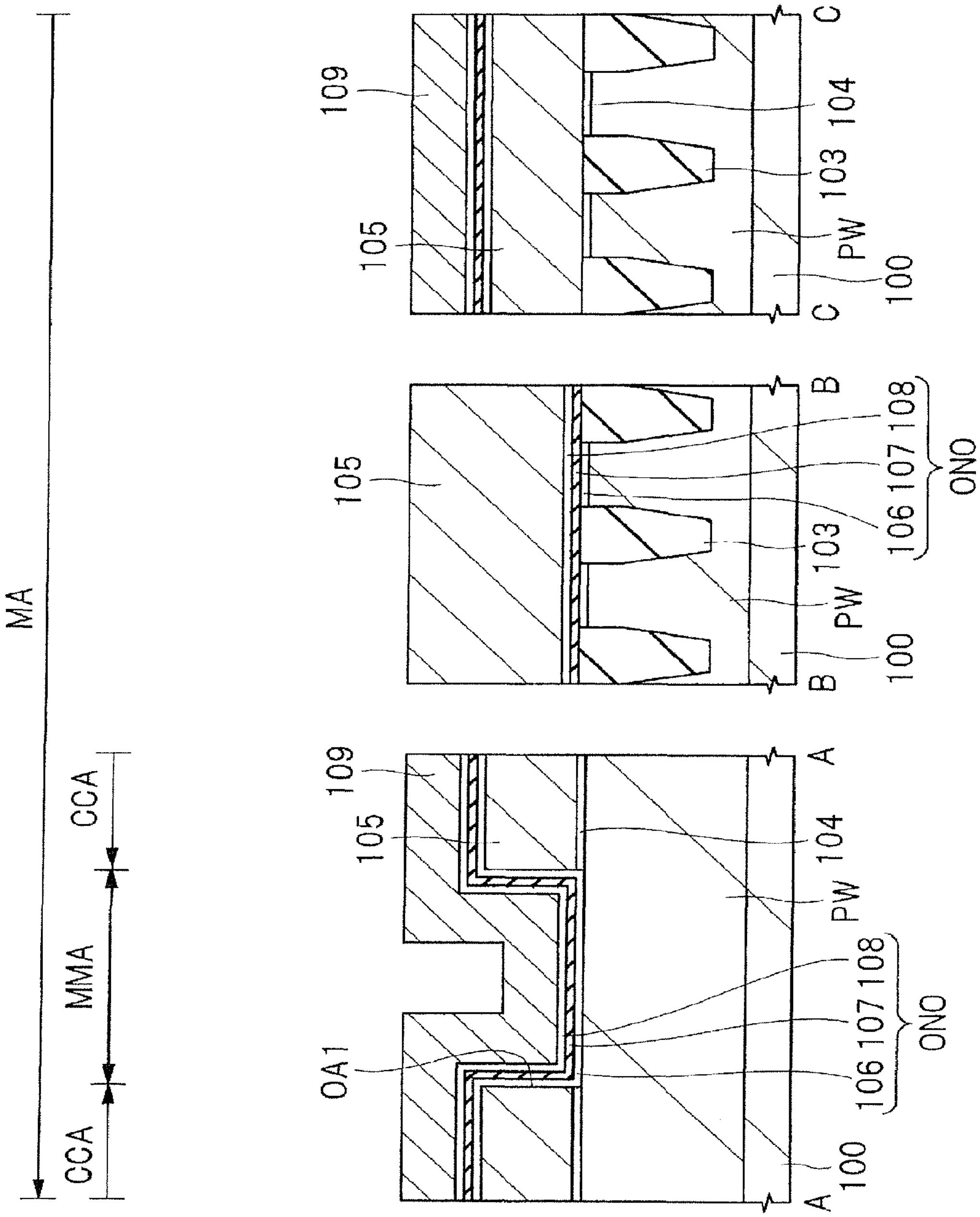
FIG. 24 is a cross-sectional view showing a manufacturing step of the semiconductor device of First Embodiment following that of FIG. 22.
Figure 25:
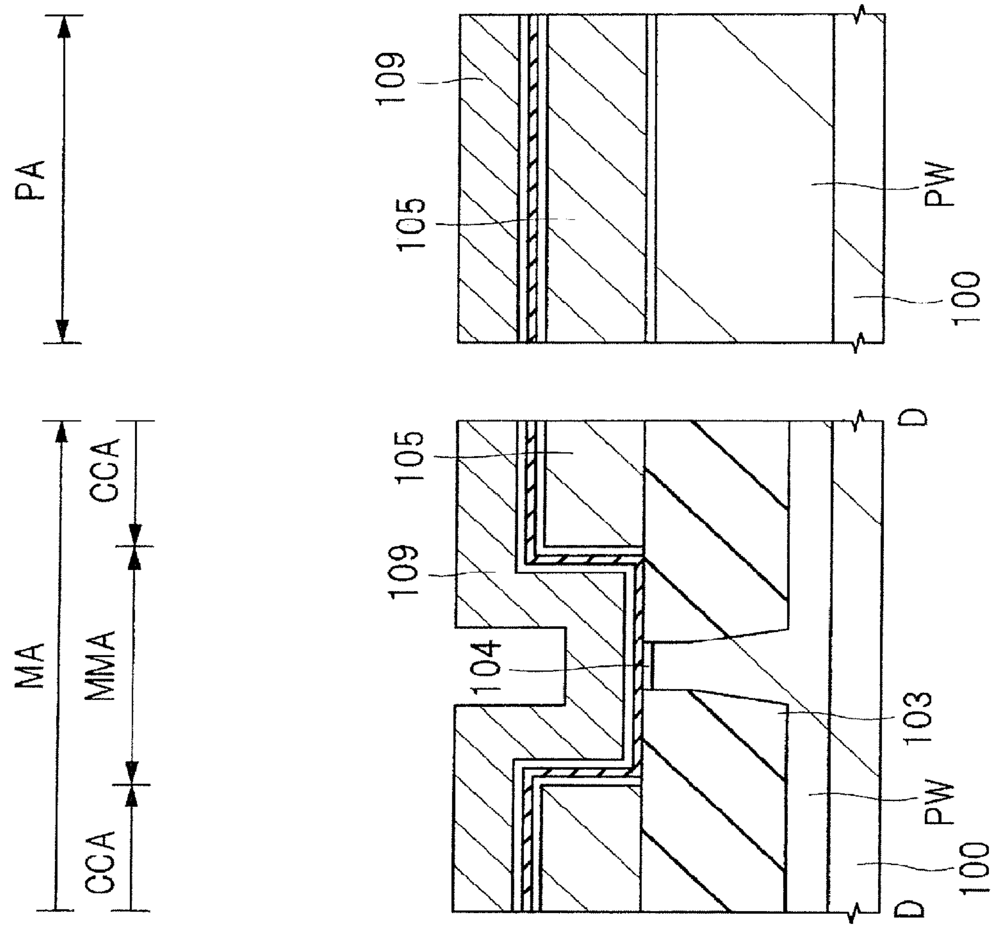
FIG. 25 is a cross-sectional view showing a manufacturing step of the semiconductor device of First Embodiment following that of FIG. 23.

Next, as shown in FIGS. 24 to 27, an insulating film ONO (106, 107, 108) and a memory gate electrode portion MG are formed. First as shown in FIGS. 24 and 25, the insulating film ONO (106, 107, 108) is formed in the opening portion OA1 and on the polysilicon film 105. For example, a silicon oxide film 106 is formed on the semiconductor substrate 100 by thermal oxidation and the silicon oxide film 106 thus formed has a thickness of about 4 nm. The silicon oxide film 106 may be formed using CVD or the like. Then, a silicon nitride film 107 of about 6 nm thick is deposited on the silicon oxide film 106, for example, by CVD. This silicon nitride film 107 serves as a charge accumulation portion of the memory cell and becomes an intermediate layer configuring the insulating film ONO. Then, a silicon oxynitride film 108 of about 8 nm thick is deposited on the silicon nitride film 107 by CVD. In such a manner, the insulating film ONO comprised of the silicon oxide film 106, the silicon nitride film 107, and the silicon oxynitride film 108 can be formed.

The insulating film ONO thus obtained functions as a gate insulating film of a memory transistor and has a charge retention (charge accumulation) function. It has therefore a stacked structure of at least three layers and these layers are configured so that the potential barrier height of an inner layer (silicon nitride film 107) be smaller than the potential barrier height of the outer layers (the silicon oxide film 106 and the silicon oxynitride film 108). In the present embodiment, the silicon nitride film 107 is formed as a charge accumulation portion inside the insulating film ONO, but another insulating film such as silicon oxynitride film, aluminum oxide film, hafnium oxide film, or tantalum oxide film may be used as the charge accumulation portion. The thickness of each of the films configuring the insulating film ONO is not limited to the above-mentioned one and it can be adjusted as needed, for example, according to the operation system of the resulting memory cell.

Next, a polysilicon film 109 of about 40 nm thick is deposited on the insulating film ONO (106, 107, and 108) by CVD or the like (FIG. 24 and FIG. 25).

Figure 26:
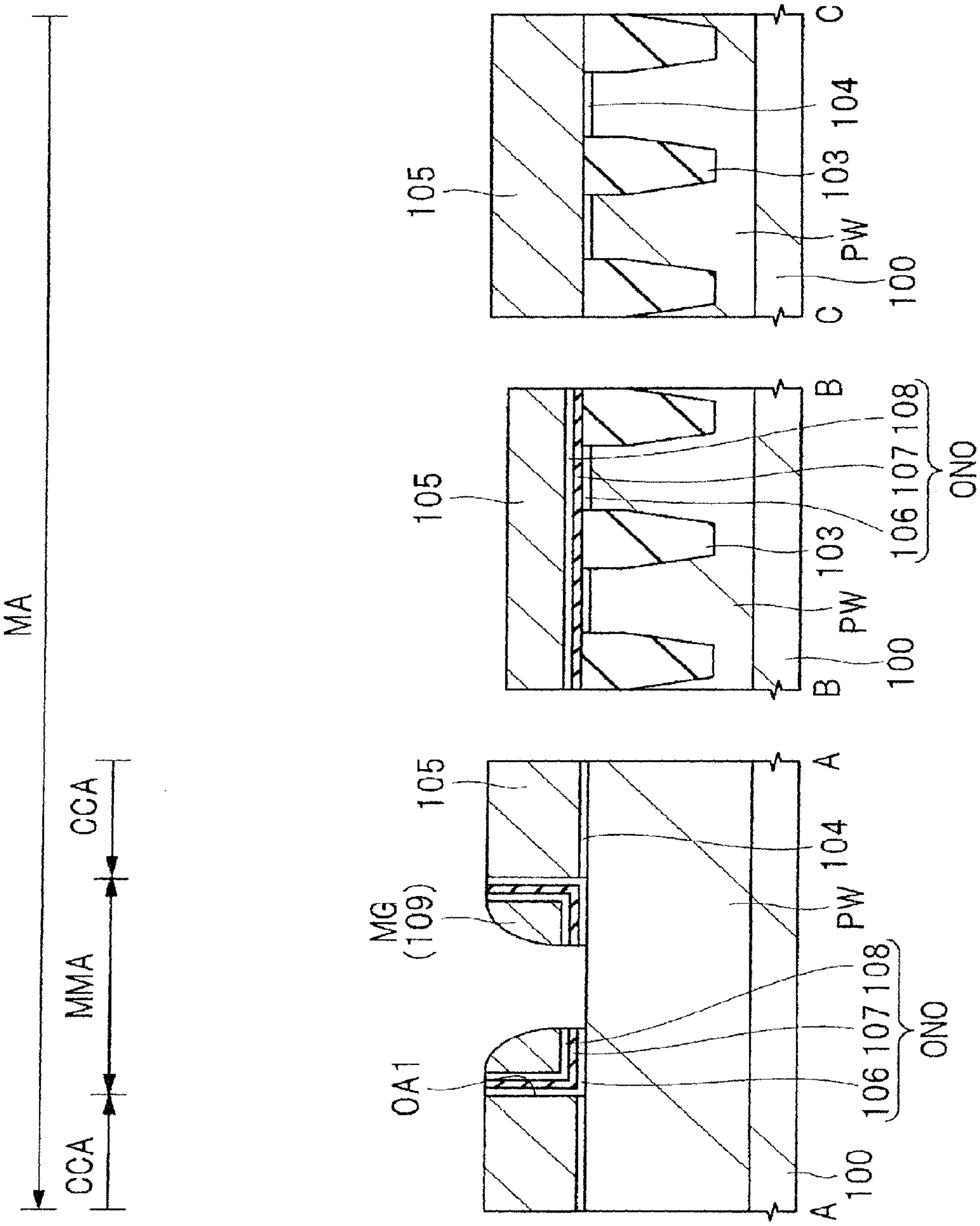
FIG. 26 is a cross-sectional view showing a manufacturing step of the semiconductor device of First Embodiment following that of FIG. 24.
Figure 27:
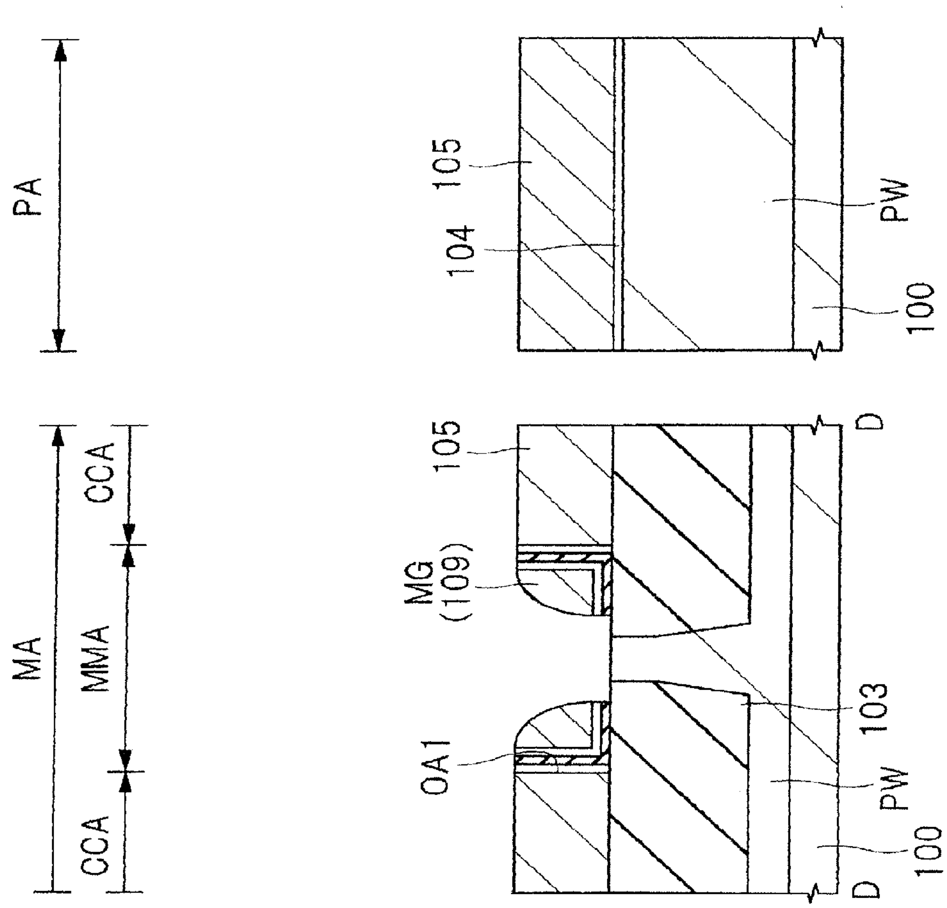
FIG. 27 is a cross-sectional view showing a manufacturing step of the semiconductor device of First Embodiment following that of FIG. 25.

Next, as shown in FIGS. 26 and 27, a polysilicon film 109 in sidewall shape is formed on the sidewall portion of the opening portion OA1 (polysilicon film 105).

For example, the polysilicon film 109 is etched back. In this etch back step, the polysilicon film 109 of a predetermined thickness from the surface thereof is removed by anisotropic etching. This etch back step makes it possible to leave the polysilicon film 109 in sidewall shape (in sidewall film shape) on the sidewall portion of the opening portion OA1 (polysilicon film 105) via the insulating film ONO. This polysilicon film 109 becomes a memory gate electrode portion MG. A memory gate length (gate length of the memory gate electrode portion MG) is determined, depending on the deposition thickness of the polysilicon film 109. By adjusting the deposition thickness of the polysilicon film 105 and the deposition thickness of the polysilicon film 109, the height of the memory gate electrode portion MG can be adjusted. A dummy gate formation region may be provided in order to improve the processability of the memory gate. For example, the memory cell formed at the end portion of the memory array may presumably vary in characteristics. For example, variation in the dimensions of the polysilicon film 109 occurs, leading to variation in the characteristics of the memory cell. It is therefore possible to form a dummy gate formation region at the end portion of the memory array and use, as a dummy gate, the polysilicon film 109 formed at both end portions of the control gate electrode portion CG, and thereby prevent it from contributing to the operation of the memory cell.

Figure 28:
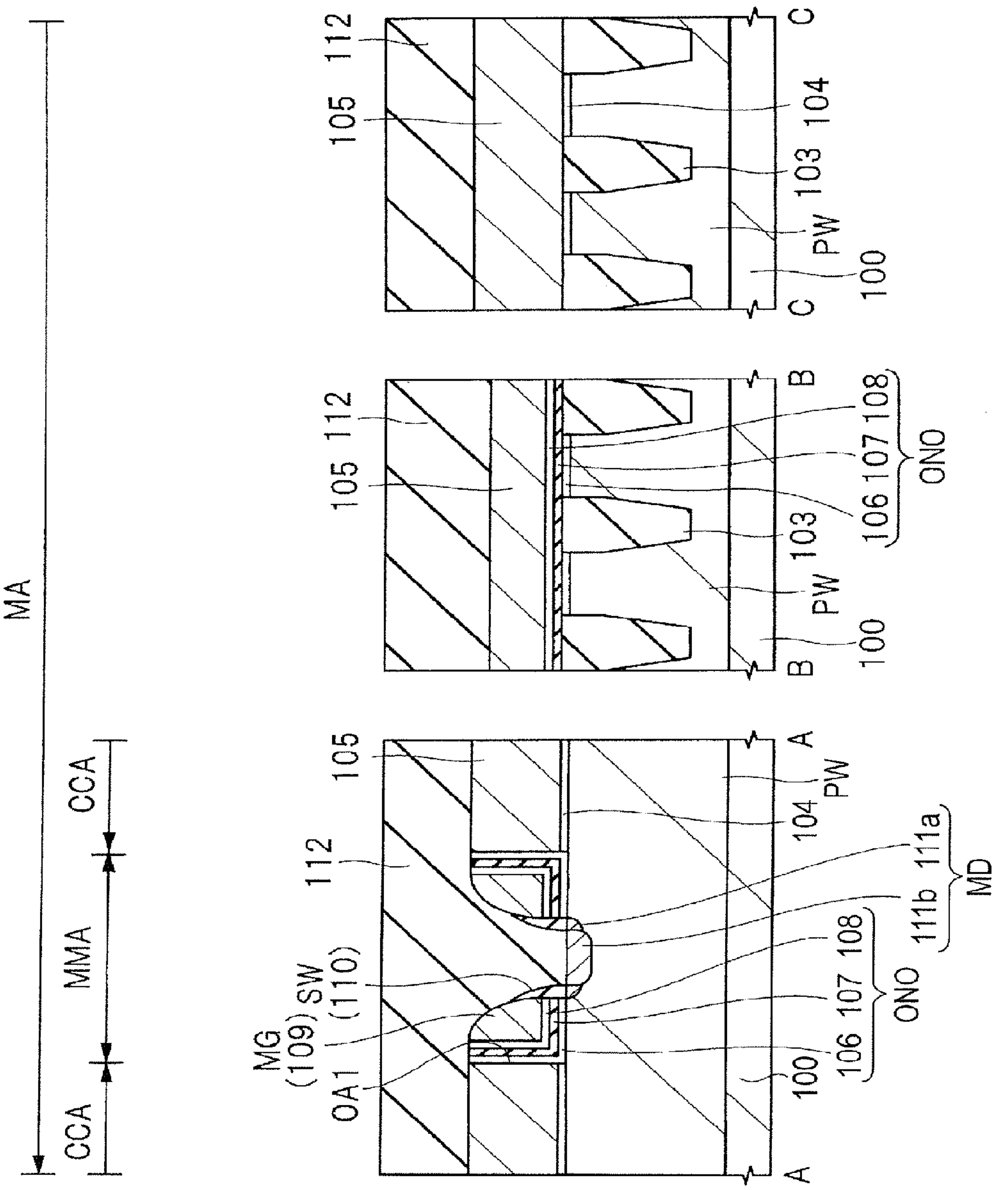
FIG. 28 is a cross-sectional view showing a manufacturing step of the semiconductor device of First Embodiment following that of FIG. 26.
Figure 29:
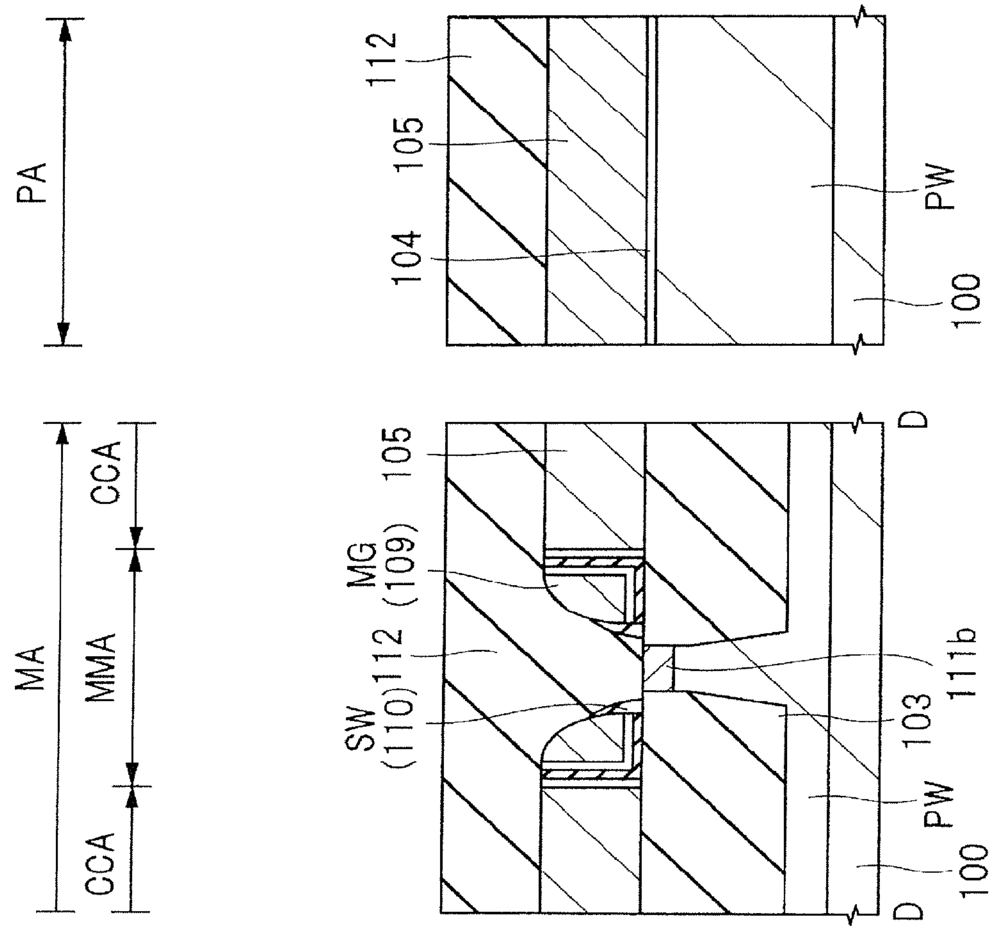
FIG. 29 is a cross-sectional view showing a manufacturing step of the semiconductor device of First Embodiment following that of FIG. 27.

Next, as shown in FIGS. 28 and 29, a drain region MD and a silicon oxide film 112 are formed.

First, with the polysilicon film 105 and the polysilicon film 109 as a mask, an n type impurity such as arsenic (As) or phosphorus (P) is implanted into the bottom surface (p well PW) of the opening portion OA1 to form an $n^-$ type semiconductor region 111*a*. This $n^-$ type semiconductor region 111*a* is formed in self alignment with the sidewall of the polysilicon film 109. Next, a sidewall film (sidewall insulating film) SW is formed on the sidewall portion of the polysilicon film 109. For example, a silicon oxide film is deposited in the opening portion OA1 and on the polysilicon films 105 and 109 by CVD or the like. The resulting silicon oxide film of a predetermined thickness from the surface thereof is removed by anisotropic dry etching to form a sidewall film SW on the sidewall portion of the polysilicon film 109. Then, with the polysilicon films 105 and 109 and the sidewall film SW as a mask, an n type impurity such as arsenic (Ar) or phosphorus (P) is implanted into the bottom surface (p well PW) of the opening portion OA1 to form an $n^+$ type semiconductor region 111*b*. This $n^+$ type semiconductor region 111*b* is formed in self alignment with the sidewall film SW. The $n^+$ type semiconductor region 111*b* has an impurity concentration and a junction depth greater than those of the $n^-$ type semiconductor region 111*a*. The drain region MD comprised of the $n^-$ type semiconductor region 111*a* and the $n^+$ type semiconductor region 111*b* is thus formed by the above-mentioned step.

Next, a silicon oxide film 112 is deposited in the opening portion OA1 and on the polysilicon films 105 and 109. This silicon oxide film 112 is preferably an SOG (spin on glass) film having a large wet etching rate because it will be removed in a later step.

Figure 30:
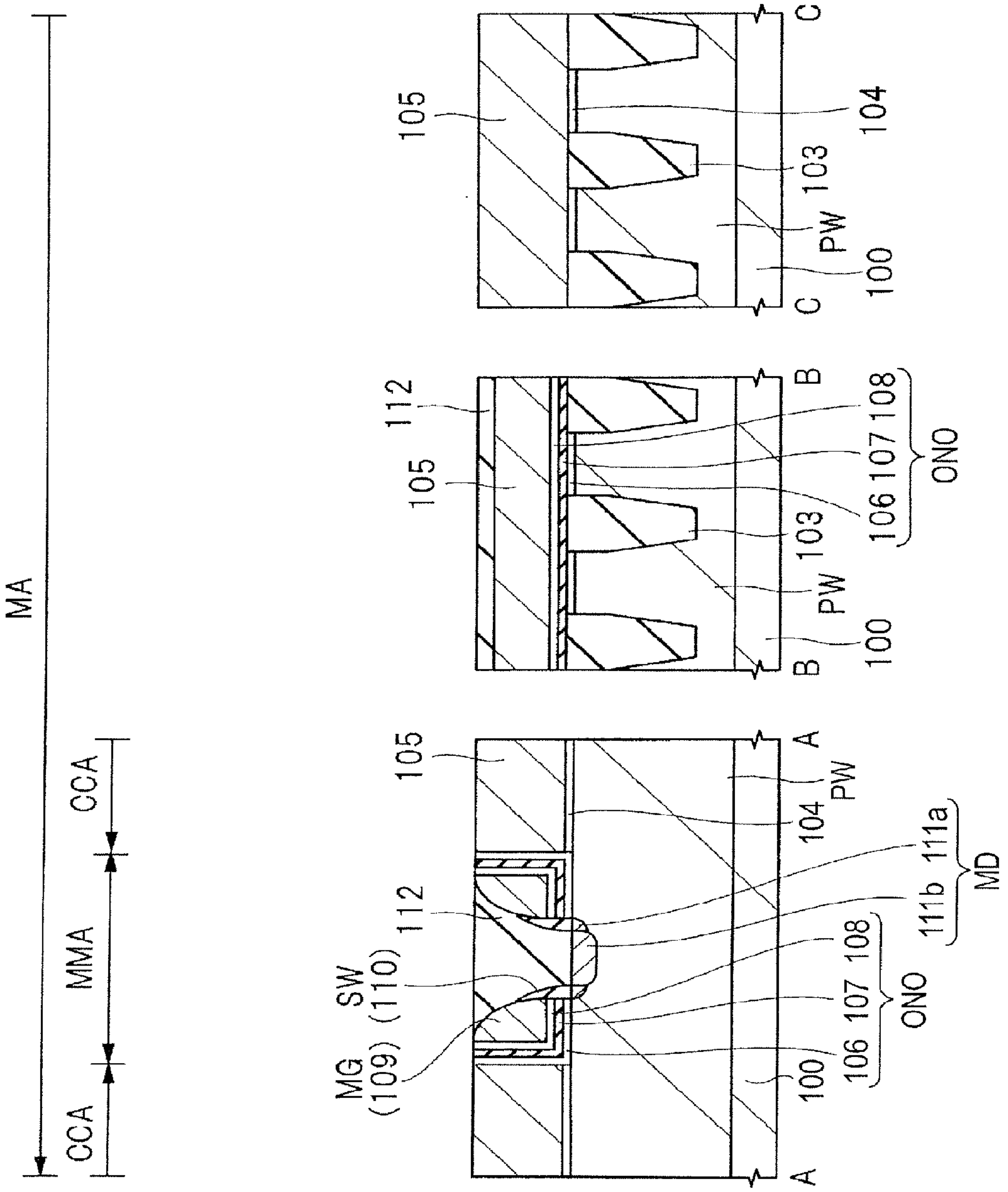
FIG. 30 is a cross-sectional view showing a manufacturing step of the semiconductor device of First Embodiment following that of FIG. 28.
Figure 31:
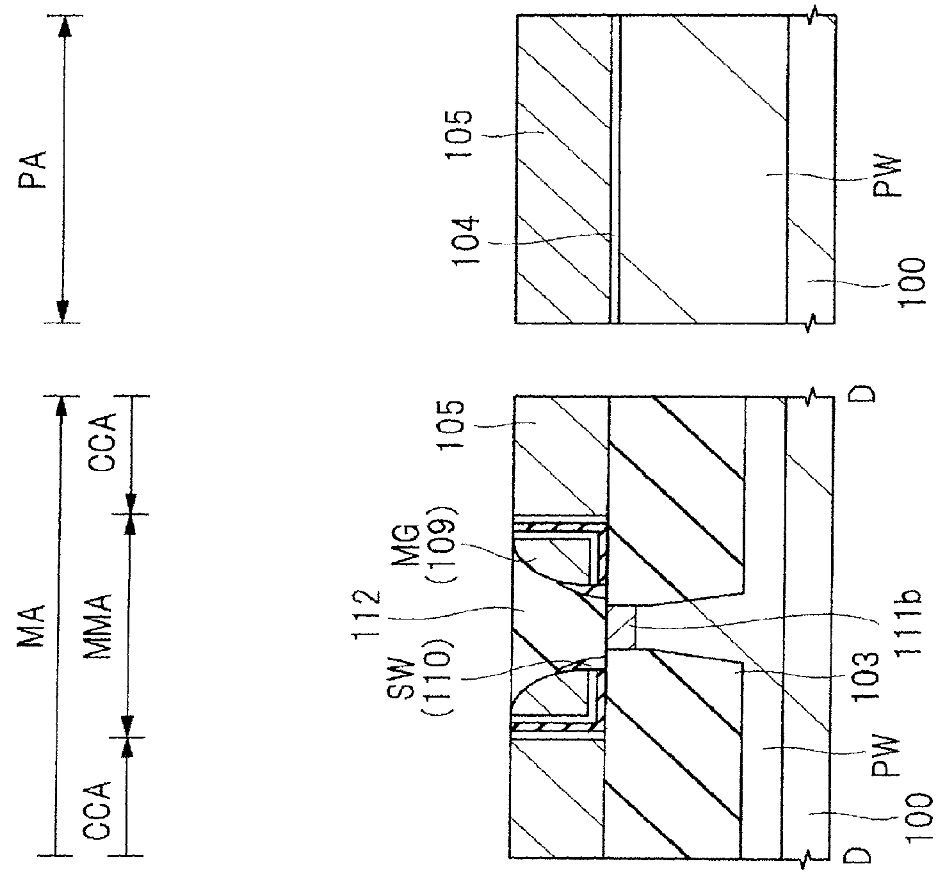
FIG. 31 is a cross-sectional view showing a manufacturing step of the semiconductor device of First Embodiment following that of FIG. 29.

Next, as shown in FIGS. 30 and 31, an upper portion of the silicon oxide film 112 is removed until the surface of the polysilicon film 105 is exposed. For example, the upper portion of the silicon oxide film 112 is removed using a method such as CMP and wet etching until the surface of the polysilicon film 105 is exposed. By this step, the opening portion OA1 between the polysilicon films 109 is filled with the silicon oxide film 112. As a result, the polysilicon film 109 is covered with the silicon oxide film 112 and the polysilicon film 105 of the region CCA is exposed in the memory cell region MA. In addition, the polysilicon film 105 of the peripheral circuit region PA is exposed.

Figure 32:
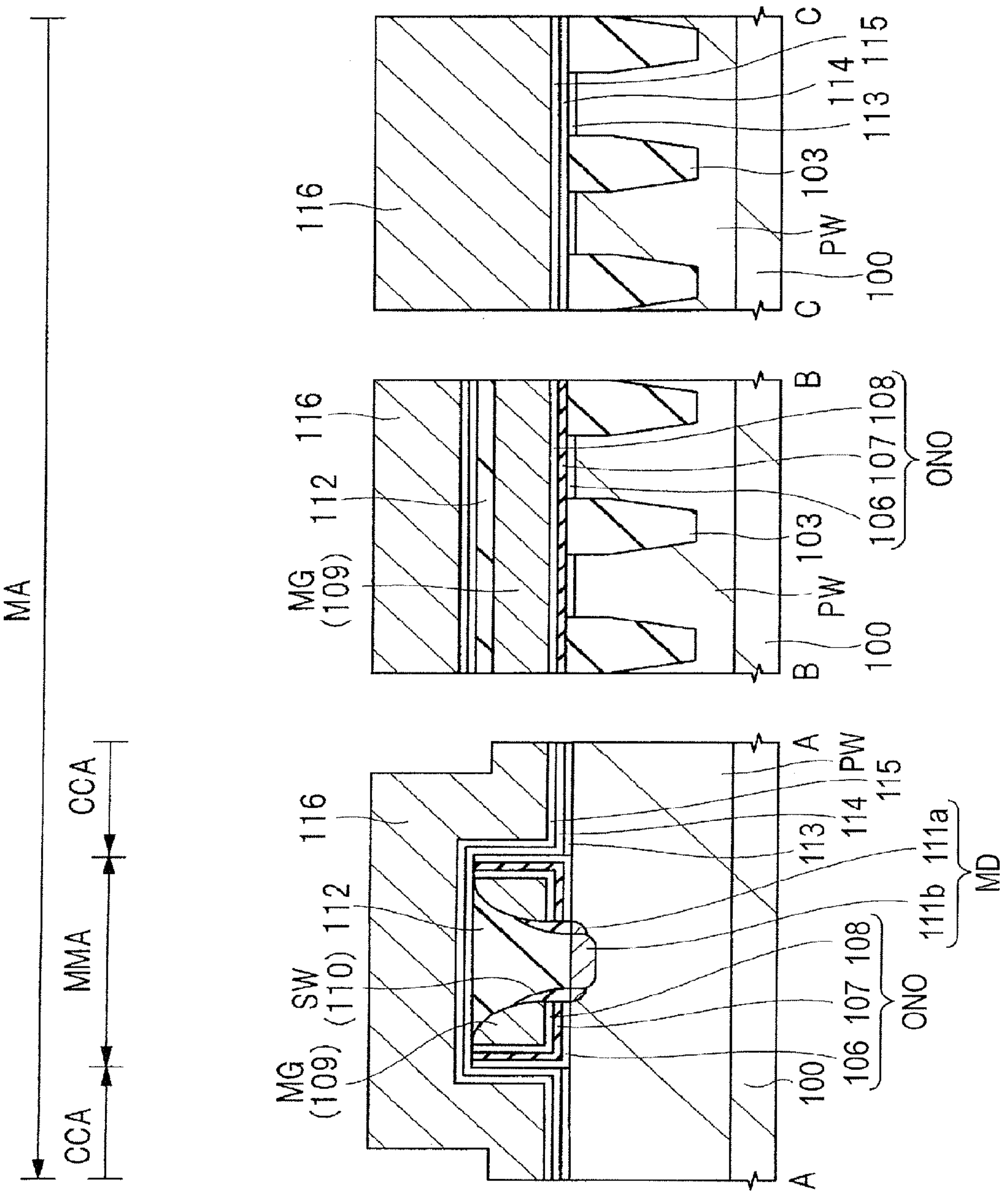
FIG. 32 is a cross-sectional view showing a manufacturing step of the semiconductor device of First Embodiment following that of FIG. 30.
Figure 33:
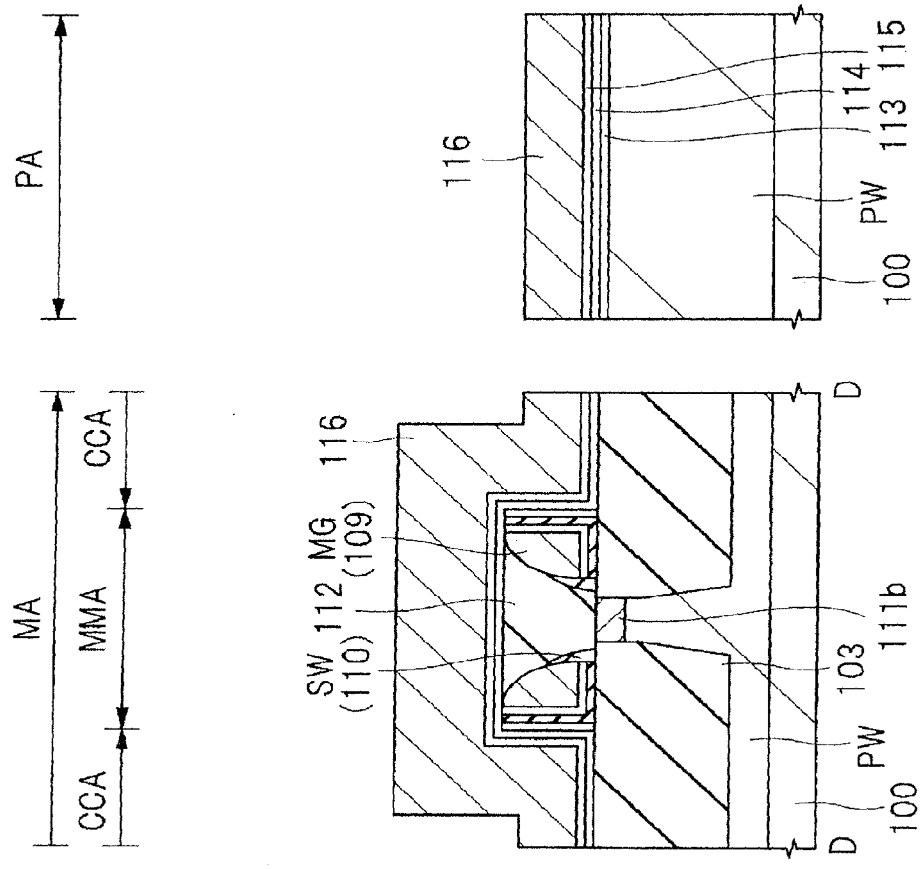
FIG. 33 is a cross-sectional view showing a manufacturing step of the semiconductor device of First Embodiment following that of FIG. 31.

Next, as shown in FIGS. 32 and 33, the polysilicon film 105 is removed and a high-k insulating film 114 and the like are formed. First, the polysilicon film 105 is removed and a silicon oxide film 113 of about 1 nm thick is formed on the semiconductor substrate 100 (p well PW) of the region CCA by thermal oxidation or the like. Next, a high-k insulating film 114 is formed on the silicon oxide film 113 and the silicon oxide film 112. As the high-k insulating film 114, for example, an Hf oxide film can be used. For example, an Hf oxide film of about 5 nm thick is deposited using CVD or the like. Next, a titanium nitride film 115 of about 10 nm thick is deposited on the high-k insulating film 114 by CVD or the like.

Next, a polysilicon film 116 of about 100 nm thick is deposited on the titanium nitride film 115 by CVD or the like (FIG. 32 and FIG. 33).

Figure 34:
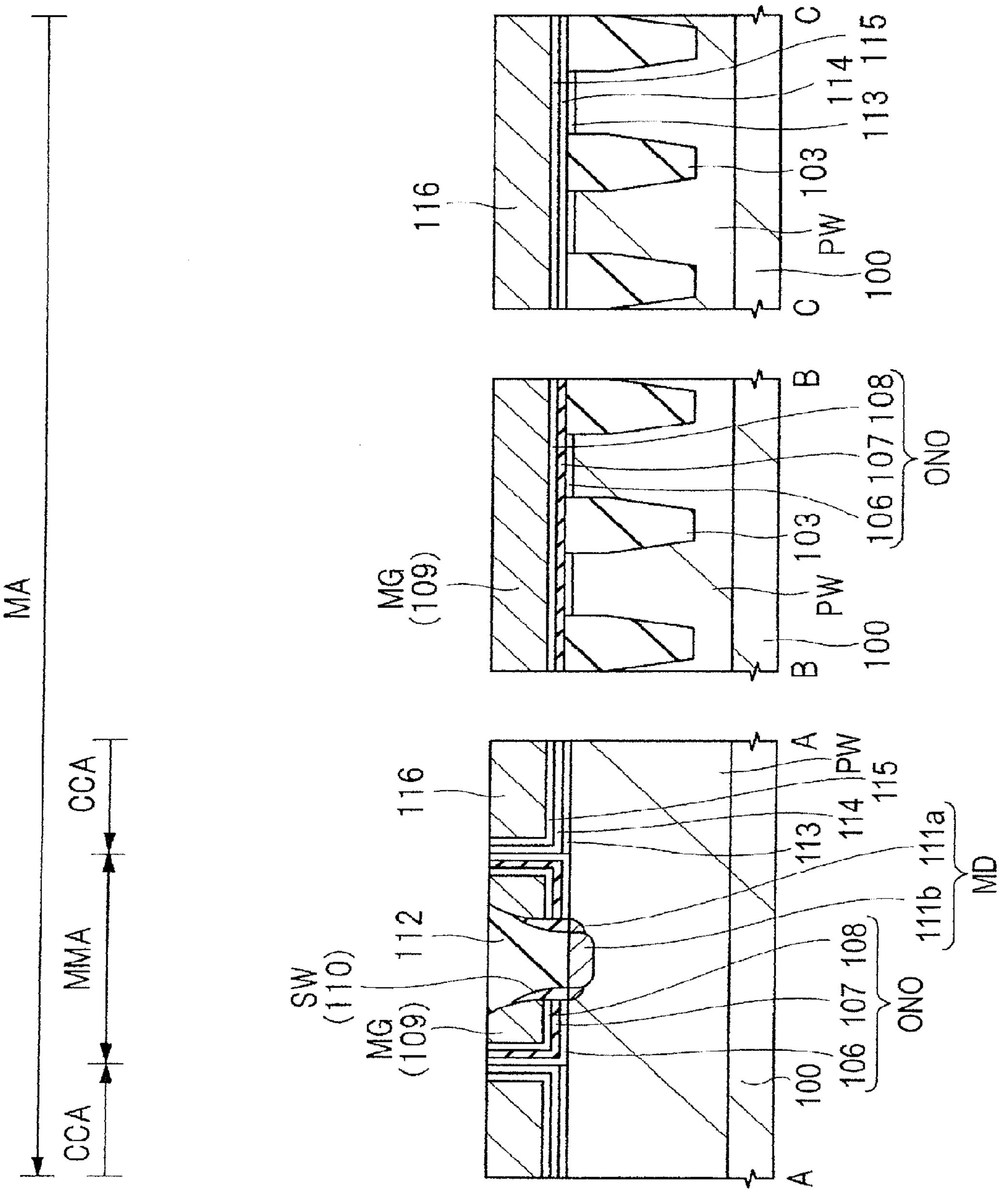
FIG. 34 is a cross-sectional view showing a manufacturing step of the semiconductor device of First Embodiment following that of FIG. 32.
Figure 35:
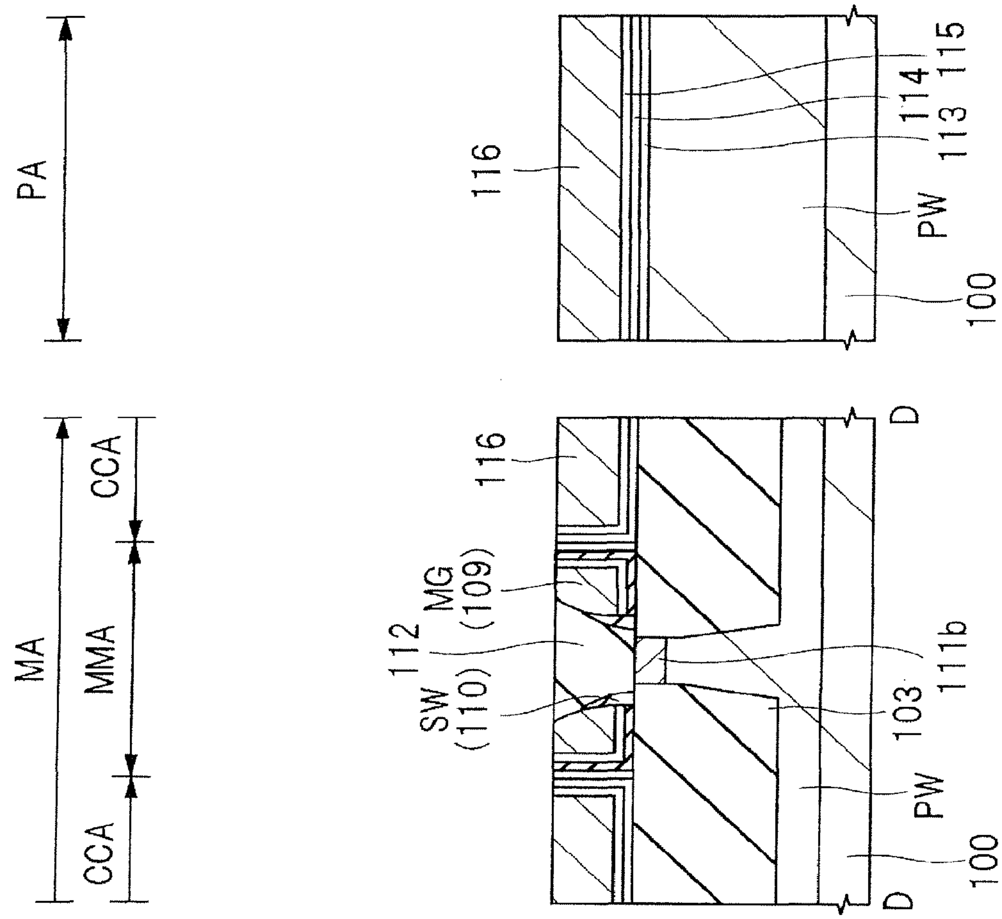
FIG. 35 is a cross-sectional view showing a manufacturing step of the semiconductor device of First Embodiment following that of FIG. 33.

Next, as shown in FIGS. 34 and 35, the polysilicon film 116 is planarized by removing an upper portion thereof by CMP or the like. At this time, the polishing amount is controlled so that the surface height of the polysilicon film 116 arranged on the semiconductor substrate 100 (p well PW) via the stacked film of the silicon oxide film 113, the high-k insulating film 114, and the titanium nitride film 115 be about 80 nm from the semiconductor substrate 100 (p well PW). By this step, in the region MMA, the polysilicon film 109 and the silicon oxide film 112 are exposed, while in the region CCA, the polysilicon film 116 is exposed. The polysilicon film 109 of the region MMA becomes a memory gate electrode portion MG.

Figure 36:
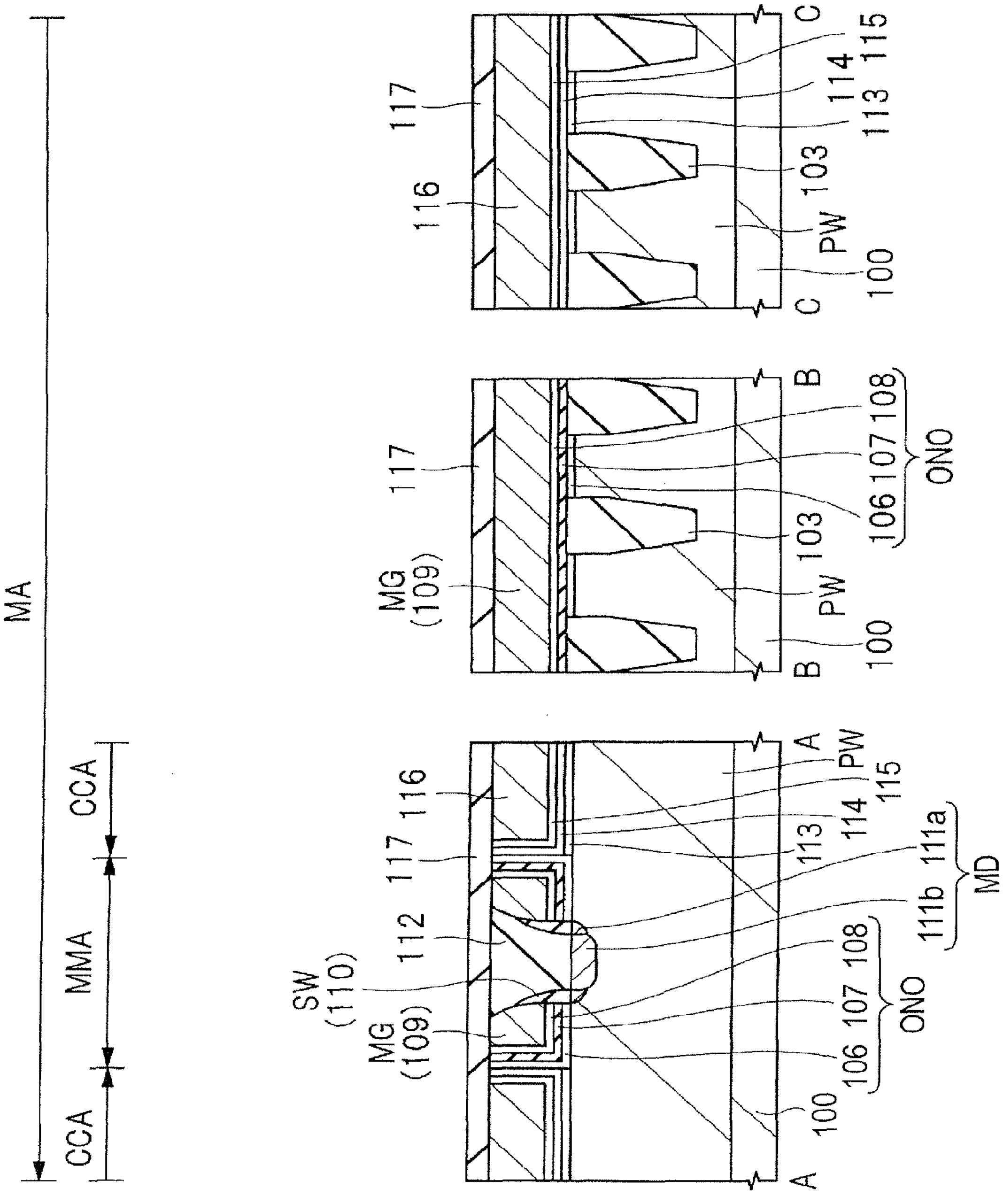
FIG. 36 is a cross-sectional view showing a manufacturing step of the semiconductor device of First Embodiment following that of FIG. 34.
Figure 37:
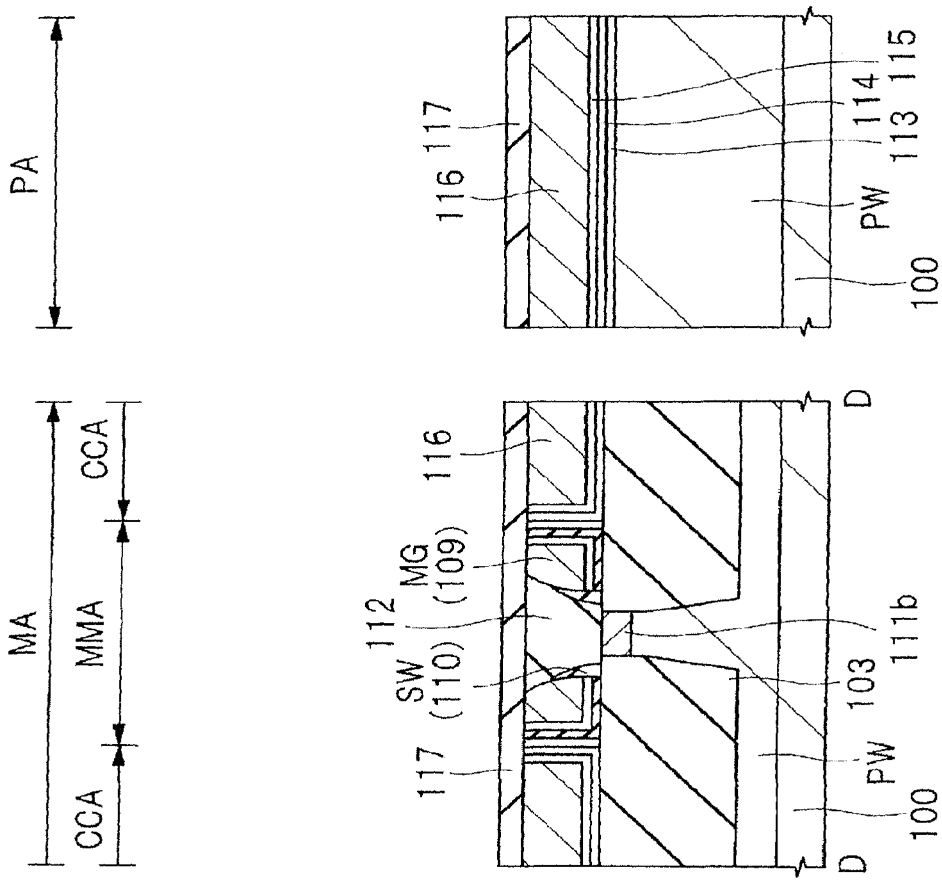
FIG. 37 is a cross-sectional view showing a manufacturing step of the semiconductor device of First Embodiment following that of FIG. 35.

Next, as shown in FIGS. 36 and 37, a silicon nitride film 117 is deposited on the polysilicon films 116 and 109 and the silicon oxide film 112 by CVD or the like. Next, the silicon nitride film 117 is left only in the peripheral circuit region PA by photolithography and dry etching.

Figure 38:
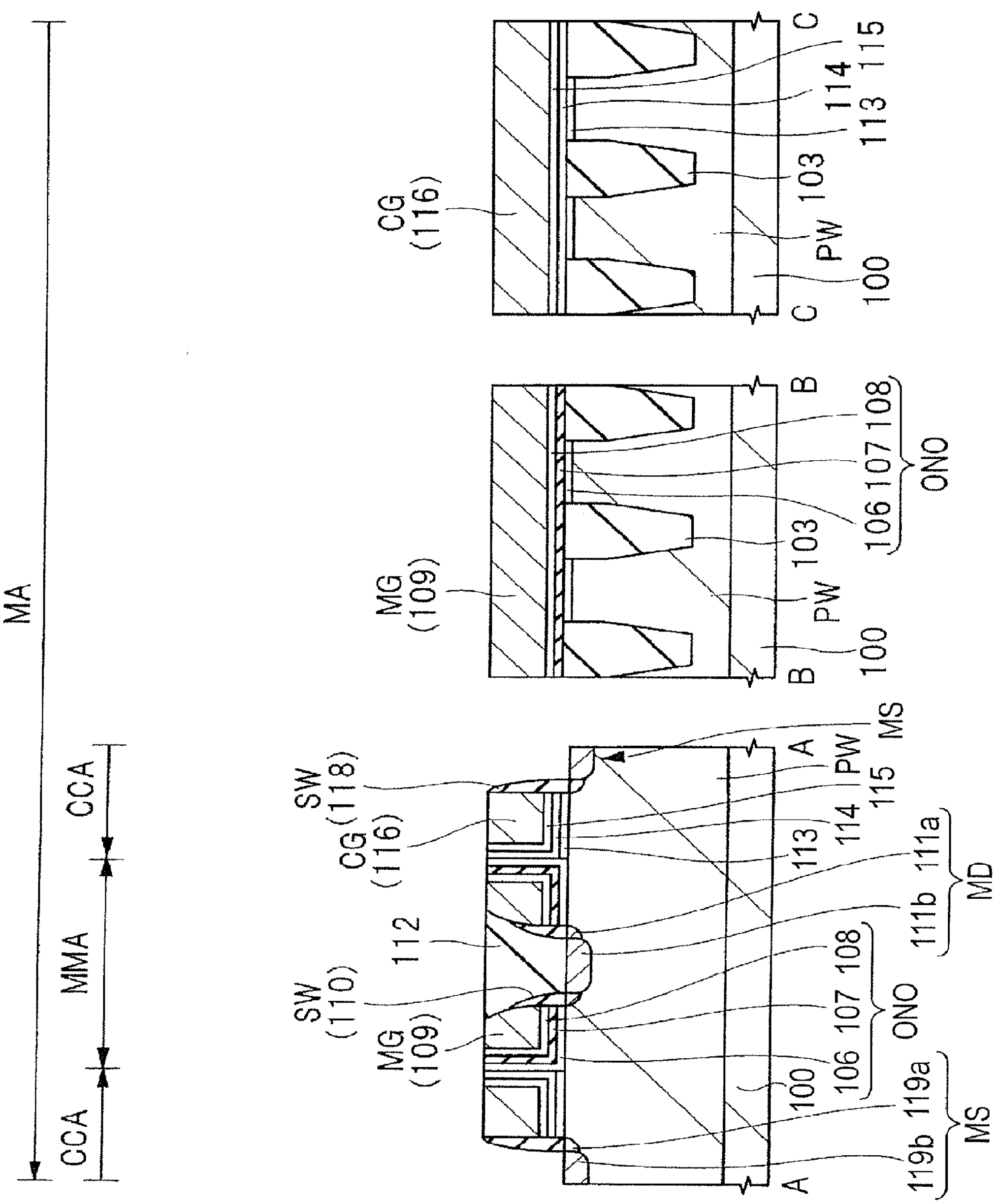
FIG. 38 is a cross-sectional view showing a manufacturing step of the semiconductor device of First Embodiment following that of FIG. 36.
Figure 39:
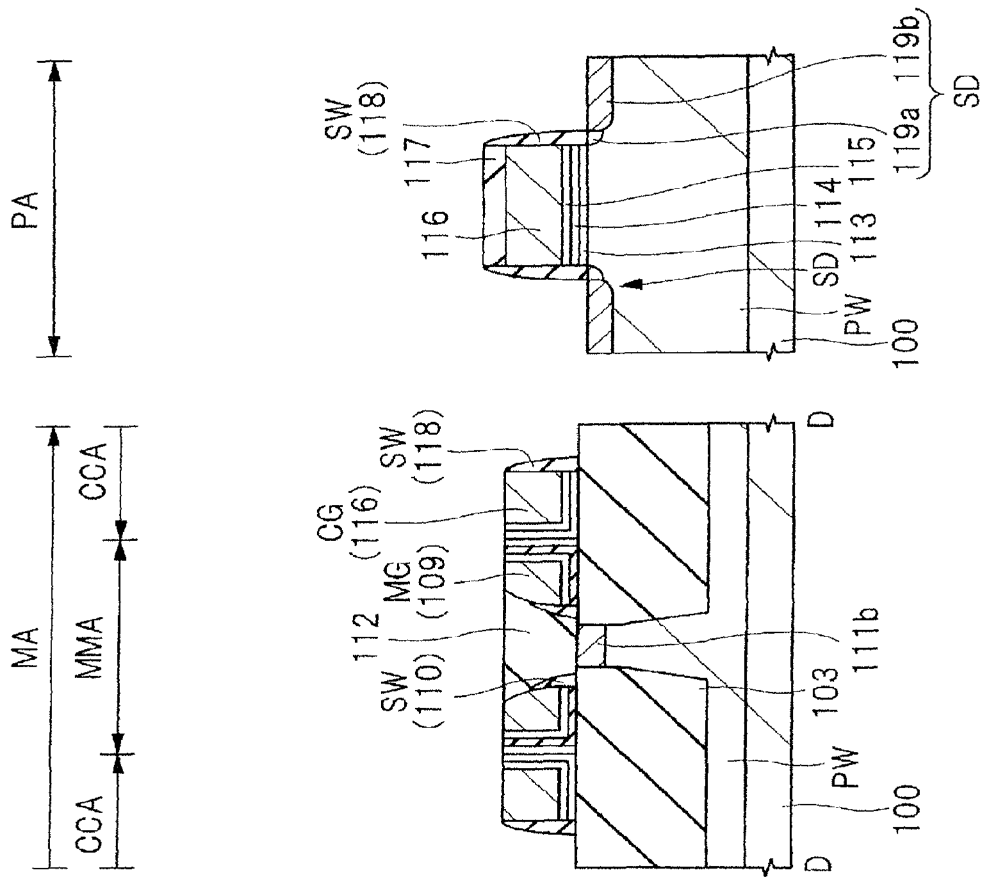
FIG. 39 is a cross-sectional view showing a manufacturing step of the semiconductor device of First Embodiment following that of FIG. 37.

Next, as shown in FIGS. 38 and 39, a control gate electrode portion CG is formed in the memory cell region MA; a polysilicon film 116 for substitution of a gate electrode portion is formed in the peripheral circuit region PA; and a source region MS of the memory cell and a source/drain region SD of the peripheral transistor are formed.

First, the polysilicon film 116 and the stacked film of the silicon oxide film 113, the high-k insulating film 114, and the titanium nitride film 115 are etched using photolithography and dry etching. By this step, a control gate electrode portion CG is formed in the memory cell region MA. In the peripheral circuit region PA, the silicon nitride film 117, the polysilicon film 116, and the stacked film of the silicon oxide film 113, the high-k insulating film 114, and the titanium nitride film 115 are etched. By this step, the polysilicon film 116 for substitution of a gate electrode portion is formed.

The polysilicon film 116 for substitution of a gate electrode portion has thereon a remaining silicon nitride film 117.

By the above-mentioned etching, in the region CCA of the memory cell region MA, the semiconductor substrate 100 (p well PW) on one side of the control gate electrode portion CG is exposed and in the peripheral circuit region PA, the semiconductor substrate 100 (p well PW) on both sides of the polysilicon film 116 is exposed.

Next, with the silicon oxide film 112, the control gate electrode portion CG, and the polysilicon film 116 as a mask, an n type impurity such as arsenic (As) or phosphorus (P) is implanted into the exposed portion of the semiconductor substrate 100 (p well PW) to form an $n^-$ type semiconductor region 119*a*. At this time, the $n^-$ type semiconductor region 119*a* is formed in self alignment with the sidewall of the control gate electrode portion CG or the polysilicon film 116.

Next, a sidewall film (sidewall insulating film) SW is formed on the sidewall portion of the control gate electrode portion CG and the polysilicon film 116. A silicon oxide film 118 is deposited on the semiconductor substrate 100 (p well PW) including the respective upper surfaces of the silicon oxide film 112, the control gate electrode portion CG, and the polysilicon film 116 by CVD or the like. The resulting silicon oxide film 118 of a predetermined thickness from the surface thereof is then removed by anisotropic dry etching to form a sidewall film SW on the respective sidewall portions of the control gate electrode portion CG and the polysilicon film 116.

Next, with the control gate electrode portion CG, the polysilicon film 116, the sidewall film SW, and the like as a mask, an n type impurity such as arsenic (As) or phosphorus (P) is implanted into the semiconductor substrate 100 (p well PW) to form an n type semiconductor region 119*b*. At this time, this $n^+$ type semiconductor region 119*b* is formed in self alignment with the sidewall film SW. This $n^+$ type semiconductor region 119*b* has an impurity concentration and a junction depth greater than those of the $n^-$ type semiconductor region 119*a*. By this step, in the memory cell region MA, a source region MS comprised of the $n^-$ type semiconductor region 119*a* and the $n^+$ type semiconductor region 119*b* is formed. In the peripheral circuit region PA, a source/drain region SD comprised of the $n^-$ type semiconductor region 119*a* and the $n^+$ type semiconductor region 119*b* is formed.

Figure 40:
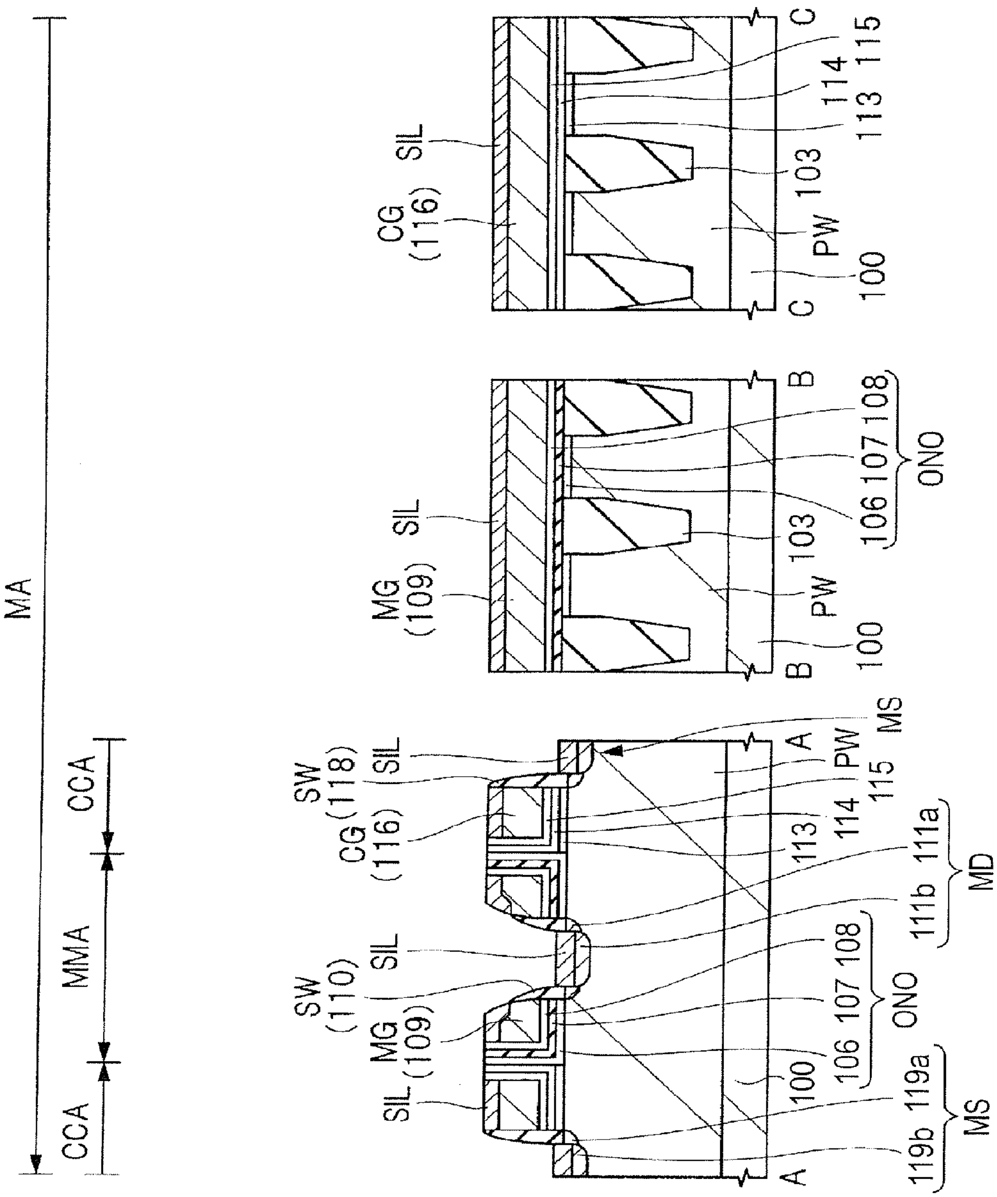
FIG. 40 is a cross-sectional view showing a manufacturing step of the semiconductor device of First Embodiment following that of FIG. 38.
Figure 41:
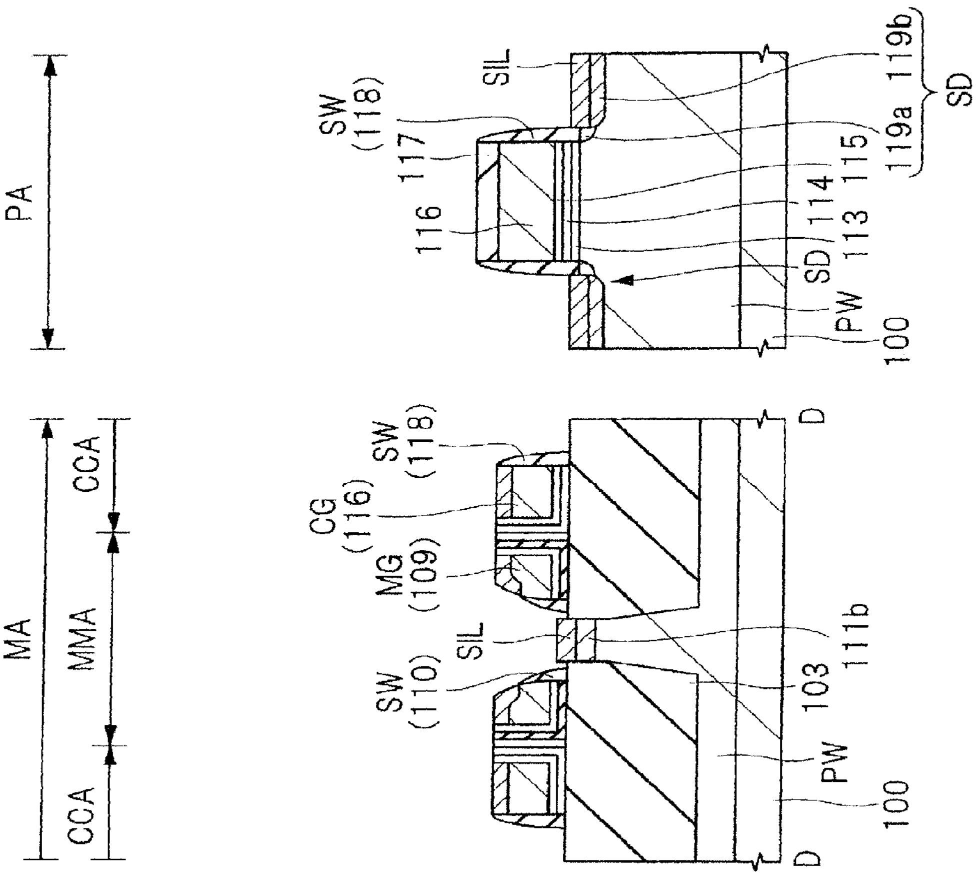
FIG. 41 is a cross-sectional view showing a manufacturing step of the semiconductor device of First Embodiment following that of FIG. 39.

Next, as shown in FIGS. 40 and 41, a metal silicide film SIL is formed on the control gate electrode portion CG, the memory gate electrode portion MG, the source region MS, the drain region MD, and the source/drain region SD by a salicide technology.

First, the silicon oxide film 112 is removed by wet etching or the like. This results in exposure of the control gate electrode portion CG, the memory gate electrode portion MG, the source region MS, the drain region MD, and the source/drain region SD. Then, a metal film (not illustrated) is formed on the semiconductor substrate 100, followed by thermal treatment of the semiconductor substrate 100 to cause a reaction between the metal film and each of the control gate electrode portion CG, the memory gate electrode portion MG, the source region MS, the drain region MD, and the source/drain region SD. As a result, a metal silicide film SIL is formed on each of the control gate electrode portion CG, the memory gate electrode portion MG, the source region MS, the drain region MD, and the source/drain region SD. The above-mentioned metal film is made of, for example, nickel or nickel-platinum (Pt) alloy and can be formed using sputtering or the like. Then, an unreacted portion of the metal film is removed. The metal silicide film SIL thus formed contributes to reduction in diffusion resistance or contact resistance.

Next, as shown in FIGS. 42 to 47, the polysilicon film 116 in the peripheral circuit region PA is substituted with a metal film 123 or the like to form a gate electrode portion GE of the peripheral transistor.

Figure 42:
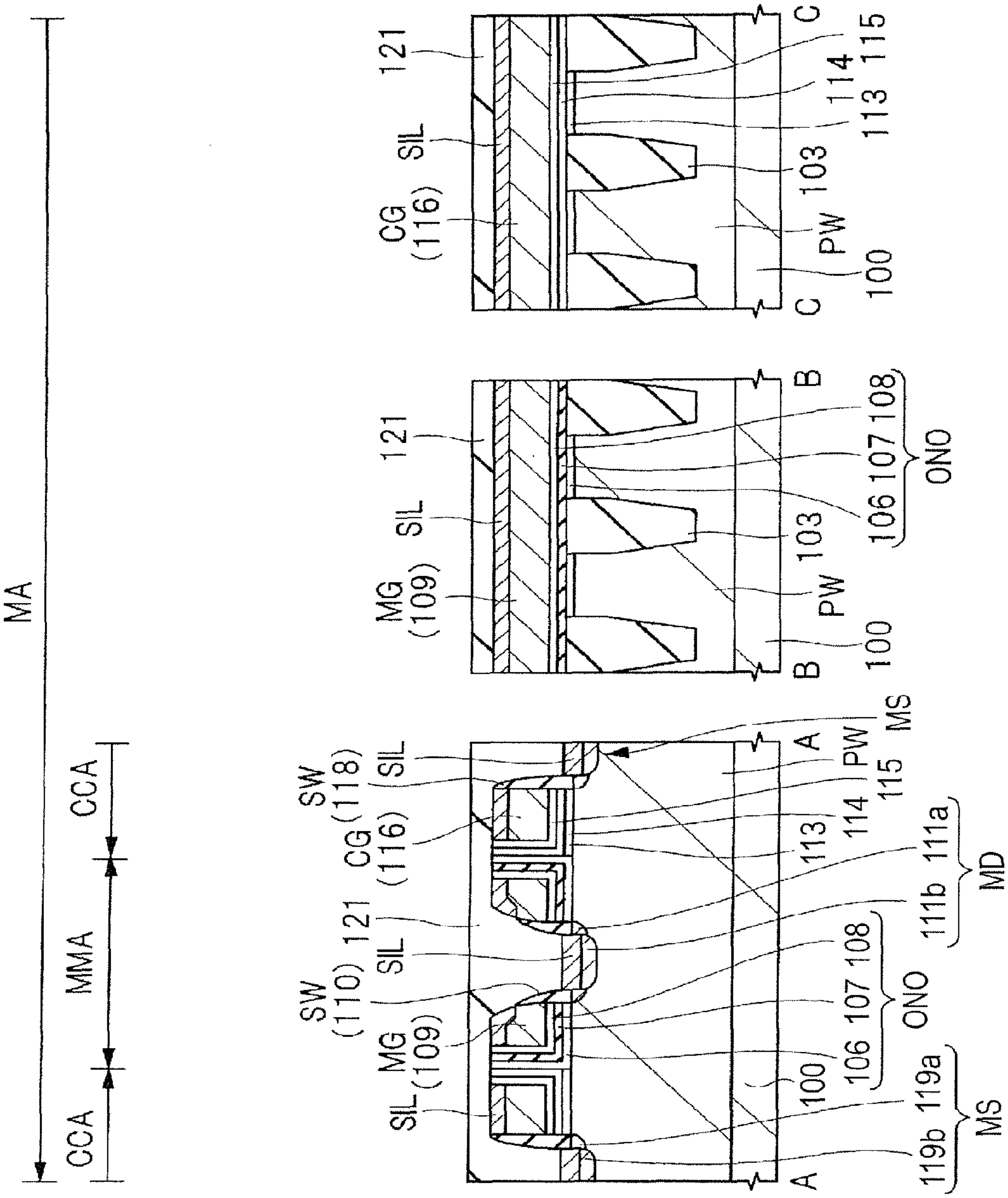
FIG. 42 is a cross-sectional view showing a manufacturing step of the semiconductor device of First Embodiment following that of FIG. 40.
Figure 43:
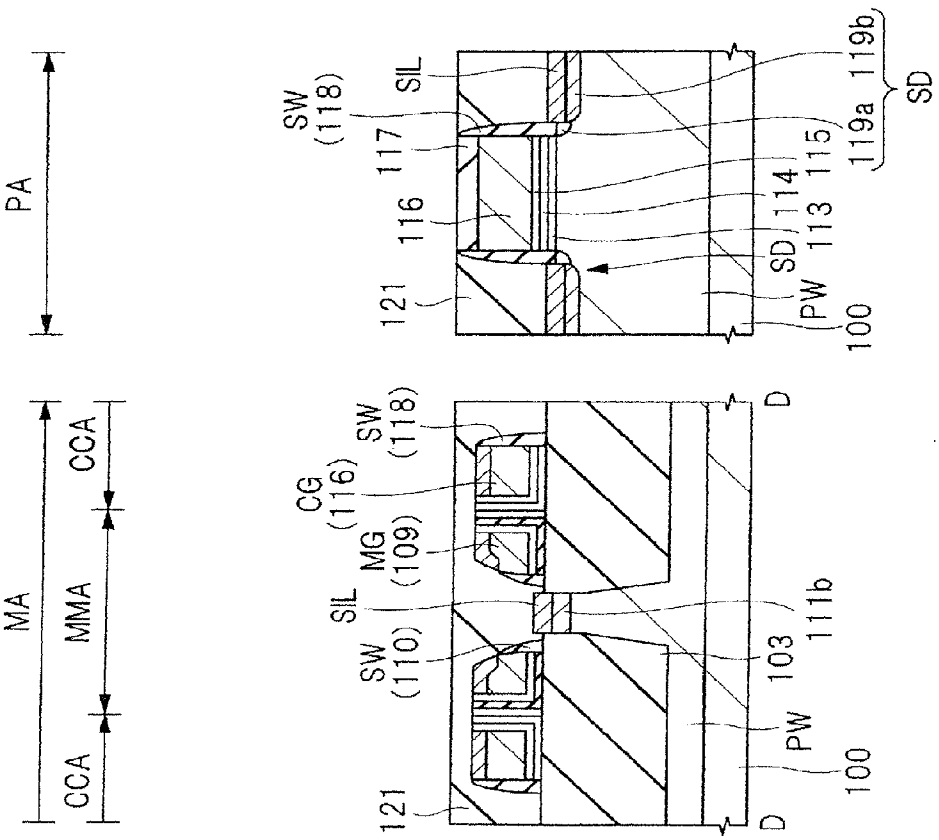
FIG. 43 is a cross-sectional view showing a manufacturing step of the semiconductor device of First Embodiment following that of FIG. 41.

First, as shown in FIGS. 42 and 43, a silicon oxide film 121 is deposited as an interlayer insulating film over the control gate electrode portion CG, the memory gate electrode portion MG, the polysilicon film 116 by CVD or the like. Next, an upper portion of this silicon oxide film 121 is removed until the surface of the silicon nitride film 117 is exposed. For example, an upper portion of the silicon oxide film 121 is polished using, for example, CMP or the like until exposure of the surface of the silicon nitride film 117. After completion of this step, the control gate electrode portion CG and the memory gate electrode portion MG have thereover the silicon oxide film 121.

Next, the silicon nitride film 117 is removed using wet etching or the like to expose the polysilicon film 116 in the peripheral circuit region PA. Next, the polysilicon film 116 is removed by etching. By this step, a recess (trench, dent) TGE is provided in a gate electrode portion formation region of the peripheral transistor.

Figure 44:
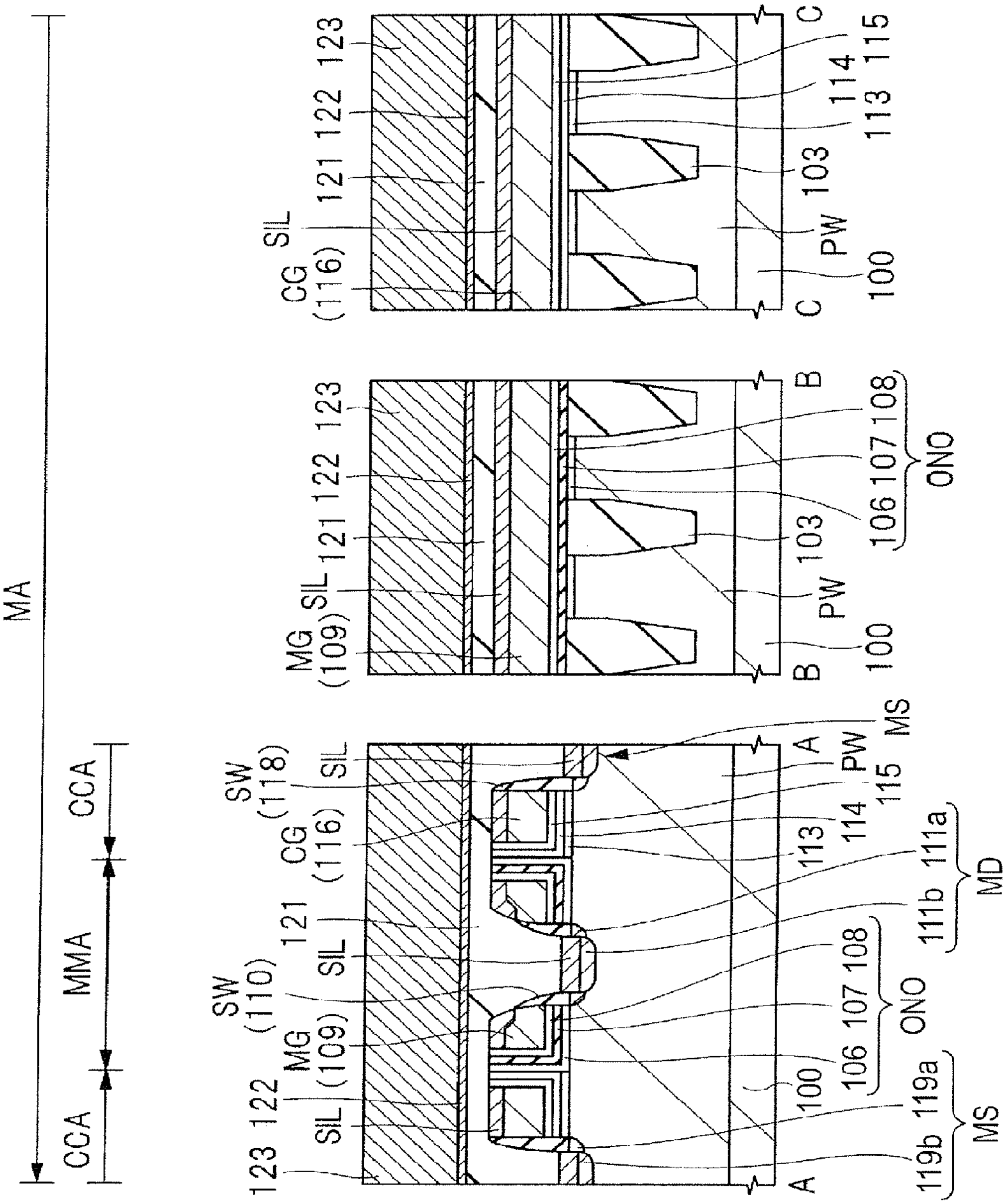
FIG. 44 is a cross-sectional view showing a manufacturing step of the semiconductor device of First Embodiment following that of FIG. 42.
Figure 45:
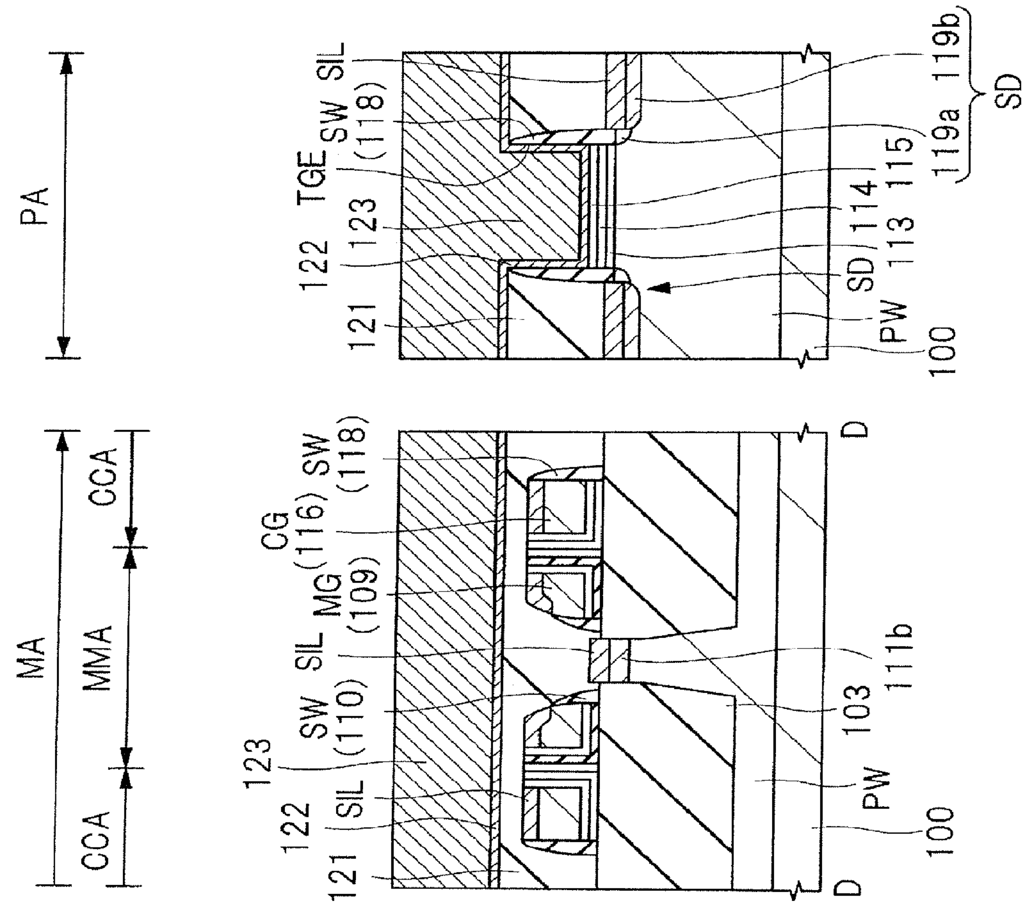
FIG. 45 is a cross-sectional view showing a manufacturing step of the semiconductor device of First Embodiment following that of FIG. 43.

Next, as shown in FIGS. 44 and 45, a metal electrode film 122 and a metal film 123 are formed on the silicon oxide film 121 and also in the recess TGE. For example, a film of about 20 nm thick made of tantalum nitride/titanium/aluminum or the like is deposited as the metal electrode film 122, followed by the formation of an aluminum film as the metal film 123. These films can be formed, for example, by sputtering.

Figure 46:
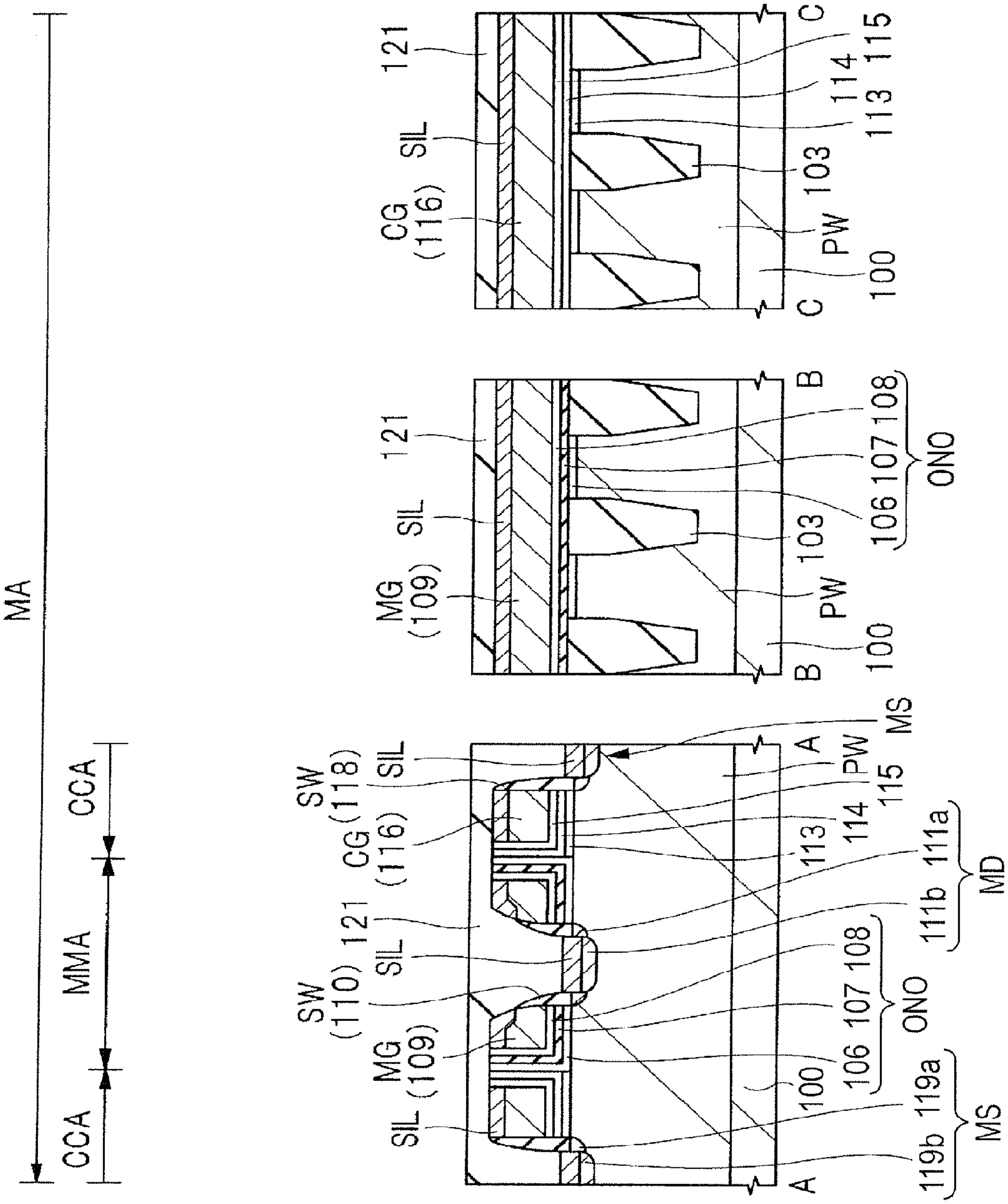
FIG. 46 is a cross-sectional view showing a manufacturing step of the semiconductor device of First Embodiment following that of FIG. 44.
Figure 47:
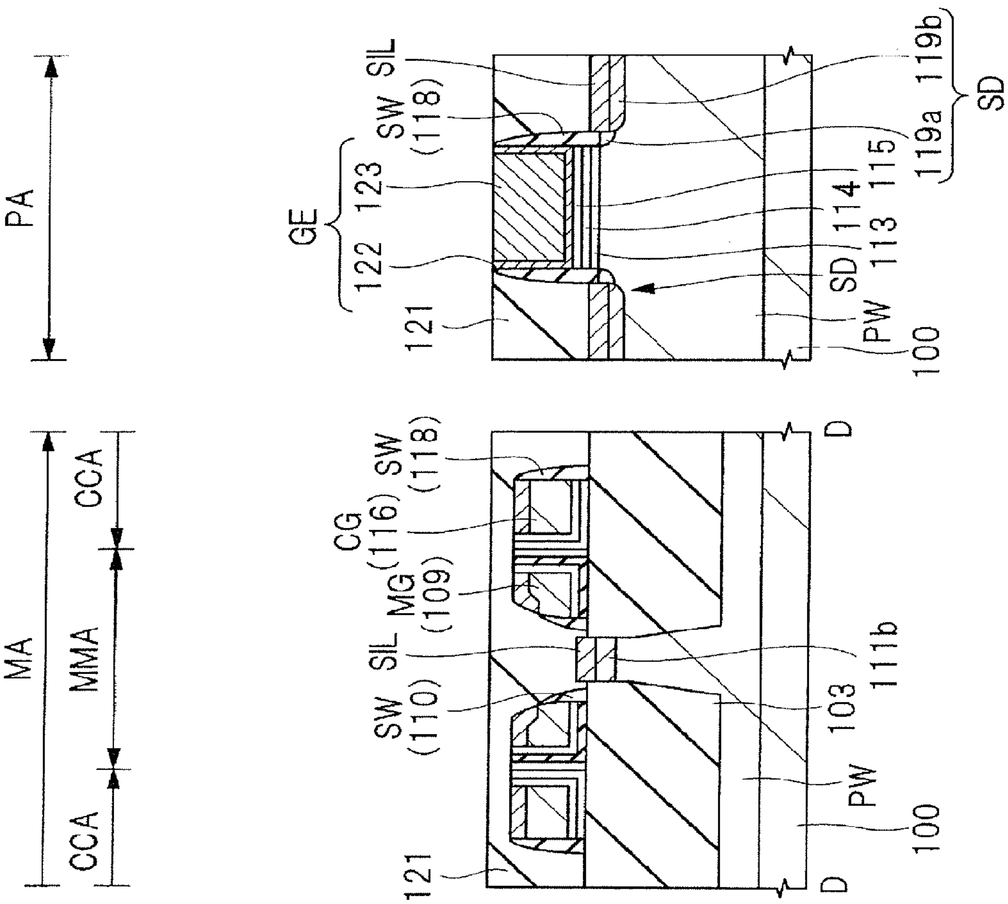
FIG. 47 is a cross-sectional view showing a manufacturing step of the semiconductor device of First Embodiment following that of FIG. 45.

Next, as shown in FIGS. 46 and 47, the metal electrode film 122 and the metal film 123 are removed until exposure of the surface of the silicon oxide film 121. For example, the metal electrode film 122 and the metal film 123 are are polished using CMP or the like until exposure of the surface of the silicon oxide film 121. By this step, the recess TGE is filled with the metal film 123 via the metal electrode film 122. This means that a gate electrode portion GE of the peripheral transistor is formed in the recess TGE. In other words, the polysilicon film 116 in the peripheral circuit region PA is substituted by the stacked film of the metal electrode film 122 and the metal film 123.

As the metal electrode film 122, a metal material, for example, a metal film or a metal compound film (for example, a metal nitride film) having conductivity can be used. This metal electrode film 122 configures a metal gate electrode. The metal electrode film 122 and the titanium nitride film 115 (metal compound film or barrier film) lying therebelow can also be regarded as the metal gate electrode. This titanium nitride film 115 (metal compound film or barrier film) functions as a barrier film for preventing diffusion of the metal material but it may be regarded as a part of the metal electrode film 122. The metal film 123 on the metal electrode film 122 is formed for further reduction in resistance of the gate electrode portion GE.

In the present embodiment, an n channel type MISFET is described as an example of the peripheral transistor, but a p channel type MISFET may be formed. The p channel type MISFET can be formed in a manner similar to that of the n channel type MISFET except that the conductivity type is reversed. As a metal electrode film of the p channel type MISFET, a film of about 20 nm thick made of tantalum nitride/titanium nitride/tantalum nitride can be used.

Figure 48:
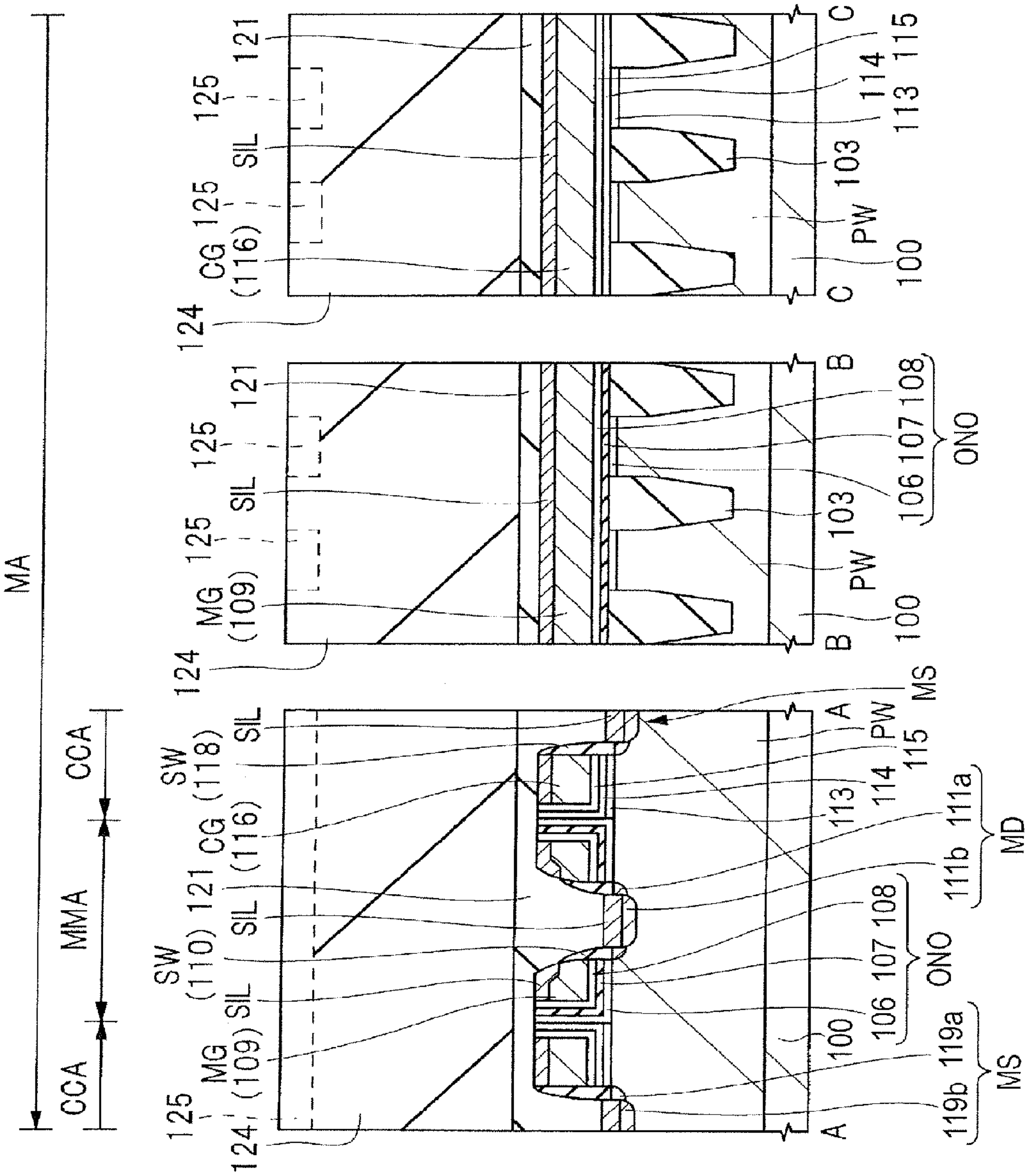
FIG. 48 is a cross-sectional view showing a manufacturing step of the semiconductor device of First Embodiment following that of FIG. 46.
Figure 49:
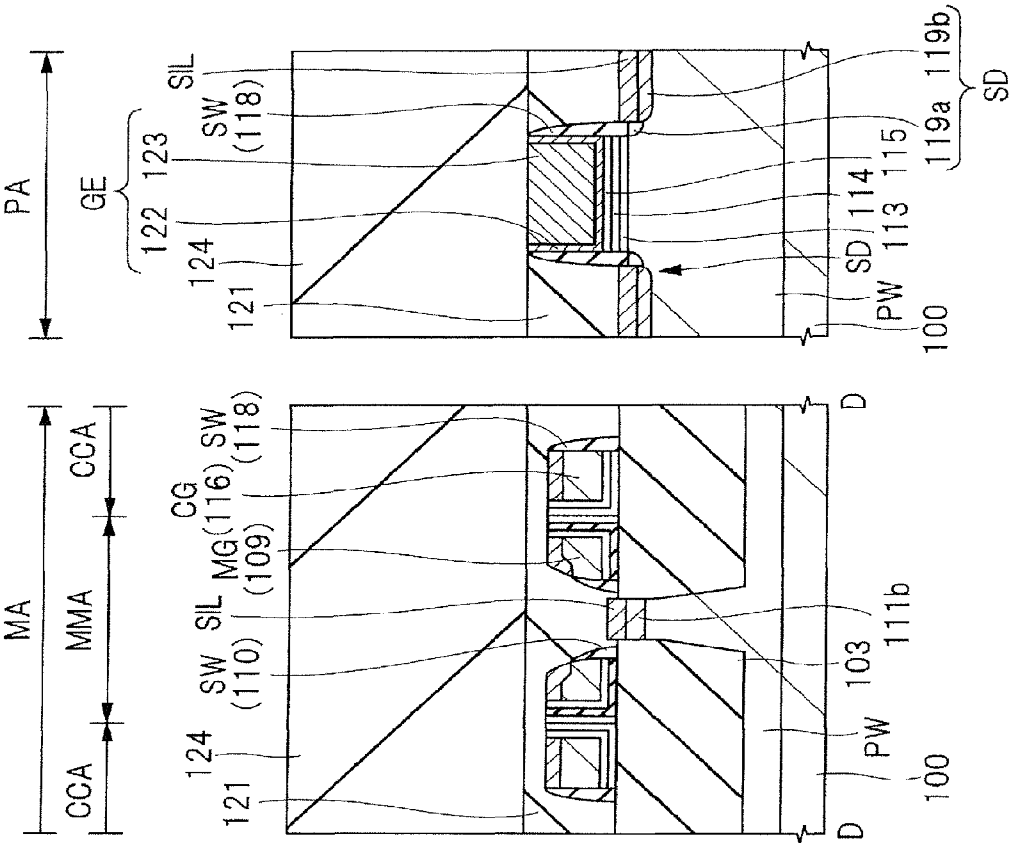
FIG. 49 is a cross-sectional view showing a manufacturing step of the semiconductor device of First Embodiment following that of FIG. 47.

Next, as shown in FIGS. 48 and 49, a silicon oxide film 124 is deposited as an interlayer insulating film on the silicon oxide film 121 and on the gate electrode portion GE by CVD or the like. Next, a plug (not illustrated) is formed in this silicon oxide film 124 and further, a wiring 125 is formed on the silicon oxide film 124. The plug can be formed by filling, with a conductive film, a contact hole in the interlayer insulating film. The wiring 125 can be formed, for example, by depositing a conductive film on the silicon oxide film 124 and then patterning it. Then, two or more wiring layers may be formed by repeating the above-mentioned step of forming an interlayer insulating film, a plug, and a wiring.

By the above-mentioned steps, the semiconductor device of the present embodiment can be formed. Thus, by the above-mentioned steps, a memory cell (memory transistor, control transistor) formed in a memory cell region MA and a peripheral transistor formed in a peripheral circuit region PA and having a high-k insulating film and a metal electrode film can be formed efficiently on the same semiconductor substrate. In other words, both a memory cell (memory transistor, control transistor) and a peripheral transistor employing a high-k/metal configuration can be provided on the same semiconductor substrate.

Second Embodiment

In the semiconductor device of First Embodiment, only the peripheral transistor employs a high-k/metal configuration, but the control transistor configuring the memory cell may employ this high-k/metal configuration.

The structure of a semiconductor device of the present embodiment will hereinafter be described referring to drawings.

[Description on Structure]

The semiconductor device of the present embodiment has a memory cell (memory transistor, control transistor) formed in a memory cell region MA and a peripheral transistor formed in a peripheral circuit region PA.

(Description on the Structure of a Memory Cell)

Figure 50:
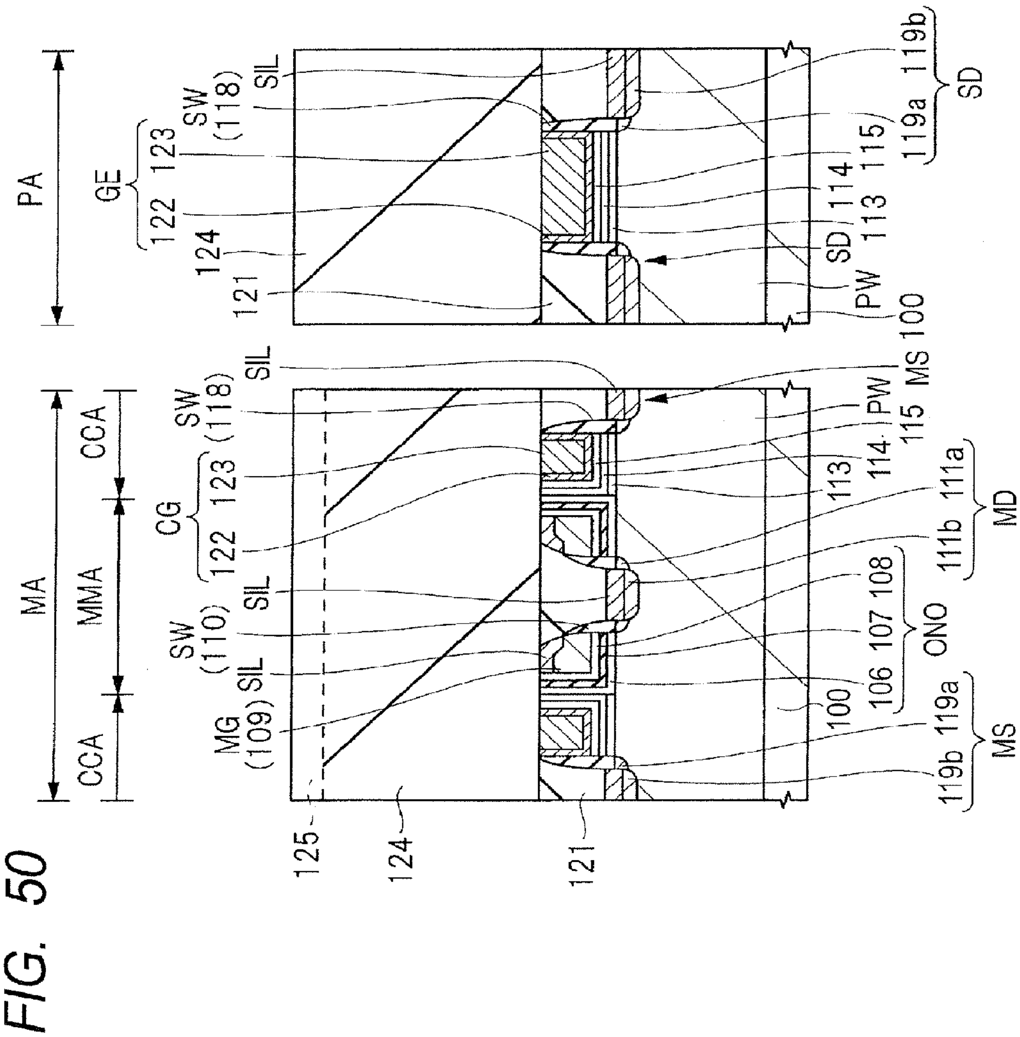
FIG. 50 is a cross-sectional view showing a semiconductor device of Second Embodiment.

FIG. 50 is a cross-sectional view showing the semiconductor device of the present embodiment. The semiconductor device of the present embodiment has a configuration similar to that of First Embodiment (refer to FIG. 1 and the like) except that the control gate electrode portion CG is comprised of a metal electrode film 122 and a metal film 123 thereon. In the semiconductor device of the present embodiment, however, not a silicon oxide film 121 but a silicon oxide film 124 is arranged on the control gate electrode portion CG and the memory gate electrode portion MG. In other words, the silicon oxide film 121 is arranged so as to fill between the control gate electrode portions CG and between the memory gate electrode portions MG and the silicon oxide film 121, the control gate electrode portion CG, and the memory gate electrode portion MG have thereon the silicon oxide film 124. The structure will hereinafter be described more specifically.

As shown in FIG. 50, the memory cell is comprised of a control transistor having a control gate electrode portion CG and a memory transistor having a memory gate electrode portion MG.

More specifically, the memory cell has, similar to that of First Embodiment, a control gate electrode portion CG provided over a semiconductor substrate 100 (p well PW) and a memory gate electrode portion MG provided over the semiconductor substrate 100 (p well PW) and adjacent to the control gate electrode portion CG. For example, the memory gate electrode portion MG is made of a silicon film and the control gate electrode portion CG is made of the metal electrode film 122 and the metal film 123 thereon. The silicon film has thereover a metal silicide film SIL.

The memory cell further has an insulating film and a metal compound film provided between the control gate electrode portion CG and the semiconductor substrate 100 (p well PW). The insulating film has a high dielectric constant film having a dielectric constant higher than that of a silicon nitride film. The memory cell has, as the insulating film, a silicon oxide film 113 and a high-k insulating film (high dielectric constant film) 114 and, as the metal compound film, a titanium nitride film 115 provided between the high-k insulating film 114 and the control gate electrode portion CG.

The high-k insulating film (high dielectric constant film) 114 lies between the control gate electrode portion CG and the semiconductor substrate 100 (p well PW) and between the control gate electrode portion CG and the memory gate electrode portion MG.

The titanium nitride film 115 (metal compound film) lies between the control gate electrode portion CG and the semiconductor substrate 100 (p well PW) and between the control gate electrode portion CG and the memory gate electrode portion MG.

The memory cell further has an insulating film ONO (106, 107, 108) provided between the memory gate electrode portion MG and the semiconductor substrate 100 (p well PW). The insulating film ONO is comprised of, for example, a silicon oxide film 106, a silicon nitride film 107 thereon, and a silicon oxynitride film 108 thereon. The silicon nitride film 107 will serve as a charge accumulation portion.

The insulating film ONO (106, 107, 108) lie between the memory gate electrode portion MG and the semiconductor substrate 100 (p well PW) and between the control gate electrode portion CG and the memory gate electrode portion MG.

This means that the control gate electrode portion CG and the memory gate electrode portion MG have therebetween the insulating film ONO (106, 107, 108), the high-k insulating film (high dielectric constant film) 114, and the metal compound film (titanium nitride film 115) which are provided successively from the side of the memory gate electrode portion MG.

The memory cell further has a source region MS and a drain region MD formed in the p well PW of the semiconductor substrate 100. The memory gate electrode portion MG and the control gate electrode portion CG have, on the sidewall portion of the synthesis pattern thereof, a sidewall film (sidewall insulating film, sidewall spacer) SW made of an insulating film.

Similar to First Embodiment, the source region MS is comprised of an $n^+$ type semiconductor region 119*b* and an $n^-$ type semiconductor region 119*a* and the drain region MD is comprised of an $n^+$ type semiconductor region 111*b* and an $n^-$ type semiconductor region 111*a*. The memory gate electrode portion MG, the source region MS ($n^+$ type semiconductor region 119*b*), the drain region MD ($n^+$ type semiconductor region 111*b*) have thereover a metal silicide film SIL.

The memory cell has thereon a silicon oxide film 121 as an interlayer insulating film and this silicon oxide film 121 has thereon a silicon oxide film 124 as an interlayer insulating film. The silicon oxide film 124 has thereon a wiring 125 and the like.

The configuration of the peripheral transistor is similar to that of First Embodiment so that a description on it is omitted. The operation example of the memory cell is also similar to that of First Embodiment so that a description on it is omitted.

Thus, according to the present embodiment, since the control gate electrode portion CG and the memory gate electrode portion MG have therebetween the high-k insulating film (high dielectric constant film) 114, the electric field intensity at the end portion (corner portion) of the memory gate electrode portion MG on the side of the control gate electrode portion CG is relaxed upon erasing as in First Embodiment. This results in reduction in uneven distribution of charges in the charge accumulation portion (silicon nitride film 107) and improvement in erase accuracy. In particular, erase accuracy can be improved even when the erase operation is performed using the above-mentioned FN tunneling system.

In addition, the control transistor also employs the high-k/metal configuration, which is useful for reducing the resistance of the control gate electrode portion and the power consumption of the control transistor. As a result, the resulting control transistor can have improved characteristics.

In the present embodiment, an n-MOS type memory cell has been described specifically, but a p-MOS type memory cell having the configuration of the present embodiment can produce an advantage similar to that of the n-MOS type memory cell. In addition, an n-MOS type transistor is used as the peripheral transistor, but a p-MOS type transistor may be used as the peripheral transistor. Both an n-MOS type transistor and a p-MOS type transistor may be formed in the peripheral circuit region PA.

Also to the semiconductor device of the present embodiment, the configuration of the memory array shown in FIGS. 4 and 5 or the circuit block example shown in FIG. 6, each described in First Embodiment, can be applied.

[Description on Manufacturing Method]

A method of manufacturing the semiconductor device of the present embodiment will next be described while referring to FIGS. 51 to 57. FIGS. 51 to 57 are cross-sectional views showing manufacturing steps of the semiconductor device of the present embodiment.

A step of forming a memory cell in the memory cell region MA and a peripheral transistor in the peripheral circuit region PA will hereinafter be described.

Steps until the step of forming the silicon nitride film 117 are similar to those of First Embodiment (FIGS. 16 to 37). Described specifically, as in First Embodiment, an element isolation region (103) is formed in the main surface of a semiconductor substrate 100 and a p well PW is formed in the semiconductor substrate 100. Next, as in First Embodiment, an insulating film ONO (106, 107, 108) and a memory gate electrode portion MG (polysilicon film 109) in sidewall shape are formed. Next, after formation of a drain region MD and a sidewall film SW, a silicon oxide film 112 is formed between the polysilicon films 109. Next, a silicon oxide film 113, a high-k insulating film 114, and a titanium nitride film 115 are formed on the semiconductor substrate 100, followed by the formation of a polysilicon film 116. Next, an upper portion of the polysilicon film 116 is removed. In such a manner, in the region MMA, a memory gate electrode portion MG is formed via the insulating film ONO (106, 107, 108), while in the region CCA, a polysilicon film 116 is formed via the silicon oxide film 113, the high-k insulating film 114, and the titanium nitride film 115. In the peripheral circuit region PA, the polysilicon film 116 is formed via the silicon oxide film 113, the high-k insulating film 114, and the titanium nitride film 115.

Figure 51:
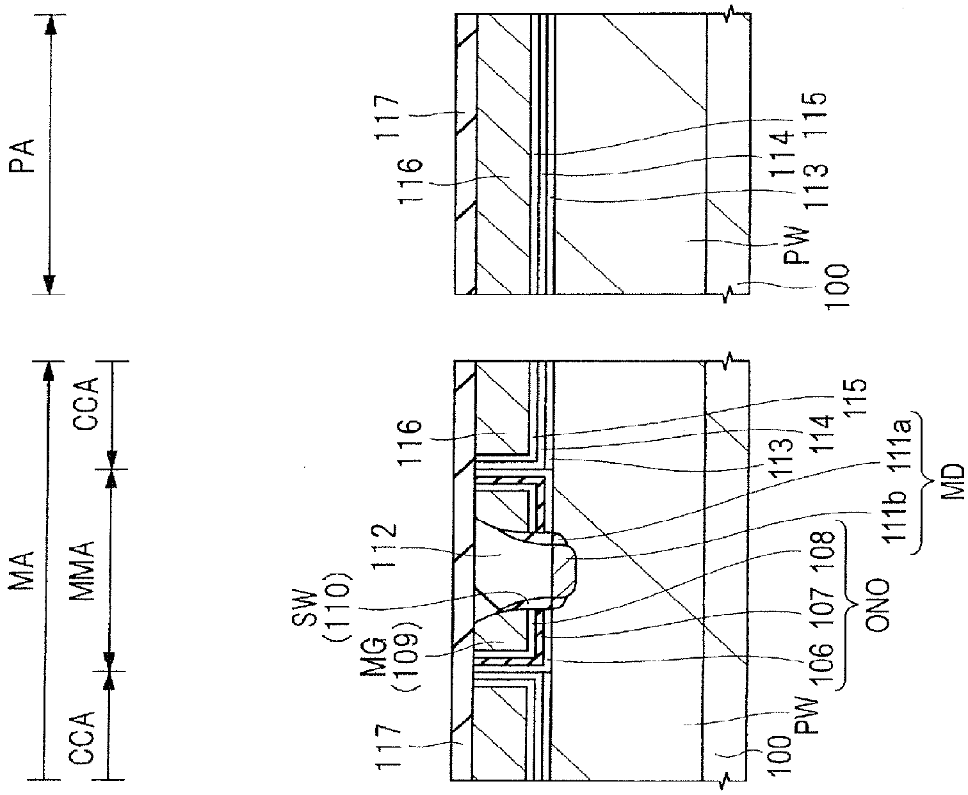
FIG. 51 is a cross-sectional view showing a manufacturing step of the semiconductor device of Second Embodiment.

Then, as shown in FIG. 51, a silicon nitride film 117 is deposited on the polysilicon films 116 and 109 and the silicon oxide film 112 by CVD or the like.

Figure 52:
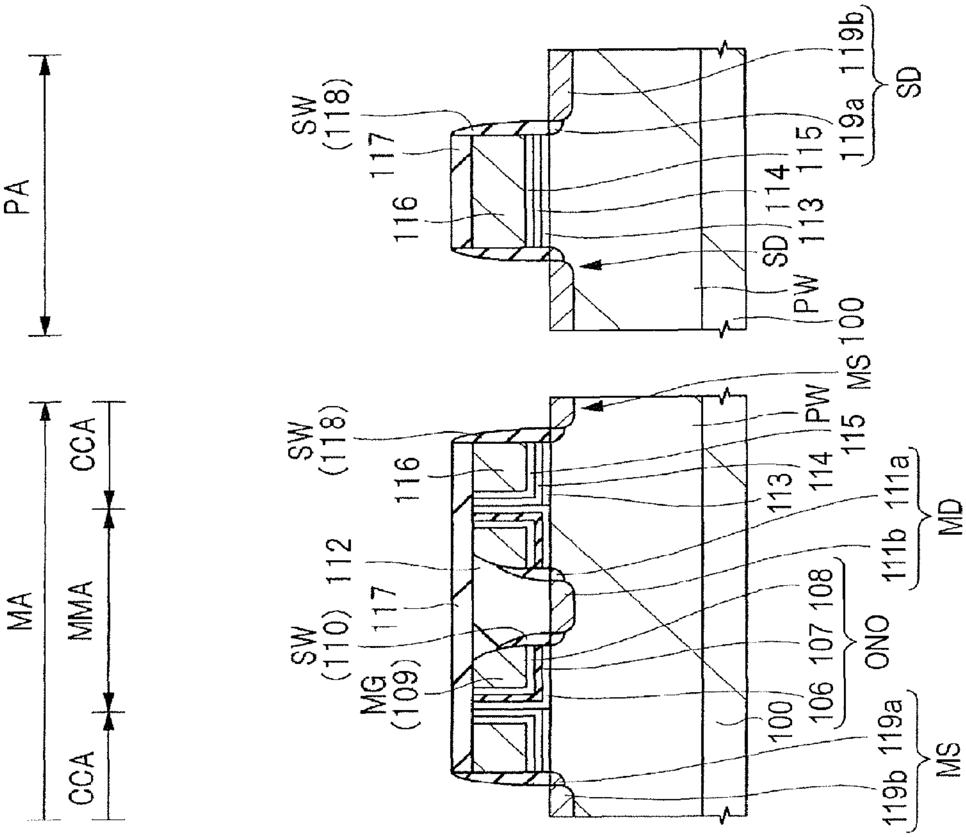
FIG. 52 is a cross-sectional view showing a manufacturing step of the semiconductor device of Second Embodiment following that of FIG. 51.

Next, as shown in FIG. 52, by photolithography and dry etching, the silicon nitride film 117 is left in the control gate electrode portion formation region and the region MMA in the memory cell region MA, while the silicon nitride film 117 is left in the gate electrode portion formation region in the peripheral circuit region PA. Then, with the resulting silicon nitride film 117 as a mask, the polysilicon film 116 and the like are etched. The remaining polysilicon film 116 is a polysilicon film for substitution of a control gate electrode portion or for substitution of a gate electrode portion.

Next, with the silicon nitride film 117 and the like as a mask, an n type impurity such as arsenic (As) or phosphorus (P) is implanted into the exposed portion of the semiconductor substrate 100 (p well PW) to form an $n^-$ type semiconductor region 119_a_. At this time, the $n^-$ type semiconductor region 119_a_ is formed in self alignment with the sidewall of the polysilicon film 116. Next, as in First Embodiment, a sidewall film (sidewall insulating film) SW is formed on the sidewall portion of the polysilicon film 116 and with the polysilicon film 116, the sidewall film SW, and the like as a mask, an n type impurity such as arsenic (As) or phosphorus (P) is implanted into the semiconductor substrate 100 (p well PW) to form an $n^+$ type semiconductor region 119_b_ in self alignment with the sidewall film SW. This $n^+$ type semiconductor region 119_b_ has an impurity concentration and a junction depth greater than those of the n type semiconductor region 119_a_. By this step, in the memory cell region MA, a source region MS comprised of the $n^-$ type semiconductor region 119_a_ and the $n^+$ type semiconductor region 119_b_ is formed. In the peripheral circuit region PA, a source/drain region SD comprised of the $n^-$ type semiconductor region 119_a_ and the $n^+$ type semiconductor region 119_b_ is formed.

Figure 53:
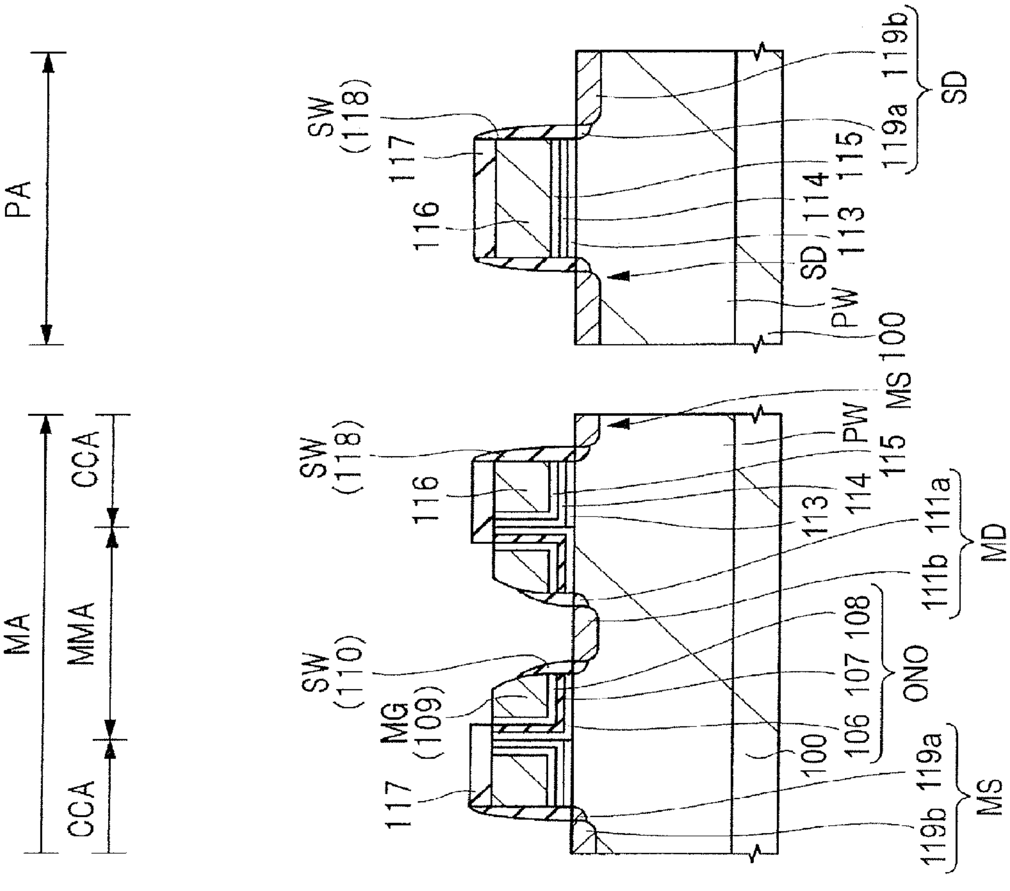
FIG. 53 is a cross-sectional view showing a manufacturing step of the semiconductor device of Second Embodiment following that of FIG. 52.
Figure 54:
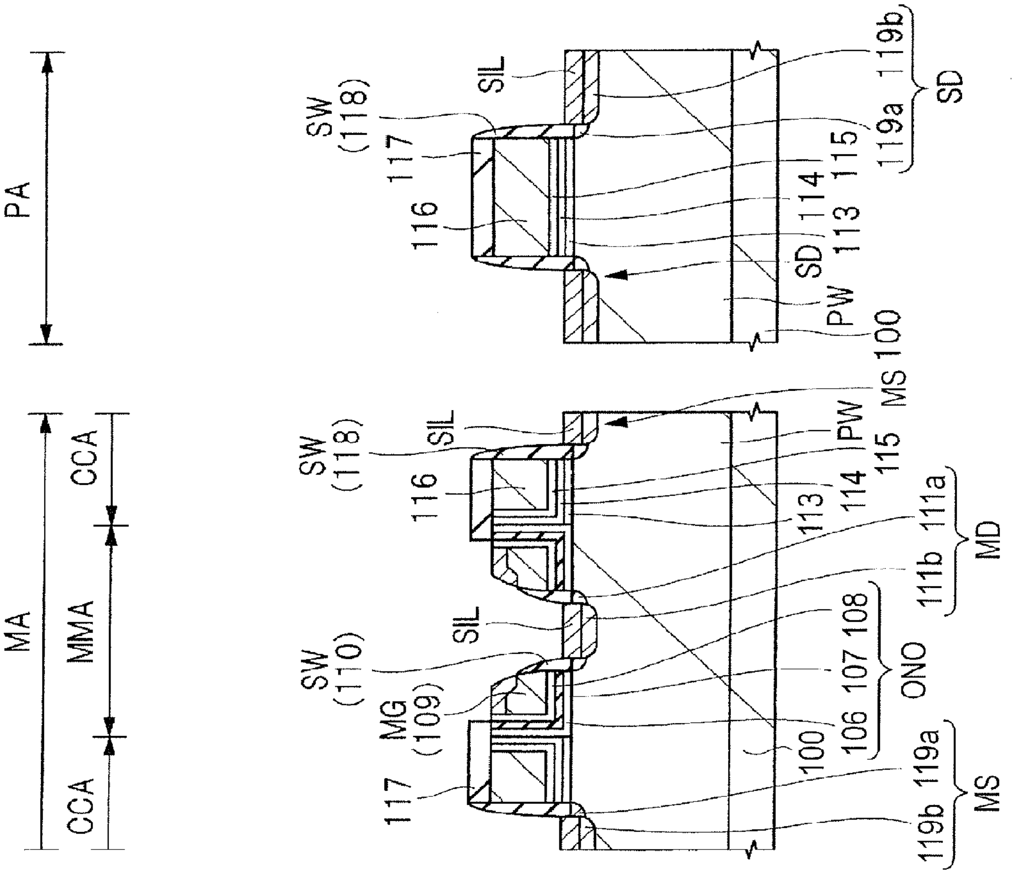
FIG. 54 is a cross-sectional view showing a manufacturing step of the semiconductor device of Second Embodiment following that of FIG. 53.

Next, as shown in FIG. 53, the silicon nitride film 117 on the memory gate electrode portion MG is removed and as in First Embodiment, a metal silicide film SIL is formed (FIG. 54). First, the silicon nitride film 117 is removed by wet etching or the like. As a result, the memory gate electrode portion MG, the source region MS, the drain region MD, and the source/drain region SD are exposed. Next, a metal film (not illustrated) is formed on the semiconductor substrate 100. The resulting semiconductor substrate 100 is heat treated to cause a reaction between the metal film and each of the memory gate electrode portion MG, the source region MS, the drain region MD, and the source/drain region SD, resulting in formation of a metal silicide film SIL over each of the memory gate electrode portion MG, the source region MS, the drain region MD, and the source/drain region SD.

Figure 55:
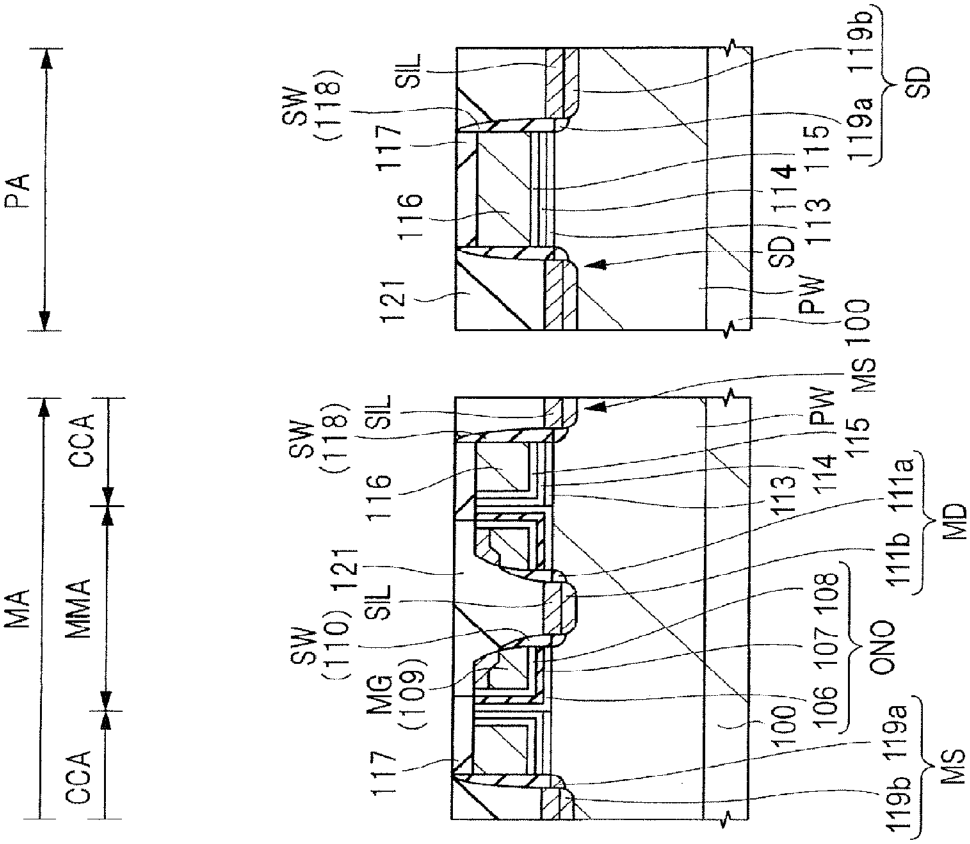
FIG. 55 is a cross-sectional view showing a manufacturing step of the semiconductor device of Second Embodiment following that of FIG. 54.

Next, as shown in FIG. 55, a silicon oxide film 121 is deposited as an interlayer insulating film over the memory gate electrode portion MG, the source region MS, the drain region MD, the source/drain region SD, and the polysilicon film 116 by CVD or the like. Next, an upper portion of the silicon oxide film 121 is removed until the surface of the silicon nitride film 117 is exposed. For example, the upper portion of the silicon oxide film 121 is polished using CMP or the like until the surface of the silicon nitride film 117 is exposed. Then, the silicon nitride film 117 is removed by wet etching or the like to expose the polysilicon film 116 in the memory cell region MA and the peripheral circuit region PA. Next, the polysilicon film 116 is removed by etching. By this step, a recess (trench, dent) TCG is provided in the control gate electrode portion formation region and a recess TGE is provided in the gate electrode portion formation region of the peripheral transistor.

Figure 56:
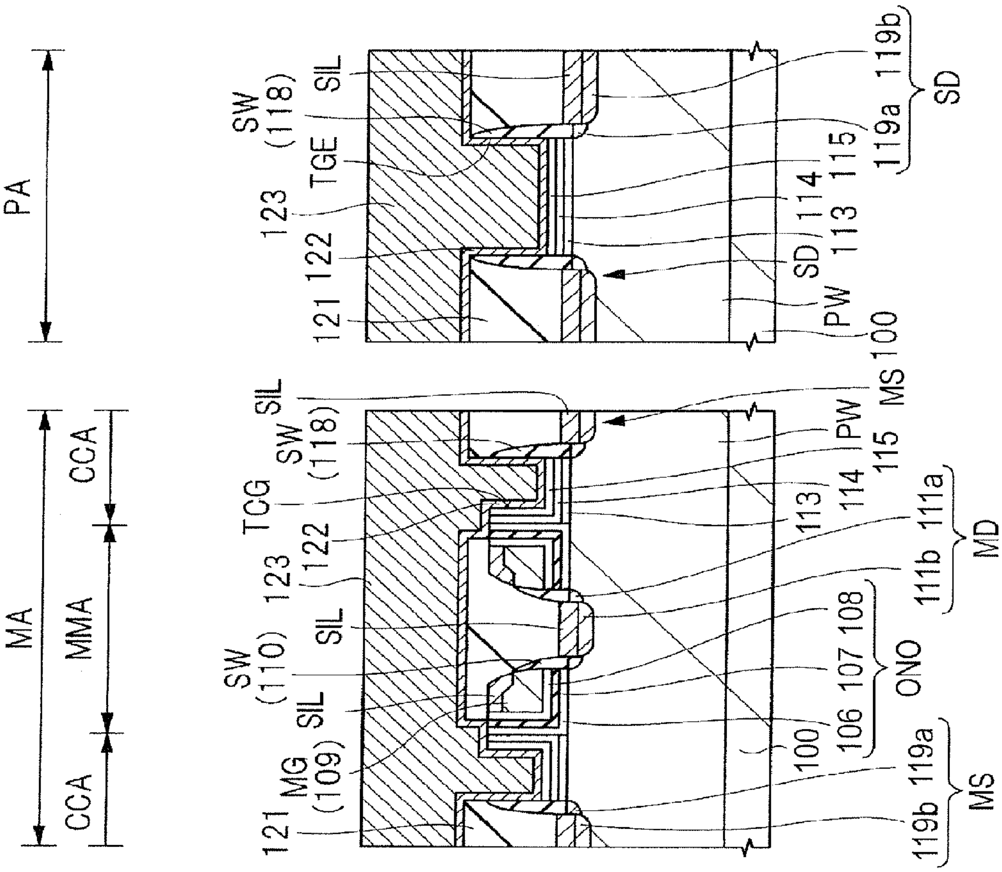
FIG. 56 is a cross-sectional view showing a manufacturing step of the semiconductor device of Second Embodiment following that of FIG. 55.

Next, as shown in FIG. 56, a metal electrode film 122 and a metal film 123 are formed on the silicon oxide film 121 and also in the recesses TOG and TGE. For example, a film of about 20 nm thick made of tantalum nitride/titanium/aluminum or the like is deposited, followed by the formation of an aluminum film. These films can be formed, for example, by sputtering.

Figure 57:
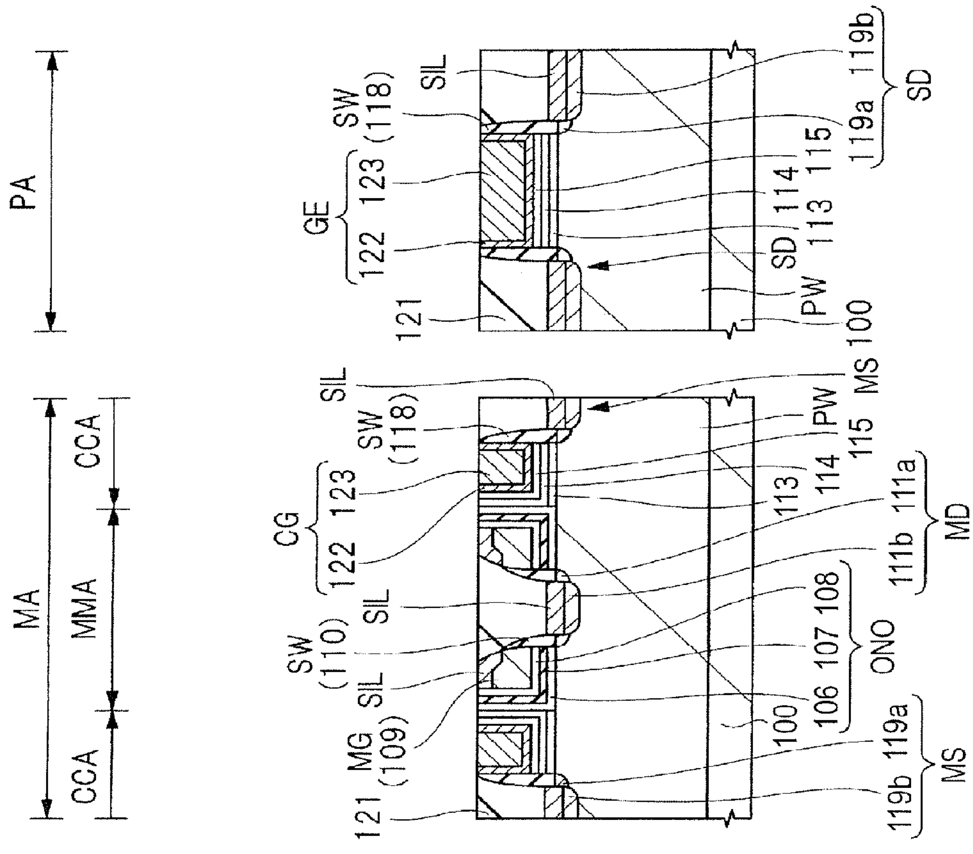
FIG. 57 is a cross-sectional view showing a manufacturing step of the semiconductor device of Second Embodiment following that of FIG. 56.

Next, as shown in FIG. 57, the metal electrode film 122 and the metal film 123 are removed until exposure of the surface of the silicon oxide film 121. For example, the metal electrode film 122 and the metal film 123 are polished using CMP or the like until exposure of the surface of the silicon nitride film 117. By this step, the recesses TCG and TGE are filled with the metal film 123 via the metal electrode film 122. This means that a control gate electrode portion CG is formed in the recess TCG and a gate electrode portion GE of the peripheral transistor is formed in the recess TGE. In other words, the polysilicon film 116 in the memory cell region MA is substituted by a stacked film of the metal electrode film 122 and the metal film 123 and the polysilicon film 116 in the peripheral circuit region PA is substituted by a stacked film of the metal electrode film 122 and the metal film 123.

Next, a silicon oxide film 124 is deposited as an interlayer insulating film on the silicon oxide film 121, the gate electrode portion GE, and the like by CVD or the like. Next, a plug (not illustrated) is formed in this silicon oxide film 124 and further, a wiring 125 is formed on the silicon oxide film 124 (refer to FIG. 50). The plug can be formed by filling, with a conductive film, a contact hole in the interlayer insulating film. The wiring 125 can be formed, for example, by depositing a conductive film on the silicon oxide film 124 and then patterning it. Then, two or more wiring layers may be formed by performing the step of forming the interlayer insulating film, plug, and wiring in repetition.

By the above-mentioned steps, the semiconductor device of the present embodiment can be formed. Thus, by the above-mentioned steps, a memory cell formed in a memory cell region MA and having a control transistor having a high-k insulating film and a metal electrode film and a peripheral transistor formed in a peripheral circuit region PA and having a high-k insulating film and a metal electrode film can be formed efficiently on the same semiconductor substrate. In other words, both a memory cell employing a high-k/metal configuration and a peripheral transistor employing a high-k/metal configuration can be provided on the same semiconductor substrate.

Third Embodiment

In the semiconductor device of First Embodiment, only the peripheral transistor uses a metal electrode film, but the memory transistor and the control transistor configuring the memory cell may use the metal electrode film.

The structure of a semiconductor device of the present embodiment will hereinafter be described referring to drawings.

[Description on Structure]

The semiconductor device of the present embodiment has a memory cell (memory transistor, control transistor) formed in a memory cell region MA and a peripheral transistor formed in a peripheral circuit region PA.

(Description on Structure of Memory Cell)

Figure 58:
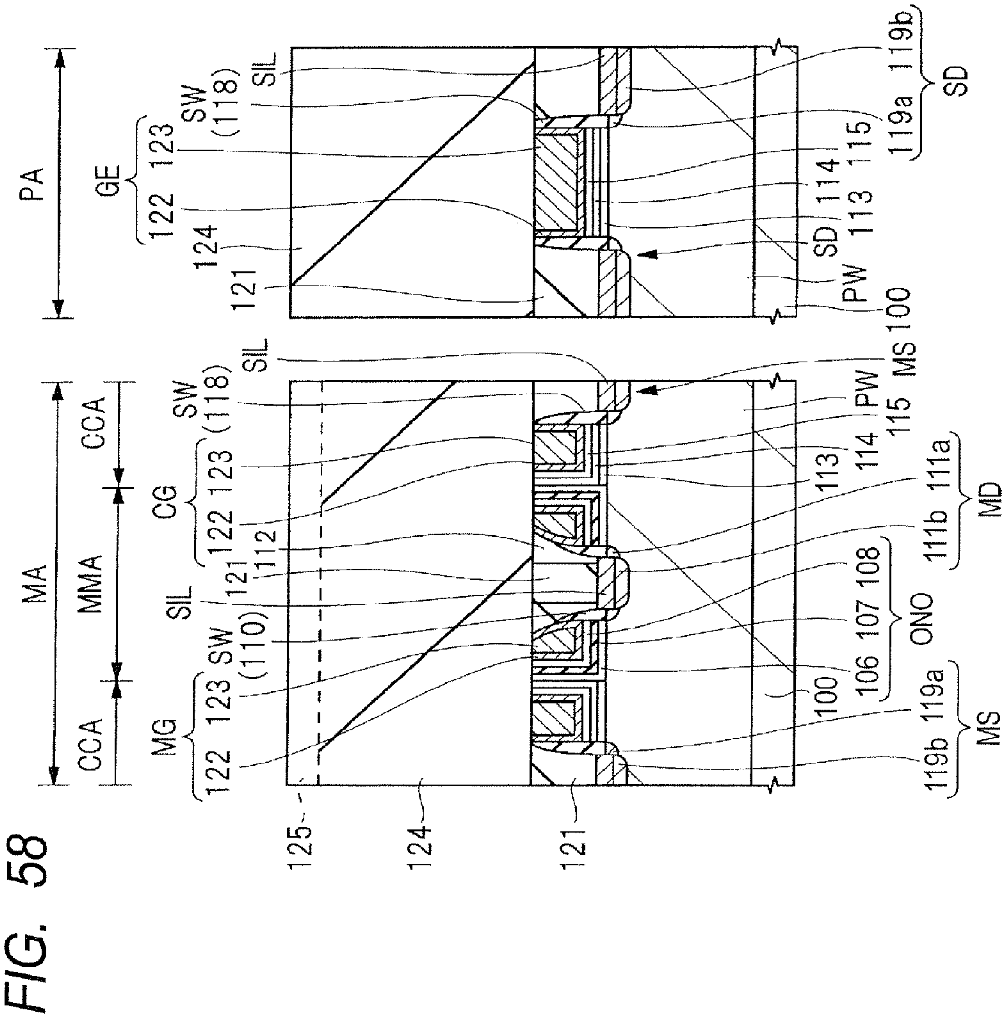
FIG. 58 is a cross-sectional view showing a semiconductor device of Third Embodiment.

FIG. 58 is a cross-sectional view showing the semiconductor device of the present embodiment. It has a configuration similar to that of First Embodiment (refer to FIG. 1 and the like) except that each of the memory gate electrode portion MG and the control gate electrode portion CG is comprised of a metal electrode film 122 and a metal film 123 thereon. In the semiconductor device of the present embodiment, however, the control gate electrode portion CG and the memory gate electrode portion MG each have not thereon the silicon oxide film 121 but a silicon oxide film 124. This means that the silicon oxide film 121 is arranged so as to fill between the control gate electrode portions CG and between the memory gate electrode portions MG. The silicon oxide film 121, the control gate electrode portion CG, and the memory gate electrode portion MG have thereon the silicon oxide film 124. The structure of the present embodiment will hereinafter be described in detail.

As shown in FIG. 58, the memory cell is comprised of a control transistor having a control gate electrode portion CG and a memory transistor having a memory gate electrode portion MG.

More specifically, the memory cell has, similar to that of First Embodiment, a control gate electrode portion CG provided over a semiconductor substrate 100 (p well PW) and a memory gate electrode portion MG provided over the semiconductor substrate 100 (p well PW) and adjacent to the control gate electrode portion CG. For example, the memory gate electrode portion MG and the control gate electrode portion CG are each made of a metal electrode film 122 and a metal film 123 thereon.

The memory cell further has an insulating film and a metal compound film provided between the control gate electrode portion CG and the semiconductor substrate 100 (p well PW). The insulating film has a high dielectric constant film having a dielectric constant higher than that of a silicon nitride film. The memory cell has, as the insulating film, a silicon oxide film 113 and a high-k insulating film (high dielectric constant film) 114 and, as the metal compound film, a titanium nitride film 115 provided between the high-k insulating film 114 and the control gate electrode portion CG.

The high-k insulating film (high dielectric constant film) 114 lies between the control gate electrode portion CG and the semiconductor substrate 100 (p well PW) and between the control gate electrode portion CG and the memory gate electrode portion MG.

The titanium nitride film 115 (metal compound film) lies between the control gate electrode portion CG and the semiconductor substrate 100 (p well PW) and between the control gate electrode portion CG and the memory gate electrode portion MG.

The memory cell further has an insulating film ONO (106, 107, 108) provided between the memory gate electrode portion MG and the semiconductor substrate 100 (p well PW). The insulating film ONO is comprised of, for example, a silicon oxide film 106, a silicon nitride film 107 thereon, and a silicon oxynitride film 108 thereon. The silicon nitride film 107 will serve as a charge accumulation portion.

The insulating film ONO (106, 107, 108) lies between the memory gate electrode portion MG and the semiconductor substrate 100 (p well PW) and between the control gate electrode portion CG and the memory gate electrode portion MG.

This means that the control gate electrode portion CG and the memory gate electrode portion MC have therebetween the insulating film ONO (106, 107, 108), the high-k insulating film (high dielectric constant film) 114, and the metal compound film (titanium nitride film 115) provided successively from the side of the memory gate electrode portion MG.

The memory cell further has a source region MS and a drain region MD in the p well PW of the semiconductor substrate 100. The memory gate electrode portion MG and the control gate electrode portion CG have, on the sidewall portion of the synthesis pattern thereof, a sidewall film (sidewall insulating film, sidewall spacer) SW made of an insulating film.

As in First Embodiment, the source region MS is comprised of the $n^+$ type semiconductor region 119*b* and the $n^-$ type semiconductor region 119*a* and the drain region MD is comprised of the $n^+$ type semiconductor region 111*b* and the $n^-$ type semiconductor region 111*a*. The source region MS ($n^+$ type semiconductor region 119*b*) and the drain region MD ($n^+$ type semiconductor region 111*b*) have thereover a metal silicide film SIL.

The memory cell region MA has, as an interlayer insulating film, a silicon oxide film 121 and this silicon oxide film 121 has thereon a silicon oxide film 124 as an interlayer insulating film. This silicon oxide film 124 has thereon a wiring 125 and the like.

The configuration of the peripheral transistor is similar to that of First Embodiment so that a description on it is omitted. An operation example of the memory cell is also similar to that of First Embodiment so that a description on it is omitted.

In the present embodiment, since the control gate electrode portion CG and the memory gate electrode portion MG have therebetween the high-k insulating film (high dielectric constant film) 114, an electric field intensity at the end portion (corner portion) of the memory gate electrode portion MG on the side of the control gate electrode portion CG is relaxed upon erasing as in First Embodiment. This makes it possible to reduce the uneven distribution of charges in the charge accumulation portion (silicon nitride film 107) and thereby improve the erase accuracy. In particular, erase accuracy can be improved even when the erase operation is performed using the above-mentioned EN tunneling system.

In addition, using a metal electrode film also for the control transistor and the memory transistor is effective for reducing the resistance of the control gate electrode portion and the memory gate electrode portion and reducing the power consumption of these transistors. As a result, these transistors can have improved characteristics.

In the present embodiment, an n-MOS type memory cell has been described specifically, but a p-MOS type memory cell having the configuration of the present embodiment can produce an advantage similar to that of the n-MOS type memory cell. In addition, an n-MOS type transistor is shown as an example of a peripheral transistor, but a p-MOS type transistor may be used as the peripheral transistor. Both an n-MOS type transistor and a p-MOS type transistor may be formed in the peripheral circuit region PA.

Also to the semiconductor device of the present embodiment, the configuration of the memory array shown in FIGS. 4 and 5 or the circuit block example shown in FIG. 6, each described in First Embodiment, can be applied.

[Description on Manufacturing Method]

A method of manufacturing the semiconductor device of the present embodiment will next be described while referring to FIGS. 59 to 64. FIGS. 59 to 64 are cross-sectional views showing manufacturing steps of the semiconductor device of the present embodiment.

A step of forming a memory cell in the memory cell region MA and a peripheral transistor in the peripheral circuit region PA will hereinafter be described.

Steps until the step of forming a silicon nitride film 117 are similar to those of First Embodiment (FIGS. 16 to 37). Described specifically, as in First Embodiment, an element isolation region (103) is formed in the main surface of a semiconductor substrate 100 and a p well PW is formed in the semiconductor substrate 100. Next, as in First Embodiment, an insulating film ONO (106, 107, 108) and polysilicon film 109 in sidewall shape are formed. This polysilicon film 109 is a polysilicon film for substitution of a memory gate electrode portion. Next, after formation of a drain region MD and a sidewall film SW, a silicon oxide film 112 is formed between the polysilicon films 109. Next, a silicon oxide film 113, a high-k insulating film 114, and a titanium nitride film 115 are formed on the semiconductor substrate 100, followed by the formation of a polysilicon film 116 thereon. Next, an upper portion of the polysilicon film 116 is removed. In such a manner, in the region MMA, the polysilicon film 109 is formed via the insulating film ONO (106, 107, 108), while in the region CCA, the polysilicon film 116 is formed via the silicon oxide film 113, the high-k insulating film 114, and the titanium nitride film 115. In the peripheral circuit region PA, the polysilicon film 116 is formed via the silicon oxide film 113, the high-k insulating film 114, and the titanium nitride film 115. This polysilicon film 109 is a polysilicon film for substitution of a memory gate electrode portion. The polysilicon film 116 is a polysilicon film for substitution of a control gate electrode portion or substitution of a gate electrode portion.

Figure 59:
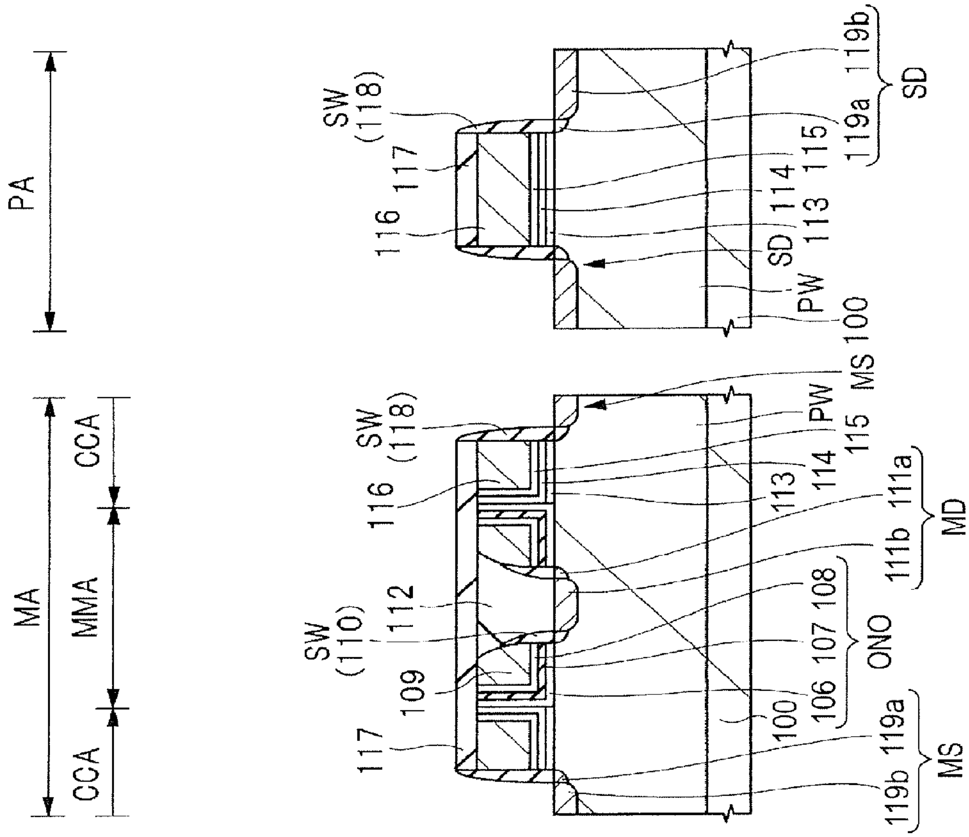
FIG. 59 is a cross-sectional view showing a manufacturing step of the semiconductor device of Third Embodiment.

Then, as shown in FIG. 59, a silicon nitride film 117 is deposited on the polysilicon films 116 and 109 and the silicon oxide film 112 by CVD or the like. Next, in the memory cell region MA, the silicon nitride film 117 is left in the control gate electrode portion formation region and the region MMA by photolithography and etching. In the peripheral circuit region PA, the silicon nitride film 117 is left in the gate electrode portion formation region.

Next, with the silicon nitride film 117 and the like as a mask, an $n^-$ type semiconductor region 119*a* is formed by the implantation of an n type impurity such as arsenic (As) or phosphorus (P) into the exposed portion of the semiconductor substrate 100 (p well PW). At this time, the $n^-$ type semiconductor region 119*a* is formed in self alignment with the sidewall of the polysilicon film 116. Next, as in First Embodiment, a sidewall film (sidewall insulating film) SW is formed on the sidewall portion of the polysilicon film 116 and with the polysilicon film 116, the sidewall film SW, and the like as a mask, an n type impurity such as arsenic (As) or phosphorus (P) is implanted into the semiconductor substrate 100 (p well PW). As a result, an $n^+$ type semiconductor region 119*b* is formed in self alignment with the sidewall film SW. This $n^+$ type semiconductor region 119*b* has an impurity concentration and a junction depth greater than those of the $n^-$ type semiconductor region 119*a*. By this step, in the memory cell region MA, a source region MS comprised of the $n^-$ type semiconductor region 119*a* and the $n^+$ type semiconductor region 119*b* is formed. In the peripheral circuit region PA, a source/drain region SD comprised of the $n^-$ type semiconductor region 119*a* and the $n^+$ type semiconductor region 119*b* is formed.

Figure 60:
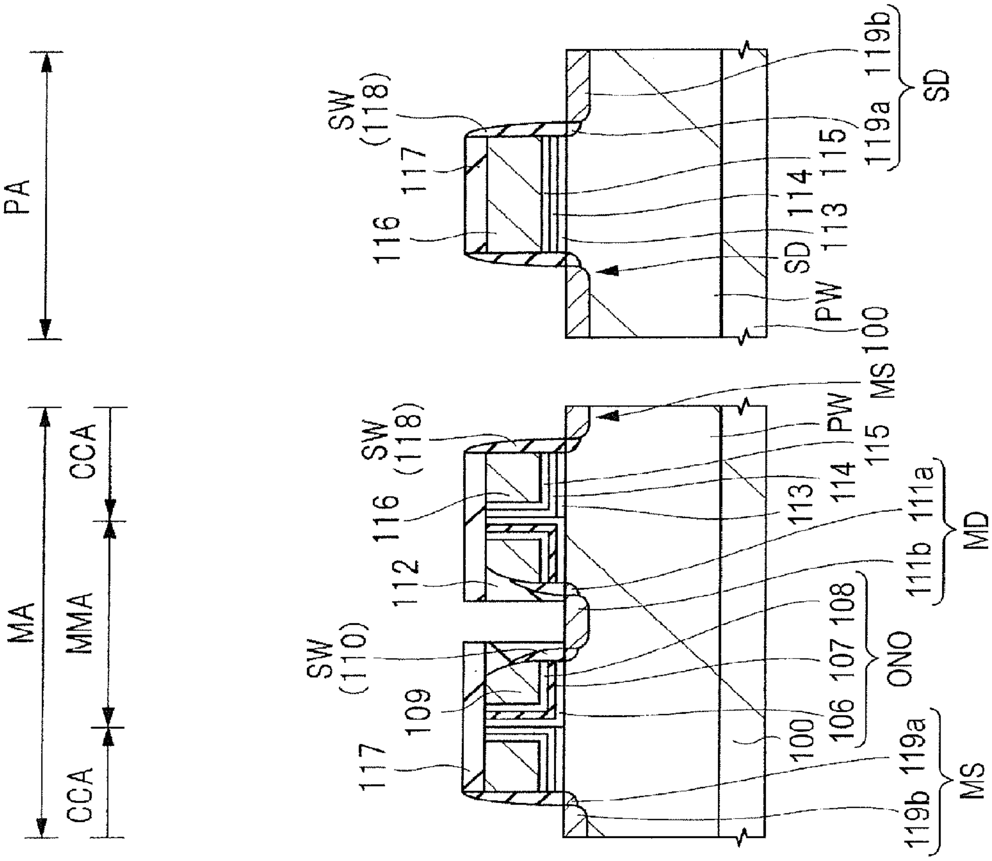
FIG. 60 is a cross-sectional view showing a manufacturing step of the semiconductor device of Third Embodiment following that of FIG. 59.
Figure 61:
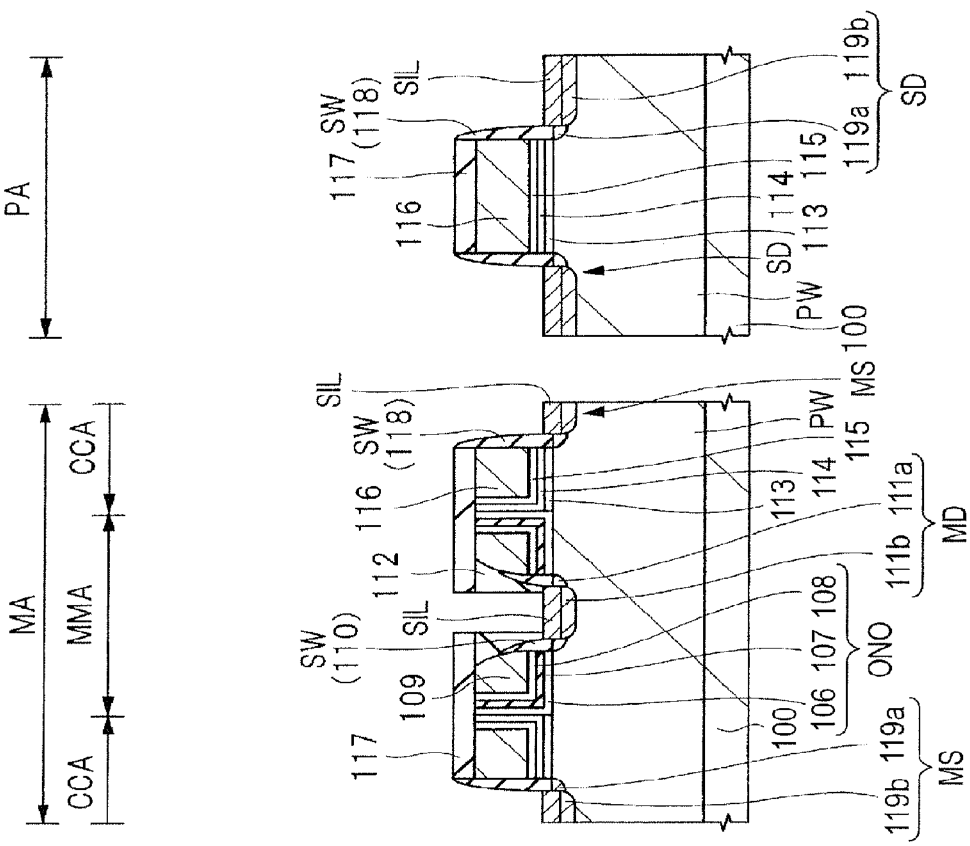
FIG. 61 is a cross-sectional view showing a manufacturing step of the semiconductor device of Third Embodiment following that of FIG. 60.

Next, as shown in FIG. 60, the silicon oxide film 112 and the silicon nitride film 117 on the drain region MD ($n^+$ type semiconductor region 111*b*) are removed and as in First Embodiment, a metal silicide film SIL is formed (FIG. 61). For example, first, the silicon oxide film 112 and the silicon nitride film 117 on the drain region D ($n^+$ type semiconductor region 111_b_) are removed by wet etching or the like. As a result, the source region MS, the drain region MD, and the source/drain region SD are exposed. Next, a metal film (not illustrated) is formed on the semiconductor substrate 100. The resulting semiconductor substrate 100 is heat treated to cause a reaction between the metal film and each of the source region MS, the drain region MD, and the source/drain region SD, resulting in formation of a metal silicide film SIL over each of the source region MS, the drain region MD, and the source/drain region SD.

Figure 62:
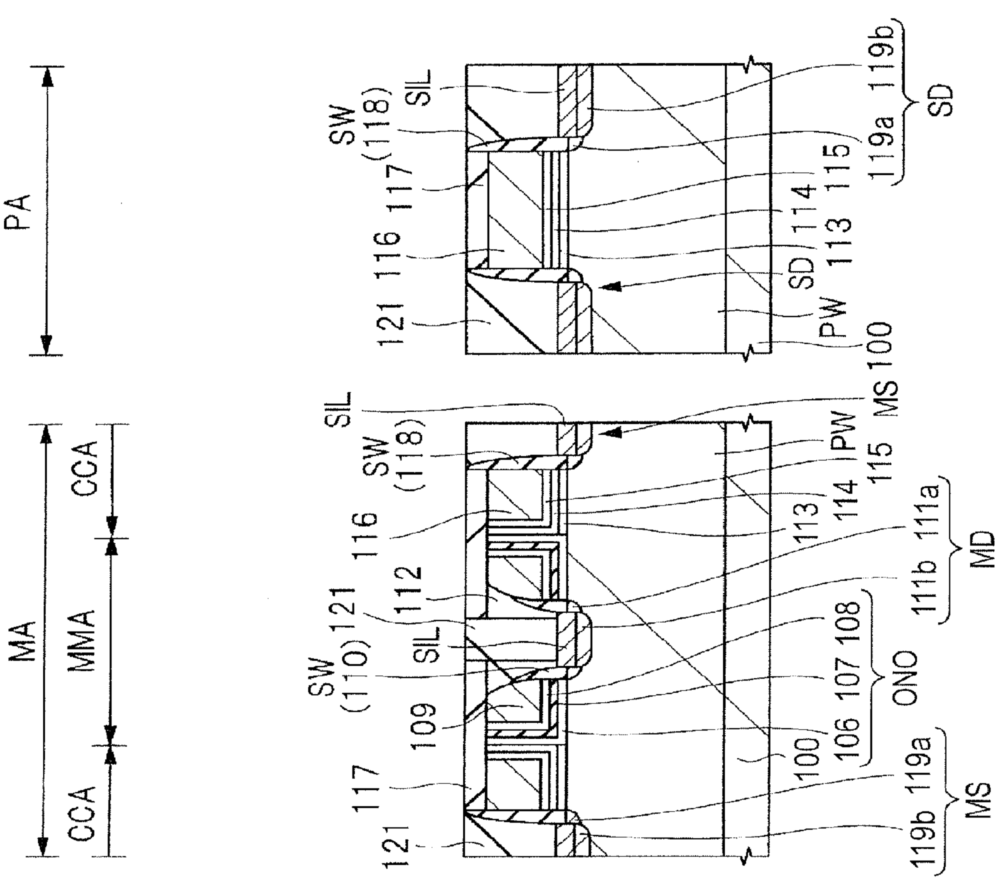
FIG. 62 is a cross-sectional view showing a manufacturing step of the semiconductor device of Third Embodiment following that of FIG. 61.
Figure 63:
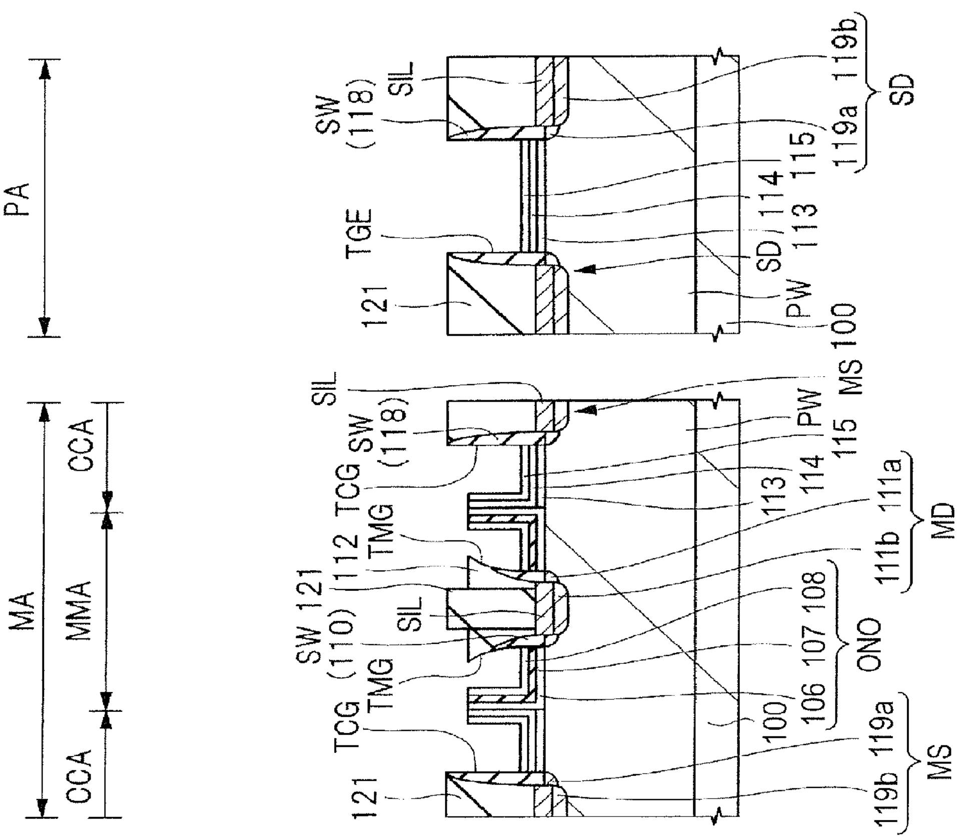
FIG. 63 is a cross-sectional view showing a manufacturing step of the semiconductor device of Third Embodiment following that of FIG. 62.

Next, as shown in FIG. 62, a silicon oxide film 121 is deposited as an interlayer insulating film on the silicon nitride film 117 and the metal silicide film SIL by CVD or the like. Next, an upper portion of the silicon oxide film 121 is removed until the surface of the silicon nitride film 117 is exposed. For example, the upper portion of the silicon oxide film 121 is polished using, for example, CMP until the surface of the silicon nitride film 117 is exposed. Then, the silicon nitride film 117 is removed by wet etching or the like to expose the polysilicon films 116 and 109 in the memory cell region MA and the peripheral circuit region PA. Next, the polysilicon films 116 and 109 are removed by etching. By this step, as shown in FIG. 63, a recess (trench, dent) TMG is provided in a memory gate electrode portion formation region, a recess (trench, dent) TMG is provided in a control gate electrode portion formation region, and a recess TGE is provided in the gate electrode portion formation region of the peripheral transistor.

Figure 64:
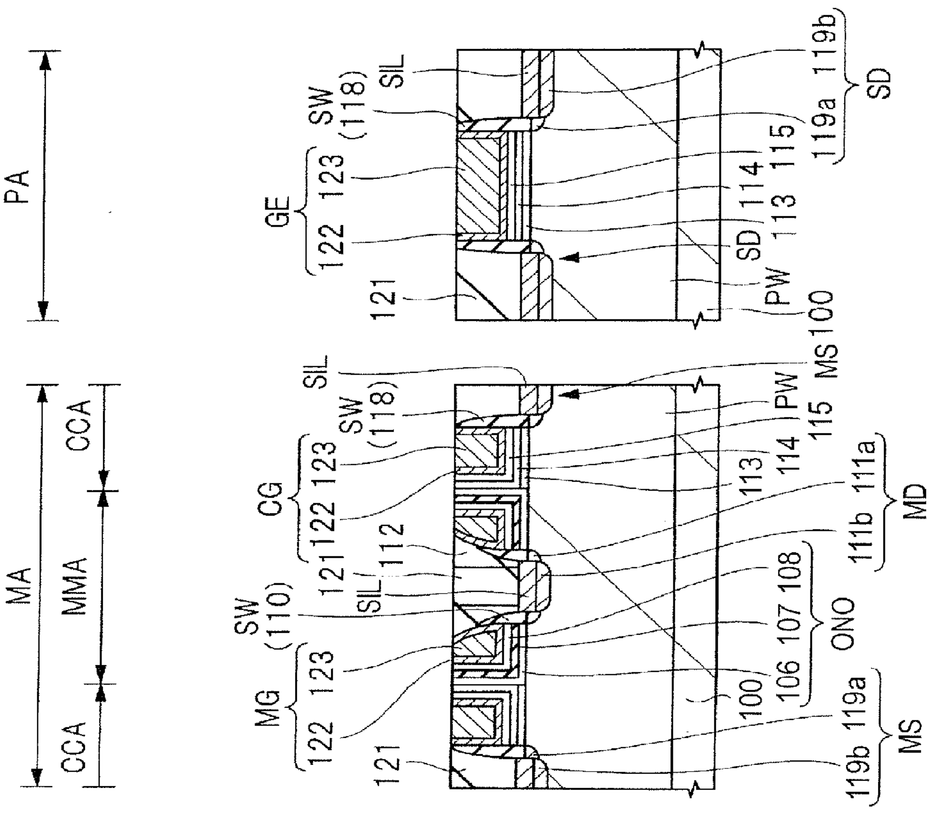
FIG. 64 is a cross-sectional view showing a manufacturing step of the semiconductor device of Third Embodiment following that of FIG. 63.

Next, as shown in FIG. 64, a metal electrode film 122 and a metal film 123 are formed on the silicon oxide film 121 and also in the recesses TMG, TCG and TGE. For example, a film of about 20 nm thick made of tantalum nitride/titanium/aluminum or the like is deposited, followed by the formation of an aluminum film. These films can be formed, for example, by sputtering.

Next, the metal electrode film 122 and the metal film 123 are removed until exposure of the surface of the silicon oxide film 121. For example, the metal electrode film 122 and the metal film 123 are polished using CMP or the like until exposure of the surface of the silicon oxide film 121. By this step, the recesses TMG, TCG and TGE are filled with the metal film 123 via the metal electrode film 122. This means that a memory gate electrode portion MG is formed in the recess TMG, a control gate electrode portion CG is formed in the recess TCG, and a gate electrode portion GE of the peripheral transistor is formed in the recess TGE. In other words, the polysilicon films 116 and 109 in the memory cell region MA are substituted by a stacked film of the metal electrode film 122 and the metal film 123, while the polysilicon film 116 in the peripheral circuit region PA is substituted by a stacked film of the metal electrode film 122 and the metal film 123.

Then, a silicon oxide film 124 is deposited as an interlayer insulating film on the silicon oxide film 121, the gate electrode portion GE, and the like by CVD or the like. Next, a plug (not illustrated) is formed in this silicon oxide film 124 and further, a wiring 125 is formed on the silicon oxide film 124 (refer to FIG. 58). The plug can be formed by filling, with a conductive film, a contact hole in the interlayer insulating film. The wiring 125 can be formed, for example, by depositing a conductive film on the silicon oxide film 124 and then patterning it. Then, two or more wiring layers may be formed by performing the above-mentioned step of forming the interlayer insulating film, plug, and wiring in repetition.

By the above-mentioned steps, the semiconductor device of the present embodiment can be formed. Thus, by the above-mentioned steps, a memory cell (memory transistor, control transistor) formed in a memory cell region MA and having a high-k insulating film and a metal film and a peripheral transistor formed in a peripheral circuit region PA and having a high-k insulating film and a metal film can be formed efficiently on the same semiconductor substrate. In other words, both a memory cell (memory transistor, control transistor) employing a high-k/metal configuration and a peripheral transistor employing a high-k/metal configuration can be provided on the same semiconductor substrate.

Fourth Embodiment

In the present embodiment, both an n-MOS type transistor and a p-MOS type transistor are formed in the peripheral circuit region PA. A gate electrode portion of the n-MOS type transistor in the peripheral circuit region PA and the control gate electrode portion CG are made of the same material, while a gate electrode portion of the p-MOS type transistor in the peripheral circuit region PA and the memory gate electrode portion MG are made of the same material.

The structure of the semiconductor device of the present embodiment will next be described referring to drawings.

[Description on Structure]

The semiconductor device of the present embodiment has a memory cell (memory transistor, control transistor) formed in a memory cell region MA and a peripheral transistor formed in a peripheral circuit region PA.

Figure 65:
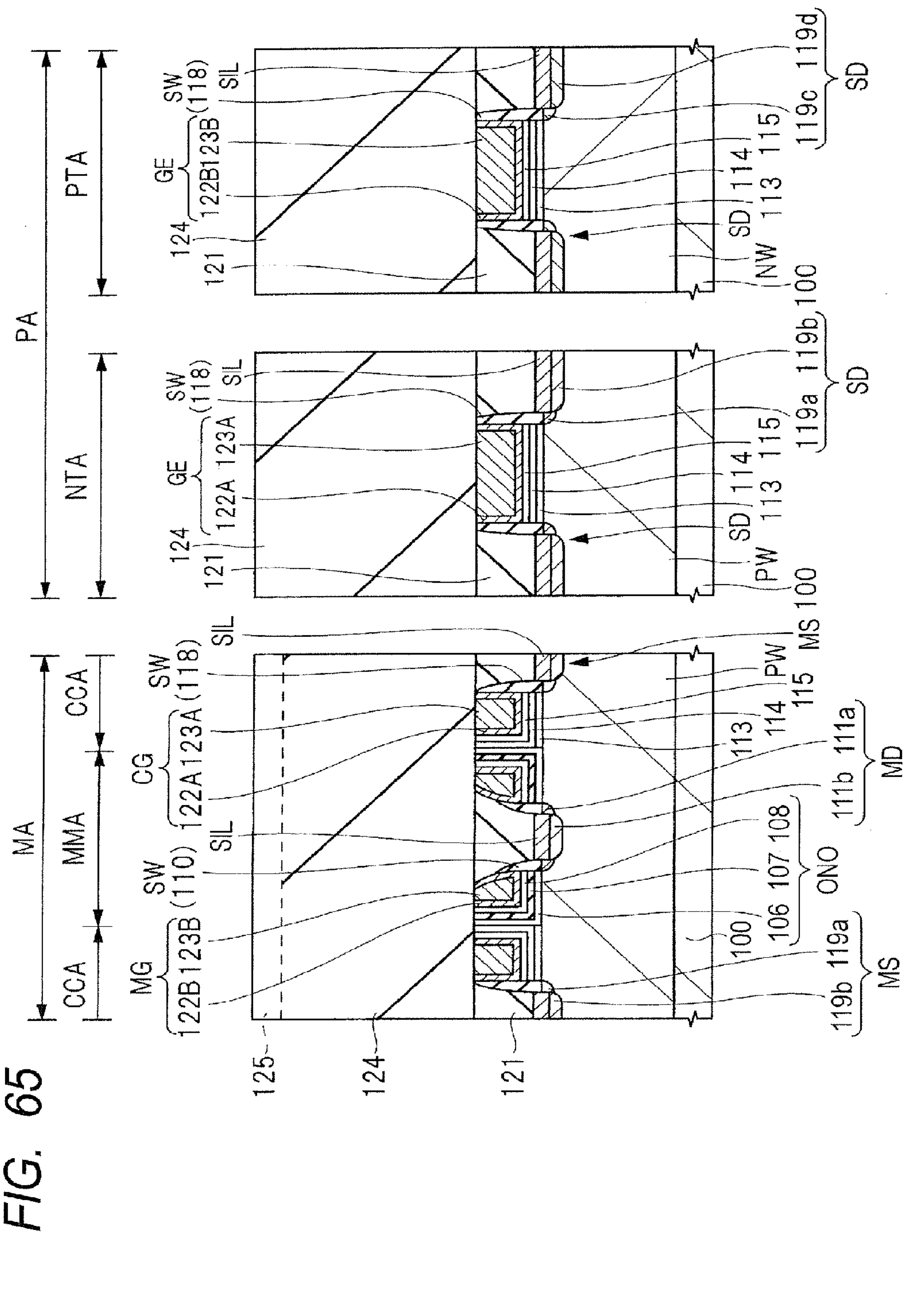
FIG. 65 is a cross-sectional view showing a semiconductor device of Fourth Embodiment.

FIG. 65 is a cross-sectional view showing the semiconductor device of the present embodiment. The peripheral circuit region PA has, in a region NTA thereof, an n-MOS type transistor and, in a region PTA, a p-MOS type transistor. The gate electrode portion GE of the n-MOS type transistor and the control gate electrode portion CG are each made of a metal electrode film 122A and a metal film 123A thereon, while the gate electrode portion GE of the p-MOS type transistor and the memory gate electrode portion MG are each made of a metal electrode film 122B and a metal film 123B thereon. The other configuration is similar to that of First Embodiment (refer to FIG. 1 and the like). The structure will hereinafter be described specifically.

As shown in FIG. 65, the memory cell is comprised of a control transistor having the control gate electrode portion CG and a memory transistor having the memory gate electrode portion MG.

Described specifically, the memory cell has, similar to that of First Embodiment, a control gate electrode portion CG provided over a semiconductor substrate 100 (p well PW) and a memory gate electrode portion MG provided over the semiconductor substrate 100 (p well PW) and adjacent to the control gate electrode portion CG. For example, the control gate electrode portion CG is comprised of a metal electrode film 122A and a metal film 123A thereon and the memory gate electrode MG is comprised of a metal electrode film 122B and a metal film 123B thereon.

The metal electrode film 122A is made of, for example, tantalum nitride/titanium/aluminum. The metal electrode film 122B is made of, for example, a tantalum nitride/titanium nitride/tantalum nitride. The metal film 123A and the metal film 123B are each made of an aluminum film but they may be made of films different from each other.

The memory cell further has an insulating film and a metal compound film provided between the control gate electrode portion CG and the semiconductor substrate 100 (p well PW). The insulating film has a high dielectric constant film having a dielectric constant higher than that of a silicon nitride film. The memory cell has a silicon oxide film 113 and a high-k insulating film (high dielectric constant film) 114 as the insulating film. Further, the high-k insulating film 114 and the control gate electrode portion CG have therebetween a titanium nitride film 115 as the metal compound film.

The high-k insulating film (high dielectric constant film) 114 lies between the control gate electrode portion CG and the semiconductor substrate 100 (p well PW) and between the control gate electrode portion CG and the memory gate electrode portion MG.

The titanium nitride film 115 (metal compound film) lies between the control gate electrode portion CG and the semiconductor substrate 100 (p well PW) and between the control gate electrode portion CG and the memory gate electrode portion MG.

The memory cell further has an insulating film ONO (106, 107, 108) provided between the memory gate electrode portion MG and the semiconductor substrate 100 (p well PW). The insulating film ONO is comprised of, for example, a silicon oxide film 106, a silicon nitride film 107 thereon, and a silicon oxynitride film 108 thereon. The silicon nitride film 107 will serve as a charge accumulation portion.

The insulating film ONO (106, 107, 108) lies between the memory gate electrode portion MG and the semiconductor substrate 100 (p well PW) and between the control gate electrode portion CG and the memory gate electrode portion MG.

This means that the control gate electrode portion CG and the memory gate electrode portion MG have therebetween the insulating film ONO (106, 107, 108), the high-k insulating film (high dielectric constant film) 114 and the metal compound film (titanium nitride film 115) which are provided successively from the side of the memory gate electrode portion MG.

The memory cell further has a source region MS and a drain region MD formed in the p well PW of the semiconductor substrate 100. The memory gate electrode portion MG and the control gate electrode portion CG have, on the sidewall portion of the synthesis pattern thereof, a sidewall film (sidewall insulating film, sidewall spacer) SW made of an insulating film.

The source region MS is, similar to that of First embodiment, comprised of an $n^+$ type semiconductor region 119*b* and an $n^-$ type semiconductor region 119*a*. The drain region MD is comprised of an $n^+$ type semiconductor region 111*b* and an $n^-$ type semiconductor region 111*a*. The source region MS ($n^+$ type semiconductor region 119*b*) and the drain region MD ($n^+$ type semiconductor region 111*b*) have thereover a metal silicide film SIL.

The memory cell region MA has a silicon oxide film 121 as an interlayer insulating film and this silicon oxide film 121 has thereon a silicon oxide film 124 as an interlayer insulating film. This silicon oxide film 124 has thereon a wiring 125 and the like.

The peripheral circuit region PA has therein both an n-MOS type transistor and a p-MOS type transistor. The n-MOS type transistor is in a region NTA, while the p-MOS type transistor is in a region PTA.

The n-MOS type transistor has a gate electrode portion GE arranged over the semiconductor substrate 100 (p well PW) and a source/drain region SD source provided in the p well PW on both sides of the gate electrode portion GE. The gate electrode portion GE is comprised of a metal electrode film 122A and a metal film 123A thereon. The peripheral transistor has an insulating film and a metal compound film arranged between the gate electrode portion GE and the semiconductor substrate 100 (p well PW). The insulating film has a high dielectric constant film having a dielectric constant higher than that of a silicon nitride film. The peripheral transistor has, as the insulating film, a silicon oxide film 113 and a high-k insulating film (high dielectric constant film) 114 and, as the metal compound film, a titanium nitride film 115 provided between the high-k insulating film 114 and the gate electrode portion GE.

The gate electrode portion GE has, on the sidewall portion thereof, a sidewall film SW made of an insulating film. The source/drain region SD is comprised of an $n^+$ type semiconductor region 119*b* and an $n^-$ type semiconductor region 119*a*. The $n^-$ type semiconductor region 119*a* is formed in self alignment with the sidewall of the gate electrode portion GE. The $n^+$ type semiconductor region 119*b* is formed in self alignment with the side surface of the sidewall film SW and has a junction depth and an impurity concentration greater than those of the $n^-$ type semiconductor region 119*a*. This source/drain region SD ($n^+$ type semiconductor region 119*b*) has thereon a metal silicide film SIL.

The p-MOS type transistor has a gate electrode portion GE arranged over the semiconductor substrate 100 (p well PW) and a source/drain region SD provided in an n well NW on both sides of the gate electrode portion GE. The gate electrode portion GE is comprised of a metal electrode film 122B and a metal film 123B thereon. The peripheral transistor has an insulating film and a metal compound film arranged between the gate electrode portion GE and the semiconductor substrate 100 (p well PW). The insulating film has a high dielectric film having a dielectric constant higher than that of a silicon nitride film. The peripheral transistor has, as the insulating film, a silicon oxide film 113 and a high-k insulating film (high dielectric constant film) 114 and, as the metal compound film, a titanium nitride film 115 provided between the high-k insulating film 114 and the gate electrode portion GE.

The gate electrode portion GE has, on the sidewall portion thereof, a sidewall film SW made of an insulating film. The source/drain region SD is comprised of a $p^+$ type semiconductor region 119*d* and a $p^-$ type semiconductor region 119*c*. The $p^-$ type semiconductor region 119*c* is formed in self alignment with the sidewall of the gate electrode portion GE. The $p^+$ type semiconductor region 119*d* is formed in self alignment with the side surface of the sidewall film SW and has a junction depth and an impurity concentration greater than those of the $p^-$ type semiconductor region 119*c*. This source/drain region SD ($p^+$ type semiconductor region 119*d*) has thereover a metal silicide film SIL.

The peripheral circuit region PA has therein a silicon oxide film 121 as an interlayer insulating film and this silicon oxide film 121 has thereon a silicon oxide film 124 as an interlayer insulating film.

According to the present embodiment, since the control gate electrode portion CG and the memory gate electrode portion MG have therebetween the high-k insulating film (high dielectric constant film) 114, an electric field intensity at the end portion (corner portion) of the memory gate electrode portion MG on the side of the control gate electrode portion CG is relaxed upon erasing, as in First Embodiment. This results in reduction in uneven distribution of charges in the charge accumulation portion (silicon nitride film 107) and improvement in erase accuracy. In particular, erase accuracy can be improved even when the erase operation is performed using the above-mentioned FN tunneling system.

In addition, since the control transistor and the memory transistor each uses a metal electrode film, these transistors can have improved characteristics due to reduction in the resistance of the control gate electrode portion and the memory gate electrode portion and reduction in power consumption of these transistors.

Further, since a film configuring the control gate electrode portion and the memory gate electrode portion can be selected individually from a metal electrode film and a metal film, the threshold voltage of each of the transistors can be adjusted easily. For example, this makes it possible to decrease the impurity concentration (channel implantation) below the gate electrode portion and thereby suppress variation in the threshold voltage of each of the transistors.

Also to the semiconductor device of the present embodiment, the configuration of the memory array shown in FIGS. 4 and 5 or the circuit block example shown in FIG. 6, each described in First Embodiment, can be applied.

[Description on Manufacturing Method]

Next, a method of manufacturing the semiconductor device of the present embodiment will be described. A step of forming a memory cell in the memory cell region MA and a peripheral transistor in the peripheral circuit region PA will be described.

Steps until the step of forming a silicon oxide film 121 (refer to FIG. 62) are similar to those of Third Embodiment so that a description on them will be omitted.

Of the silicon nitride film 117 shown in FIG. 62, the silicon nitride film 117 in the region CCA and the region NTA are removed using photolithography and etching. The polysilicon film 116 in the region CCA and the region NTA is thereby exposed. Next, the polysilicon film 116 is removed by etching. As a result, a recess (trench, dent) is provided in the control gate electrode portion formation region and a recess is provided in the gate electrode portion formation region in the region NTA.

Next, the recess is filled with a metal film 123A via a metal electrode film 122A as in Third Embodiment. For example, after formation of a film of about 20 nm thick made of, for example, a tantalum nitride/titanium/aluminum and an aluminum film on the semiconductor substrate, an upper portion of each of these films is polished using CMP or the like.

The polysilicon film 116 is then removed from the region MMA and the region PTA by etching. As a result, a recess (trench, dent) is provided in the memory gate electrode portion formation region and a recess is provided in the gate electrode portion formation region in the region PTA.

As in Third Embodiment, the recess is then filled with a metal film 123B via a metal electrode film 122B. The metal electrode film 122B is made of a material different from that of the metal electrode film 122A. For example, after formation of a film of about 20 nm thick made of, for example, a tantalum nitride/titanium nitride/tantalum nitride and an aluminum film on the semiconductor substrate, an upper portion of each of these films is polished using CMP or the like.

Next, a silicon oxide film 124 is deposited as an interlayer insulating film on the silicon oxide film 121, the gate electrode portion GE, and the like by CVD or the like. Next, a plug (not illustrated) is formed in this silicon oxide film 124 and further, a wiring 125 is formed in the silicon oxide film 124 (refer to FIG. 65).

By the above-mentioned steps, the semiconductor device of the present embodiment can be formed. Thus, by the above-mentioned steps, a memory cell (memory cell transistor, control transistor) formed in a memory cell region MA and having a high-k insulating film and a metal film and a peripheral transistor formed in a peripheral circuit region PA and having a high-k insulating film and a metal film can be formed efficiently on the same semiconductor substrate. In particular, memory cells having respectively different metal films and peripheral transistors (n-MOS type transistor and p-MOS type transistor) having respectively different metal films can be formed efficiently on the same semiconductor substrate.

Fifth Embodiment

In the semiconductor device of First Embodiment, the memory gate electrode portion MG is formed in sidewall shape. The control gate electrode portion CG may also be formed in sidewall shape.

The structure of a semiconductor device of the present embodiment will next be described referring to drawings.

[Description on Structure]

The semiconductor device of the present embodiment has a memory cell (memory transistor, control transistor) formed in a memory cell region MA and a peripheral transistor formed in a peripheral circuit region PA.

(Description on Structure of Memory Cell)

Figure 66:
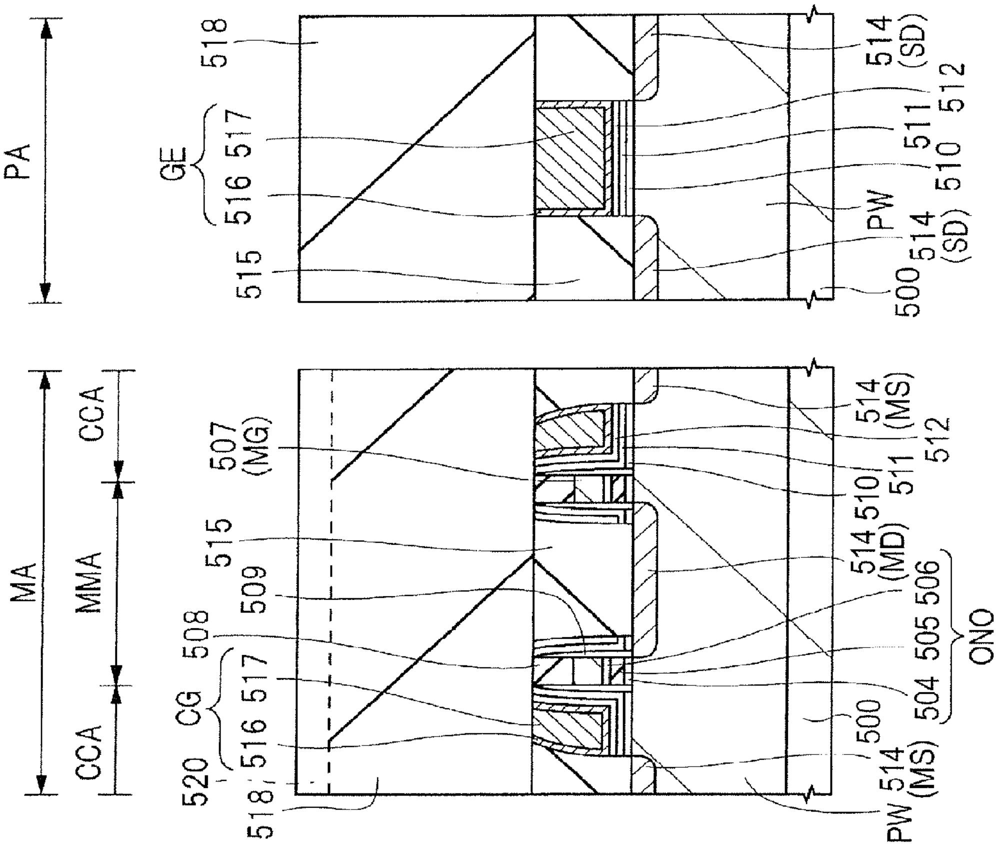
FIG. 66 is a cross-sectional view showing a semiconductor device of Fifth Embodiment.
Figure 67:
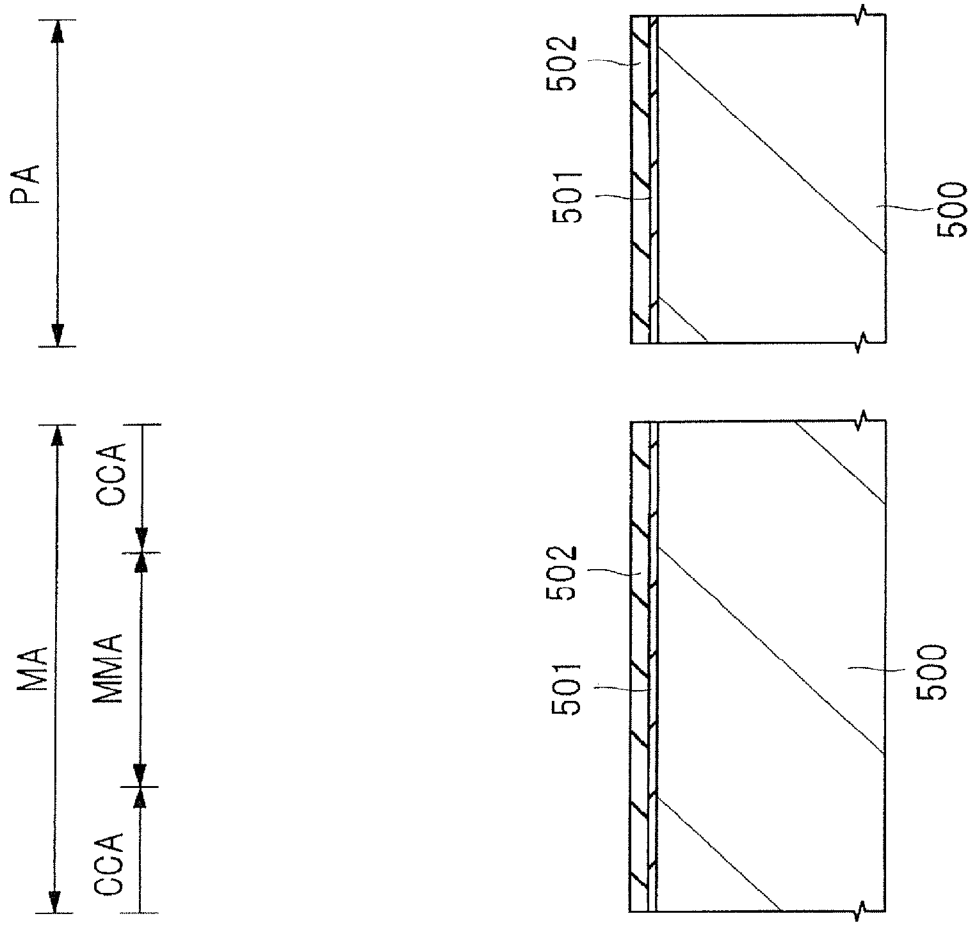
FIG. 67 is a cross-sectional view showing a manufacturing step of the semiconductor device of Fifth Embodiment.

FIG. 66 is a cross-sectional view showing the semiconductor device of the present embodiment. As shown in FIG. 66, the memory cell is comprised of a control transistor having a control gate electrode portion CG and a memory transistor having a memory gate electrode portion MG.

More specifically, the memory cell has a control gate electrode portion CG arranged over a semiconductor substrate 500 (p well PW) and a memory gate electrode portion MG arranged over the semiconductor substrate 500 (P well PW) and adjacent to the control gate electrode portion CG. For example, the memory gate electrode portion MG is made of a silicon film, while the control gate electrode portion CG is made of a metal electrode film 516 and a metal film 517 thereon.

The memory cell further has an insulating film and a metal compound film arranged between the control gate electrode portion CG and the semiconductor substrate 500 (p well PW). The insulating film has a high dielectric constant film having a dielectric constant higher than that of a silicon nitride film. As shown in FIG. 66, the memory cell has, as the insulating film, a silicon oxide film 510 and a high-k insulating film (high dielectric constant film) 511 and, as the metal compound film, a titanium nitride film 512 provided the high-k insulating film 511 and the control gate electrode portion CG.

The high-k insulating film (high dielectric constant film) 511 lies between the control gate electrode portion CG and the semiconductor substrate 500 (p well PW) and between the control gate electrode portion CG and the memory gate electrode portion MG.

The titanium nitride film 512 (metal compound film) lies between the control gate electrode portion CG and the semiconductor substrate 500 (p well PW) and between the control gate electrode portion CG and the memory gate electrode portion MG.

The memory cell further has an insulating film ONO (504, 505, 506) provided between the memory gate electrode portion MG and the semiconductor substrate 500 (p well PW). The insulating film ONO is, for example, comprised of a silicon oxide film 504, a silicon nitride film 505 thereon, and a silicon oxynitride film 506 thereon. The silicon nitride film 505 will serves as a charge accumulation portion.

The insulating film ONO (504, 505, 506) lies between the memory gate electrode portion MG and the semiconductor substrate 500 (p well PW). The memory gate electrode portion MG has thereon a silicon oxide film 508. A stacked film of the insulating film ONO (504, 505, 506), the memory gate electrode portion MG, and the silicon oxide film 508 has, on the sidewall thereof, a silicon oxide film 509 in sidewall shape.

This means that the control gate electrode portion CG and the memory gate electrode portion MG have therebetween the silicon oxide film 509, the high-k insulating film (high dielectric constant film) 511, and the metal compound film (titanium nitride film 512) which are provided successively from the side of the memory gate electrode portion MG.

The memory cell further has a source region MS and a drain region MD formed in the p well PW of the semiconductor substrate 500.

The source region MS is comprised of an $n^+$ type semiconductor region 514 formed in self alignment with the side surface of the control gate electrode portion CG and the drain region MD is comprised of an $n^+$ type semiconductor region 514 formed from below the side surface of the memory gate electrode portion MG.

The memory cell region MA has a silicon oxide film 515 as an interlayer insulating film and this silicon oxide film 515 has thereon a silicon oxide film 518 as an interlayer insulating film. This silicon oxide film 518 has thereon a wiring 520 and the like.

(Description on Structure of Peripheral Transistor)

As shown in FIG. 66, the peripheral transistor has a gate electrode portion GE arranged over the semiconductor substrate 500 (p well PW) and a source/drain region SD provided in the p well PW on both sides of the gate electrode portion GE. The gate electrode portion GE is comprised of a metal electrode film 516 and a metal film 517 thereon. The peripheral transistor further has an insulating film and a metal compound film arranged between the gate electrode portion GE and the semiconductor substrate 500 (p well PW). The insulating film has a high dielectric constant film having a dielectric constant higher than that of a silicon nitride film. As shown in FIG. 66, the peripheral transistor has, as the insulating film, a silicon oxide film 510 and a high-k insulating film (high dielectric constant film) 511 and, as the metal compound film, a titanium nitride film 512 between the high-k insulating film 511 and the gate electrode portion GE.

The source/drain region SD is comprised of an type semiconductor region 514. The $n^-$ type semiconductor region 514 is formed in self alignment with the sidewall of the gate electrode portion GE.

The peripheral circuit region PA has therein a silicon oxide film 515 as an interlayer insulating film and this silicon oxide film 515 has thereon a silicon oxide film 518 as an interlayer insulating film.

Thus, in the present embodiment, the control gate electrode portion CG and the memory gate electrode portion MG have therebetween the high-k insulating film (high dielectric constant film) 511 so that an electric field intensity at an end portion (corner portion) of the memory gate electrode portion MG on the side of the control gate electrode portion CG is relaxed upon erasing. This results in reduction in uneven distribution of charges in the charge accumulation portion (silicon nitride film 505) and improvement in erase accuracy.

In particular, when erase is performed through the FN tunneling system, compared with the BTBT system, the electric field at the end portion (corner portion) of the memory gate electrode portion MG on the side of the control gate electrode portion CG becomes greater, leading to concentrated injection of many holes into this end portion. This facilitates variation in the distribution of charges (holes, electrons) in the charge accumulation portion (silicon nitride film 505), which may deteriorate the erase accuracy.

In the present embodiment, on the other hand, the control gate electrode portion CG and the memory gate electrode portion MG have therebetween the high-k insulating film (high dielectric constant film) 511 so that an electric field intensity at the end portion (corner portion) of the memory gate electrode portion MG on the side of the control gate electrode portion is relaxed upon erasing. This results in improvement in erase accuracy.

Further, in the present embodiment, the control gate electrode portion CG and the memory gate electrode portion MG have therebetween the silicon oxide film 509, the high-k insulating film (high dielectric constant film) 511, and the metal compound film (titanium nitride film 512) which are arranged successively from the side of the memory gate electrode portion MG so that an electric field intensity at the end portion (corner portion) of the memory gate electrode portion MG on the side of the control gate electrode portion CG is relaxed upon erasing. This results in improvement in erase accuracy.

In the present embodiment, an n-MOS type memory cell has been described in detail, but a p-MOS type memory cell having the configuration of the present embodiment produces an advantage similar to that of the n-MOS type memory cell. Also as an example of the peripheral transistor, an n-MOS type transistor is shown, but a p-MOS type transistor may be used as the peripheral transistor or both an n-MOS type transistor and a p-MOS type transistor may be formed in the peripheral circuit region PA.

Also to the semiconductor device of the present embodiment, the configuration of the memory array shown in FIGS. 4 and 5 or the circuit block example shown in FIG. 6, each described in First Embodiment, can be applied.

[Description on Manufacturing Method]

Next, a method of manufacturing the semiconductor device of the present embodiment will be described referring to FIGS. 67 to 78. FIGS. 67 to 78 are cross-sectional views showing the manufacturing steps of the semiconductor device of the present embodiment.

A step of forming a memory cell in the memory cell region MA and a peripheral transistor in the peripheral circuit region PA will hereinafter be described referring to these drawings.

First, an element isolation region is formed in the main surface of a semiconductor substrate 500. This element isolation region is formed, as in First Embodiment, by forming a silicon oxide film 501 and a silicon nitride film 502, each shown in FIG. 67, on the semiconductor substrate 500, forming an element isolation trench (not illustrated), and filling the trench with a silicon oxide film.

Figure 68:
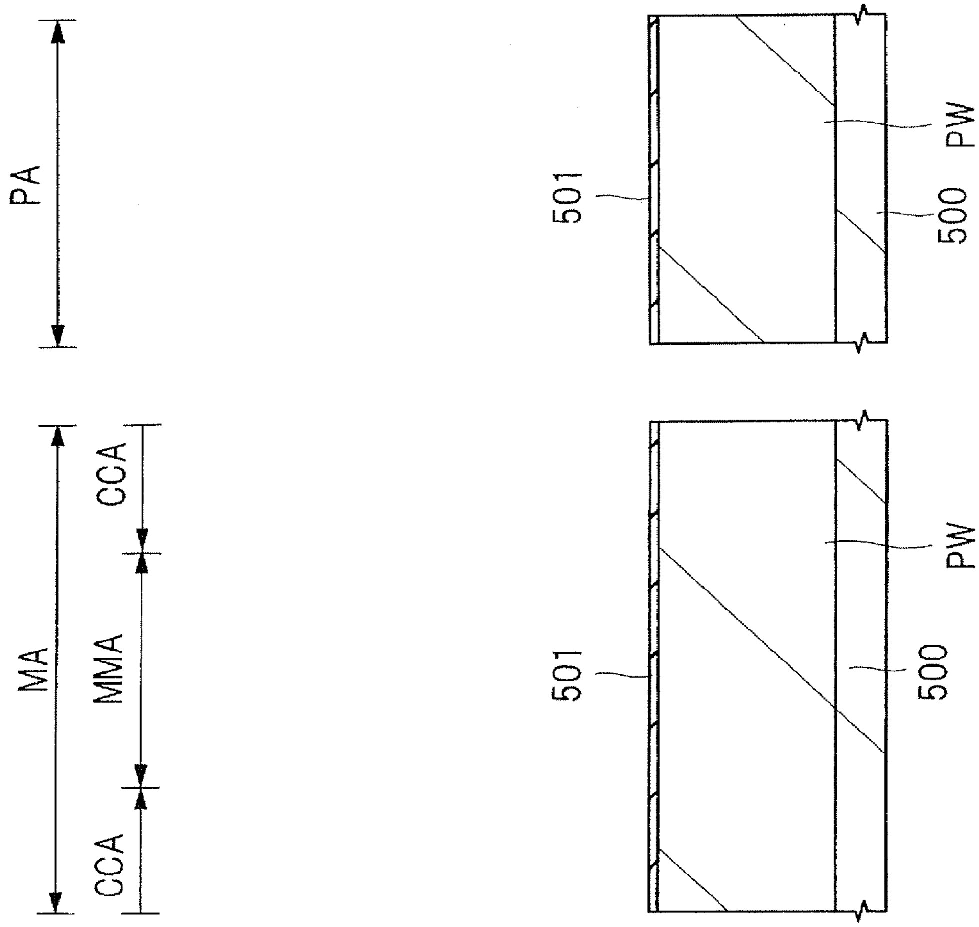
FIG. 68 is a cross-sectional view showing a manufacturing step of the semiconductor device of Fifth Embodiment following that of FIG. 67.

Next, as shown in FIG. 68, a p well PW is formed in the semiconductor substrate 500. This p well PW is formed, as in First Embodiment, by the ion implantation of a p type impurity (for example, boron (B)) via the silicon oxide film 501.

Figure 69:
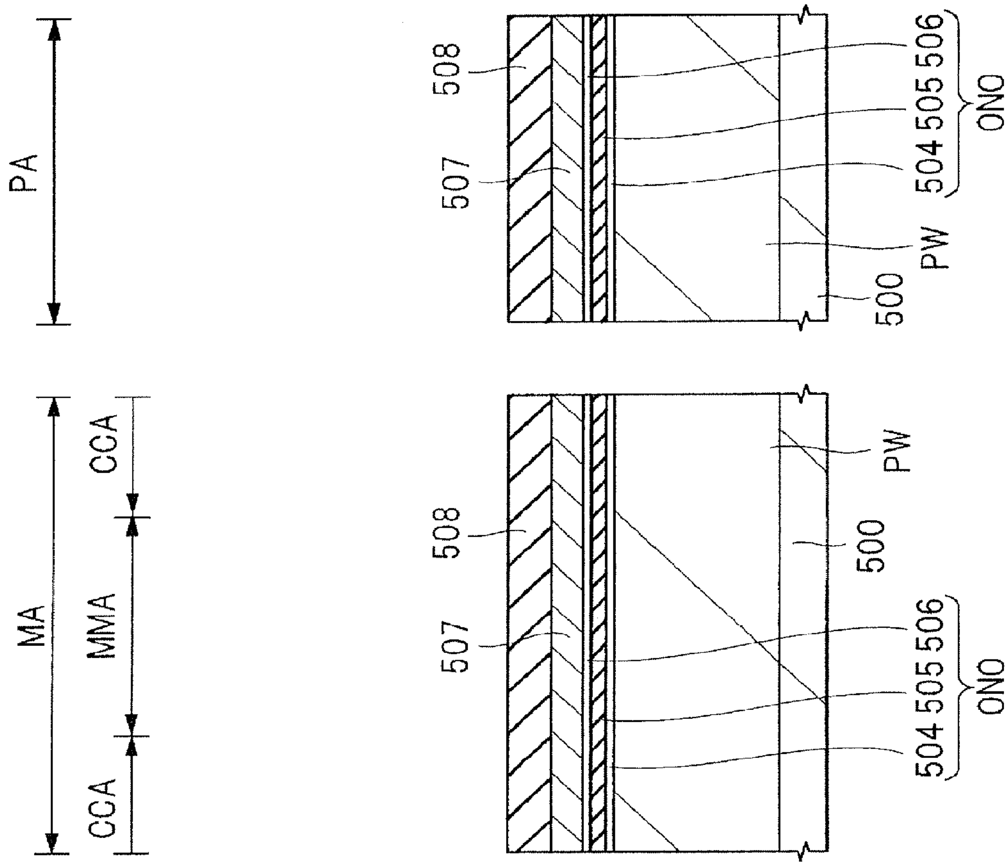
FIG. 69 is a cross-sectional view showing a manufacturing step of the semiconductor device of Fifth Embodiment following that of FIG. 68.

Next, as shown in FIG. 69, an insulating film ONO (504, 505, 506) is formed on the semiconductor substrate 500 (p well PW), followed by formation of a polysilicon film 507 and a silicon oxide film 508 thereon.

First, a silicon oxide film 504 is formed on the semiconductor substrate 500. This silicon oxide film 504 is formed, for example, by thermal oxidation so as to have a thickness of about 4 nm. The silicon oxide film 504 may be formed using CVD or the like. Then, a silicon nitride film 505 of about 6 nm thick is deposited on the silicon oxide film 504, for example, by CVD. This silicon nitride film 505 becomes a charge accumulation portion of the memory cell and becomes an intermediate layer configuring the insulating film ONO. Next, a silicon oxynitride film 506 of about 8 nm thick is deposited on the silicon nitride film 505 by CVD or the like. As a result, the insulating film ONO comprised of the silicon oxide film 504, the silicon nitride film 505, and the silicon oxynitride film 506 can be formed.

Next, a polysilicon film 507 of about 40 nm thick is formed on the silicon oxynitride film 506 (insulating film ONO) by CVD or the like. This polysilicon film 507 will be a memory gate electrode portion MG. Next, a silicon oxide film 508 of about 60 nm thick is formed on the polysilicon film 507 by CVD or the like.

Figure 70:
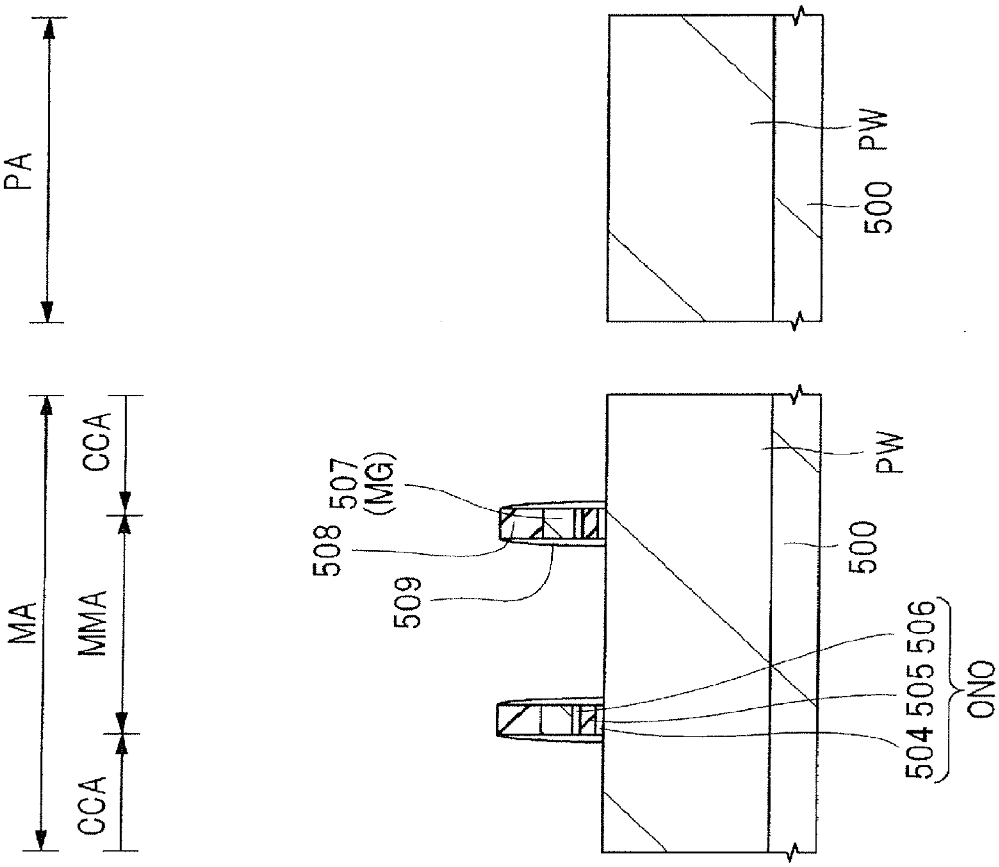
FIG. 70 is a cross-sectional view showing a manufacturing step of the semiconductor device of Fifth Embodiment following that of FIG. 69.

Next, as shown in FIG. 70, the insulating film ONO, polysilicon film 507, and silicon oxide film 508 are patterned to form a memory gate electrode portion MG. For example, a photoresist film (not illustrated) is formed in the memory gate electrode portion formation region on the silicon oxide film 508 by photolithography and with this photoresist film as a mask, the insulating film ONO, polysilicon film 507, and silicon oxide film 508 are etched. As a result, a memory gate electrode portion MG comprised of the polysilicon film 507 is formed on the semiconductor substrate 500 (p well PW) via the ONO film. The silicon oxide film 508 has remained on the memory gate electrode portion MG. This remaining silicon oxide film 508 may be called "cap insulating film".

Next, a silicon oxide film 509 in sidewall shape is formed on the sidewall of the memory gate electrode portion MG. This means that the silicon oxide film 509 is formed on the sidewall portion of the stacked film of the insulating film ONO, polysilicon film 507, and silicon oxide film 508.

For example, a silicon oxide film 509 is deposited on the semiconductor substrate 500 (p well PW) and also the stacked film by CVD or like. Next, the silicon oxide film 509 of a predetermined thickness from the surface thereof is removed by anisotropic dry etching to form a silicon oxide film (sidewall film) 509 in sidewall shape on the sidewall portion of the stacked film. The silicon oxide film (sidewall film) 509 referred herein has a single layer structure but it may have a stacked film structure. For example, a sidewall film having a three-layer structure may be formed by successively depositing a silicon oxide film, a silicon nitride film, and a silicon oxide film on the semiconductor substrate 500 (p well PW) and then, dry etching them anisotropically. Thus, using a sidewall film having a stacked film structure can improve the breakdown voltage between the memory gate electrode portion MG and the control gate electrode portion CG further.

Figure 71:
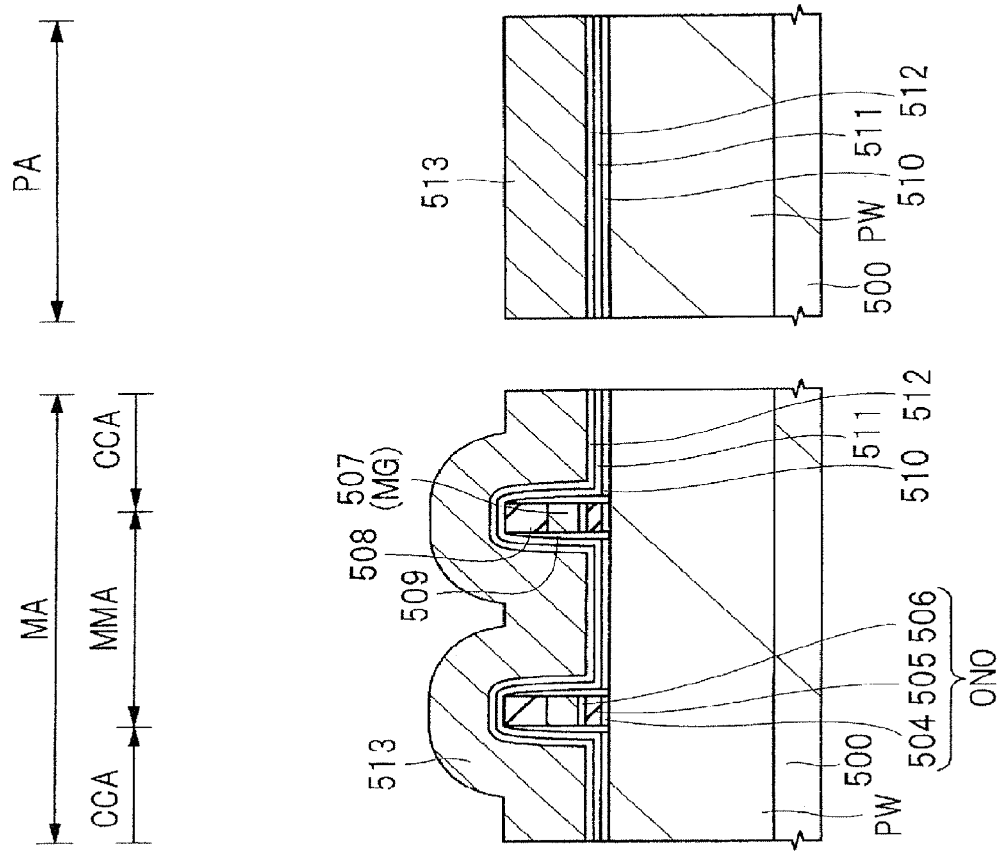
FIG. 71 is a cross-sectional view showing a manufacturing step of the semiconductor device of Fifth Embodiment following that of FIG. 70.

Next, as shown in FIG. 71, a high-k insulating film 511, a titanium nitride film 512, and a polysilicon film 513 are formed on the silicon oxide film (sidewall film) 509 and the stacked film as well as on the semiconductor substrate 500 (p well PW).

First, a silicon oxide film 510 is formed on the semiconductor substrate 500. The silicon oxide film 510 is formed, for example, by thermal oxidation so as to have a thickness of about 1 nm. Then, a high-k insulating film 511 is formed on the silicon oxide film (sidewall film) 509 and the stacked film as well as on the silicon oxide film 510. As the high-k insulating film 511, for example, an Hf oxide film can be used. For example, an Hf oxide film of about 5 nm thick is deposited using CVD or the like. Then, a titanium nitride film 512 of about 10 nm thick is deposited on the high-k insulating film 511 by CVD or the like.

Next, a polysilicon film 513 of about 40 nm thick is deposited on the titanium nitride film 512 by CVD or the like. This polysilicon film 513 will be a polysilicon film for substitution of a control gate electrode portion. The control gate length (gate length of the control gate electrode portion CG) is therefore determined according to the deposition thickness of this polysilicon film 513.

Figure 72:
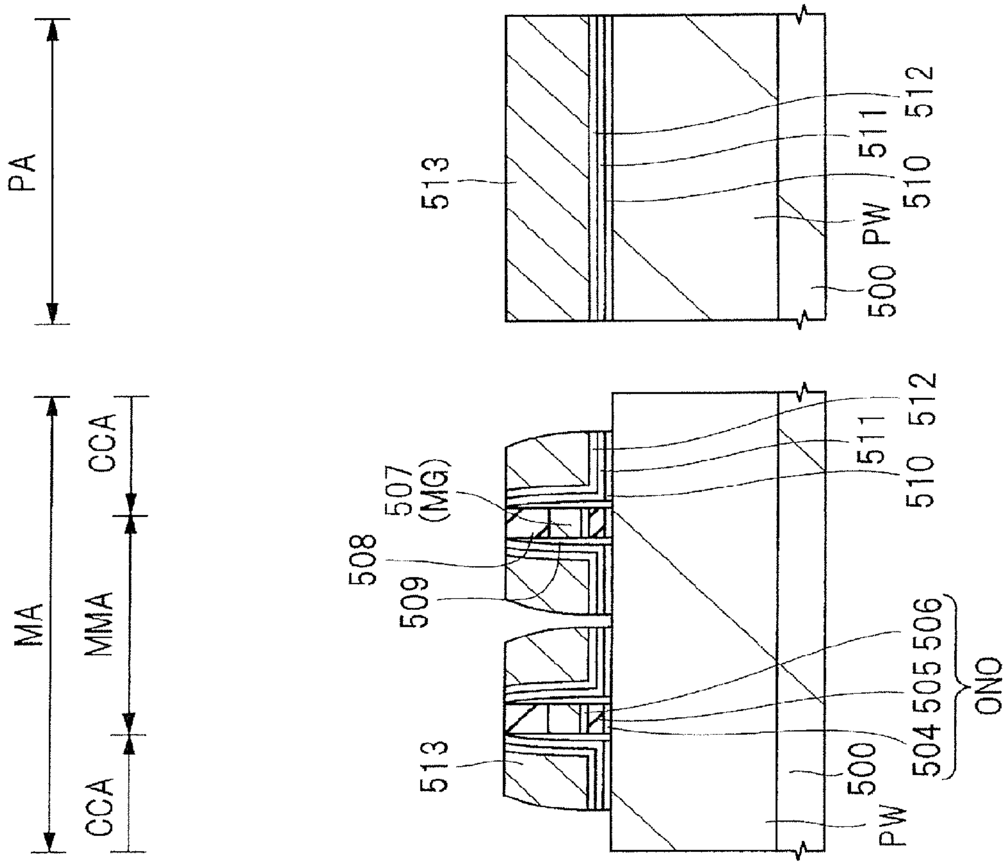
FIG. 72 is a cross-sectional view showing a manufacturing step of the semiconductor device of Fifth Embodiment following that of FIG. 71.

Next, as shown in FIG. 72, the upper surface of the polysilicon film 513 in the peripheral circuit region PA is covered with a mask (not illustrated) and the polysilicon film 513 in the memory cell region MA is etched back. By this etch back step, the polysilicon film 513 of a predetermined thickness from the surface thereof is removed by anisotropic dry etching. By this step, the polysilicon film 513 can be left in sidewall shape (sidewall film shape) on both sides of the memory gate electrode portion MG (on both sides of the stacked film of the insulating film ONO, polysilicon film 507, and silicon oxide film 508) via the silicon oxide film (sidewall film) 509, high-k insulating film 511, and titanium nitride film 512. At this time, respective portions of the titanium nitride film 512, the high-k insulating film 511, and the silicon oxide film 510 other than those arranged along the sidewall portion and below the polysilicon film 513 in sidewall shape are removed. The polysilicon film 513 in sidewall shape located on the side of the region CCA is a polysilicon film for substitution of a control gate electrode portion. Next, the mask (not illustrated) is removed.

Figure 73:
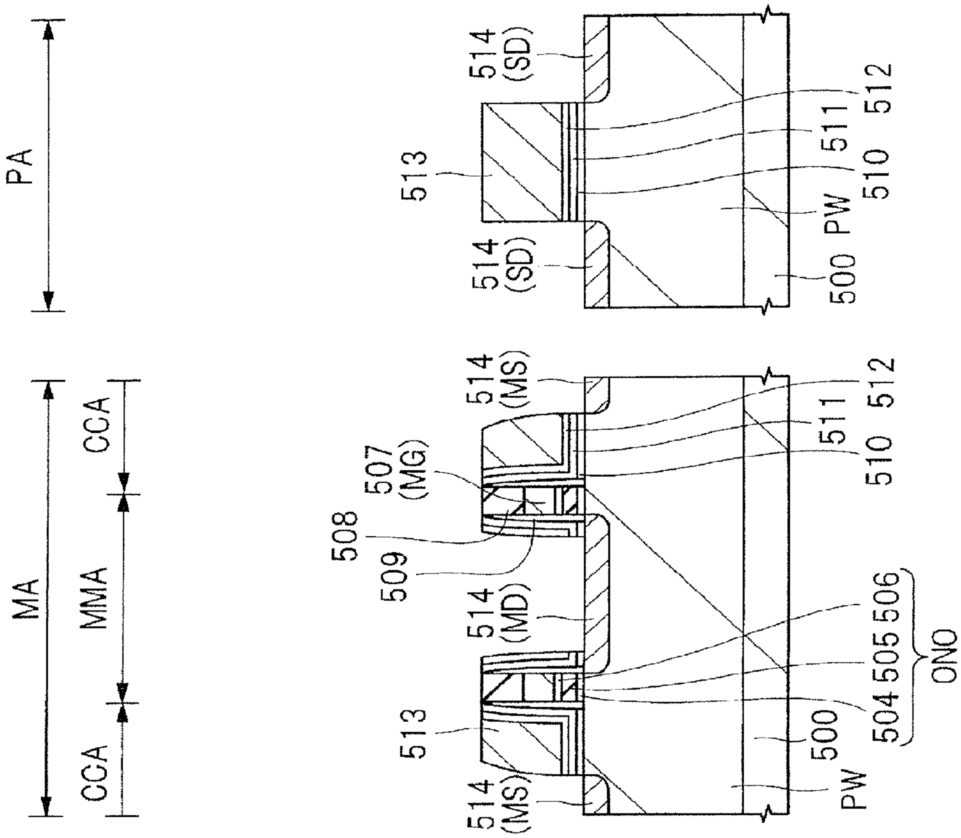
FIG. 73 is a cross-sectional view showing a manufacturing step of the semiconductor device of Fifth Embodiment following that of FIG. 72.

Next, as shown in FIG. 73, the polysilicon film 513 in the peripheral circuit region PA is formed into that for the substitution of a gate electrode portion while removing the polysilicon film 513 in sidewall shape located on the side of the region MMA. Next, a source region MS and a drain region MD of a memory cell and a source/drain region SD of the peripheral transistor are formed.

First, a photoresist film (not illustrated) is formed on the polysilicon film 513 in sidewall shape located in the region CCA and in the gate electrode portion formation region of the peripheral transistor by photolithography. With this photoresist film as a mask, the polysilicon film 513 located in the region MMA is etched. By this etching, the titanium nitride film 512, the high-k insulating film 511, and the silicon oxide film 510 below the polysilicon film 513 are removed. The titanium nitride film 512 and the high-k insulating film 511 arranged along the sidewall portion of the polysilicon film 513 remains along the sidewall portion of the memory gate electrode portion MG. The titanium nitride film 512, the high-k insulating film 511, the silicon oxide film 510, and the silicon oxide film 509 remaining along the sidewall portion of the memory gate electrode portion MG are called a sidewall residual film.

Next, an n type impurity such as arsenic (As) or phosphorus (P) is implanted to form a source region MS and a drain region MD of the memory cell in the memory cell region MA and to form a source/drain region SD in the peripheral circuit region PA. More specifically, an $n^+$ type semiconductor region 514 is formed by the ion implantation of an n type impurity such as arsenic (As) or phosphorus (P) into an exposed portion of the semiconductor substrate 100 (p well PW) with the memory gate electrode portion MG (including the sidewall residual film) and the polysilicon film 513 as a mask. At this time, implantation conditions or thermal diffusion conditions of the n type impurity are adjusted so that the n type impurity diffuses, in the region MMA, from the lower portion of the sidewall residual film on the sidewall portion of the memory gate electrode portion MG to the end portion of the memory gate electrode portion MG. The $n^+$ type semiconductor region 514 of the region MMA in the memory cell region MA becomes a drain region MD of the memory cell and the type semiconductor region 514 of the region CCA in the memory cell region MA becomes a source region MS of the memory cell. The $n^+$ type semiconductor region 514 in the peripheral circuit region PA becomes a source/drain region SD of the peripheral transistor. Since at the memory gate electrode portion MG, the height is about 120 nm due to the insulating film ONO, the polysilicon film 507, and the silicon oxide film 508, such a height can prevent, at the time of implantation of the n type impurity, the impurity from penetrating and reaching the channel region below the memory gate electrode portion MG.

After that, a metal silicide film (not illustrated) may be formed on the source region MS and the drain region MD of the memory cell and the source/drain region SD of the peripheral transistor by the salicide technology described in First Embodiment.

Next, as shown in FIGS. 74 to 78, the polysilicon film 513 is substituted with a metal electrode film 516 or the like to form a control gate electrode portion CG of the memory cell and a gate electrode portion GE of the peripheral transistor.

Figure 74:
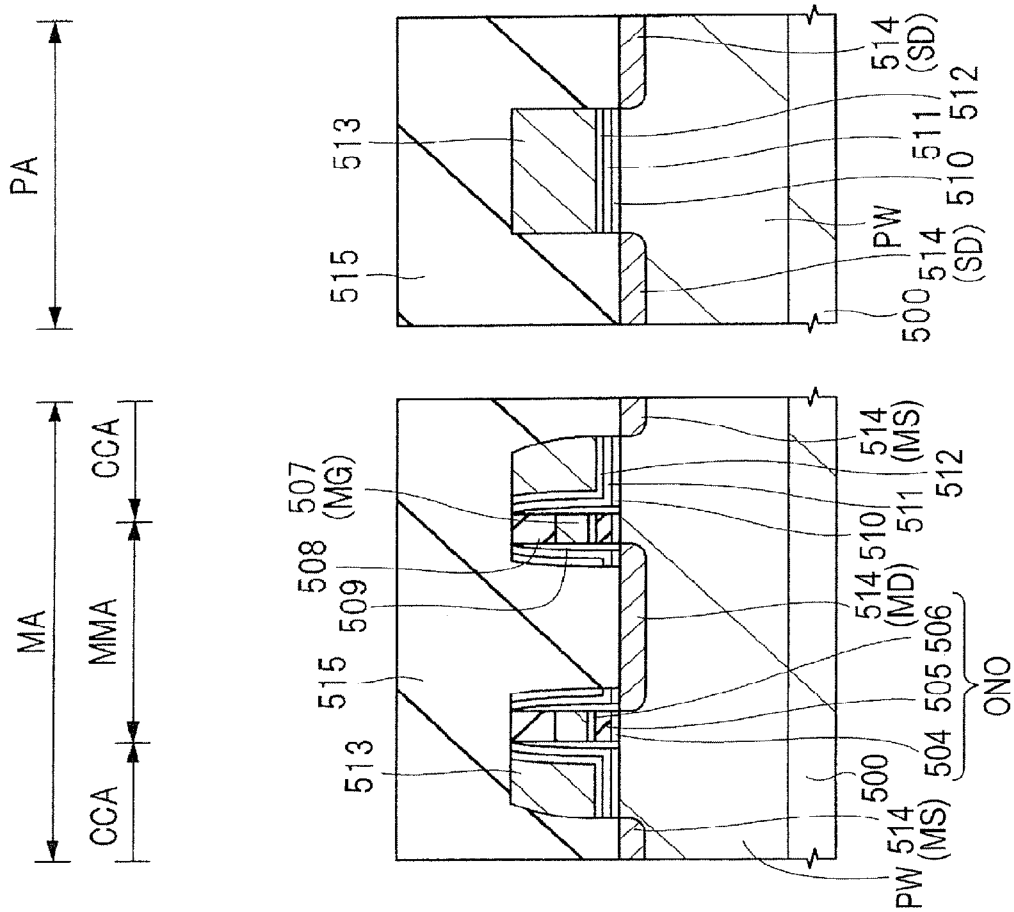
FIG. 74 is a cross-sectional view showing a manufacturing step of the semiconductor device of Fifth Embodiment following that of FIG. 73.
Figure 75:
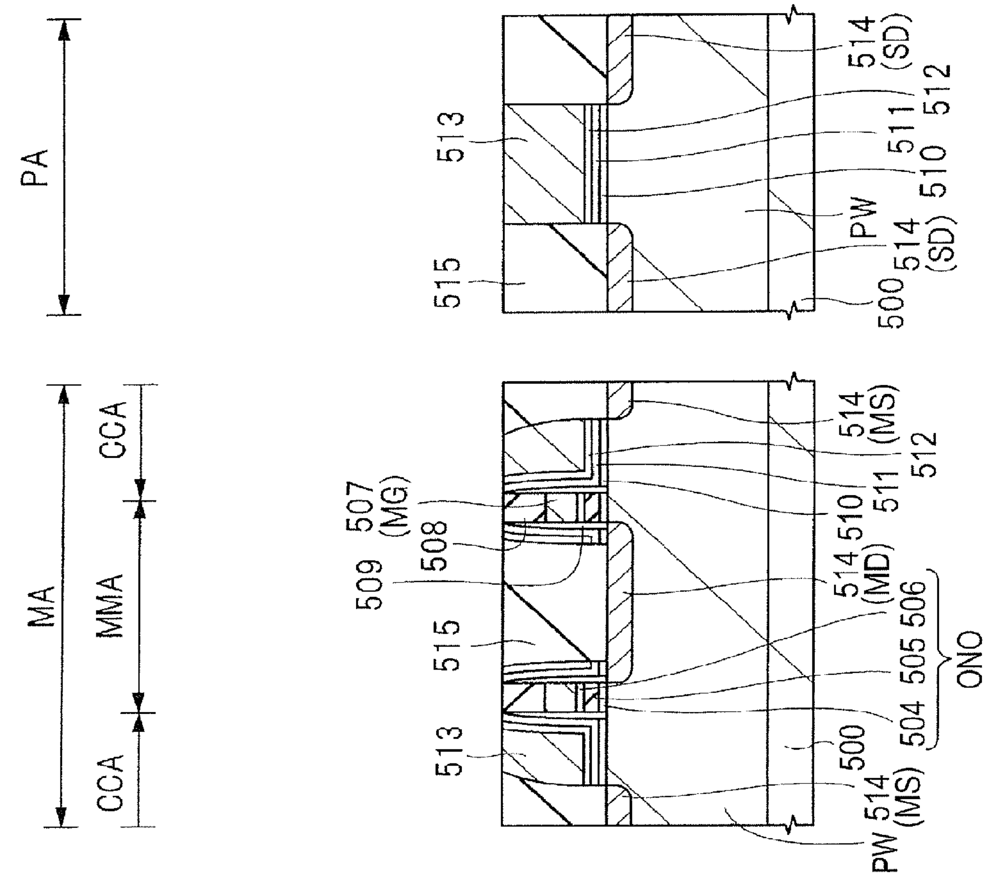
FIG. 75 is a cross-sectional view showing a manufacturing step of the semiconductor device of Fifth Embodiment following that of FIG. 74.
Figure 76:
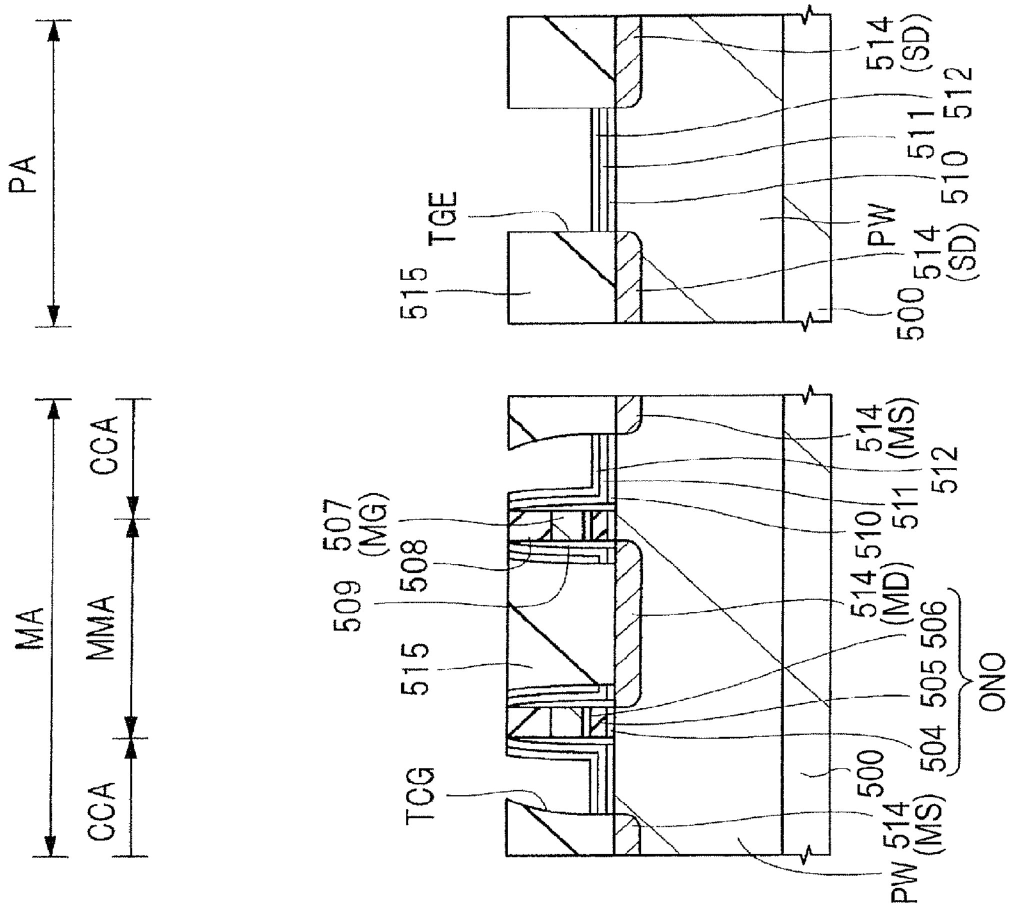
FIG. 76 is a cross-sectional view showing a manufacturing step of the semiconductor device of Fifth Embodiment following that of FIG. 75.

First, as shown in FIG. 74, a silicon oxide film 515 is deposited as an interlayer insulating film on the polysilicon film 513 and the memory gate electrode portion MG by CVD or the like. Next, as shown in FIG. 75, an upper portion of this silicon oxide film 515 is polished using CMP or the like until exposure of the surface of the polysilicon film 513 in the memory cell region MA and the peripheral circuit region PA. Next, as shown in FIG. 76, the polysilicon film 513 is removed by etching. By this step, a recess (trench, dent) TCG is formed in the control gate electrode portion formation region of the memory cell region MA and a recess (trench) TGE is formed in the gate electrode portion formation region of the peripheral transistor in the peripheral circuit region PA.

Figure 77:
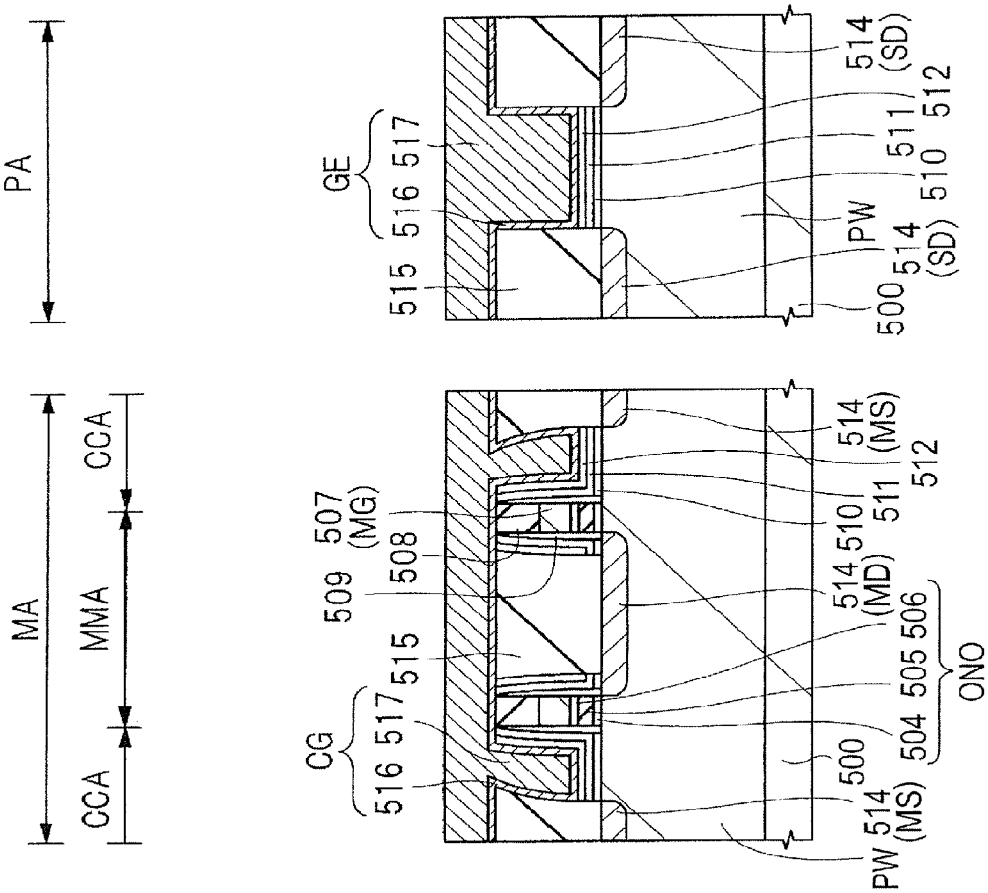
FIG. 77 is a cross-sectional view showing a manufacturing step of the semiconductor device of Fifth Embodiment following that of FIG. 76.

Next, as shown in FIG. 77, a metal film 517 is formed, via a metal electrode film 516, in the recesses TCG and TGE as well as on the silicon oxide film 515. For example, after deposition of a film of about 20 nm thick made of tantalum nitride/titanium/aluminum, an aluminum film is formed. These films can be formed, for example, by sputtering.

Figure 78:
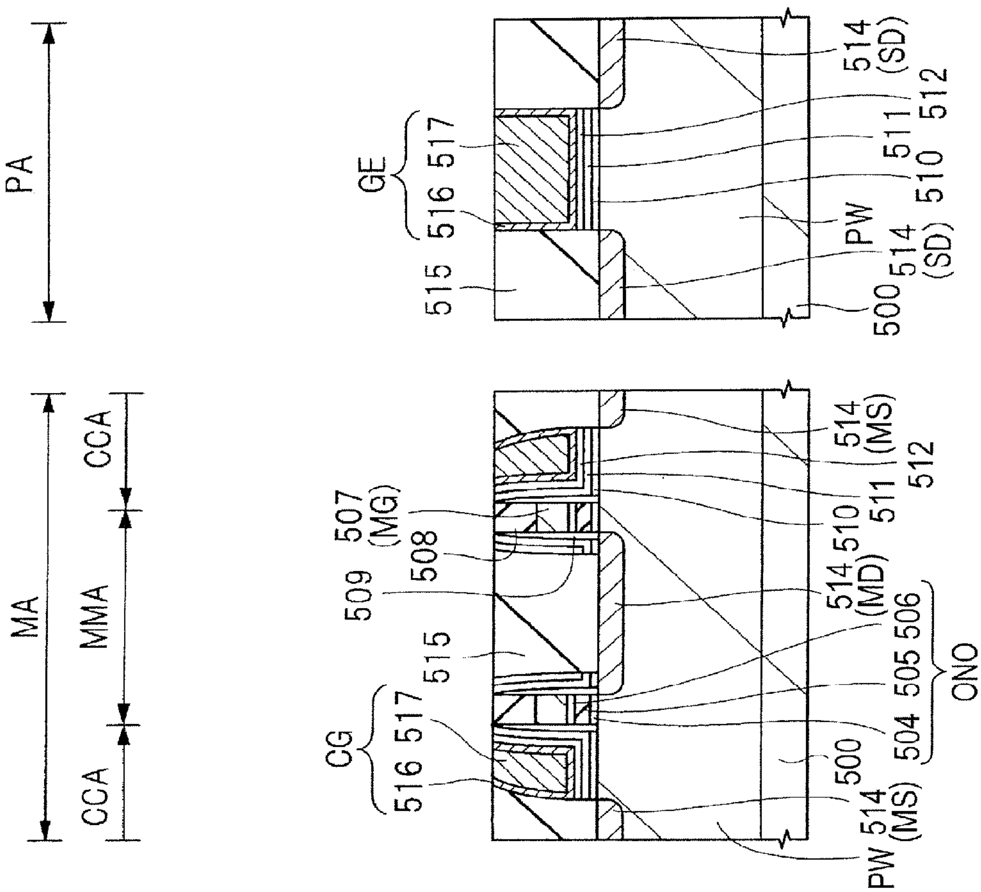
FIG. 78 is a cross-sectional view showing a manufacturing step of the semiconductor device of Fifth Embodiment following that of FIG. 77.

Next, as shown in FIG. 78, the metal electrode film 516 and the metal film 517 are removed until the surface of the silicon oxide film 515 is exposed. For example, the metal electrode film 516 and the metal film 517 are polished using CMP or the like until the surface of the silicon oxide film 515 is exposed. By this step, the recesses TCG and TGE are filled with the metal film 517 via the metal electrode film 516. This means that a control gate electrode portion CG of the memory cell is formed in the recess TCG and a gate electrode portion GE of the peripheral transistor is formed in the recess TGE. In other words, the polysilicon film 513 in the memory cell region MA and the polysilicon film 513 in the peripheral circuit region PA are each substituted with a stacked film of the metal electrode film 516 and the metal film 517.

Next, a silicon oxide film 518 is deposited as an interlayer insulating film by CVD or the like on the silicon oxide film 515, the control gate electrode portion CG, the gate electrode portion GE, and the like. Next, a plug is formed in the resulting silicon oxide films 515 and 518 and further, a wiring 520 is formed on the silicon oxide film 518 (refer to FIG. 66). The plug can be formed by embedding a conductive film in the interlayer insulating film. The wiring 520 can be formed, for example, by depositing a conductive film on the silicon oxide film 518 and then patterning it. Two or more wiring layers may thereafter be formed by repeating the step of forming an interlayer insulating film, a plug, and a wiring.

By the above-mentioned steps, the semiconductor device of the present embodiment can be formed. Thus, by the above-mentioned steps, a memory cell formed in a memory cell region MA and having a high-k insulating film and a metal film and a peripheral transistor formed in a peripheral circuit region PA and having a high-k insulating film and a metal film can be formed efficiently on the same semiconductor substrate. In other words, both a memory cell employing a high-k/metal configuration for the control transistor thereof and a peripheral transistor employing a high-k/metal configuration can be provided on the same semiconductor substrate.

According to the present embodiment, the polysilicon film 105 described in First Embodiment, that is, a film configuring a sidewall upon forming the memory gate electrode portion MG in sidewall shape becomes unnecessary. The step of forming or removing the polysilicon film 105 therefore becomes unnecessary, making it possible to simplify the manufacturing steps of the semiconductor device.

Sixth Embodiment

In Fifth Embodiment, after formation of an element isolation region in the main surface of a semiconductor substrate, an insulating film ONO is formed on the semiconductor substrate. Alternatively, an element isolation region may be formed after formation of an insulating film ONO on a semiconductor substrate.

The structure of a semiconductor device of the present embodiment will hereinafter be described referring to drawings.

[Description on Structure]

The semiconductor device of the present embodiment has a memory cell (memory transistor, control transistor) formed in a memory cell region MA and a peripheral transistor formed in a peripheral circuit region PA.

Figure 79:
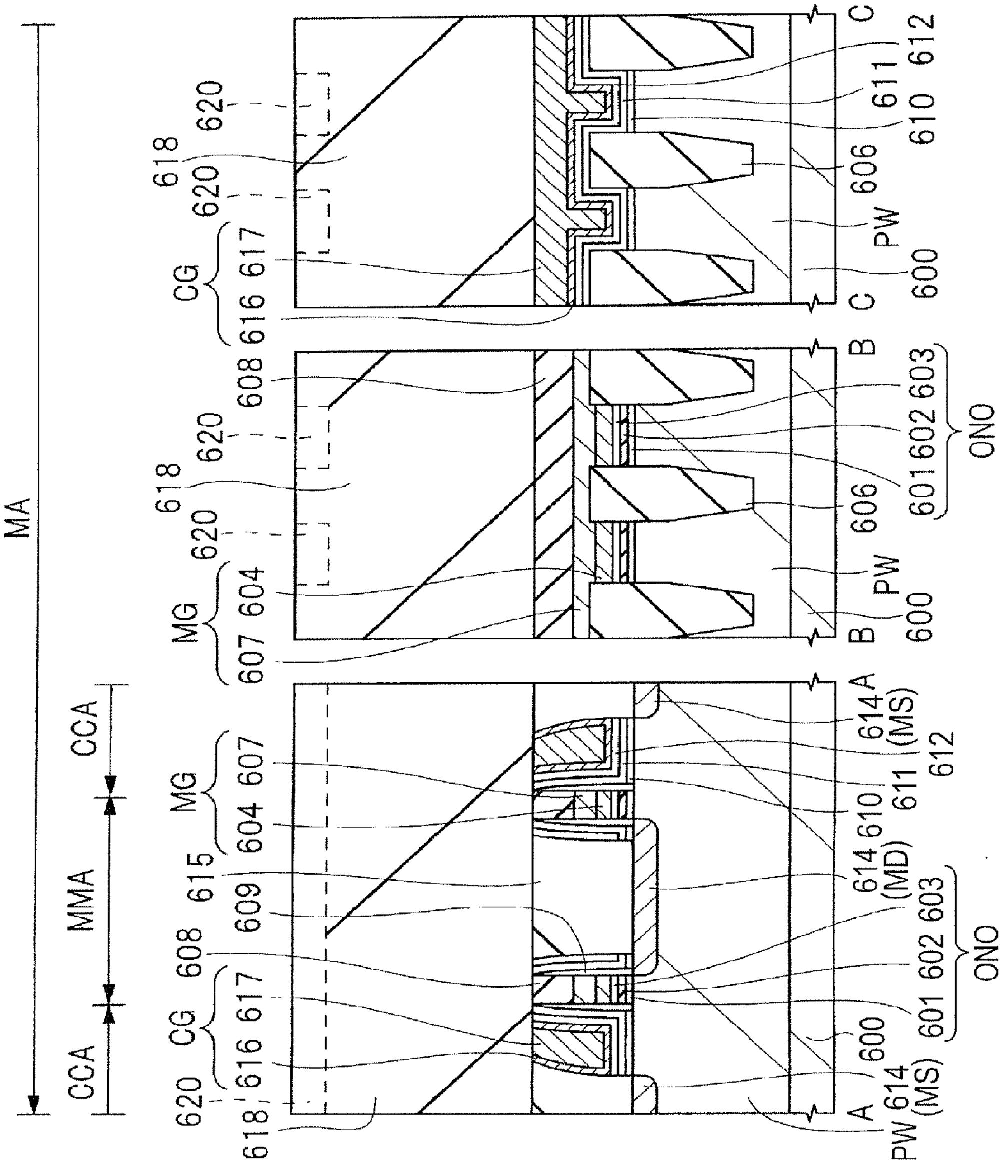
FIG. 79 is a cross-sectional view showing a semiconductor device of Sixth Embodiment.
Figure 80:
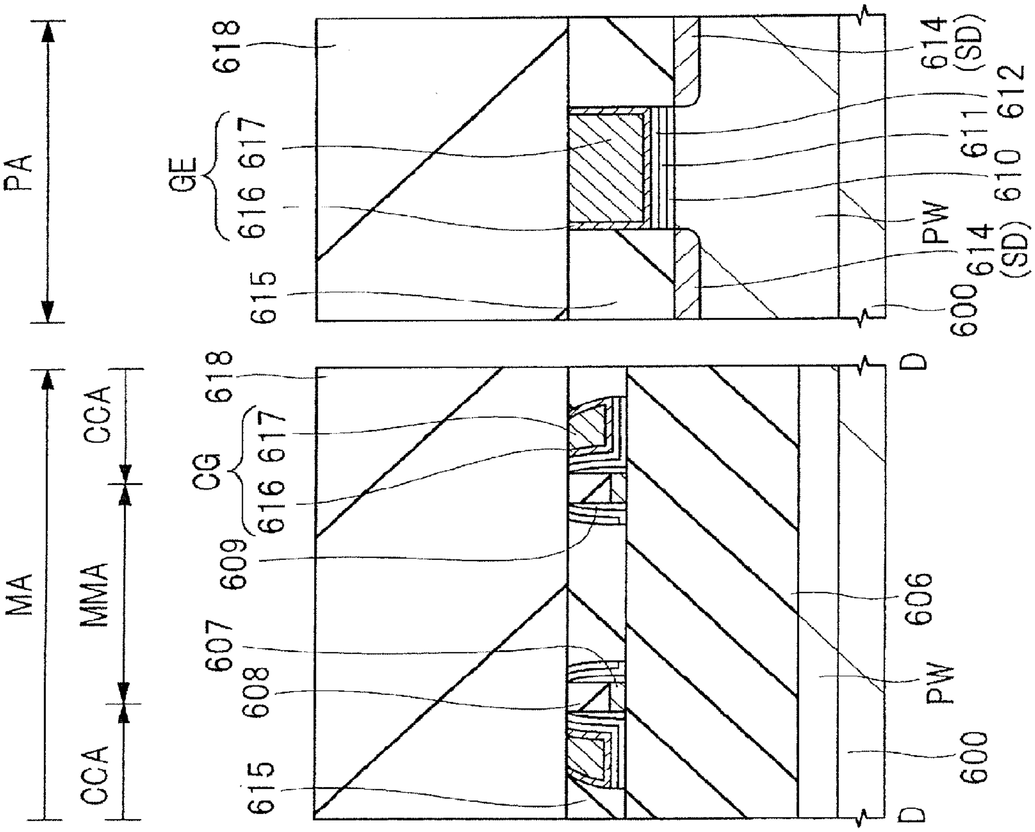
FIG. 80 is a cross-sectional view showing the semiconductor device of Sixth Embodiment.

FIGS. 79 and 80 are cross-sectional views showing the semiconductor device of the present embodiment. The drawing on the left (portion A-A) of FIG. 79 corresponds to the cross-section A-A of FIG. 4, the central drawing (portion B-B) of FIG. 79 corresponds to the B-B cross-section of FIG. 4, and the drawing on the right of FIG. 79 corresponds to the C-C cross-section.

As shown in FIG. 79, the memory cell is comprised of a control transistor having a control gate electrode portion CG and a memory transistor having a memory gate electrode portion MG. As shown in the drawing on the left of FIG. 79, the memory cell of the present embodiment has a configuration similar to that of Fifth Embodiment (FIG. 66).

Described specifically, the memory cell has a control gate electrode portion CC arranged over a semiconductor substrate 600 (p well PW) and a memory gate electrode portion MG arranged over the semiconductor substrate 600 (p well PW) and adjacent to the control gate electrode portion CG. For example, the memory gate electrode portion MG is made of silicon films (604 and 607), while the control gate electrode portion CG is made of a metal electrode film 616 and a metal film 617 thereon.

The memory cell further has an insulating film and a metal compound film arranged between the control gate electrode portion CG and the semiconductor substrate 600 (p well PW). The insulating film has a high dielectric constant film having a dielectric constant higher than that of a silicon nitride film. As shown in FIG. 79, the memory cell has, as the insulating film, a silicon oxide film 610 and a high-k insulating film (high dielectric constant film) 611. Further, the high-k insulating film 611 and the control gate electrode portion CG have therebetween a titanium nitride film 612 as the metal compound film.

The high-k insulating film (high dielectric constant film) 611 lie's between the control gate electrode portion CG and the semiconductor substrate 600 (p well PW) and between the control gate electrode portion CG and the memory gate electrode portion MG.

The titanium nitride film 612 (metal compound film) lies between the control gate electrode portion CG and the semiconductor substrate 600 (p well PW) and between the control gate electrode portion CG and the memory gate electrode portion MG.

The memory cell further has an insulating film ONO (601, 602, 603) arranged between the memory gate electrode portion MG and the semiconductor substrate 600 (p well PW). The insulating film ONO is comprised of, for example, a silicon oxide film 601, a silicon nitride film 602 thereon, and a silicon oxynitride film 603 thereon. The silicon nitride film 602 will serve as a charge accumulation portion.

The insulating film ONO (601, 602, 603) lies between the memory gate electrode portion MG and the semiconductor substrate 600 (p well PW). This memory gate electrode portion MG has thereon a silicon oxide film 608. A stacked film of the insulating film ONO (601, 602, 603), the memory gate electrode portion MG, and the silicon oxide film 608 has, on the sidewall thereof, a silicon oxide film 609 in sidewall shape.

This means that the control gate electrode portion CG and the memory gate electrode portion MG have therebetween the silicon oxide film 609, the high-k insulating film (high dielectric constant film) 611, and the metal compound film (titanium nitride film 612) which are provided successively from the side of the memory gate electrode portion MG.

The memory cell further has a source region MS and a drain region MD formed in the p well PW of the semiconductor substrate 600.

The source region MS is comprised of an $n^+$ type semiconductor region 614 formed in self alignment with the side surface of the control gate electrode portion CG and the drain region MD is comprised of an $n^+$ type semiconductor region 614 formed from below the side surface of the memory gate electrode portion MG.

The memory cell region MA has, as an interlayer insulating film, a silicon oxide film 615 and further, this silicon oxide film 615 has thereon a silicon oxide film 618 as an interlayer insulating film. This silicon oxide film 618 has thereon a wiring 620 and the like.

In the present embodiment, however, as shown in the central drawing of FIG. 79, an element isolation region 606 penetrates through the insulating film ONO and reaches the middle of the semiconductor substrate.

In First Embodiment, as described referring to FIG. 4, the active regions (hatched portion) are provided in a line shape extending in direction X and memory cell arrays are arranged. A plurality of memory cell arrays is arranged in direction Y (gate-width direction). In the cross-section B-B in the central drawing of FIG. 79, the active regions (exposed regions of the p well PW) and the element isolation regions 606 are arranged alternately. In the present embodiment, the element isolation regions 606 are formed so as to penetrate through the insulating film ONO. The active regions in a line shape extending in direction X are coupled to each other via a coupling portion extending in direction Y so that this coupling portion has thereon the insulating film ONO.

The peripheral transistor shown in FIG. 80 has a configuration similar to that of Fifth Embodiment (FIG. 66) so that a description on it is omitted. The operation example of the memory cell is similar to that of First Embodiment so that a description on it is omitted.

According to the present embodiment, similar to Fifth Embodiment, the control gate electrode portion CG and the memory gate electrode portion MG have therebetween the high-k insulating film (high dielectric constant film) 611 so that an electric field intensity at the end portion (corner portion) of the memory gate electrode portion MG on the side of the control gate electrode portion CG is relaxed upon erasing. This makes it possible to reduce uneven distribution of charges in the charge accumulation portion (silicon nitride film 602) and thereby improve the erase accuracy. In particular, erase accuracy can be improved even when the erase operation is performed using the above-mentioned EN tunneling system.

In addition, the control transistor also employs the high-k/metal configuration to reduce the resistance of the control gate electrode portion CG and reduce the power consumption of the control transistor. As a result, the resulting control transistor can have improved characteristics.

In the present embodiment, the element isolation region 606 penetrates through the insulating film ONO so that diffusion of charges via the insulating film ONO on the element isolation region 606 can be suppressed. As a result, the memory cell can have improved operation characteristics.

In the present embodiment, an n-MOS type memory cell has been described in detail, but a p-MOS type memory cell having the configuration of the present embodiment produces an advantage similar to that of the n-MOS type memory cell. Also as an example of the peripheral transistor, an n-MOS type transistor is shown, but a p-MOS type transistor may be used as the peripheral transistor or both an n-MOS type transistor and a p-MOS type transistor may be formed in the peripheral circuit region PA.

[Description on Manufacturing Method]

Next, a manufacturing method of the semiconductor device of the present embodiment will be described referring to FIGS. 81 to 98. FIGS. 81 to 98 are cross-sectional views showing manufacturing steps of the semiconductor device of the present embodiment.

Referring to the drawings, a step of forming a memory cell in the memory cell region MA and a peripheral transistor in the peripheral circuit region PA will hereinafter be described.

Figure 81:
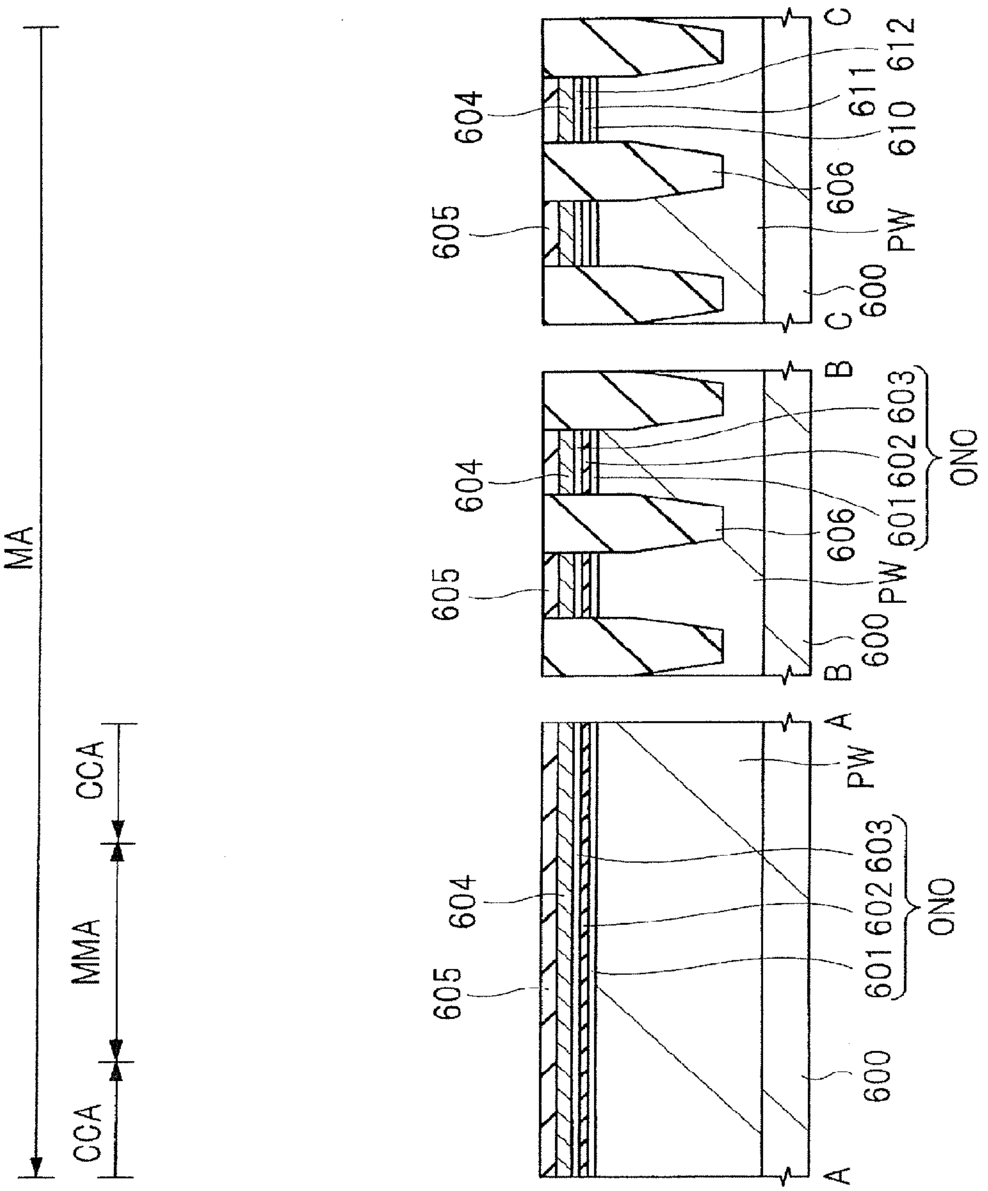
FIG. 81 is a cross-sectional view showing a manufacturing step of the semiconductor device of Sixth Embodiment.
Figure 82:
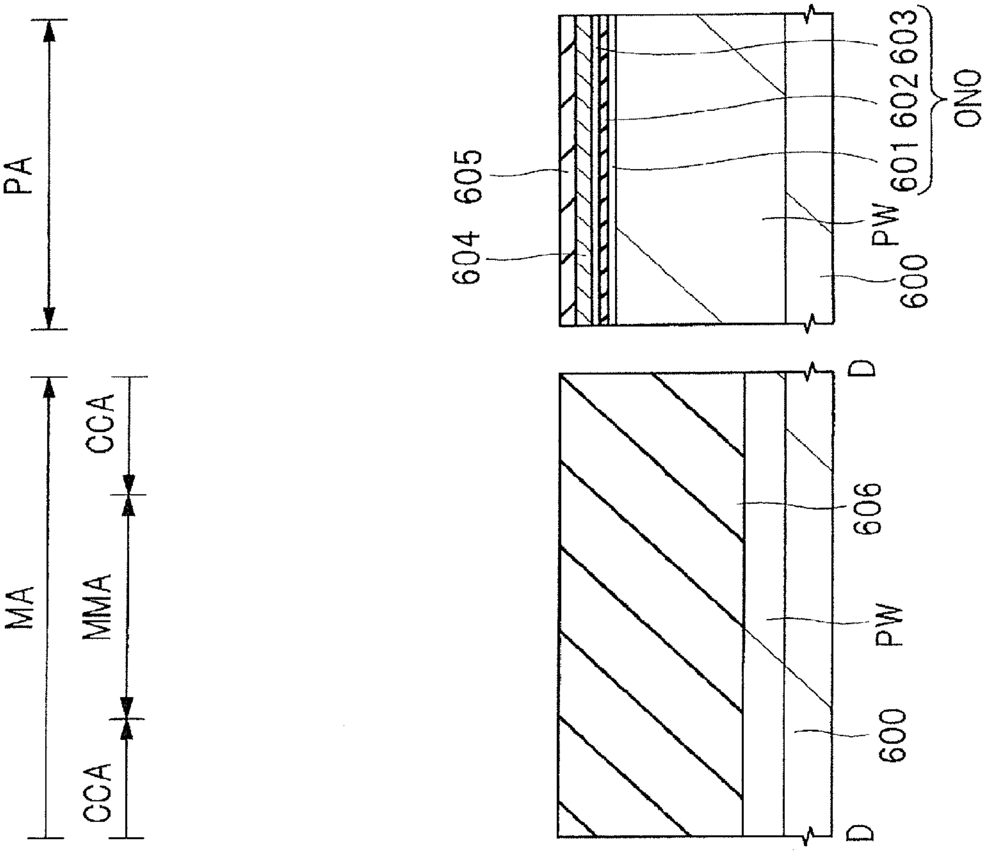
FIG. 82 is a cross-sectional view showing a manufacturing step of the semiconductor device of Sixth Embodiment.

First, as shown in FIGS. 81 and 82, after formation of a p well PW in a semiconductor substrate 600 and formation of an insulating film ONO comprised of a silicon oxide film 601, a silicon nitride film 602, and a silicon oxynitride film 603 on the semiconductor substrate 600, an element isolation region 606 is formed in the main surface of the semiconductor substrate 600.

More specifically, the p well PW in the semiconductor substrate 600 can be formed by the ion implantation of a p type impurity (for example, boron (B)) in the semiconductor substrate 600 in a manner similar to that of First Embodiment.

Next, an insulating film ONO (601, 602, 603) is formed on the semiconductor substrate 600 (p well PW), followed by the formation of a polysilicon film 604 and a silicon nitride film 605 thereon. First, a silicon oxide film 601 is formed on the semiconductor substrate 600. This silicon oxide film 601 is formed, for example, by thermal oxidation so as to have a thickness of about 4 nm. The silicon oxide film 601 may be formed using CVD or the like. Then, a silicon nitride film 602 of about 6 nm thick is deposited on the silicon oxide film 601, for example, by CVD. This silicon nitride film 602 becomes a charge accumulation portion of the memory cell and becomes an intermediate layer configuring the insulating film ONO. Next, a silicon oxynitride film 603 of about 8 nm thick is deposited on the silicon nitride film 602 by CVD or the like. As a result, the insulating film ONO comprised of the silicon oxide film 601, the silicon nitride film 602, and the silicon oxynitride film 603 can be formed.

Then, a polysilicon film 604 of about 20 nm thick is formed on the silicon oxynitride film 603 (insulating film ONO) by CVD or the like. This polysilicon film 604 will be a portion of a memory gate electrode portion MG. Then, a silicon nitride film 605 of about 50 nm thick is formed on the polysilicon film 604 by CVD or the like.

Next, an element isolation region 606 is formed. This element isolation region 606 can be formed using STI described in First Embodiment. Described specifically, an element isolation trench of about 150 nm deep penetrating through the silicon nitride film 605, the polysilicon film 604, and the insulating film ONO and reaching the semiconductor substrate 600 (p well PW) is formed and the trench is filled with a silicon oxide film to form the element isolation region 606.

Figure 83:
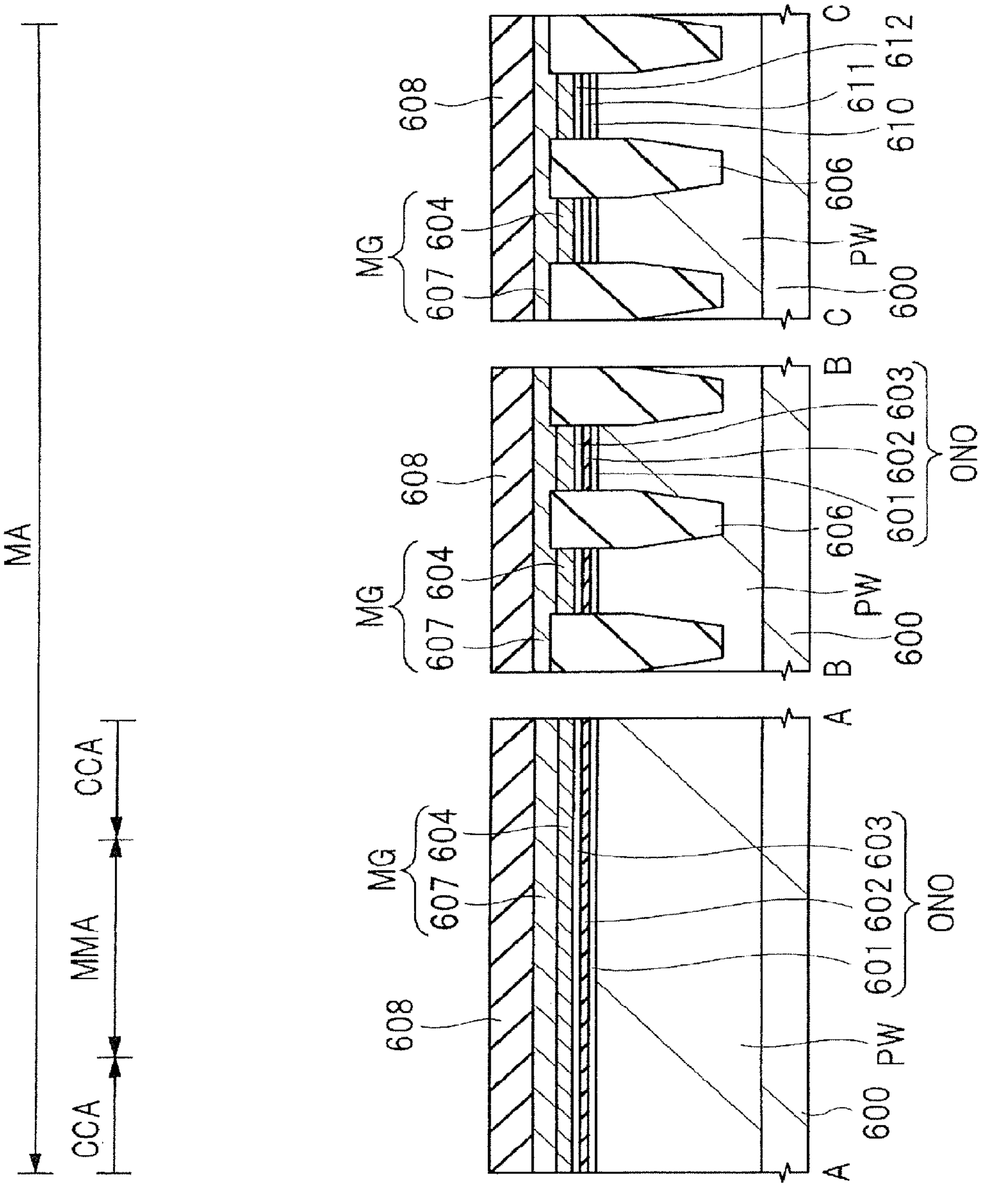
FIG. 83 is a cross-sectional view showing a manufacturing step of the semiconductor device of Sixth Embodiment following that of FIG. 81.
Figure 84:
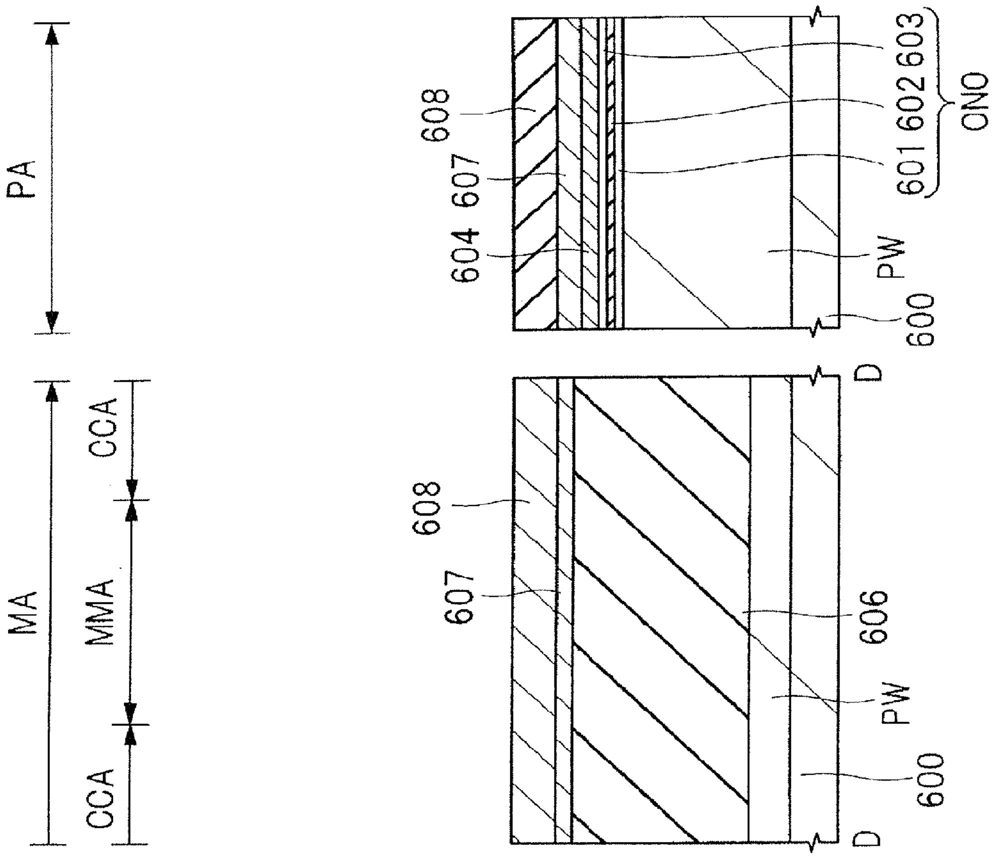
FIG. 84 is a cross-sectional view showing a manufacturing step of the semiconductor device of Sixth Embodiment following that of FIG. 82.

Next, as shown in FIGS. 83 and 84, after removal of the silicon nitride film 605, a polysilicon film 607 having a thickness equal to or greater than the removed silicon nitride film 605 is formed on the element isolation region 606 and the polysilicon film 604. As a result, a plurality of polysilicon films 604 isolated by the element isolation region 606 is coupled to each other by the polysilicon film 607. These two layers of the polysilicon films 604 and 607 will be a memory gate electrode portion MG. Then, a silicon oxide film 608 is formed on the polysilicon film 607 by CVD or the like.

Figure 85:
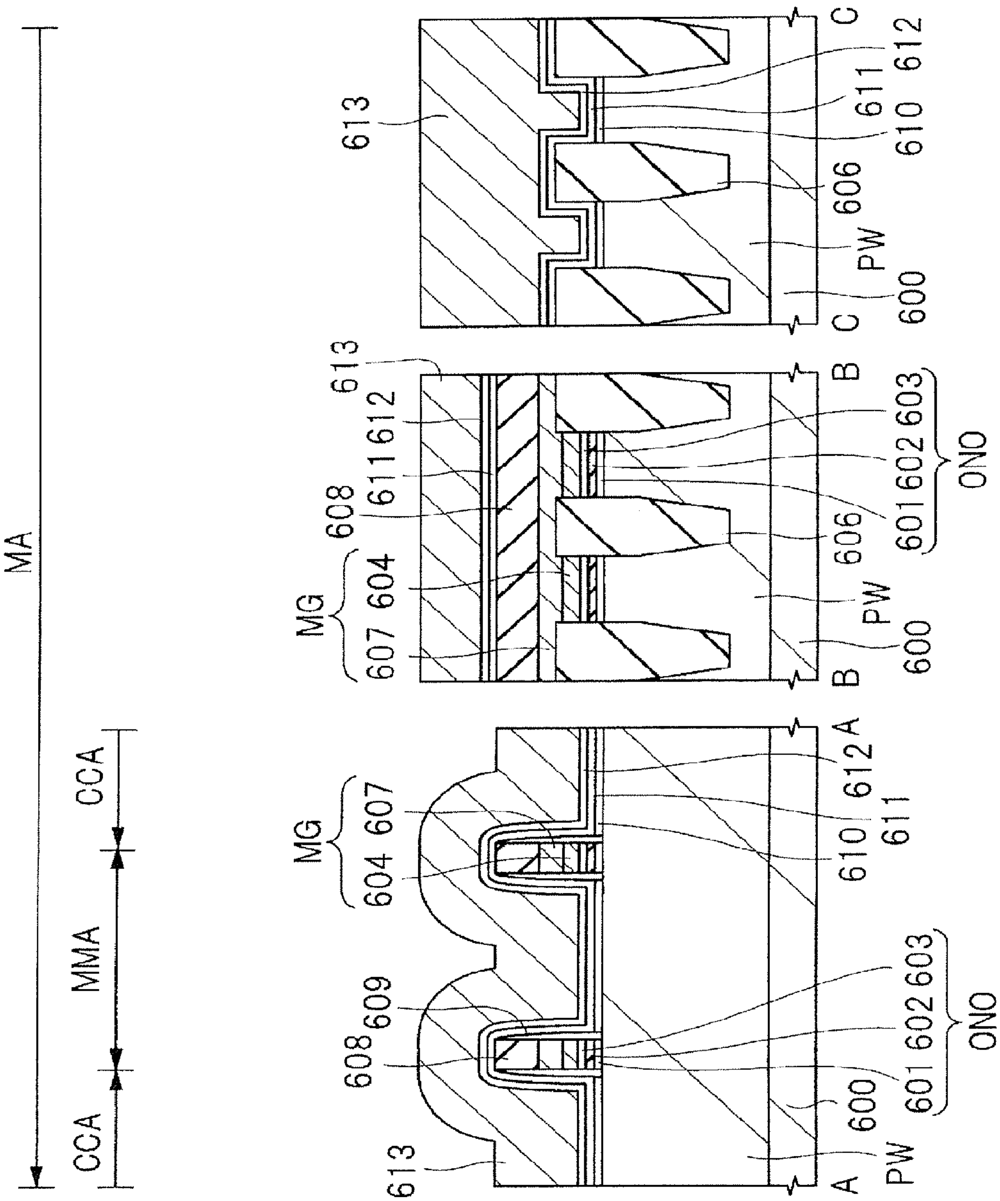
FIG. 85 is a cross-sectional view showing a manufacturing step of the semiconductor device of Sixth Embodiment following that of FIG. 83.
Figure 86:
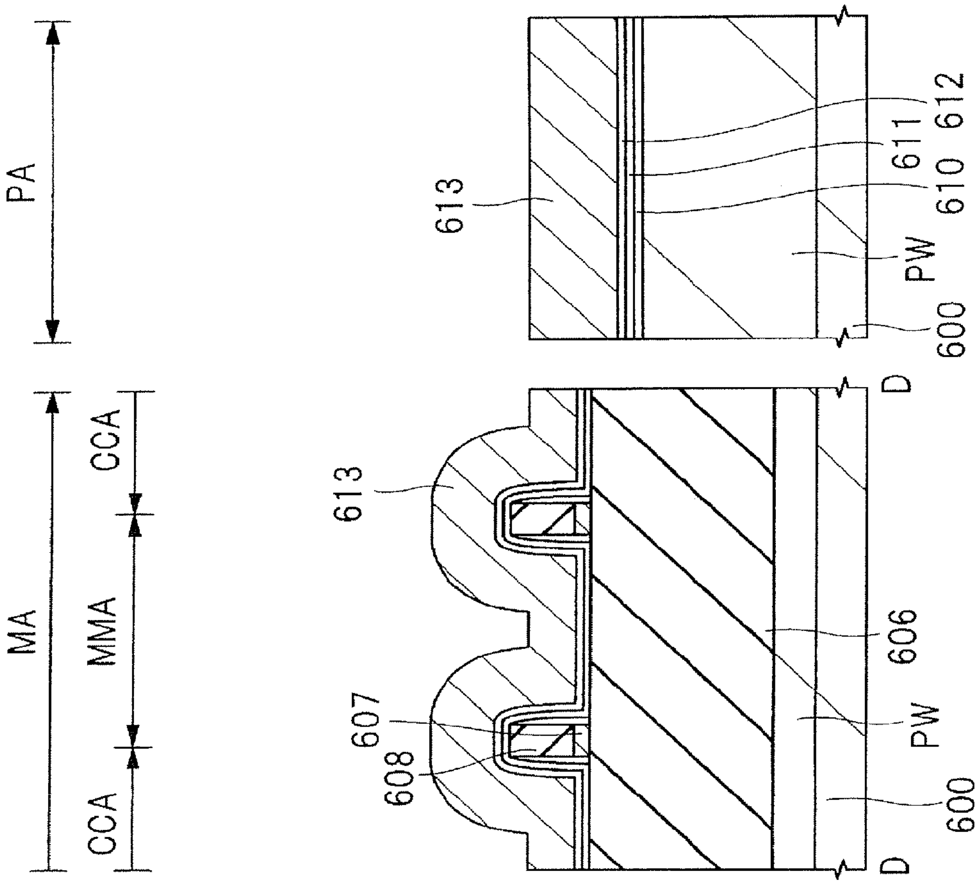
FIG. 86 is a cross-sectional view showing a manufacturing step of the semiconductor device of Sixth Embodiment following that of FIG. 84.

Next, as shown in FIGS. 85 and 86, a photoresist film (not illustrated) is formed in the memory gate electrode portion formation region by photolithography. With this photoresist film as a mask, the silicon oxide film 608, the polysilicon films 607 and 604, and the insulating film ONO are dry etched. As a result, a memory gate electrode portion MG (polysilicon films 604 and 607) are formed on the semiconductor substrate 600 (p well PW) via the insulating film ONO. This memory gate electrode portion MG has thereon the residual silicon oxide film 608.

Next, a silicon oxide film 609 in sidewall shape is formed on the sidewall of the memory gate electrode portion MG as in Fifth Embodiment. Next, a silicon oxide film 610 is formed on the semiconductor substrate 600 and then, a high-k insulating film 611, a titanium nitride film 612, and a polysilicon film 613 are formed as in Fifth Embodiment on the semiconductor substrate 600 (p well PW) including on the silicon oxide film (sidewall film) 609 and the silicon oxide film 608.

Figure 87:
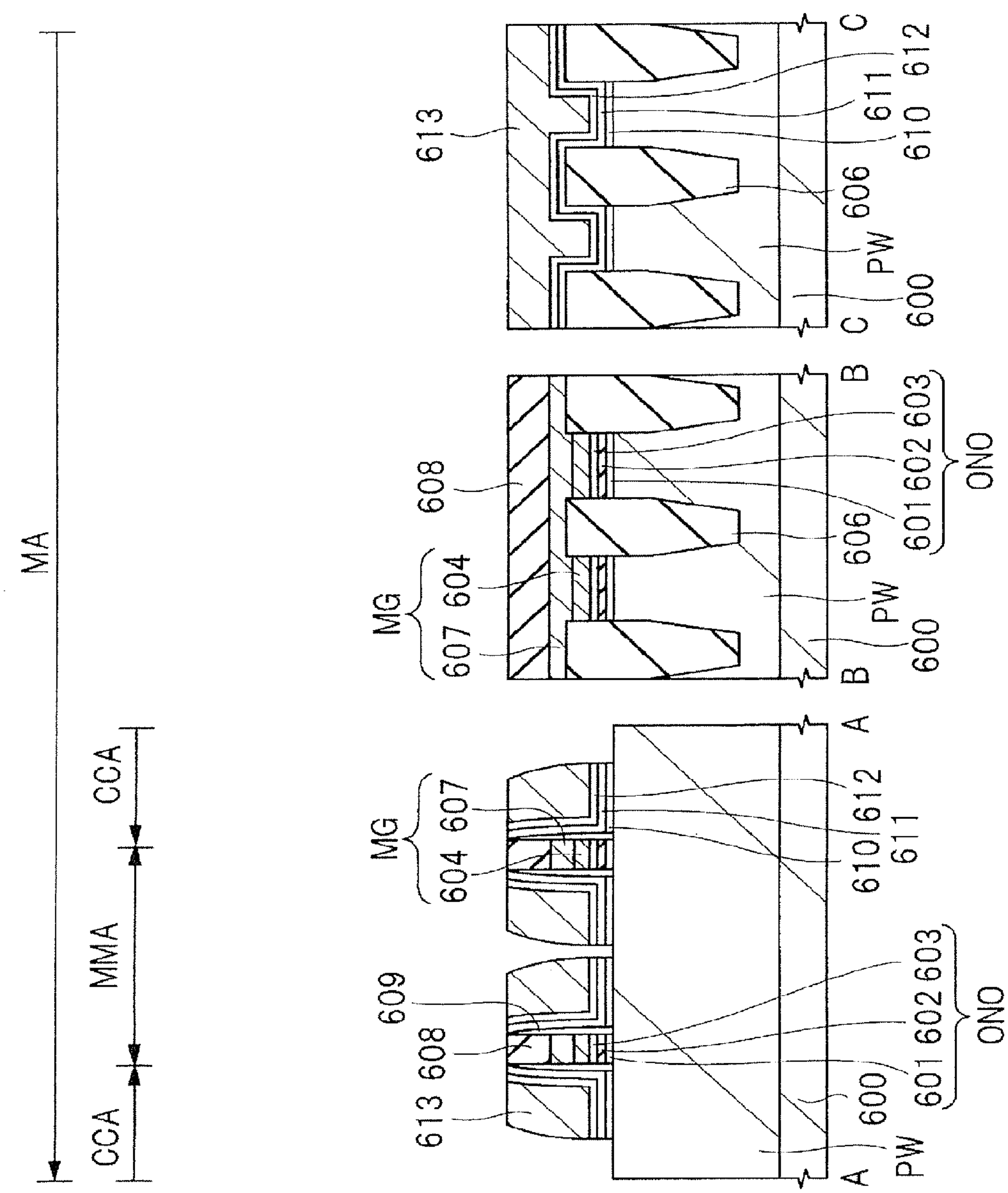
FIG. 87 is a cross-sectional view showing a manufacturing step of the semiconductor device of Sixth Embodiment following that of FIG. 85.
Figure 88:
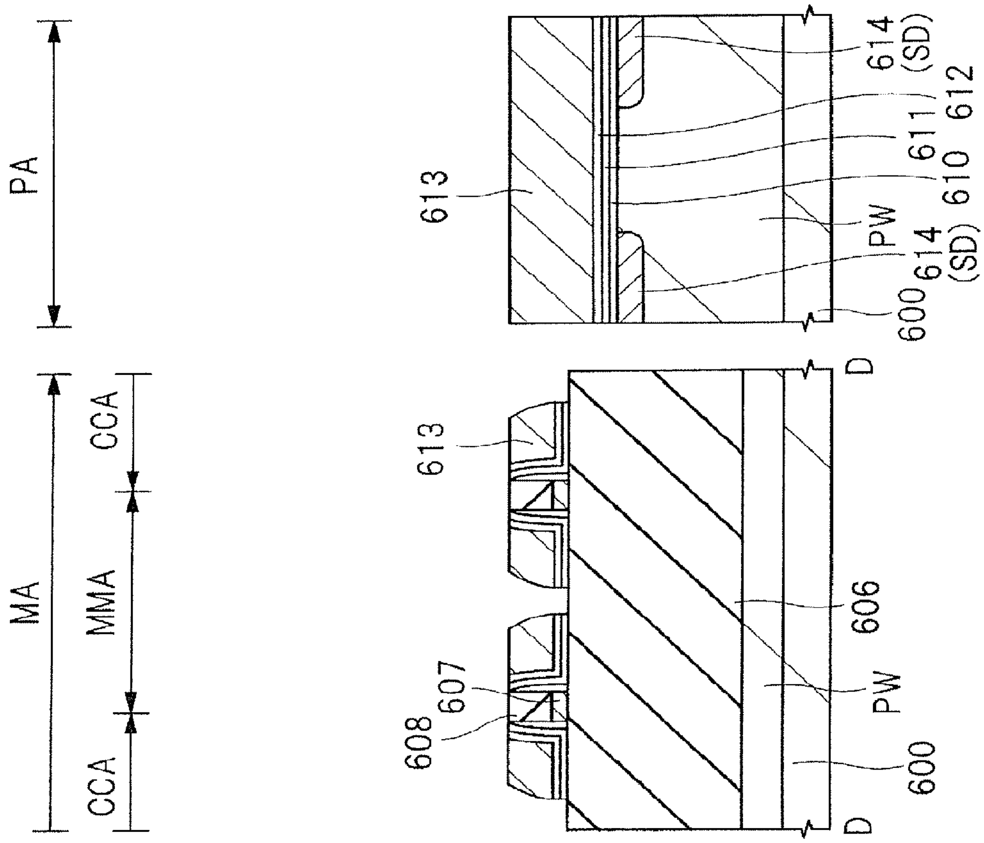
FIG. 88 is a cross-sectional view showing a manufacturing step of the semiconductor device of Sixth Embodiment following that of FIG. 86.

Next, as shown in FIGS. 87 and 88, the upper surface of the polysilicon film 613 in the peripheral circuit region PA is covered with a mask film (not illustrated) and the polysilicon film 613 in the memory cell region MA is etched back. In this etch back step, as in Fifth Embodiment, the polysilicon film 613 of a predetermined film thickness from the surface thereof is removed by anisotropic dry etching. By this step, the polysilicon film 613 can be left in sidewall shape (sidewall film shape) on both sides (both sides of the stacked film of the insulating film ONO, the polysilicon films 601 and 607, and the silicon oxide film 608) of the memory gate electrode portion MG via the silicon oxide film (sidewall film) 609, the high-k insulating film 611, and the titanium nitride film 612. The polysilicon film 613 in sidewall shape located on the side of the region CCA is a polysilicon film for substitution of a control gate electrode portion. Next, the above-mentioned mask (not illustrated) is removed.

Figure 89:
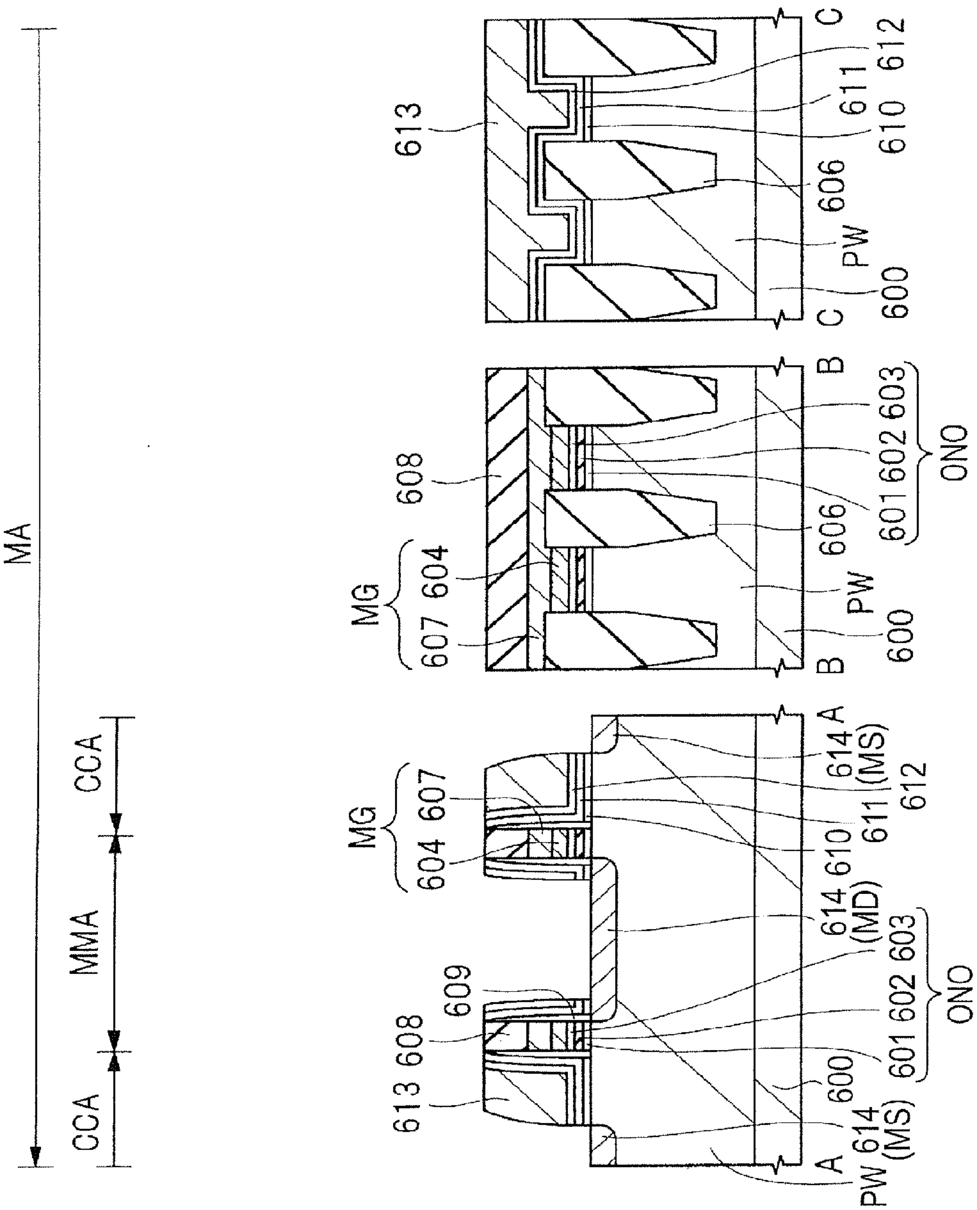
FIG. 89 is a cross-sectional view showing a manufacturing step of the semiconductor device of Sixth Embodiment following that of FIG. 87.
Figure 90:
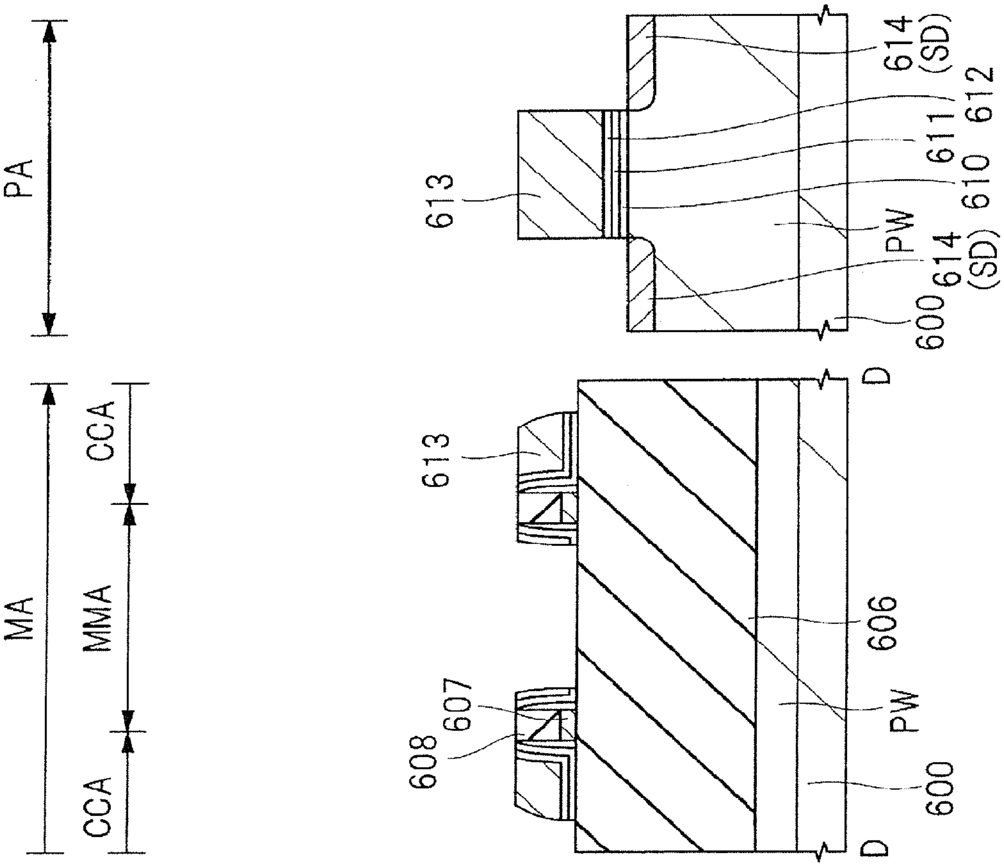
FIG. 90 is a cross-sectional view showing a manufacturing step of the semiconductor device of Sixth Embodiment following that of FIG. 88.

Next, as shown in FIGS. 89 and 90, a polysilicon film 613 for substitution of a gate electrode portion is formed in the peripheral circuit region PA while removing the polysilicon film 613 in sidewall shape located on the side of the region MMA. Next, a source region MS and a drain region MD of the memory cell and a source/drain region SD of the peripheral transistor are formed. These steps are similar to those of Fifth Embodiment.

After that, a metal silicide film (not illustrated) may be formed on the source region MS and the drain region MD of the memory cell and the source/drain region SD of the peripheral transistor by the salicide technology described in First Embodiment.

Next, as shown in FIGS. 91 to 98, the polysilicon film 613 is substituted with a metal electrode film 616 and the like to form a control gate electrode portion CG of the memory cell and a gate electrode portion GE of the peripheral transistor.

Figure 91:
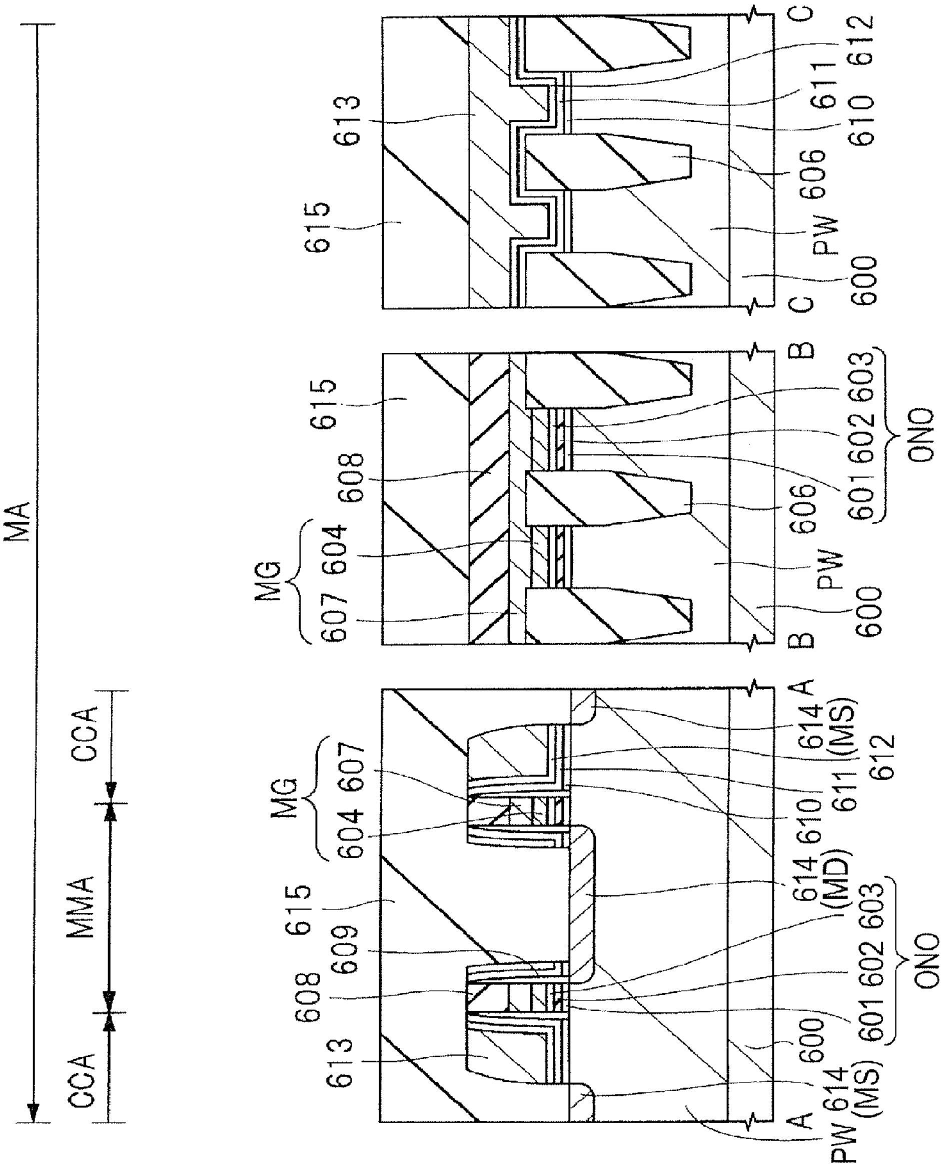
FIG. 91 is a cross-sectional view showing a manufacturing step of the semiconductor device of Sixth Embodiment following that of FIG. 89.
Figure 92:
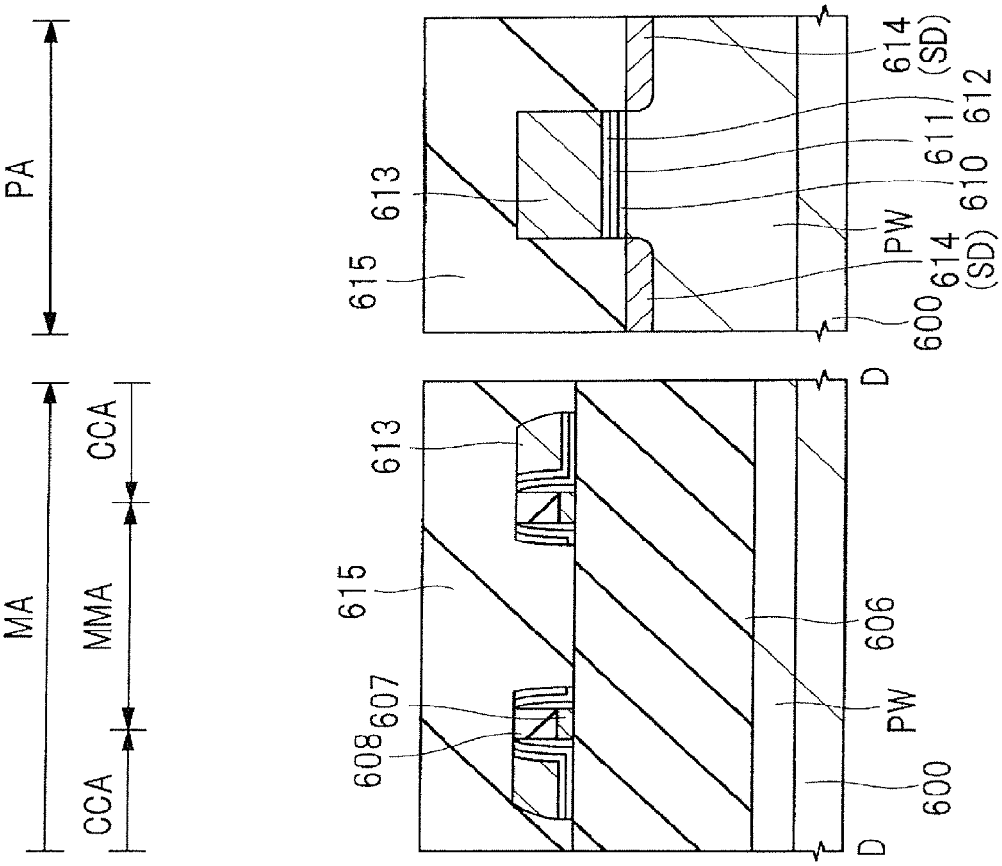
FIG. 92 is a cross-sectional view showing a manufacturing step of the semiconductor device of Sixth Embodiment following that of FIG. 90.
Figure 93:
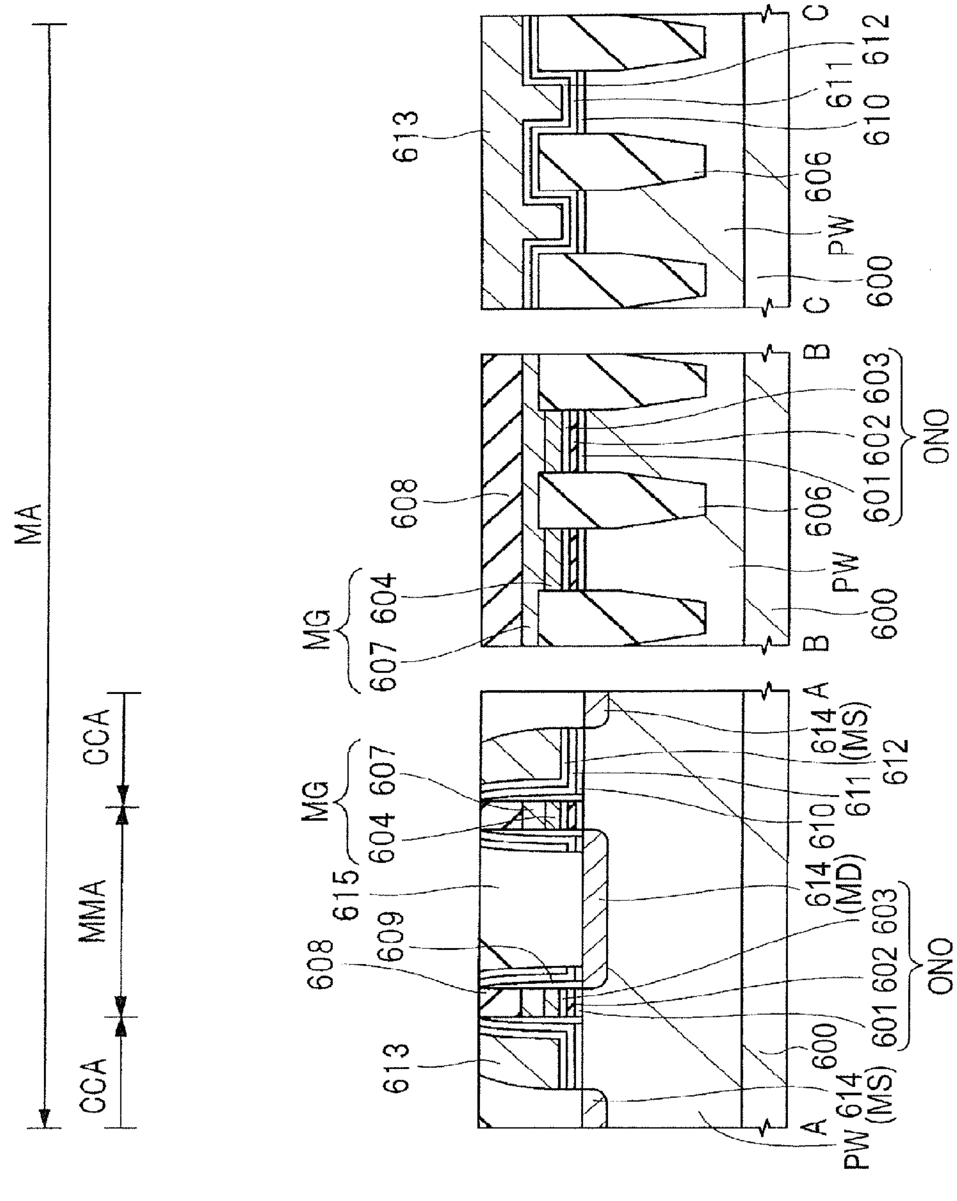
FIG. 93 is a cross-sectional view showing a manufacturing step of the semiconductor device of Sixth Embodiment following that of FIG. 91.
Figure 94:
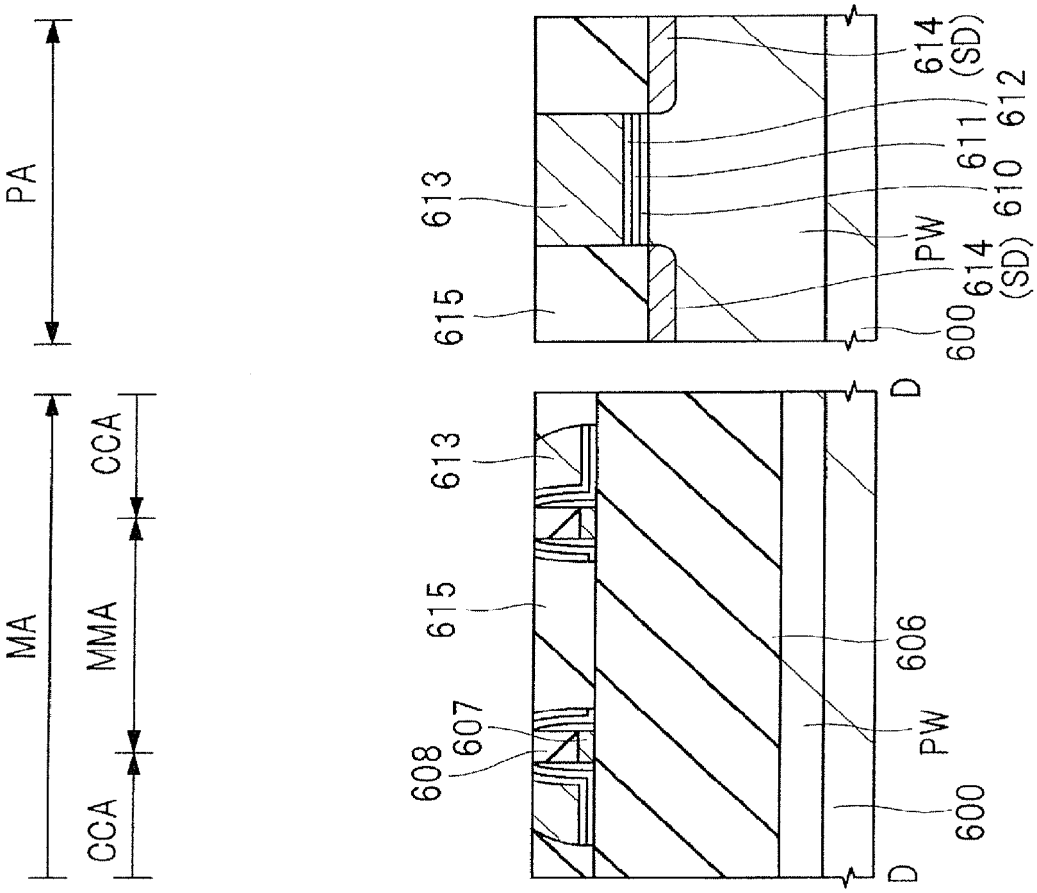
FIG. 94 is a cross-sectional view showing a manufacturing step of the semiconductor device of Sixth Embodiment following that of FIG. 92.
Figure 95:
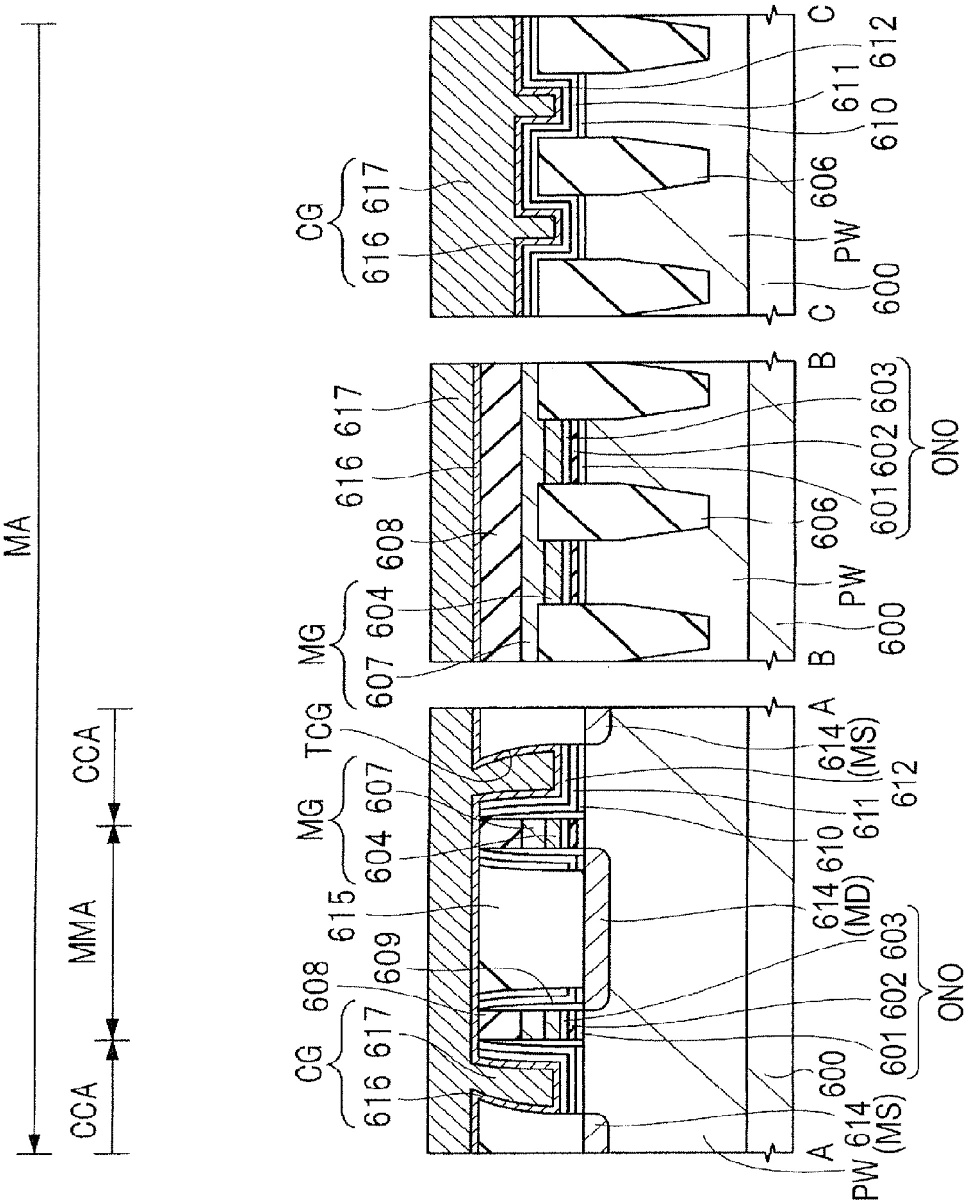
FIG. 95 is a cross-sectional view showing a manufacturing step of the semiconductor device of Sixth Embodiment following that of FIG. 93.
Figure 96:
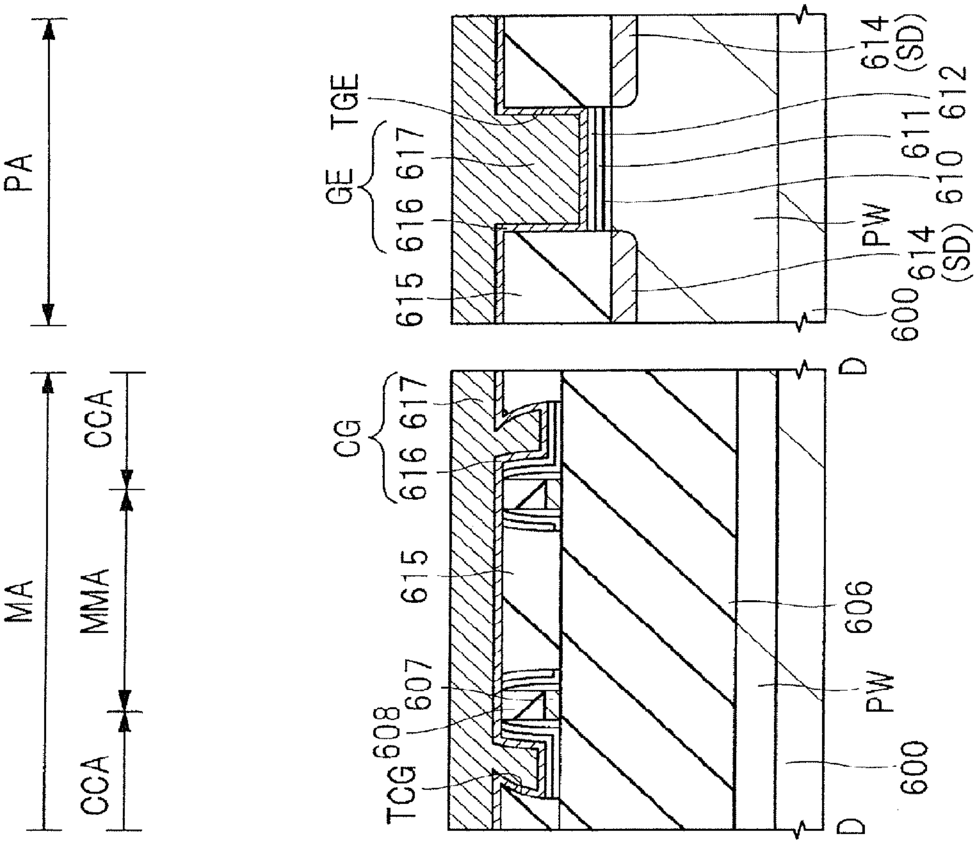
FIG. 96 is a cross-sectional view showing a manufacturing step of the semiconductor device of Sixth Embodiment following that of FIG. 94.

First, as shown in FIGS. 91 and 92, a silicon oxide film 615 is formed as an interlayer insulating film on the polysilicon film 613 and the silicon oxide film 608 by CVD or the like. Next, as shown in FIGS. 93 and 94, an upper portion of this silicon oxide film 615 is polished using CMP or the like until the surface of the polysilicon film 613 in the memory cell region MA and the peripheral circuit region PA is exposed. Next, the polysilicon film 613 is removed by etching. By this step, as shown in FIGS. 95 and 96, a recess (trench, dent) TCG is formed in the control gate electrode portion formation region of the memory cell region MA and a recess (trench, dent) TGE is formed in the gate electrode portion formation region of the peripheral transistor in the peripheral circuit region PA.

Figure 97:
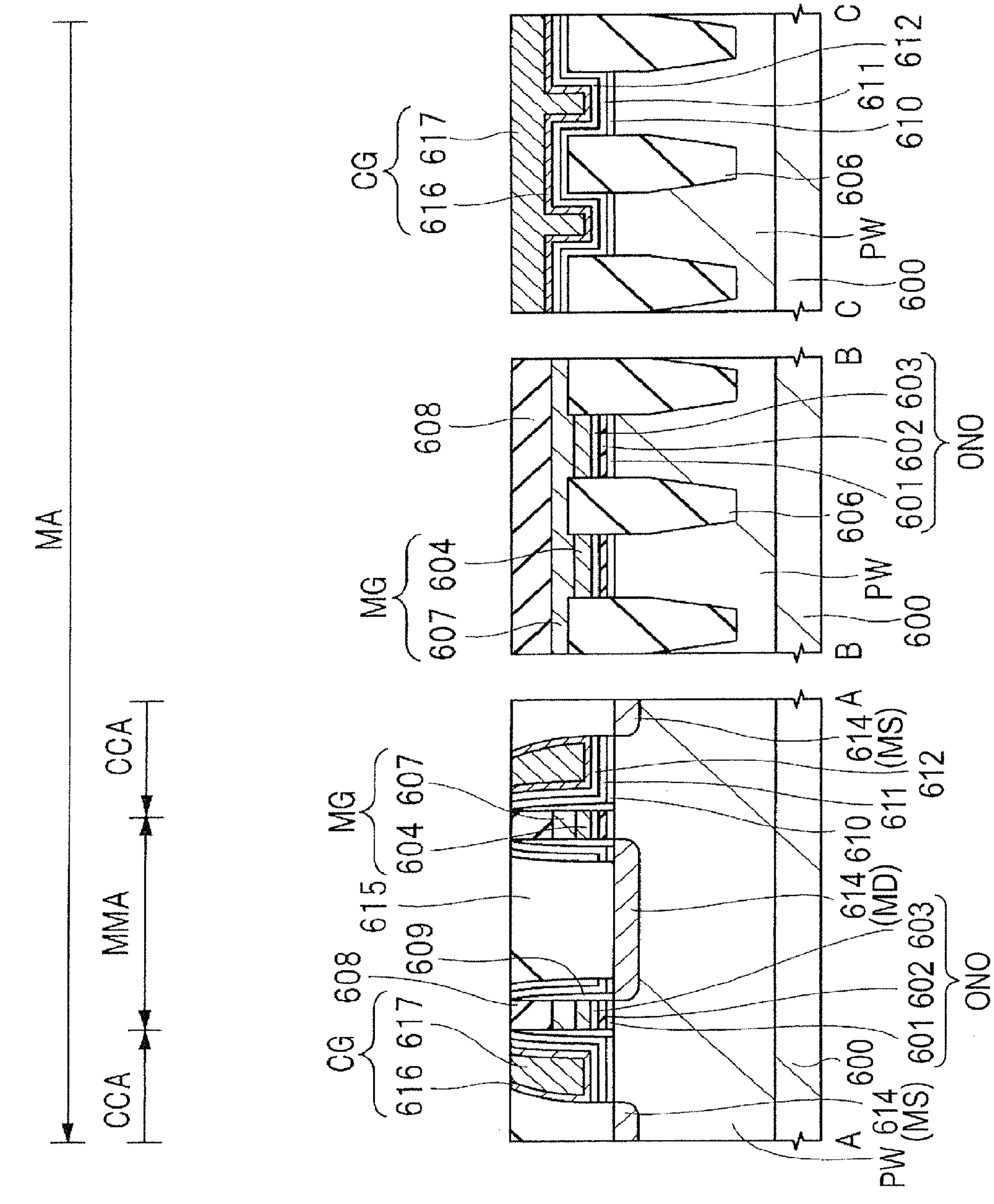
FIG. 97 is a cross-sectional view showing a manufacturing step of the semiconductor device of Sixth Embodiment following that of FIG. 95.
Figure 98:
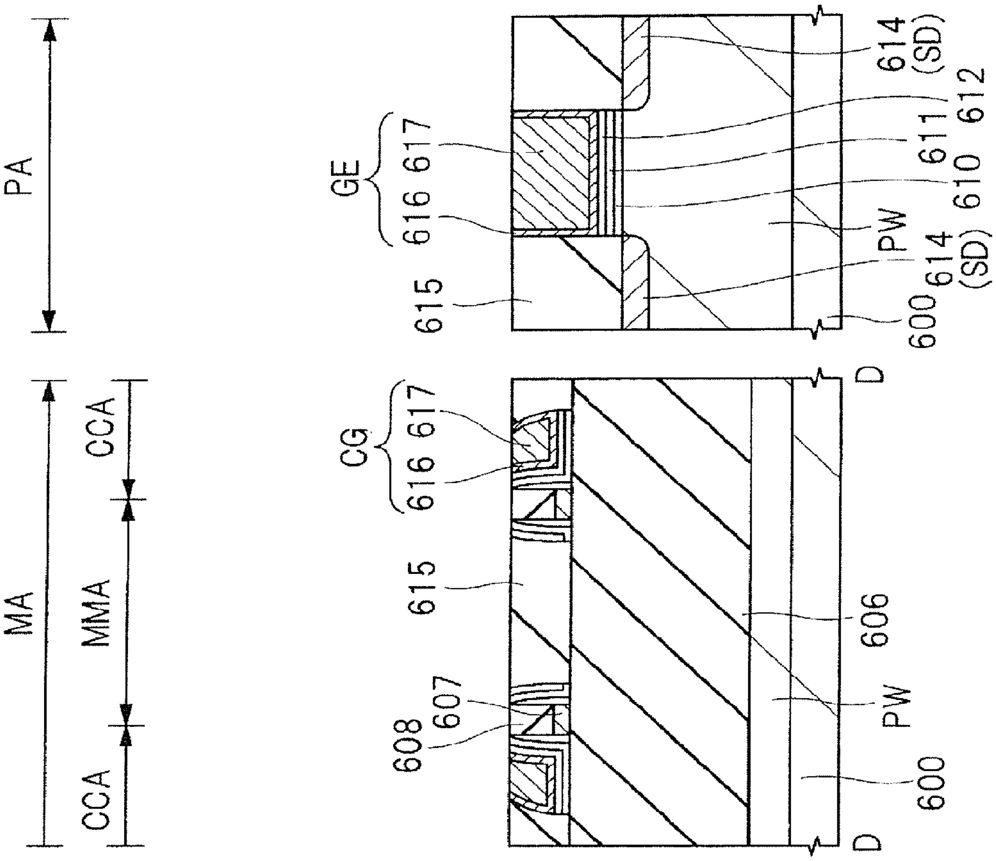
FIG. 98 is a cross-sectional view showing a manufacturing step of the semiconductor device of Sixth Embodiment following that of FIG. 96.

Next, as in Fifth Embodiment, a metal film 617 is formed, via the metal electrode film 616, in the recess TCG and the recess TGE as well as on the silicon oxide film 615. Next, as shown in FIGS. 97 and 98, the metal electrode film 616 and the metal film 617 are removed by CMP or the like until the surface of the silicon oxide film 615 is exposed. Thus, by filling the recess TCG and the recess TGE with the metal film 617 via the metal electrode film 616, the control gate electrode portion CG of the memory cell and the gate electrode portion GE of the peripheral transistor are formed.

Next, as in Fifth Embodiment, a silicon oxide film 618 is deposited as an interlayer insulating film by CVD or the like on the silicon oxide film 615, the silicon oxide film 608, the control gate electrode portion CG, and the gate electrode portion GE. Next, a plug (not illustrated) is formed in the resulting silicon oxide film 618 and further, a wiring 620 (refer to FIGS. 79 and 80) is formed on the silicon oxide film 618. Two or more wiring layers may thereafter be formed by repeating the step of forming an interlayer insulating film, a plug, and a wiring.

By the above-mentioned steps, the semiconductor device of the present embodiment can be formed. Thus, by the above-mentioned steps, a memory cell formed in a memory cell region MA and having a control transistor having a high-k insulating film and a metal electrode film and a peripheral transistor formed in a peripheral circuit region PA and having a high-k insulating film and a metal electrode film can be formed efficiently on the same semiconductor substrate. In other words, both a memory cell employing, for a control transistor thereof, a high-k/metal configuration and a peripheral transistor employing a high-k/metal configuration can be loaded on the same semiconductor substrate.

According to the present embodiment, the polysilicon film 105 described in First Embodiment, that is, a film configuring a sidewall upon forming the memory gate electrode portion MG in sidewall shape becomes unnecessary. The step of forming or removing the polysilicon film 105 therefore becomes unnecessary, making it possible to simplify the manufacturing steps of the semiconductor device.

In addition, according to the present embodiment, by forming the element isolation region after formation of the insulating film ONO on the semiconductor substrate, the element isolation region 606 can be formed so that it penetrates through the insulating film ONO. This makes it possible to suppress, as described above, diffusion of charges via the insulating film ONO on the element isolation region 606 and thereby provide a memory cell having improved operation characteristics.

Seventh Embodiment

In Fifth Embodiment, after formation of the polysilicon film 513 in sidewall shape (sidewall film shape), via the silicon oxide film 509 and the like, on both sides of the memory gate electrode portion MG, the polysilicon film 513 located on the side of the region MMA is removed, but this polysilicon film may be left. The structure of a semiconductor device of the present embodiment will hereinafter be described referring to drawings.

[Description on Structure]

The semiconductor device of the present embodiment has a memory cell (memory transistor, control transistor) formed in a memory cell region MA and a peripheral transistor formed in a peripheral circuit region PA.

Figure 99:
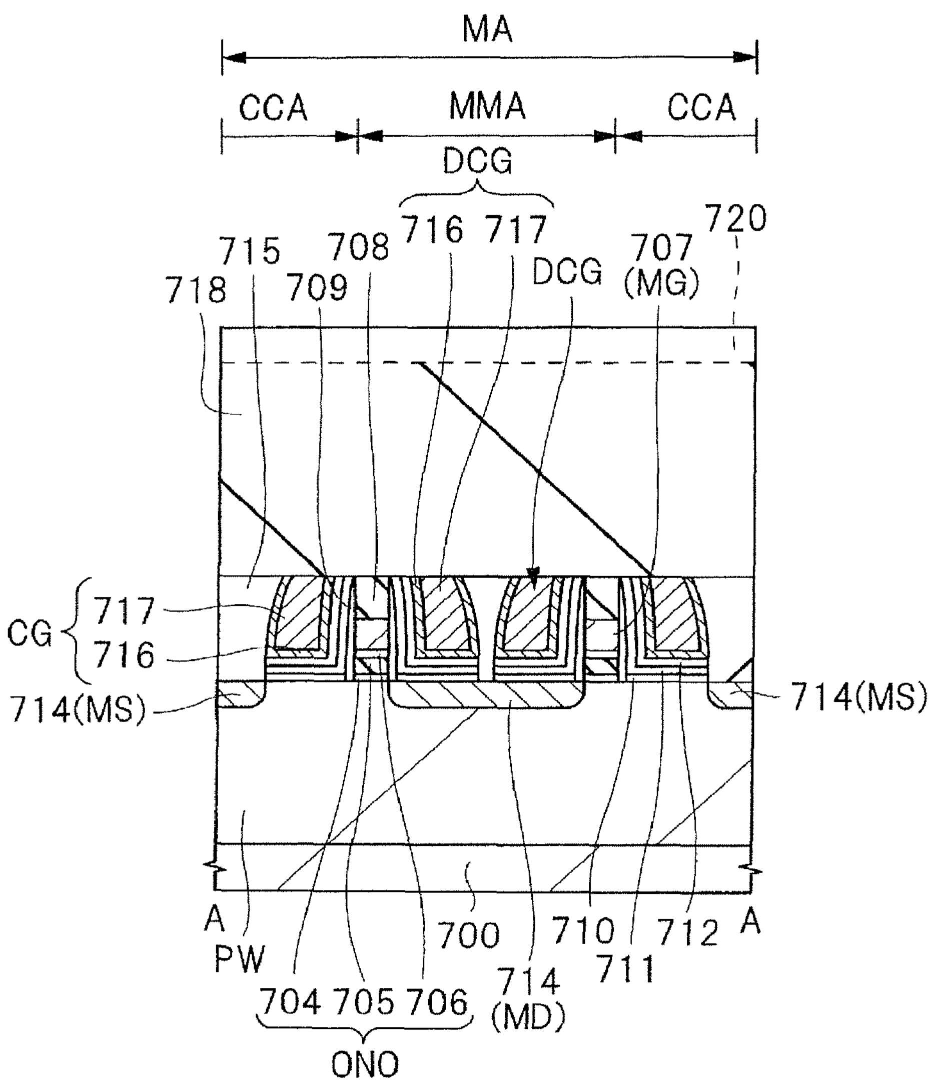
FIG. 99 is a cross-sectional view showing a semiconductor device of Seventh Embodiment.

FIG. 99 is a cross-sectional view showing the semiconductor device of the present embodiment. As shown in FIG. 99, the memory cell of the present embodiment is comprised of a control transistor having a control gate electrode portion CG and a memory transistor having a memory gate electrode portion MG.

The present embodiment is similar to Fifth Embodiment (FIG. 66) except that the region MMA has therein a dummy control gate electrode portion DCG.

Described specifically, the memory cell has a control gate electrode portion CG arranged over a semiconductor substrate 700 (p well PW), a memory gate electrode portion MG arranged over the semiconductor substrate 700 (p well PW) and adjacent to the control gate electrode portion CG, and a dummy control gate electrode portion DCG arranged over the semiconductor substrate 700 (p well PW) and adjacent to the memory gate electrode portion MG. For example, the memory gate electrode portion MG is made of a silicon film, while the control gate electrode portion CG is made of a metal electrode film 716 and a metal film 717 thereon. The dummy control gate electrode portion DCG is made of a metal electrode film 716 and a metal film 717 thereon.

The memory cell further has an insulating film and a metal compound film arranged between the control gate electrode portion CG and the semiconductor substrate 700 (p well PW). The insulating film has a high dielectric constant film having a dielectric constant higher than that of a silicon nitride film. As shown in FIG. 99, the memory cell has, as the insulating film, a silicon oxide film 710 and a high-k insulating film (high dielectric constant film) 711. Further, the high-k insulating film 711 and the control gate electrode portion CG have therebetween a titanium nitride film 712 as the metal compound film.

The high-k insulating film (high dielectric constant film) 711 lies between the control gate electrode portion CG and the semiconductor substrate 700 (p well PW) and between the control gate electrode portion CG and the memory gate electrode portion MG.

The titanium nitride film 712 (metal compound film) lies between the control gate electrode portion CG and the semiconductor substrate 700 (p well PW) and between the control gate electrode portion CG and the memory gate electrode portion MG.

The memory cell further has an insulating film and a metal compound film arranged between the dummy control gate electrode portion DCG and the semiconductor substrate 700 (p well PW). The insulating film has a high dielectric constant film having a dielectric constant higher than that of a silicon nitride film. As shown in FIG. 99, the memory cell has, as the insulating film, a silicon oxide film 710 and a high-k insulating film (high dielectric constant film) 711. Further, the high-k insulating film 711 and the dummy control gate electrode portion DCG have therebetween a titanium nitride film 712 as the metal compound film.

The high-k insulating film (high dielectric constant film) 711 lies between the dummy control gate electrode portion DCG and the semiconductor substrate 700 (p well PW) and between the dummy control gate electrode portion DCG and the memory gate electrode portion MG.

The titanium nitride film 712 (metal compound film) lies between the dummy control gate electrode portion DCG and the semiconductor substrate 700 (p well PW) and between the dummy control gate electrode portion DOG and the memory gate electrode portion MG.

The memory cell further has an insulating film ONO (704, 705, 706) arranged between the memory gate electrode portion MG and the semiconductor substrate 700 (p well PW). The insulating film ONO is comprised of, for example, a silicon oxide film 704, a silicon nitride film 705 thereon, and a silicon oxynitride film 706 thereon. The silicon nitride film 705 will serve as a charge accumulation portion.

The insulating film ONO (704, 705, 706) lies between the memory gate electrode portion MG and the semiconductor substrate 700 (p well PW). This memory gate electrode portion MG has thereon a silicon oxide film 708. A stacked film of the insulating film ONO (704, 705, 706), the memory gate electrode portion MG, and the silicon oxide film 708 has, on the sidewall thereof, a silicon oxide film 709 in sidewall shape.

This means that the control gate electrode portion CG and the memory gate electrode portion MG have therebetween the silicon oxide film 709, the high-k insulating film (high dielectric constant film) 711, and the metal compound film (titanium nitride film 712) which are provided successively from the side of the memory gate electrode portion MG.

The memory cell further has a source region MS and a drain region MD formed in the p well PW of the semiconductor substrate 700.

The source region MS is comprised of an $n^+$ type semiconductor region 714 formed in self alignment with the side surface of the control gate electrode portion CG and the drain region MD is comprised of an $n^+$ type semiconductor region 714 formed from below the side surface of the memory gate electrode portion MG. This drain region MD has thereover the dummy control gate electrode portion DCG. This dummy control gate electrode portion DOG however does not contribute to the operation of the memory cell. For example, upon operation of the memory cell, the dummy control gate electrode portion DCG is controlled so as not to contribute to the operation of the memory cell by setting it at floating or fixed potential (for example, ground potential of 0 V).

The memory cell region MA has, as an interlayer insulating film, a silicon oxide film 715 and this silicon oxide film 715 has thereon a silicon oxide film 718 as an interlayer insulating film. This silicon oxide film 718 has thereon a wiring 720 and the like.

The peripheral transistor of the present embodiment is similar to that of Fifth Embodiment (FIG. 66) so that a description on it is omitted. The operation example of the memory cell is similar to that of First Embodiment except for the control of the above-mentioned dummy control gate electrode portion DCG so that a description on it is omitted.

According to the present embodiment, similar to Fifth Embodiment, the control gate electrode portion CG and the memory gate electrode portion MG have therebetween the high-k insulating film (high dielectric constant film) 711 so that an electric field intensity at the end portion (corner portion) of the memory gate electrode portion MG on the side of the control gate electrode portion CG is relaxed upon erasing. This makes it possible to reduce uneven distribution of charges in the charge accumulation portion (silicon nitride film 705) and thereby improve the erase accuracy. In particular, erase accuracy can be improved even when the erase operation is performed using the above-mentioned FN tunneling system.

In addition, the control transistor also employs the high-k/metal configuration to reduce the resistance of the control gate electrode portion CG and reduce the power consumption of the control transistor. As a result, the resulting control transistor can have improved characteristics.

In the present embodiment, an n-MOS type memory cell has been described in detail, but a p-MOS type memory cell having the configuration of the present embodiment produces an advantage similar to that of the n-MOS type memory cell. Also as an example of the peripheral transistor, an n-MOS type transistor is shown, but a p-MOS type transistor may be used as the peripheral transistor or both an n-MOS type transistor and a p-MOS type transistor may be formed in the peripheral circuit region PA.

Also to the semiconductor device of the present embodiment, the configuration of the memory array shown in FIGS. 4 and 5 or the circuit block example shown in FIG. 6, each described in First Embodiment, can be applied.

[Description on Manufacturing Method]

Next, a method of manufacturing the semiconductor device (FIG. 99) of the present embodiment will be described. In the present embodiment, a source region MS and a drain region MD of the memory cell and a source/drain region SD of the peripheral transistor are formed while leaving the polysilicon film (513) in sidewall shape on both sides of the memory gate electrode portion MG as shown in FIG. 72 in Fifth Embodiment. Next, as in Fifth Embodiment, the polysilicon film (513) is substituted with a metal electrode film 716 and a metal film 717 thereon to form a control gate electrode portion CG and a dummy control gate electrode portion DCG of the memory cell and a gate electrode portion GE of the peripheral transistor.

Thus, by the above-mentioned steps, a step of removing the polysilicon film (513) described in Fifth Embodiment becomes unnecessary. This can simplify the manufacturing steps of the semiconductor device.

Eighth Embodiment

In the semiconductor device of Fifth Embodiment, only the peripheral transistor uses a metal electrode film. It is also possible that the memory transistor and the control transistor configuring the memory cell use the metal electrode film.

The structure of the semiconductor device of the present embodiment will hereinafter be described referring to drawings.

[Description on Structure]

The semiconductor device of the present embodiment has a memory cell (memory transistor, control transistor) formed in a memory cell region MA and a peripheral transistor formed in a peripheral circuit region PA.

Figure 100:
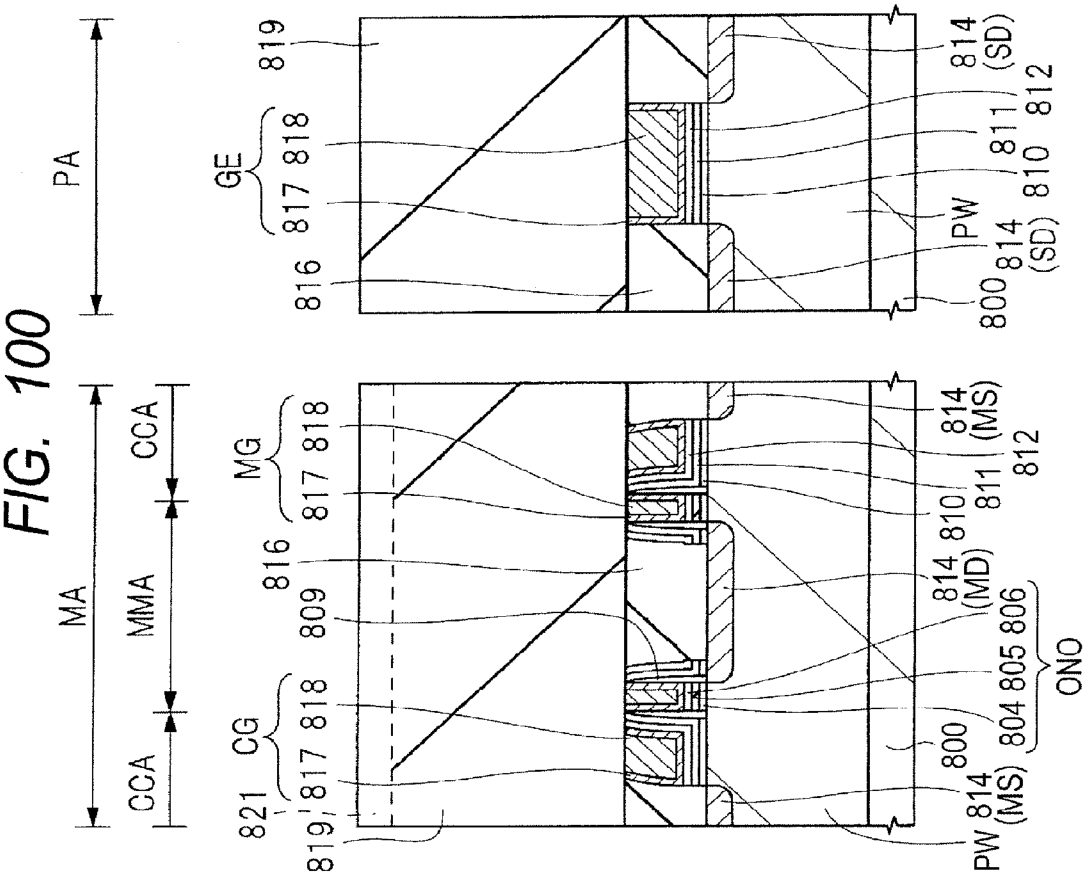
FIG. 100 is a cross-sectional view showing a semiconductor device of Eighth Embodiment.

FIG. 100 is a cross-sectional view showing the semiconductor device of the present embodiment. As shown in FIG. 100, the memory cell is comprised of a control transistor having a control gate electrode portion CG and a memory transistor having a memory gate electrode portion MG.

The semiconductor device of the present embodiment is similar to that of Fifth Embodiment except for the configuration of the memory gate electrode portion MG so that only the memory gate electrode portion MG will be described and a description on the other configuration will be omitted.

As shown in FIG. 100, the memory gate electrode portion MG is, similar to the control gate electrode portion CG or a gate electrode portion GE of the peripheral transistor, comprised of a metal electrode film 817 and a metal film 818 lying thereon.

Thus, the semiconductor device of the present embodiment has a configuration similar to that of Fifth Embodiment so that as in Fifth Embodiment, the semiconductor device can have improved erase accuracy.

In addition, in the semiconductor device of the present embodiment, the control transistor and the memory transistor also use a metal electrode film. This makes it possible to reduce the resistance of the control gate electrode portion and the memory gate electrode portion and reduce the power consumption of these transistors. As a result, the transistors thus obtained can have improved characteristics.

[Description on Manufacturing Method]

Next, a method of manufacturing the semiconductor device of the present embodiment will be described referring to FIGS. 101 to 104. FIGS. 101 to 104 are cross-sectional views showing manufacturing steps of the semiconductor device of the present embodiment.

A step of forming a memory cell in a memory cell region MA and a peripheral transistor in a peripheral circuit region will hereinafter be described referring to drawings.

As in Fifth Embodiment, an element isolation region and a p well PW are formed in a semiconductor substrate 800.

Figure 101:
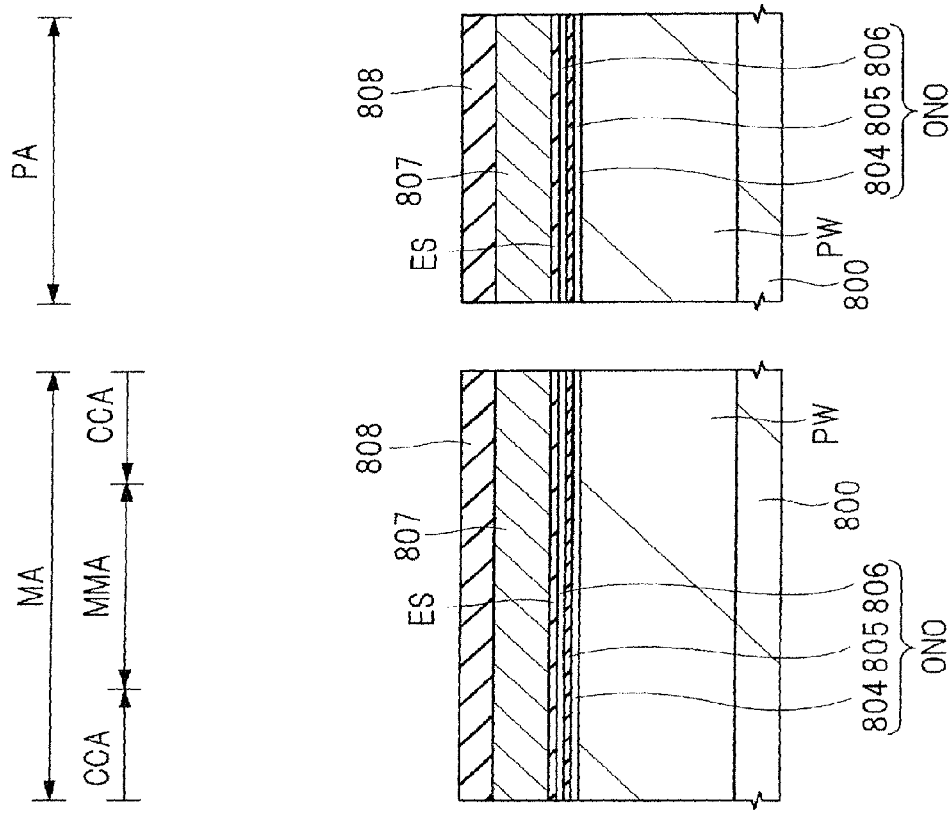
FIG. 101 is a cross-sectional view showing a manufacturing step of the semiconductor device of Eighth Embodiment.

Next, as shown in FIG. 101, an insulating film ONO (804, 805, 806) is formed on the semiconductor substrate 800 (p well PW). Then, a stopper film ES is formed on the insulating film ONO.

Described specifically, a silicon oxide film 804 is formed on the semiconductor substrate 800. This silicon oxide film 804 is formed, for example, by thermal oxidation so as to have a thickness of about 4 nm. The silicon oxide film 804 may be formed using CVD or the like. Next, a silicon nitride film 805 of about 6 nm thick is deposited on the silicon oxide film 804, for example, by CVD. This silicon nitride film 805 will serve as a charge accumulation portion of the memory cell and become an intermediate layer configuring the insulating film ONO. A silicon oxynitride film 806 of about 8 nm thick is then deposited on the silicon nitride film 805 by CVD. As a result, the insulating film ONO comprised of the silicon oxide film 804, the silicon nitride film 805, and the silicon oxynitride film 806 can be formed.

Next, a silicon nitride film of about 5 nm thick is deposited as a stopper film ES by CVD or the like on the silicon oxynitride film 806 (insulating film ONO).

Next, a polysilicon film 807 of about 80 nm thick is formed on the stopper film ES by CVD or the like. Then, a silicon oxide film 808 of about 20 nm thick is formed on the polysilicon film 807 by CVD or the like.

Figure 102:
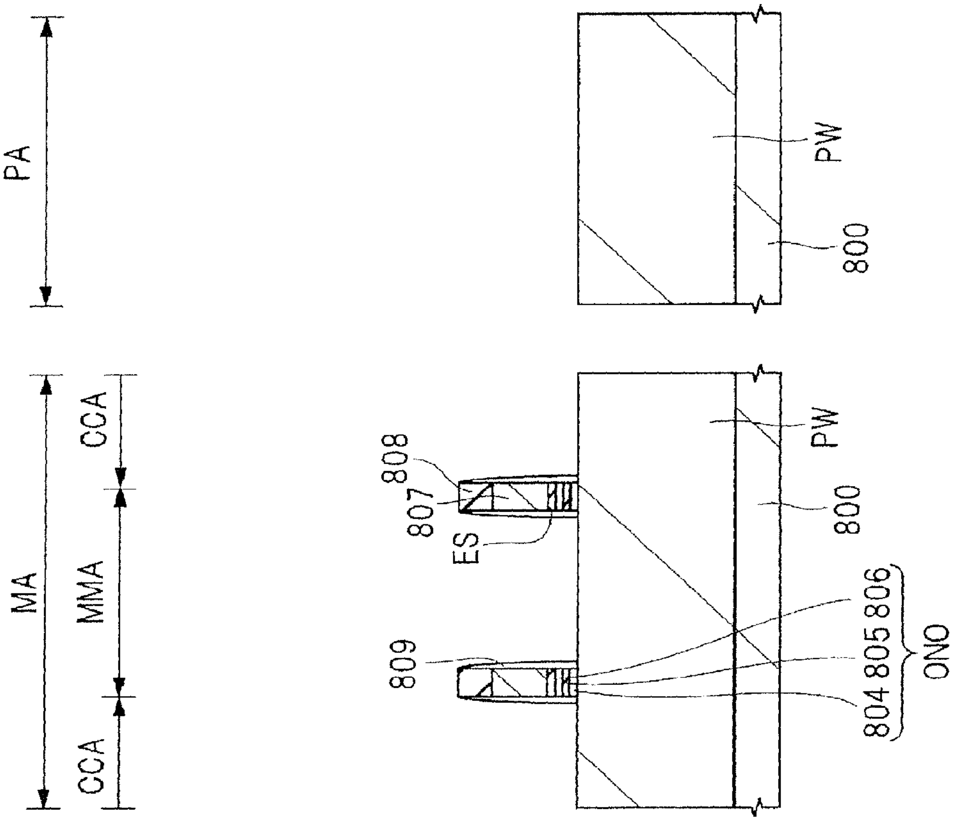
FIG. 102 is a cross-sectional view showing a manufacturing step of the semiconductor device of Eighth Embodiment following that of FIG. 101.

Next, as shown in FIG. 102, as in Fifth Embodiment, the insulating film ONO, the stopper film ES, the polysilicon film 807, and the silicon oxide film 808 are patterned to form a polysilicon film 807 for substitution of a memory gate electrode portion. Next, a silicon oxide film 809 in sidewall shape is formed, as in Fifth Embodiment, on the sidewall of the polysilicon film 807 for substitution of a memory gate electrode portion.

Figure 103:
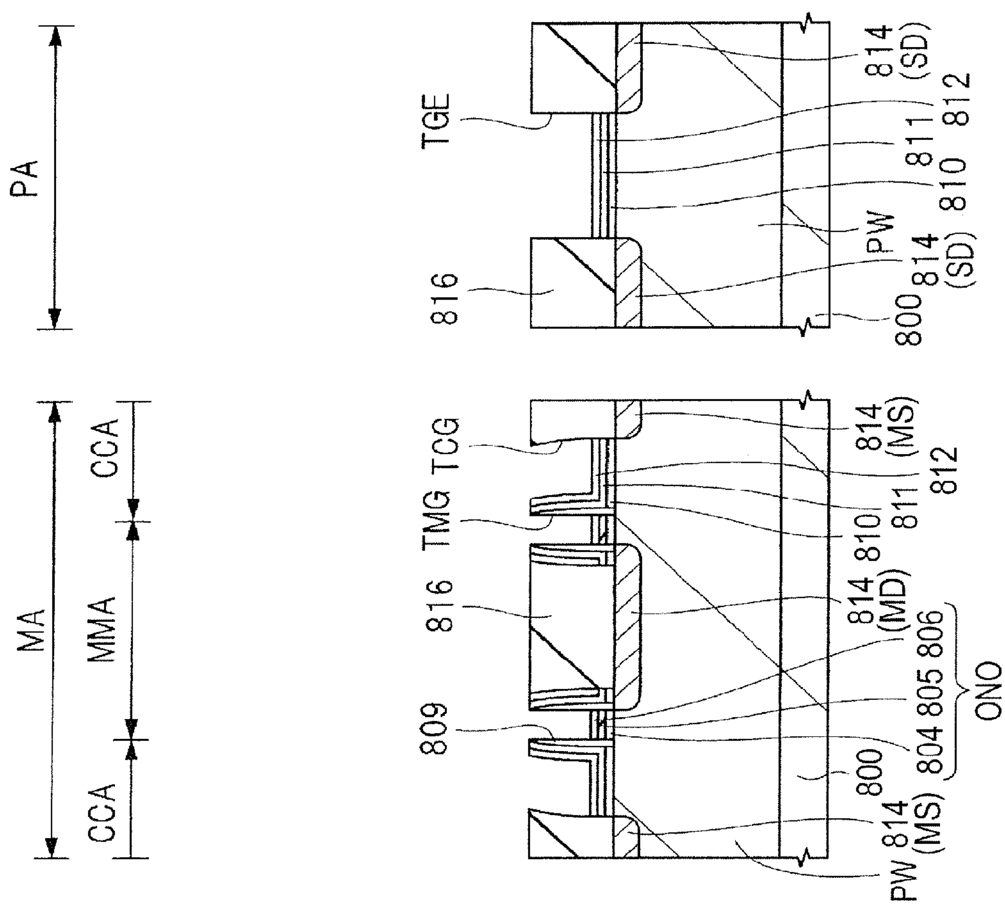
FIG. 103 is a cross-sectional view showing a manufacturing step of the semiconductor device of Eighth Embodiment following that of FIG. 102.

Next, as shown in FIG. 103, as in Fifth Embodiment, a recess (trench, dent) TCG is provided in a control gate electrode portion formation region and a recess (trench, dent) TGE is provided in a gate electrode portion formation region of the peripheral transistor. At this time, a recess (trench, dent) TMG is also provided in a memory gate electrode portion formation region.

For example, as in Fifth Embodiment, after formation of a silicon oxide film 810, a high-k insulating film 811, a titanium nitride film 812, and a polysilicon film for substitution (not illustrated), these films are left (not illustrated) in sidewall shape on both sides of the polysilicon film 807 for substitution of a memory gate electrode portion. From the polysilicon film for substitution in sidewall shape, a portion thereof located on the side of the region MMA is removed. The remaining polysilicon film for substitution will be a polysilicon film for substitution of the control gate electrode portion or the gate electrode portion. Then, a source region MS and a drain region MD of the memory cell and a source/drain region SD of the peripheral transistor are formed. Next, a silicon oxide film 816 is formed as an interlayer insulating film and an upper portion of the silicon oxide film 816 is polished using CMP or the like until exposure of the surface of the polysilicon film for substitution. By this treatment, the silicon oxide film 808 is removed and the polysilicon film for substitution and the polysilicon film 807 are exposed.

Next, the polysilicon film for substitution and the polysilicon film 807 are removed by etching to form a recess (trench, dent) TMG in the memory gate electrode portion formation region, a recess (trench, dent) TCG in the control gate electrode portion formation region and a recess (trench, dent) TGE in the gate electrode portion formation region of the peripheral transistor. Upon the above-mentioned etching, the stopper film (silicon nitride film) ES at the bottom of the recess (trench, dent) in the memory gate electrode portion formation region is removed (FIG. 103).

Figure 104:
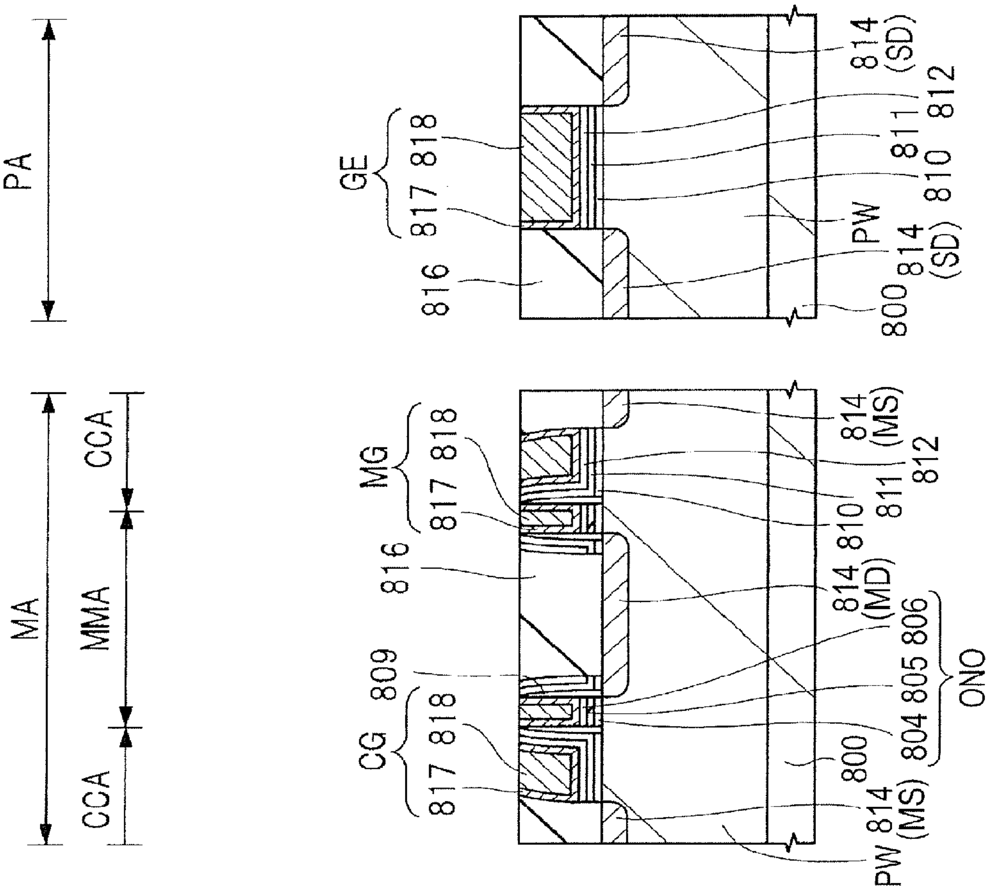
FIG. 104 is a cross-sectional view showing a manufacturing step of the semiconductor device of Eighth Embodiment following that of FIG. 103.

Next, as in Fifth Embodiment, the recesses TMG, TCG, and TGE are filled with a metal film 818 via a metal film 817. First as shown in FIG. 104, a metal film 818 is formed in the recesses TMG, TCG, and TGE as well as on the silicon oxide film 816 via the metal electrode film 817. Then, the metal electrode film 817 and the metal film 818 are polished using CMP or the like until exposure of the surface of the silicon oxide film 816. As a result, a memory gate electrode portion MG of the memory cell is formed in the recess TMG; a control gate electrode portion CG of the memory cell is formed in the recess TOG; and a gate electrode portion GE of the peripheral transistor is formed in the recess TGE.

Next, a silicon oxide film 819 is formed as an interlayer insulating film on the silicon oxide film 816 by CVD or the like. Then, a plug is formed in these silicon oxide films 816 and 819, followed by the formation of a wiring 821 on the silicon oxide film 819 (refer to FIG. 100).

By the above-mentioned steps, the semiconductor device of the present invention can be formed. Thus, by these steps, a memory cell formed in a memory cell region MA and having a high-k insulating film and a metal electrode film and a peripheral transistor formed in a peripheral circuit region PA and having a high-k insulating film and a metal electrode film can be formed efficiently on the same semiconductor substrate.

Ninth Embodiment

The structure of a semiconductor device of the present embodiment will hereinafter be described referring to drawings.

[Description on Structure]

The semiconductor device of the present embodiment has a memory cell (memory transistor, control transistor) formed in a memory cell region MA and a peripheral transistor formed in a peripheral circuit region PA.

(Description on Structure of Memory Cell)

Figure 105:
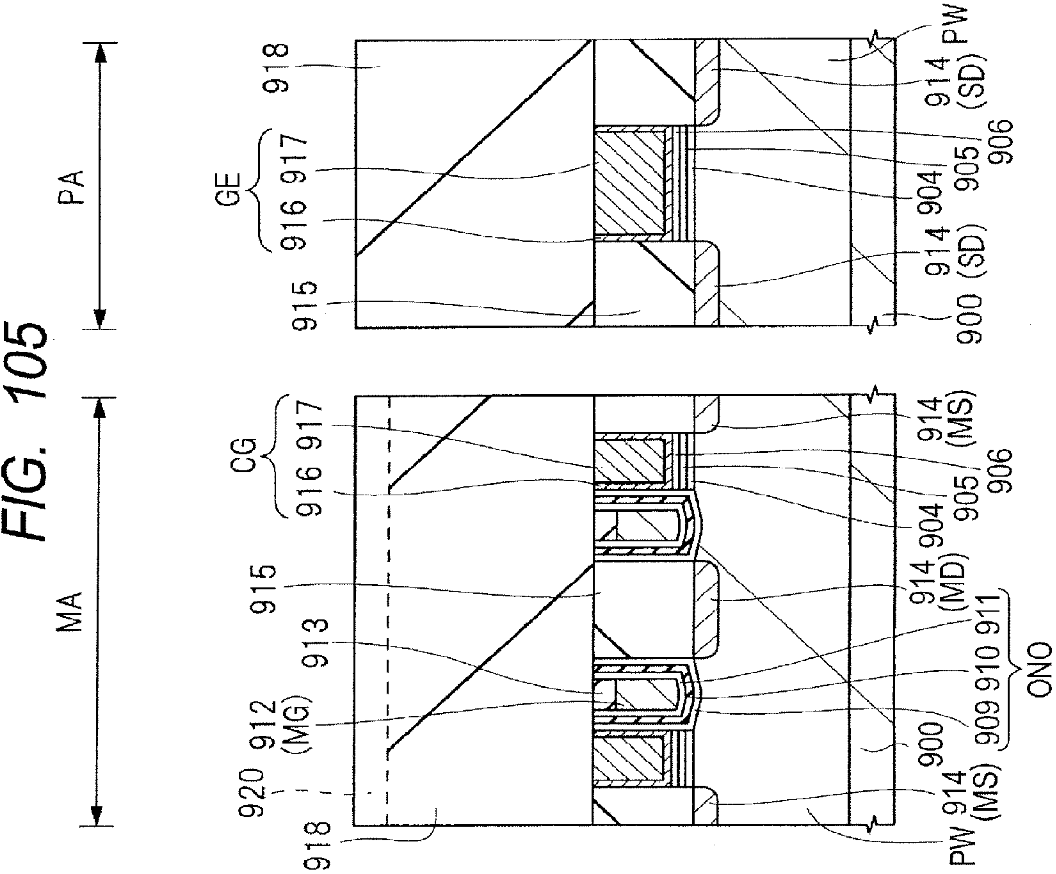
FIG. 105 is a cross-sectional view showing a semiconductor device of Ninth Embodiment.

FIG. 105 is a cross-sectional view showing the semiconductor device of the present embodiment. As shown in FIG. 105, the memory cell is comprised of a control transistor having a control gate electrode portion CG and a memory transistor having a memory gate electrode portion MG.

Described specifically, the memory cell has a control gate electrode portion CG arranged over a semiconductor substrate 900 (p well PW) and a memory gate electrode portion MG arranged over the semiconductor substrate 900 (p well PW) and adjacent to the control gate electrode portion CG. For example, the memory gate electrode portion MG is made of a silicon film, while the control gate electrode portion CG is made of a metal electrode film 916 and a metal film 917 thereon. The memory cell further has an insulating film and a metal compound film provided between the control gate electrode portion CG and the semiconductor substrate 900 (p well PW). The insulating film has a high dielectric constant film having a dielectric constant higher than that of a silicon nitride film. As shown in FIG. 105, the memory cell has, as the insulating film, a silicon oxide film 904 and a high-k insulating film (high dielectric constant film) 905. Further, the high-k insulating film 905 and the control gate electrode portion CG have therebetween a titanium nitride film 906 as the metal compound film.

The memory cell further has an insulating film ONO (909, 910, 911) arranged between the memory gate electrode portion MG and the semiconductor substrate 900 (p well PW). The insulating film ONO is comprised of, for example, a silicon oxide film 909, a silicon nitride film 910 thereon, and a silicon oxynitride film 911 thereon. The silicon nitride film 910 will serve as a charge accumulation portion.

The insulating film ONO (909, 910, 911) is arranged between the memory gate electrode portion MG and the semiconductor substrate 900 (p well PW), between the control gate electrode portion CG and the memory gate electrode portion MG, and between the memory gate electrode portion MG and the silicon oxide film 915. This means that the insulating film ONO is arranged so as to extend along the sidewall and bottom surface of a recess made of the sidewall of the control gate electrode portion CG, the semiconductor substrate 900 (p well PW), and the sidewall of the silicon oxide film 915. In other words, the insulating film ONO (909, 910, 911) extends between the memory gate electrode portion MG and the semiconductor substrate 900 (p well PW), between the control gate electrode portion CG and the memory gate electrode portion MG, and along the side surface of the memory gate electrode portion MG on the side opposite to the control gate electrode portion CG. The recess has, on the bottom surface thereof, a dent. This dent is provided so that it becomes deeper from the outer periphery of the bottom surface of the recess to the center portion.

The memory cell further has a source region MS and a drain region MD formed in the p well PW of the semiconductor substrate 900.

The source region MS is comprised of an $n^+$ type semiconductor region 914 formed in self alignment with the side surface of the control gate electrode portion CG and the drain region MD is comprised of an n type semiconductor region 914 formed from below the insulating film ONO arranged along the side surface of the memory gate electrode portion MG.

The memory cell region MA has, as an interlayer insulating film, a silicon oxide film 915 and this silicon oxide film 915 has thereon a silicon oxide film 918 as an interlayer insulating film. This silicon oxide film 918 has thereon a wiring 920 and the like.

(Description on Structure of Peripheral Transistor)

As shown in FIG. 105, the peripheral transistor has a gate electrode portion GE arranged over the semiconductor substrate 900 (p well PW) and a source/drain region SD provided in the p well PW on both sides of the gate electrode portion GE. The gate electrode portion GE is comprised of a metal electrode film 916 and a metal film 917 thereon. The peripheral transistor further has an insulating film and a metal compound film arranged between the gate electrode portion GE and the semiconductor substrate 900 (p well PW). The insulating film has a high dielectric constant film having a dielectric constant higher than that of a silicon nitride film. The peripheral transistor has, as the insulating film, a silicon oxide film 904 and a high-k insulating film (high dielectric constant film) 905. The high-k insulating film 905 and the gate electrode portion GE have therebetween a titanium nitride film 906 as the metal compound film.

The source/drain region SD is comprised of an $n^+$ type semiconductor region 914. The $n^-$ type semiconductor region 914 is formed in self alignment with the sidewall of the gate electrode portion GE.

The peripheral circuit region PA has therein a silicon oxide film 915 as an interlayer insulating film and this silicon oxide film 915 has thereon a silicon oxide film 918 as an interlayer insulating film.

Thus, in the present embodiment, the insulating film ONO is arranged on the dent of the semiconductor substrate 900 so that electric field against the insulating film ONO upon erasing increases. Compared with using the semiconductor substrate 900 which is flat without having a recess therein, the present embodiment can improve the erase speed. Thus, the memory cell can have improved operation characteristics.

In the present embodiment, an n-MOS type memory cell has been described in detail, but a p-MOS type memory cell having the configuration of the present embodiment produces an advantage similar to that of the n-MOS type memory cell. Also as an example of the peripheral transistor, an n-MOS type transistor is shown, but a p-MOS type transistor may be used as the peripheral transistor or both an n-MOS type transistor and a p-MOS type transistor may be formed in the peripheral circuit region PA.

The operation example of the memory cell is similar to that of First Embodiment so that a description on it is omitted.

Also to the semiconductor device of the present embodiment, the configuration of the memory array shown in FIGS. 4 and 5 or the circuit block example shown in FIG. 6, each described in First Embodiment, can be applied.

[Description on Manufacturing Method]

Next, a method of manufacturing the semiconductor device of the present embodiment will next be described referring to FIGS. 106 to 114. FIGS. 106 to 114 are cross-sectional views showing the manufacturing steps of the semiconductor device of the present embodiment.

A step of forming a memory cell in a memory cell region MA and a peripheral transistor in a peripheral circuit region PA will hereinafter be described referring to these drawings.

Figure 106:
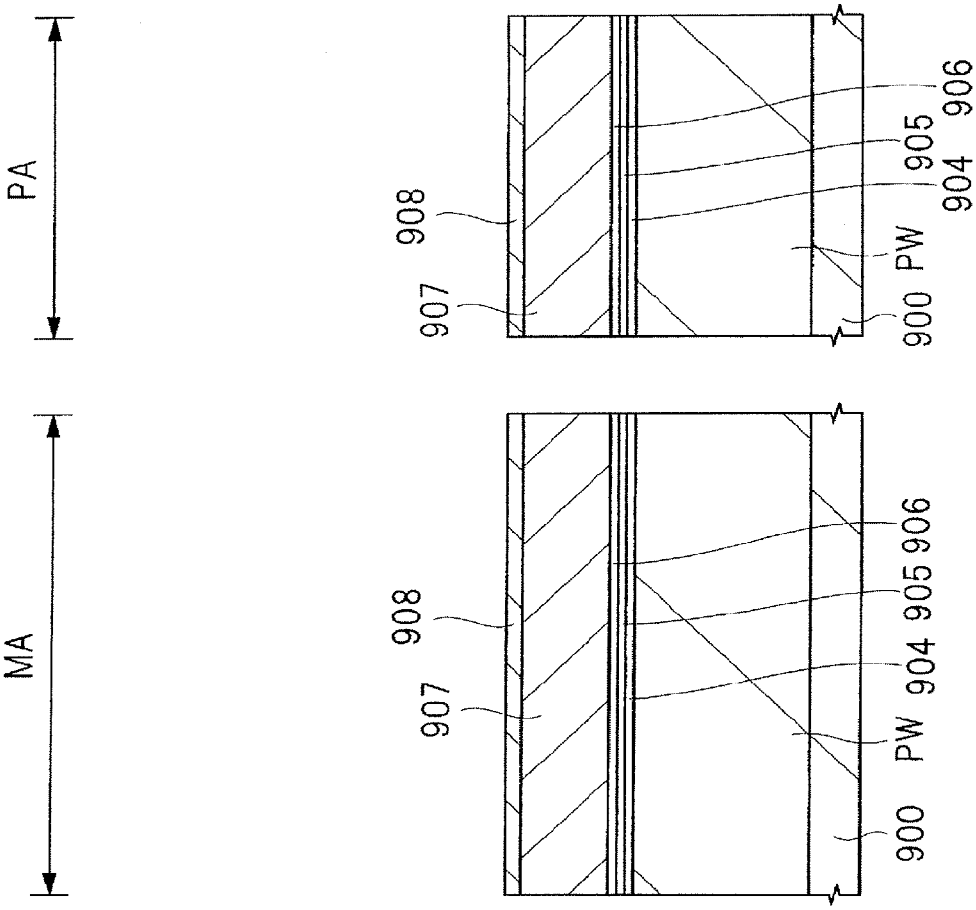
FIG. 106 is a cross-sectional view showing a manufacturing step of the semiconductor device of Ninth Embodiment.

First, an element isolation region (not illustrated) is formed in the main surface of a semiconductor substrate 900. This element isolation region is formed as in First Embodiment. Then, as shown in FIG. 106, a p well PW is formed in the semiconductor substrate 900. This p well PW is formed, as in First Embodiment, by the ion implantation.

Next, a silicon oxide film 904 is formed on the semiconductor substrate (p well PW) 900 and a high-k insulating film 905 is then formed on this silicon oxide film 904. Described specifically, a silicon oxide film 904 of about 1 nm thick is formed on the semiconductor substrate 900 (p well PW) by thermal oxidation. Then, a high-k insulating film 905 is formed on the silicon oxide film 904. As the high-k insulating film 905, for example, an Hf oxide film can be used. For example, an Hf oxide film of about 5 nm thick is deposited using CVD or the like.

Then, a titanium nitride film 906 of about 10 nm thick is deposited on the high-k insulating film 905 by CVD or the like.

A polysilicon film 907 of about 100 nm thick is then deposited on the titanium nitride film 906 by CVD or the like. Next, a silicon oxide film 908 of about 20 nm thick is formed on the polysilicon film 907 by CVD or the like.

Figure 107:
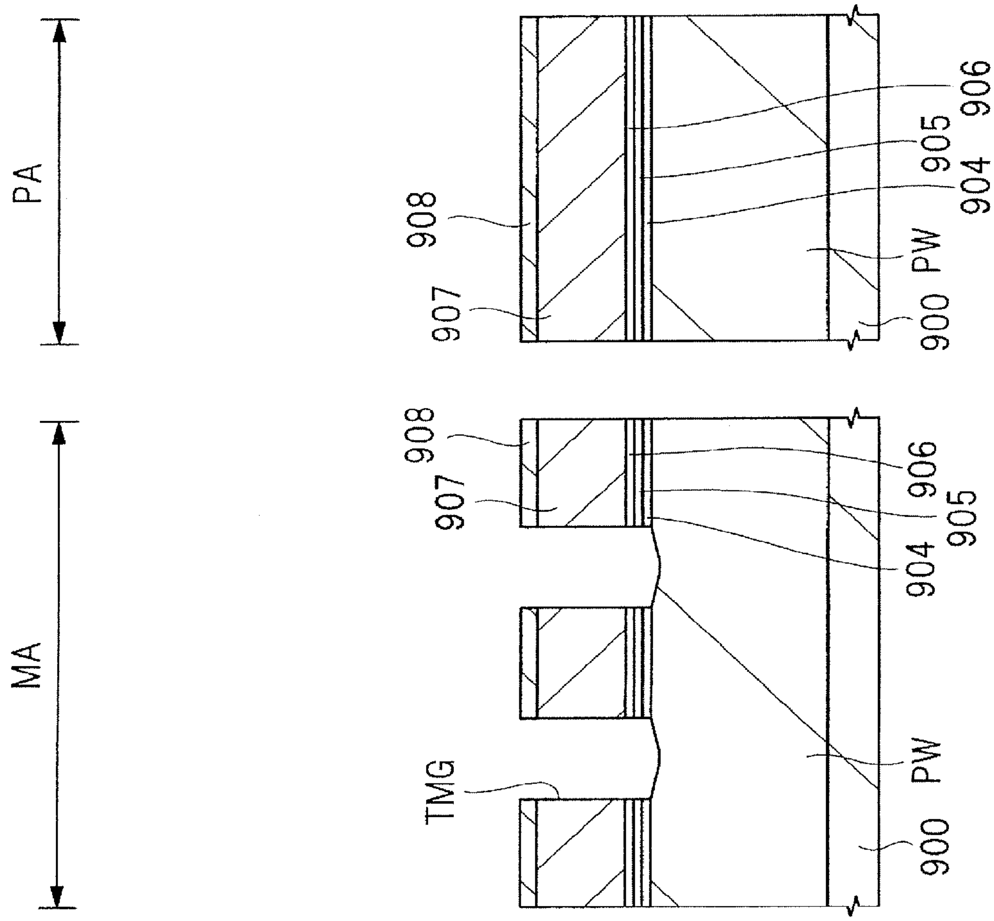
FIG. 107 is a cross-sectional view showing a manufacturing step of the semiconductor device of Ninth Embodiment following that of FIG. 106.

Next, as shown in FIG. 107, the silicon oxide film 908, the polysilicon film 907, the titanium nitride film 906, the high-k insulating film 905, and the silicon oxide film 904 in the memory gate electrode portion formation region are removed using photolithography and dry etching to form a recess (trench, dent) TMG. At this time, etching is performed until a dent is formed in the surface of the semiconductor substrate 900 (p well PW). The dent thus provided becomes gradually deeper from the outer periphery of the bottom surface of the recess (trench, dent) TMG to the center portion.

Figure 108:
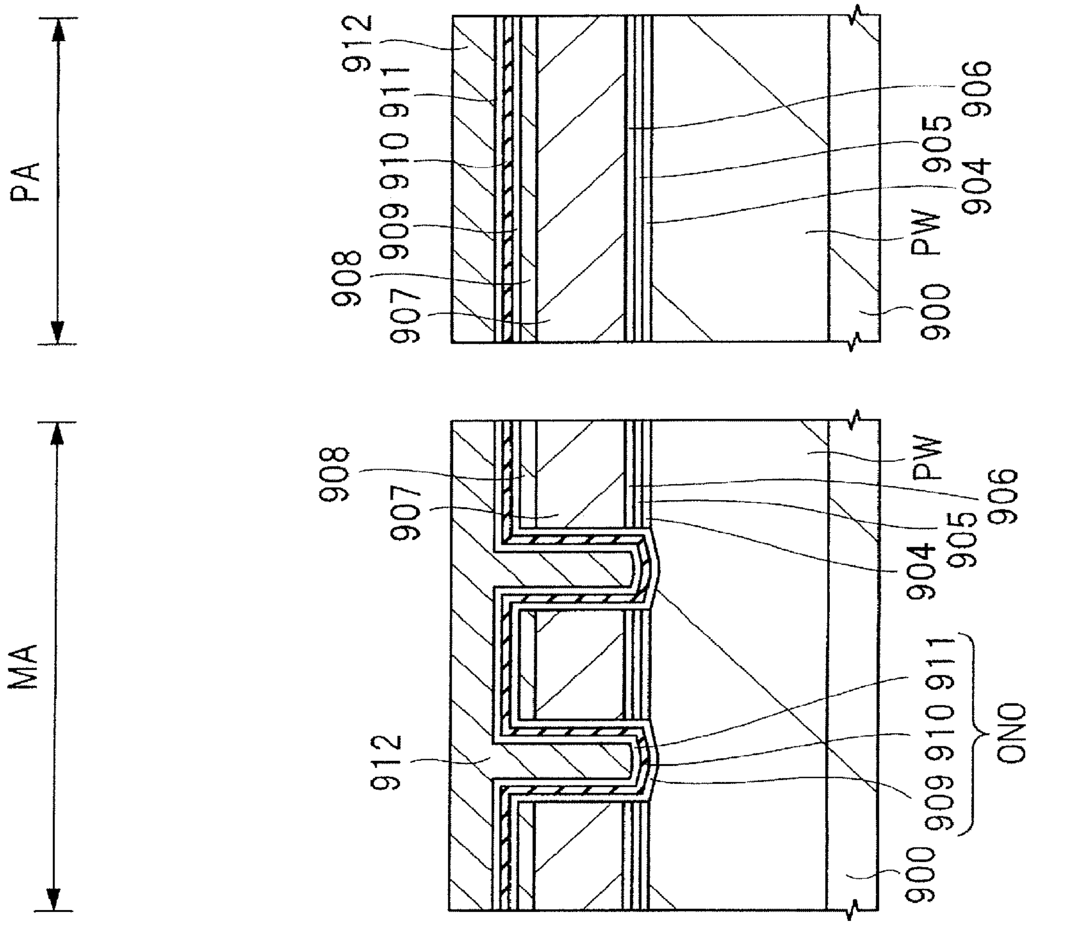
FIG. 108 is a cross-sectional view showing a manufacturing step of the semiconductor device of Ninth Embodiment following that of FIG. 107.

Next, as shown in FIG. 108, an insulating film ONO (909, 910, 911) and a polysilicon film 912 are formed in the recess (trench, dent) TMG as well as on the silicon oxide film 908. Described specifically, first a silicon oxide film of about 4 nm thick is deposited in the recess (trench, dent) TMG as well as on the silicon oxide film 908, for example, by CVD. Then, a silicon nitride film 910 of about 6 nm thick is deposited on the silicon oxide film 909, for example, by CVD. This silicon nitride film 910 will be a charge accumulation portion of the memory cell and becomes an intermediate layer configuring the insulating film ONO. Next, a silicon oxynitride film 911 of about 8 nm thick is deposited on the silicon nitride film 910 by CVD or the like.

Next, a polysilicon film 912 having a thickness enough to fill the recess (trench, dent) TMG therewith is deposited on the insulating film ONO (909, 910, 911) by CVD or the like.

Figure 109:
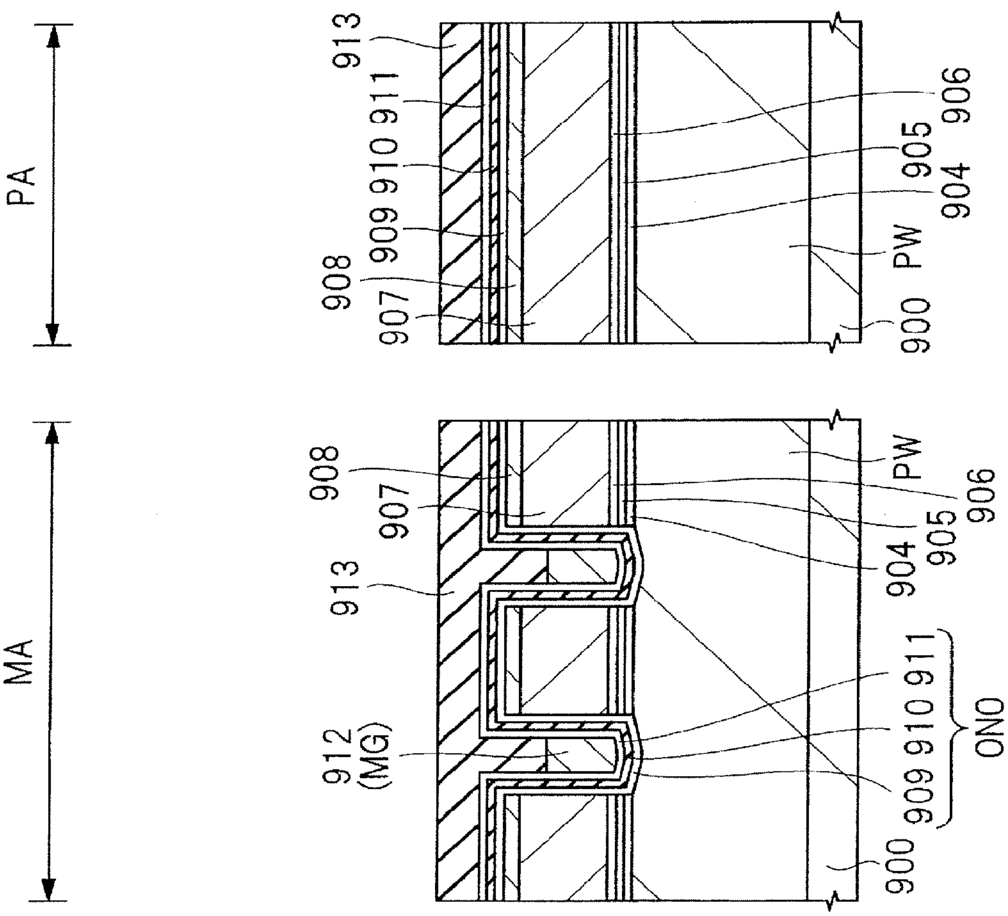
FIG. 109 is a cross-sectional view showing a manufacturing step of the semiconductor device of Ninth Embodiment following that of FIG. 108.

Next, as shown in FIG. 109, a memory gate electrode portion MG is formed. For example, the surface of the polysilicon film 912 is etched back. At this time, this etchback is performed until the thickness of the polysilicon film 912 in the recess (trench, dent) TMG becomes below the thickness of the polysilicon film 907. By this step, the polysilicon film 912 formed in the recess (trench, dent) TMG will be a memory gate electrode portion MG.

Next, a silicon oxide film 913 is deposited on the insulating film ONO (909, 910, 911) and the polysilicon film 912 by CVD or the like. Then, an upper portion of the silicon oxide film 913 is removed until exposure of the surface of the polysilicon film 907 by CMP or the like.

Figure 110:
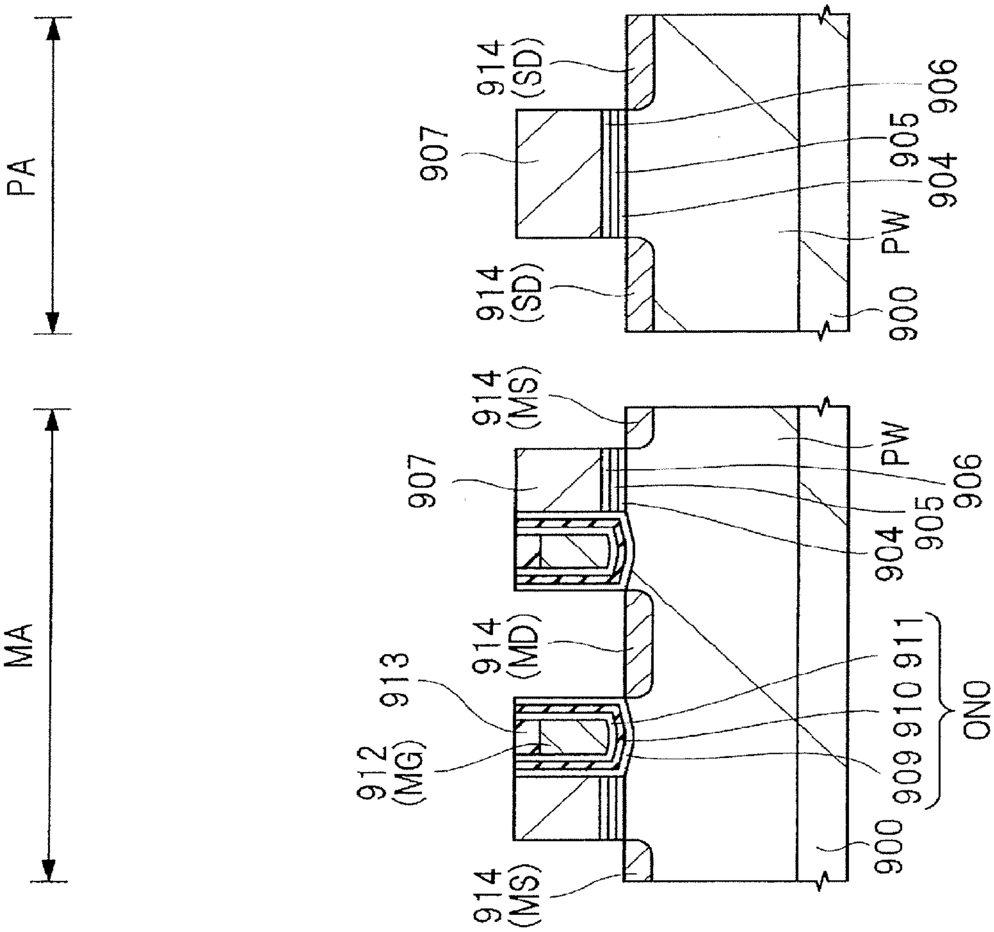
FIG. 110 is a cross-sectional view showing a manufacturing step of the semiconductor device of Ninth Embodiment following that of FIG. 109.

Next, as shown in FIG. 110, a polysilicon film 907 for substitution of a control gate electrode portion and a polysilicon film 907 for the substitution of a gate electrode portion are formed. First, a photoresist film (not illustrated) covering therewith the control gate electrode portion formation region and the upper surface of the recess TMG and a photoresist film (not illustrated) covering therewith the gate electrode portion formation region are formed using photolithography. Next, with these photoresist films as a mask, the polysilicon film 907, the titanium nitride film 906, the high-k insulating film 905, and the silicon oxide film 904 are etched (FIG. 110). As a result, the polysilicon film 907 is formed adjacent to the memory gate electrode portion MG via the insulating film ONO. This polysilicon film 907 will be a polysilicon film for substitution of a control gate electrode portion. The polysilicon film 907 in the peripheral circuit region PA will be a polysilicon film for substitution of a gate electrode portion.

Next, a source region MS and a drain region MD of the memory cell and a source/drain region SD of the peripheral transistor are formed. Described specifically, with the silicon oxide film 913 and the polysilicon film 907 on the memory gate electrode portion MG as a mask, an n type impurity such as arsenic (As) or phosphorus (P) is implanted into the exposed portion of the semiconductor substrate 900 (p well PW) to form an $n^+$ type semiconductor region 914. The $n^+$ type semiconductor region 914 between the memory gate electrode portions MG will be a drain region MD of the memory cell and the type semiconductor region 914 on the side of the polysilicon film 907 in the memory cell region MA will be a source region MS of the memory cell. The $n^+$ type semiconductor region 914 in the peripheral circuit region PA will be a source/drain region SD of the peripheral transistor. Upon this impurity implantation, since the height including that of the silicon oxide film 913 arranged on the memory gate electrode portion MG is as high as about 120 nm, an n type impurity can be prevented from penetrating and reaching the channel region below the memory gate electrode portion MG upon implantation of it.

The source region MS, the drain region MD, and the source/drain region SD of the peripheral transistor may be formed so as to have an LDD structure by forming a sidewall film on the sidewall of the polysilicon film 907 (refer to First Embodiment). A metal salicide film (not illustrated) may be formed on the source region MS and the drain region MD of the memory cell and the source/drain region SD of the peripheral transistor by the salicide technology described in First Embodiment.

Figure 111:
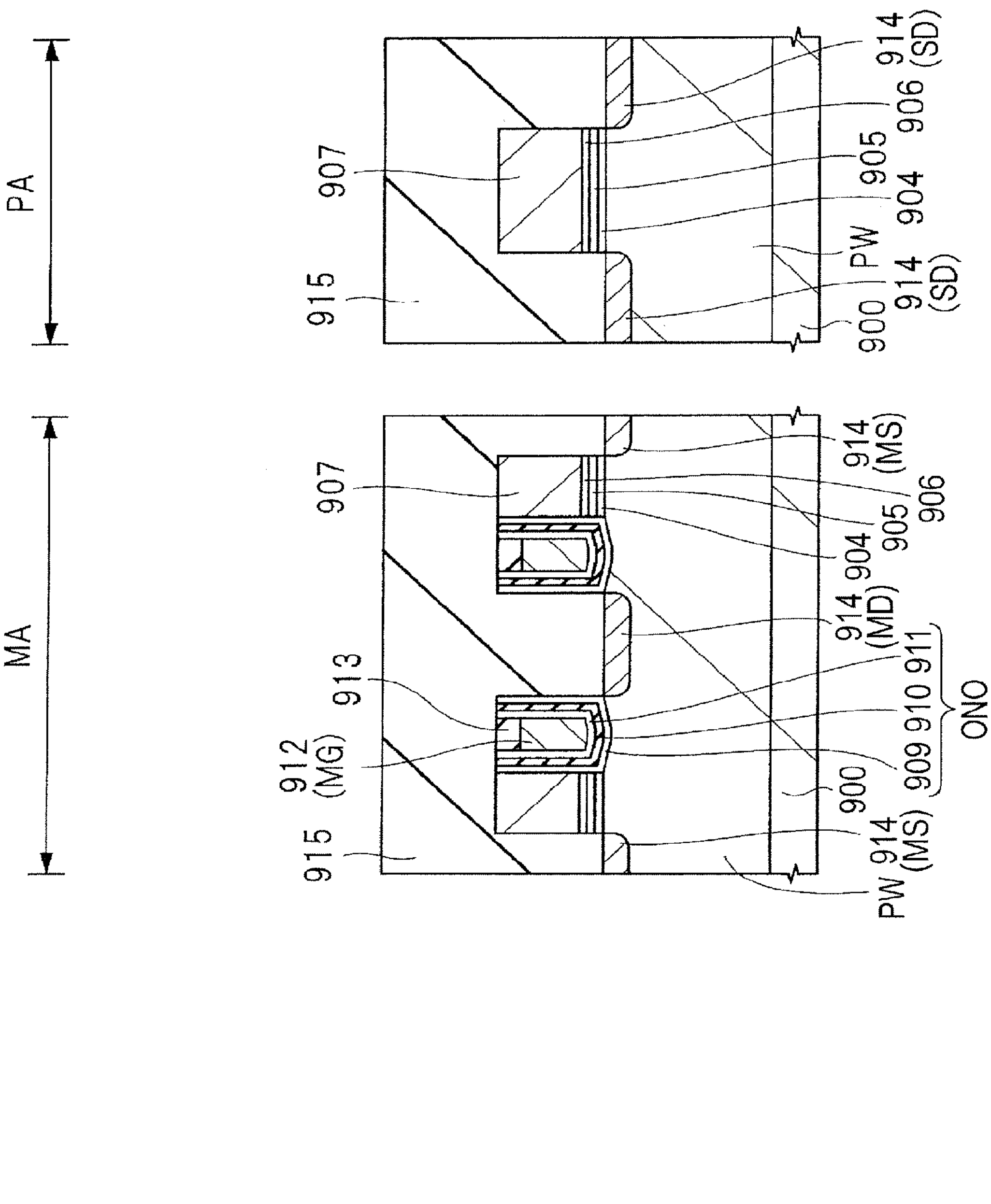
FIG. 111 is a cross-sectional view showing a manufacturing step of the semiconductor device of Ninth Embodiment following that of FIG. 110.
Figure 112:
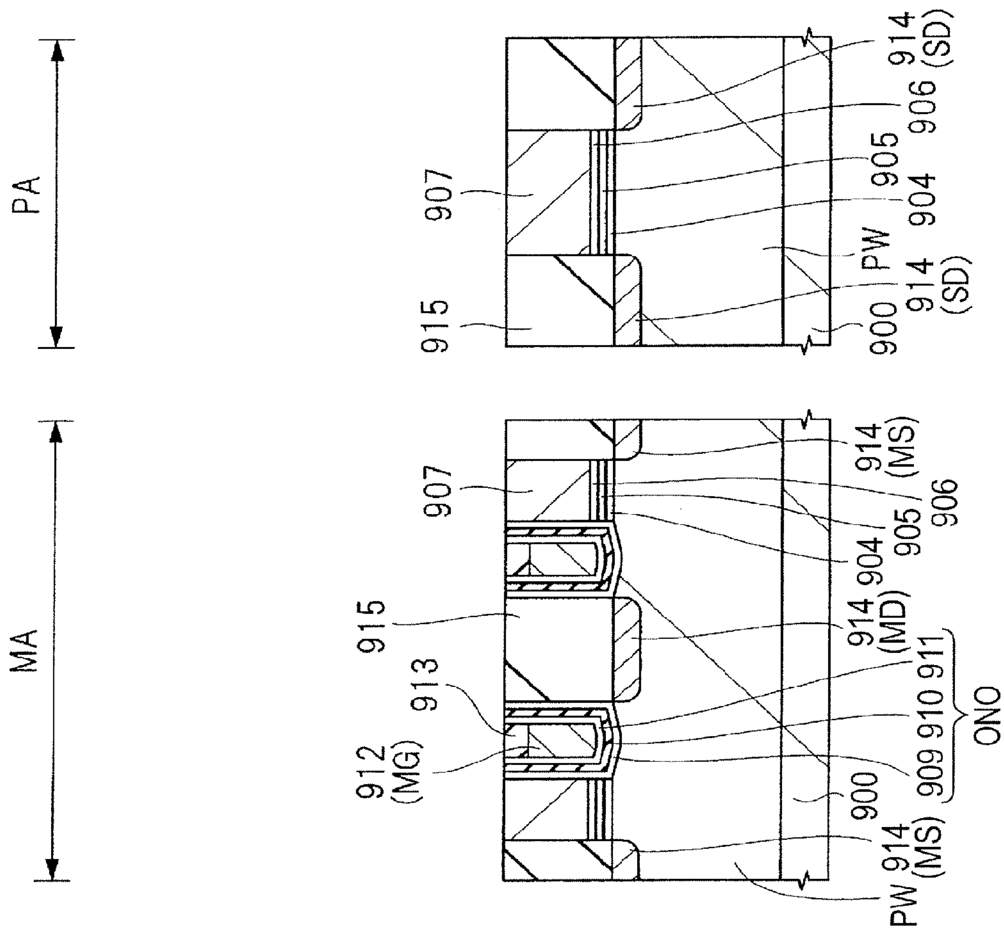
FIG. 112 is a cross-sectional view showing a manufacturing step of the semiconductor device of Ninth Embodiment following that of FIG. 111.

Next, as shown in FIG. 111, a silicon oxide film 915 is formed as an interlayer insulating film over the polysilicon film 907 and the memory gate electrode portion MG by CVD or the like. Next, as shown in FIG. 112, an upper portion of this silicon oxide film 915 is polished using CMP or the like until the surface of the polysilicon film 907 is exposed.

Figure 113:
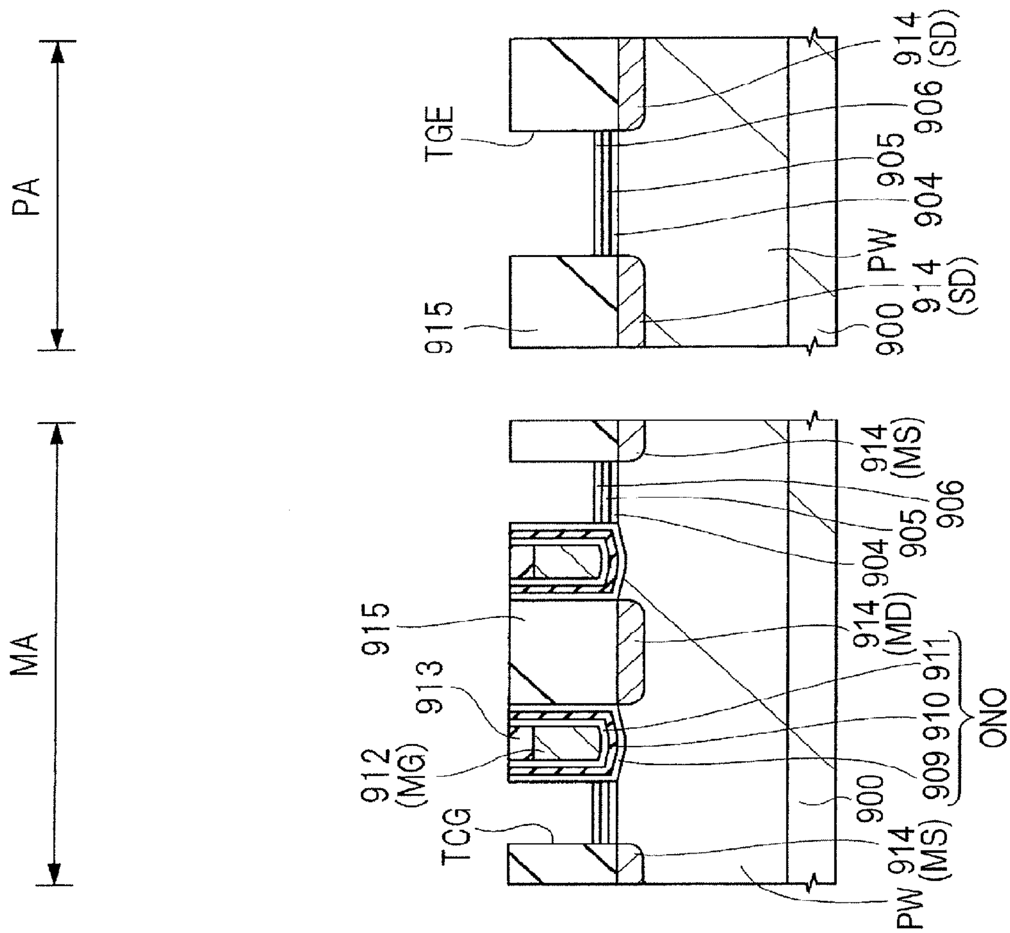
FIG. 113 is a cross-sectional view showing a manufacturing step of the semiconductor device of Ninth Embodiment following that of FIG. 112.

Next, as shown in FIG. 113, the polysilicon film 907 is removed by etching. By this step, a recess (trench, dent) TCG is provided in the control gate electrode portion formation region and a recess TGE is provided in the gate electrode portion formation region of the peripheral transistor.

Figure 114:
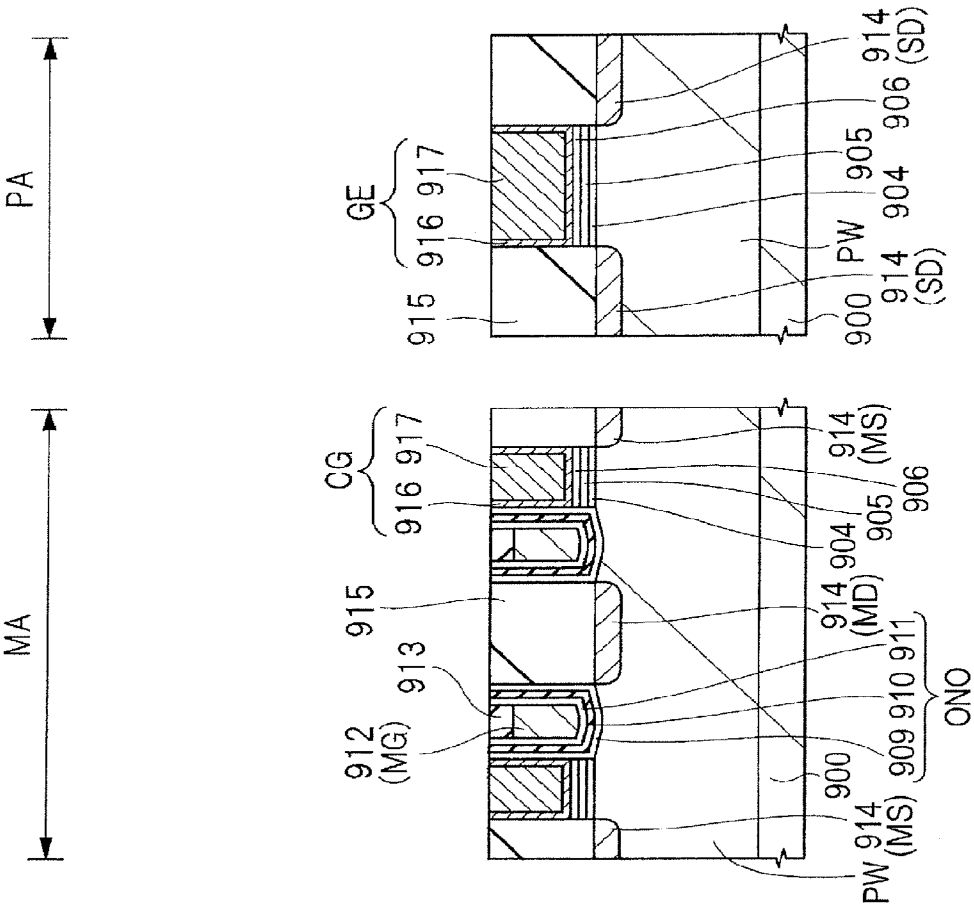
FIG. 114 is a cross-sectional view showing a manufacturing step of the semiconductor device of Ninth Embodiment following that of FIG. 113.

Next, as shown in FIG. 114, a metal electrode film 916 and a metal film 917 are formed in the recesses TCG and TGE as well as on the silicon oxide film 915. For example, after deposition of a film of about 20 nm thick made of tantalum nitride/titanium/aluminum, an aluminum film is formed. These films can be formed, for example, by sputtering. Then, the metal electrode film 916 and the metal film 917 are removed using CMP or the like until exposure of the surface of the silicon oxide film 915.

By this step, the recesses TCG and TEG are filled with the metal film 917 via the metal electrode film 916. In other words, a control gate electrode portion CG is formed in the recess TCG and a gate electrode portion GE of the peripheral transistor is formed in the recess TOE.

Then, a silicon oxide film 918 is deposited as an interlayer insulating film on the silicon oxide film 915, the gate electrode portion GE, and the like by CVD or the like. Then, a plug (not illustrate) is formed in this silicon oxide film 918 and a wiring 920 is formed on the silicon oxide film 918 (refer to FIG. 105).

By the above-mentioned steps, the semiconductor device of the present embodiment can be formed. Thus, by the above-mentioned steps, a memory cell formed in a memory cell region MA and having a high-k insulating film and a metal electrode film and a peripheral transistor formed in a peripheral circuit region PA and having a control transistor having a high-k insulating film and a metal electrode film can be formed efficiently on the same semiconductor substrate. In other words, both a memory cell employing a high-k/metal configuration and a peripheral transistor employing a high-k/metal configuration can be loaded on the same semiconductor substrate.

In addition, by the above-mentioned steps, a semiconductor device having improved erase characteristics can be provided by forming a dent (TMG) in a semiconductor substrate and arranging an insulating film ONO on the dent.

Tenth Embodiment

In Ninth Embodiment, a stacked film of the metal electrode film 916 and the metal film 917 thereon is formed only on one side of the memory gate electrode portion MG, but the stacked film of the metal electrode film 916 and the metal film 917 thereon may be formed on both sides of the memory gate electrode portion MG.

The structure of the semiconductor device of the present embodiment will hereinafter be described referring to some drawings.

Figure 115:
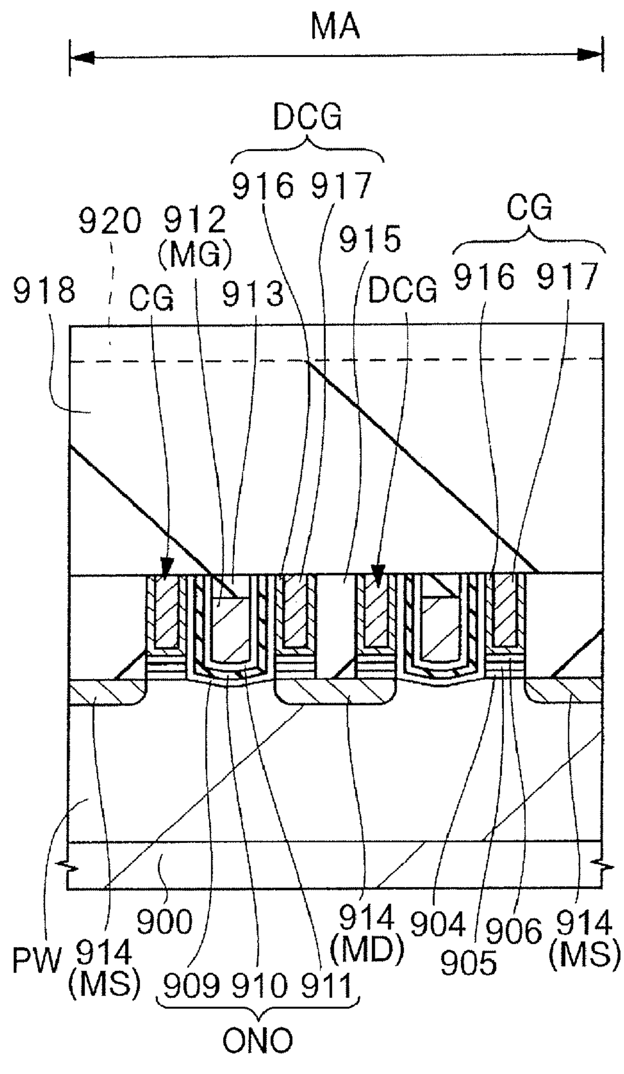
FIG. 115 is a cross-sectional view showing a semiconductor device of Tenth Embodiment.

FIG. 115 is a cross-sectional view showing the semiconductor device of the present embodiment. As shown in FIG. 115, a memory cell is comprised of a control transistor having a control gate electrode portion CG and a memory transistor having a memory gate electrode portion MG.

In the present embodiment, the memory gate electrode portion MG has a control gate electrode portion arranged adjacent to one side of the memory gate electrode portion MG and a dummy control gate electrode portion DCG arranged adjacent to the other side thereof.

The memory gate electrode portion MG is made of a silicon film, while the control gate electrode portion CG is made of a metal electrode film 916 and a metal film 917 thereon. The dummy control gate electrode portion DCG is comprised of a metal electrode film 916 and a metal film 917 thereon.

The memory cell further has an insulating film and a metal compound film between the control gate electrode portion CG and the semiconductor substrate 900 (p well PW). The insulating film has a high dielectric constant film having a dielectric constant higher than that of a silicon nitride film. The memory cell has, as the insulating film, a silicon oxide film 904 and a high-k insulating film (high dielectric constant film) 905. The high-k insulating film 905 and the control gate electrode portion CG have therebetween a titanium nitride film 906 as the metal compound film.

The memory cell further has an insulating film and a metal compound film between the dummy control gate electrode portion DCG and the semiconductor substrate 900 (p well PW). The insulating film has a high dielectric constant film having a dielectric constant higher than that of a silicon nitride film. The memory cell has, as the insulating film, a silicon oxide film 904 and a high-k insulating film (high dielectric constant film) 905. The high-k insulating film 905 and the control gate electrode portion CG have therebetween a titanium nitride film 906 as the metal compound film.

The memory cell further has an insulating film ONO (909, 910, 911) arranged between the memory gate electrode portion MG and the semiconductor substrate 900 (p well PW). The insulating film ONO is comprised of, for example, a silicon oxide film 909, a silicon nitride film 910 lying thereon, and a silicon oxynitride film 911 lying thereon. The silicon nitride film 910 will be a charge accumulation portion.

The memory cell further has a source region MS and a drain region MD formed in the p well PW of the semiconductor substrate 700.

The source region MS is comprised of an $n^+$ type semiconductor region 914 formed in self alignment with the side surface of the control gate electrode portion CG and the drain region MD is comprised of an $n^+$ type semiconductor region 914 formed from below the side surface of the memory gate electrode portion MG. The drain region MD has thereover the dummy control gate electrode portion DCG. This dummy control gate electrode portion DCG does not contribute to the operation of the memory cell. For example, upon operation of the memory cell, the dummy control gate electrode portion DCG is controlled so as not to contribute to the operation of the memory cell by placing it under a floating state.

Such a manufacturing step of the semiconductor device is performed in the following manner. For example, patterning is performed so as to leave the polysilicon film 907 on both sides of the memory gate electrode portion MG in the step shown in FIG. 110 in Ninth Embodiment. A source region MS and a drain region MD of the memory cell and a source/drain region SD of the peripheral transistor are formed while leaving the polysilicon film 907 on both sides of the memory gate electrode portion MG. Then, as in Ninth Embodiment, the polysilicon film 907 is substituted with the metal electrode film 916 and the metal film 917.

Thus, by providing the control gate electrode portion CG on one side of the memory gate electrode portion MG and providing the dummy control gate electrode portion DCG on the other side, variation in threshold voltage due to disturb stress can be suppressed. In other words, it leads to improvement in disturb resistance.

In the present embodiment, the memory gate electrode portion MG and the drain region MD where hot carriers causing disturb are generated have, between them, the dummy control gate electrode portion DCG. Presence of this dummy control gate electrode portion DCG is presumed to suppress the influence of the hot carriers.

Eleventh Embodiment

In First Embodiment, the peripheral transistor has employed a high-k/metal configuration. Alternatively, some of the peripheral transistors may use a gate electrode portion GE made of, for example, a silicon film without using the high-k metal configuration.

The structure of a semiconductor device of the present embodiment will next be described referring to some drawings.

[Description on Structure]

The semiconductor device of the present embodiment has a memory cell (memory transistor, control transistor) formed in a memory cell region MA and a peripheral transistor formed in a peripheral circuit region PA.

Figure 116:
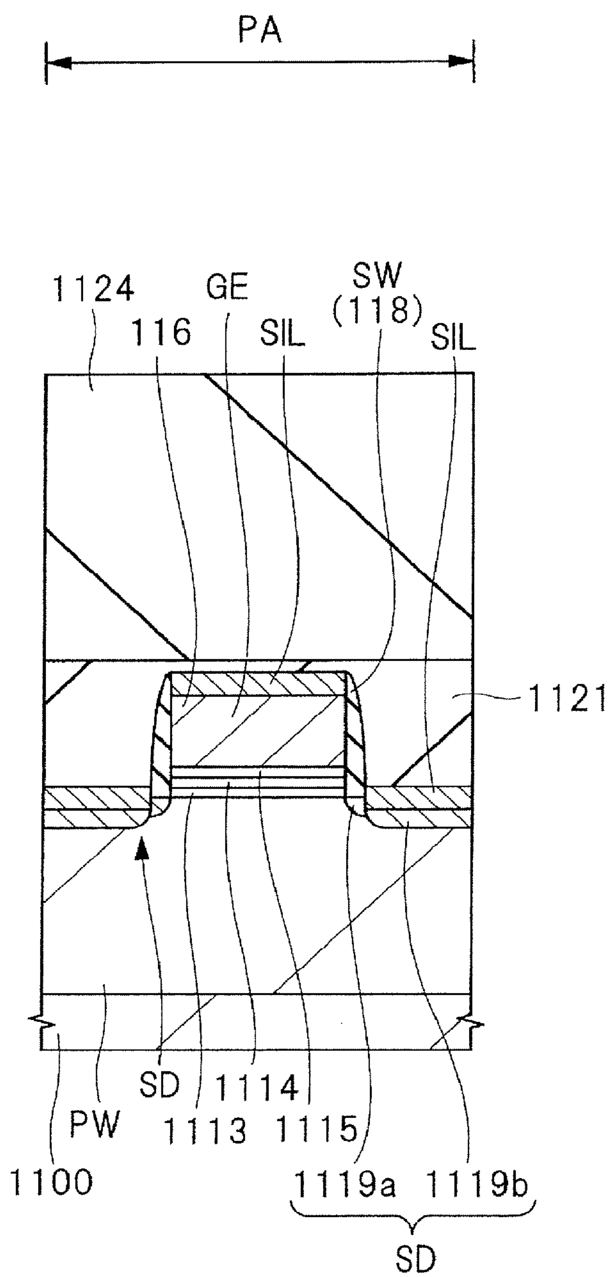
FIG. 116 is a cross-sectional view showing a configuration of one of peripheral transistors of a semiconductor device of Eleventh Embodiment.

FIG. 116 is a cross-sectional view showing the configuration of some of the peripheral transistors of the semiconductor device of the present embodiment. The semiconductor device of the present embodiment is similar to that of First Embodiment in the other configuration, that is, the configuration of the memory cell and the configuration of the other peripheral transistors.

As shown in FIG. 116, some of the peripheral transistors of the semiconductor device of the present embodiment have a gate electrode portion GE arranged over a semiconductor substrate 1100 (p well PW) and a source/drain region SD provided in the p well PW on both sides of the gate electrode portion GE. The gate electrode portion GE is made of a silicon film. This silicon film has thereover a metal silicide film SIL. The peripheral transistor has an insulating film and a metal compound film between the gate electrode portion GE and the semiconductor substrate 1100 (p well PW). The insulating film has a high dielectric constant film having a dielectric constant higher than that of a silicon nitride film. As shown in FIG. 116, the peripheral transistor has, as the insulating film, a silicon oxide film 1113 and a high-k insulating film (high dielectric constant film) 1114. The high-k insulating film 1114 and the gate electrode portion GE have therebetween a titanium nitride film 1115 as the metal compound film.

The gate electrode portion GE has, on the sidewall portion thereof, a sidewall film SW made of an insulating film. The source/drain region SD is comprised of an $n^+$ type semiconductor region 1119*b* and an $n^-$ type semiconductor region 1119*a*. The $n^-$ type semiconductor region 1119*a* is formed in self alignment with the sidewall of the gate electrode portion GE. The $n^+$ type semiconductor region 1119*b* is formed in self alignment with the side surface of the sidewall film SW and has a junction depth and an impurity concentration greater than those of the n type semiconductor region 1119*a*. This source/drain region SD ($n^+$ type semiconductor region 1119*b*) has thereover a metal silicide film SIL.

The peripheral circuit region PA has therein a silicon oxide film 1121 as an interlayer insulating film and this silicon oxide film 1121 has thereon a silicon oxide film 1124 as an interlayer insulating film.

In such a peripheral transistor formation region, the gate electrode portion GE may be formed, for example, by patterning without forming the silicon nitride film 117 in the step shown in FIGS. 36 to 40 of First Embodiment. Then, as in the memory gate electrode portion MG and the control gate electrode portion CG, a metal silicide film SIL is formed over the gate electrode portion GE made of a silicon film.

Thus, for example, some of a plurality of peripheral transistors may be configured so as to have a gate electrode portion GE made of a silicon film without using the high-k/metal configuration. It is also possible to form the gate electrode portion GE of all the peripheral transistors as a gate electrode portion GE made of a silicon film.

Twelfth Embodiment

In the semiconductor device of First Embodiment, the memory gate electrode portion MG has a sidewall shape. In addition, the control gate electrode portion CG may also have a sidewall shape.

The structure of the semiconductor device of the present embodiment will next be described referring to drawings.

[Description on Structure]

The semiconductor device of the present embodiment has a memory cell (memory transistor, control transistor) formed in a memory cell region MA and a peripheral transistor formed in a peripheral circuit region PA.

Figure 117:
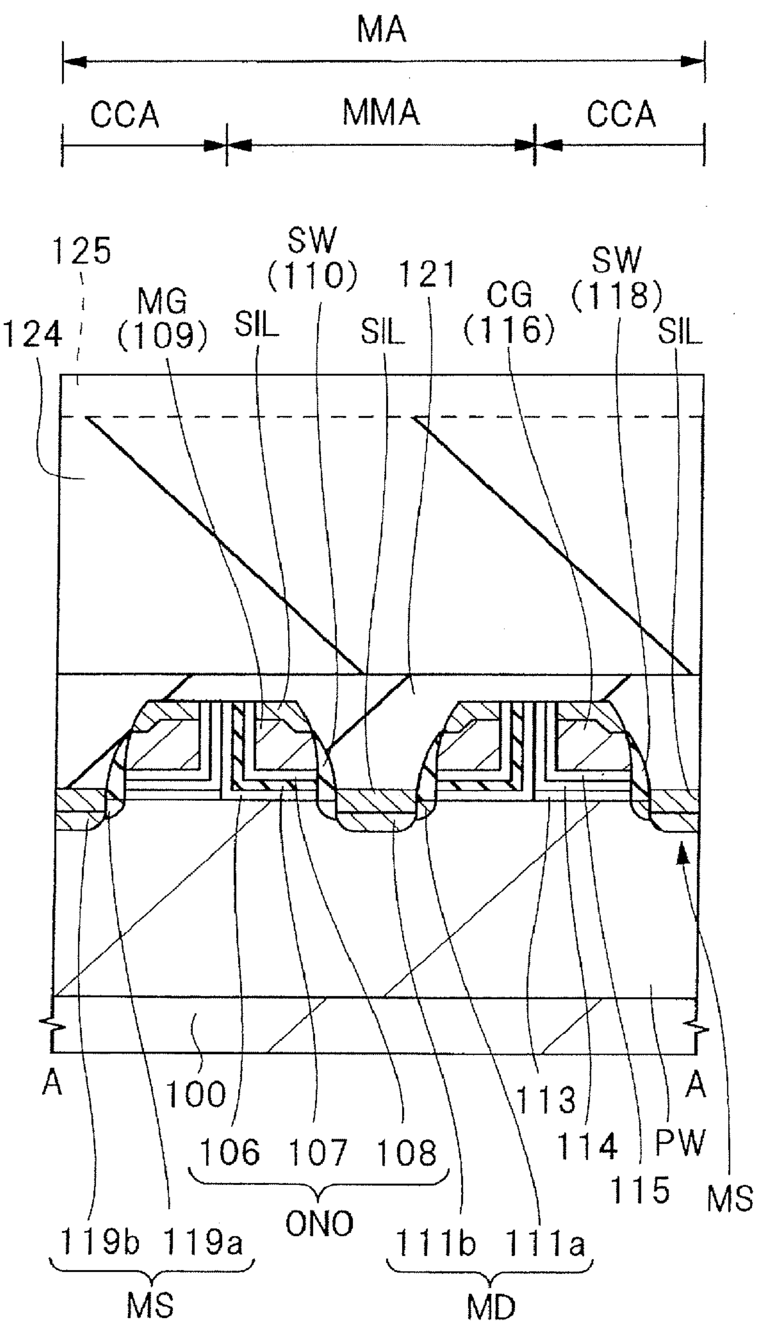
FIG. 117 is a cross-sectional view showing the configuration of a memory cell of a semiconductor device of Twelfth Embodiment.

FIG. 117 is a cross-sectional view showing the configuration of the memory cell of the semiconductor device of the present embodiment. The semiconductor device is similar to that of First Embodiment except that it has a control gate electrode portion CG in sidewall shape.

As shown in FIG. 117, the memory cell of the present embodiment has a control gate electrode portion CG arranged over a semiconductor substrate 100 (p well PW) and a memory gate electrode portion MG arranged over the semiconductor substrate 100 (p well PW) and adjacent to the control gate electrode portion CG. For example, the control gate electrode portion CG and the memory gate electrode portion MG are each made of a silicon film. This silicon oxide film has thereover a metal silicide film SIL. Further, the control gate electrode portion CG and the memory gate electrode portion MG each have a sidewall shape.

In forming such a memory cell, for example, the polysilicon film 116 shown in FIG. 32 of First Embodiment may be removed by a predetermined thickness from the surface thereof by anisotropic dry etching. By this step, the polysilicon film 116 can be left in sidewall shape (sidewall film shape). Then, as shown in FIG. 39, with the silicon nitride film 117 as a mask, the polysilicon film 116 for substitution of a gate electrode portion is formed in the peripheral circuit region PA. Steps subsequent thereto are similar to those of First Embodiment.

Thus, both the memory gate electrode portion MG and the control gate electrode portion CG may have a sidewall shape. This makes it possible to scale down the memory gate electrode portion MG and the control gate electrode portion CG.

Invention made by the present inventors has been described specifically based on the embodiments thereof. It is needless to say that the invention is not limited to or by the above-mentioned embodiments but can be changed without departing from the scope of the invention.

[Supplement 1]

A semiconductor device having:

a semiconductor substrate;

a first gate electrode portion arranged over the semiconductor substrate;

a second gate electrode portion arranged over the semiconductor substrate so as to be adjacent to the first gate electrode portion;

a first insulating film formed between the first gate electrode portion and the semiconductor substrate;

a second insulating film formed between the second gate electrode portion and the semiconductor substrate, between the first gate electrode portion and the second gate electrode portion, and along a side surface of the second gate electrode portion on a side opposite to the side of the first gate electrode portion, and having a charge accumulation portion in the second insulating film; and a metal compound film arranged between the first gate electrode portion and the first insulating film, the first insulating film having a high dielectric constant film having a dielectric constant higher than that of a silicon nitride film.

[Supplement 2]

In the semiconductor device according to Supplement 1, the semiconductor substrate has, in a first region thereof, a first element having the first gate electrode portion, the second gate electrode portion, the first insulating film, and the second insulating film, the semiconductor substrate has, in a second region thereof, a second element having a third gate electrode portion arranged over the second region of the semiconductor substrate via a third insulating film and a source/drain region formed in the semiconductor substrate on both sides of the third gate electrode portion, the third insulating film has the high dielectric constant film, and the third gate electrode portion has a metal film or a metal compound film.

[Supplement 3]

A method of manufacturing a semiconductor device having the steps of:

(a) forming a first conductive film over a semiconductor substrate via a first insulating film;

(b) etching the first insulating film and the first conductive film to form a first recess in a first region of the semiconductor substrate;

(c) successively forming a second insulating film and a second conductive film over the first conductive film and the first recess;

(d) removing the second insulating film and the second conductive film until exposure of the first conductive film; and (e) etching the first insulating film and the first conductive film to leave, via the first insulating film, the first conductive film in a second region adjacent to the first region.

[Supplement 4]

In the method of manufacturing a semiconductor device according to Supplement 3, the step (e) is a step of leaving the first conductive film also in a third region via the first insulating film.

[Supplement 5]

In the method of manufacturing a semiconductor device according to Supplement 4, the step (e) is followed by the steps of:

(f) forming a third insulating film over the first conductive film;

(g) removing the third insulating film until exposure of the first conductive film;

(h) removing the first conductive film to form a second recess; and (i) forming a metal film or a metal compound film in the second recess.

What is claimed is:

1. A method of manufacturing a semiconductor device, comprising the steps of:

(a) forming a first conductive film in a first region of a semiconductor substrate via a first insulating film having therein a charge accumulation portion;

(b) successively forming a second insulating film and a second conductive film over the semiconductor substrate, over the first conductive film and over the side surface thereof;

(c) etching the second insulating film and the second conductive film to leave, via the second insulating film, the second conductive film in a second region adjacent to the first region, with the second insulating film covering a corner of a lower portion of the second conductive film at a side adjacent to the first region; and (d) forming a third insulating film over the semiconductor substrate and the second conductive film, wherein the second insulating film has a high dielectric constant film having a dielectric constant higher than that of a silicon nitride film.

2. The method of manufacturing a semiconductor device according to claim 1, wherein the step (c) is a step of leaving the second conductive film also in a third region via the second insulating film.

3. The method of manufacturing a semiconductor device according to claim 2, comprising, after the step (d), the steps of:

(e) removing the third insulating film until exposure of the second conductive film;

(f) removing the second conductive film in the third region to form a recess; and (g) forming a metal film or a metal compound film in the recess.

4. The method of manufacturing a semiconductor device according to claim 1, wherein the first conductive film in the step (a) lies in sidewall shape on the sidewall of a first film via the first insulating film.

5. The method of manufacturing a semiconductor device according to claim 1, wherein the step (c) is a step of etching the second conductive film into a sidewall shape.

* * * * *